(12) United States Patent
Mauck et al.

(10) Patent No.: US 10,654,299 B2
(45) Date of Patent: May 19, 2020

(54) LOW-PARTICLE GAS ENCLOSURE SYSTEMS AND METHODS

(71) Applicant: Kateeva, Inc., Newark, CA (US)

(72) Inventors: Justin Mauck, Belmont, CA (US); Alexander Sou-Kang Ko, Santa Clara, CA (US); Eliyahu Vronsky, Los Altos, CA (US); Shandon Alderson, San Carlos, CA (US); Alexey Stepanov, Sunnyvale, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 16/102,392

(22) Filed: Aug. 13, 2018

(65) Prior Publication Data

US 2018/0370263 A1    Dec. 27, 2018

Related U.S. Application Data

(63) Continuation of application No. 14/275,637, filed on May 12, 2014, and a continuation-in-part of
(Continued)

(51) Int. Cl.
*B41J 29/02* (2006.01)
*B05C 15/00* (2006.01)
(Continued)

(52) U.S. Cl.
CPC ............... *B41J 29/02* (2013.01); *B05C 15/00* (2013.01); *B41J 29/13* (2013.01); *H01L 51/56* (2013.01)

(58) Field of Classification Search
None
See application file for complete search history.

(56) References Cited

U.S. PATENT DOCUMENTS 3,216,858 A    11/1965  Bogdanowski
3,251,139 A    5/1966   Strimling
(Continued)

FOREIGN PATENT DOCUMENTS

CN    1445089 A    10/2003
CN    1722918 A    1/2006
(Continued)

OTHER PUBLICATIONS

Non-Final Office Action dated Apr. 17, 2015, to U.S. Appl. No. 13/774,691.
(Continued)

*Primary Examiner* — Jethro M. Pence
(74) *Attorney, Agent, or Firm* — Paula J. Tostado

(57) ABSTRACT

The present teachings relate to various embodiments of a gas enclosure system that can have various components comprising a particle control system that can provide a low-particle zone proximal to a substrate. Various components of a particle control system can include a gas circulation and filtration system, a low-particle-generating motion system for moving a printhead assembly relative to a substrate, a service bundle housing exhaust system, and a printhead assembly exhaust system. In addition to maintaining substantially low levels for each species of various reactive species, including various reactive atmospheric gases, such as water vapor and oxygen, for various embodiments of a gas enclosure system that have a particle control system, an on-substrate particle specification can be readily met. Accordingly, processing of various substrates in an inert, low-particle gas environment according to systems and methods of the present teachings can have substantially lower manufacturing defects.

16 Claims, 51 Drawing Sheets

Related U.S. Application Data application No. 14/205,340, filed on Mar. 11, 2014, now Pat. No. 9,604,245, which is a continuation-in-part of application No. 13/802,304, filed on Mar. 13, 2013, now Pat. No. 9,048,344, which is a continuation-in-part of application No. 13/720,830, filed on Dec. 19, 2012, now Pat. No. 8,899,171, and a continuation-in-part of application No. 12/652,040, filed on Jan. 5, 2010, now Pat. No. 8,383,202, which is a continuation-in-part of application No. 12/139,391, filed on Jun. 13, 2008, now abandoned.

(60) Provisional application No. 61/833,398, filed on Jun. 10, 2013, provisional application No. 61/911,934, filed on Dec. 4, 2013, provisional application No. 61/925,578, filed on Jan. 9, 2014, provisional application No. 61/983,417, filed on Apr. 23, 2014, provisional application No. 61/579,233, filed on Dec. 22, 2011, provisional application No. 61/142,575, filed on Jan. 5, 2009.

(51) Int. Cl.
   *B41J 29/13* (2006.01)
   *H01L 51/56* (2006.01)

(56) References Cited

U.S. PATENT DOCUMENTS

| | | |
|---|---|---|
| 3,498,343 A | 3/1970 | Sperberg |
| 3,670,466 A | 6/1972 | Lynch |
| 3,885,362 A | 5/1975 | J |
| 4,226,897 A | 10/1980 | Coleman |
| 4,581,478 A | 4/1986 | Pugh et al. |
| 4,676,144 A | 6/1987 | Smith |
| 4,693,175 A | 9/1987 | Hashimoto |
| 4,721,121 A | 1/1988 | Adams |
| 5,029,518 A | 7/1991 | Austin |
| 5,065,169 A | 11/1991 | Vincent et al. |
| 5,314,377 A | 5/1994 | Pelosi |
| 5,344,365 A | 9/1994 | Scott et al. |
| 5,562,539 A | 10/1996 | Hashimoto et al. |
| 5,633,133 A | 5/1997 | Long et al. |
| 5,651,625 A | 7/1997 | Smith et al. |
| 5,869,636 A | 2/1999 | Irie et al. |
| 5,896,154 A | 4/1999 | Mitani et al. |
| 6,023,899 A | 2/2000 | Mecozzi |
| 6,049,167 A | 4/2000 | Onitsuka et al. |
| 6,089,282 A | 7/2000 | Spiegelman et al. |
| 6,375,304 B1 | 4/2002 | Aldrich et al. |
| 6,604,810 B1 | 8/2003 | Silverbrook |
| 6,781,684 B1 | 8/2004 | Ekhoff |
| 6,939,212 B1 | 9/2005 | Pham |
| 7,258,768 B2 | 8/2007 | Yamazaki |
| 7,326,300 B2 | 2/2008 | Sun et al. |
| 7,384,662 B2 | 6/2008 | Takano et al. |
| 7,387,662 B2 | 6/2008 | Ahman et al. |
| 7,703,911 B2 | 4/2010 | Chung et al. |
| 7,989,025 B2 | 8/2011 | Sakai et al. |
| 8,383,202 B2 | 2/2013 | Somekh et al. |
| 8,414,688 B1 | 4/2013 | Delgado et al. |
| 8,720,366 B2 | 5/2014 | Somekh et al. |
| 8,802,186 B2 | 8/2014 | Somekh et al. |
| 8,802,195 B2 | 8/2014 | Somekh et al. |
| 8,899,171 B2 | 12/2014 | Mauck et al. |
| 9,048,344 B2 | 6/2015 | Mauck et al. |
| 9,174,433 B2 | 11/2015 | Somekh et al. |
| 9,248,643 B2 | 2/2016 | Somekh et al. |
| 9,278,564 B2 | 3/2016 | Mauck et al. |
| 9,387,709 B2 | 7/2016 | Mauck et al. |
| 2001/0041530 A1 | 11/2001 | Hara |
| 2002/0033860 A1 | 3/2002 | Kubota et al. |
| 2002/0053589 A1 | 5/2002 | Owen et al. |
| 2002/0079057 A1 | 6/2002 | Yoshioka et al. |
| 2002/0084464 A1 | 7/2002 | Yamazaki et al. |
| 2002/0124906 A1 | 9/2002 | Suzuki et al. |
| 2002/0191063 A1 | 12/2002 | Gelbart et al. |
| 2003/0000476 A1 | 1/2003 | Matsunaga et al. |
| 2003/0097929 A1 | 5/2003 | Watanabe et al. |
| 2003/0175414 A1 | 9/2003 | Hayashi |
| 2004/0021762 A1 | 2/2004 | Seki et al. |
| 2004/0050325 A1 | 3/2004 | Samoilov et al. |
| 2004/0062856 A1 | 4/2004 | Marcus et al. |
| 2004/0075112 A1 | 4/2004 | Yamazaki et al. |
| 2004/0075385 A1 | 4/2004 | Tao |
| 2004/0086631 A1 | 5/2004 | Han et al. |
| 2004/0115339 A1 | 6/2004 | Ito |
| 2004/0118309 A1 | 6/2004 | Fedor et al. |
| 2004/0123804 A1 | 7/2004 | Yamazaki et al. |
| 2005/0005850 A1 | 1/2005 | Yamazaki |
| 2005/0040338 A1 | 2/2005 | Weiss et al. |
| 2005/0062773 A1 | 3/2005 | Fouet |
| 2005/0104945 A1 | 5/2005 | Chung et al. |
| 2005/0140764 A1 | 6/2005 | Chang et al. |
| 2005/0223994 A1 | 10/2005 | Blomiley et al. |
| 2006/0008591 A1 | 1/2006 | Sun et al. |
| 2006/0045669 A1 | 3/2006 | Namioka et al. |
| 2006/0054774 A1 | 3/2006 | Yassour et al. |
| 2006/0096395 A1 | 5/2006 | Weiss et al. |
| 2006/0099328 A1 | 5/2006 | Waite et al. |
| 2006/0119669 A1 | 6/2006 | Sharma et al. |
| 2006/0219605 A1 | 10/2006 | Devitt |
| 2006/0236938 A1 | 10/2006 | Powell et al. |
| 2006/0273713 A1 | 12/2006 | Mehta et al. |
| 2007/0004328 A1 | 1/2007 | Balzer |
| 2007/0021050 A1 | 1/2007 | Kennedy |
| 2007/0026151 A1 | 2/2007 | Higginson et al. |
| 2007/0044713 A1 | 3/2007 | Yasui et al. |
| 2007/0046185 A1 | 3/2007 | Kim |
| 2007/0195653 A1 | 8/2007 | Yassour et al. |
| 2007/0234952 A1 | 10/2007 | Kojima |
| 2007/0257033 A1 | 11/2007 | Yamada |
| 2008/0085652 A1 | 4/2008 | Winters |
| 2008/0206036 A1 | 8/2008 | Smith et al. |
| 2008/0241587 A1 | 10/2008 | Ohmi et al. |
| 2008/0259101 A1 | 10/2008 | Kurita et al. |
| 2008/0260938 A1 | 10/2008 | Ikeda et al. |
| 2008/0273072 A1 | 11/2008 | Chung et al. |
| 2008/0308037 A1 | 12/2008 | Bulovic et al. |
| 2008/0311307 A1 | 12/2008 | Bulovic et al. |
| 2009/0031579 A1 | 1/2009 | Kuroda |
| 2009/0058915 A1 | 3/2009 | Hayashi et al. |
| 2009/0081885 A1 | 3/2009 | Levy et al. |
| 2009/0244510 A1 | 10/2009 | Domanowski |
| 2009/0295857 A1 | 12/2009 | Kikuchi et al. |
| 2009/0324368 A1 | 12/2009 | Koparal et al. |
| 2010/0182359 A1 | 7/2010 | Kim et al. |
| 2010/0201749 A1 | 8/2010 | Somekh et al. |
| 2010/0282271 A1 | 11/2010 | Devitt |
| 2011/0043554 A1 | 2/2011 | Silverbrook et al. |
| 2011/0096124 A1 | 4/2011 | North et al. |
| 2011/0318503 A1 | 12/2011 | Adams et al. |
| 2012/0056923 A1 | 3/2012 | Vronsky et al. |
| 2012/0128890 A1 | 5/2012 | Mirchev |
| 2012/0156365 A1 | 6/2012 | Ohara |
| 2012/0201749 A1 | 8/2012 | Crawshaw et al. |
| 2012/0306951 A1 | 12/2012 | Somekh et al. |
| 2013/0004656 A1 | 1/2013 | Chen et al. |
| 2013/0038649 A1 | 2/2013 | Lowrance et al. |
| 2013/0040061 A1 | 2/2013 | Lowrance et al. |
| 2013/0096124 A1 | 4/2013 | Nanchen et al. |
| 2013/0164438 A1 | 6/2013 | Somekh et al. |
| 2013/0164439 A1 | 6/2013 | Somekh et al. |
| 2013/0209669 A1 | 8/2013 | Somekh et al. |
| 2013/0209670 A1 | 8/2013 | Somekh et al. |
| 2013/0209671 A1 | 8/2013 | Somekh et al. |
| 2013/0252533 A1 | 9/2013 | Mauck et al. |
| 2013/0258709 A1 | 10/2013 | Thompson et al. |
| 2014/0253616 A1 | 9/2014 | Tremel |
| 2014/0290567 A1 | 10/2014 | Mauck et al. |
| 2014/0311405 A1 | 10/2014 | Kateeva Inc |
| 2016/0207313 A1 | 7/2016 | Somekh et al. |
| 2017/0080730 A1 | 3/2017 | Mauck et al. |

(56) References Cited

U.S. PATENT DOCUMENTS

| | | |
|---|---|---|
| 2017/0130315 A1 | 5/2017 | Somekh et al. |
| 2017/0239966 A1 | 8/2017 | Mauck et al. |
| 2017/0321911 A1 | 11/2017 | Mauck et al. |
| 2018/0370263 A1 | 12/2018 | Mauck et al. |

FOREIGN PATENT DOCUMENTS

| | | |
|---|---|---|
| CN | 1956209 A | 5/2007 |
| CN | 101088141 A | 12/2007 |
| CN | 101243543 A | 8/2008 |
| CN | 101357541 A | 2/2009 |
| CN | 201446232 U | 5/2010 |
| CN | 101754861 A | 6/2010 |
| CN | 101809193 A | 8/2010 |
| CN | 102271922 A | 12/2011 |
| CN | 102328317 A | 1/2012 |
| EP | 2973676 A2 | 1/2016 |
| JP | 62098783 | 6/1987 |
| JP | 2005502487 A | 4/1993 |
| JP | 549294 | 6/1993 |
| JP | H09503704 A | 4/1997 |
| JP | H11312640 A | 11/1999 |
| JP | 2002069650 A | 3/2002 |
| JP | 2002093878 A | 3/2002 |
| JP | 2003173871 A | 6/2003 |
| JP | 2003266007 A | 9/2003 |
| JP | 2003272847 A | 9/2003 |
| JP | 2004146369 A | 5/2004 |
| JP | 2004164873 A | 6/2004 |
| JP | 2004241751 A | 8/2004 |
| JP | 2004253332 A | 9/2004 |
| JP | 2004291456 A | 10/2004 |
| JP | 2004362854 A | 12/2004 |
| JP | 2004535956 A | 12/2004 |
| JP | 2005074299 A | 3/2005 |
| JP | 2005254038 A | 9/2005 |
| JP | 2006026463 A | 2/2006 |
| JP | 2006123551 A | 5/2006 |
| JP | 2006150900 A | 6/2006 |
| JP | 2007013140 A | 1/2007 |
| JP | 2007122914 A | 5/2007 |
| JP | 2007273093 A | 10/2007 |
| JP | 2007299785 A | 11/2007 |
| JP | 2008004919 A | 1/2008 |
| JP | 2008047340 A | 2/2008 |
| JP | 2008511146 A | 4/2008 |
| JP | 2009112889 A | 5/2009 |
| JP | 4423082 B2 | 3/2010 |
| JP | 2010134315 A | 6/2010 |
| JP | 2010533057 A | 10/2010 |
| JP | 2011065967 A | 3/2011 |
| JP | 2011225355 A | 11/2011 |
| JP | 2011255366 A | 12/2011 |
| JP | 2012074370 A | 4/2012 |
| KR | 20060044265 A | 5/2006 |
| KR | 20060088909 A | 8/2006 |
| KR | 20070042272 A | 4/2007 |
| KR | 20090126568 A | 12/2009 |
| KR | 20120022197 A | 3/2012 |
| TW | 200302678 A | 8/2003 |
| TW | 200303829 A | 9/2003 |
| TW | I247554 | 1/2006 |
| TW | 200618308 A | 6/2006 |
| WO | 2006021568 A1 | 3/2006 |
| WO | 2011118652 A1 | 9/2011 |
| WO | 2013023099 A1 | 2/2013 |

OTHER PUBLICATIONS

Non-Final Office Action dated Apr. 24, 2013, to U.S. Appl. No. 13/551,209.
Non-Final Office Action dated Apr. 27, 2016, to U.S. Appl. No. 14/543,786.
Non-Final Office Action dated Apr. 28, 2014, to U.S. Appl. No. 13/720,830.
Non-Final Office Action dated Apr. 4, 2016, to U.S. Appl. No. 14/205,340.
Non-Final Office Action dated Aug. 3, 2015, to U.S. Appl. No. 14/727,602.
Non-Final Office Action dated Dec. 31, 2013, to U.S. Appl. No. 13/774,577.
Non-Final Office Action dated Feb. 17, 2017 for U.S. Appl. No. 15/409,844.
Non-Final Office Action dated Feb. 28, 2014, to U.S. Appl. No. 13/773,649.
Non-Final Office Action dated Feb. 7, 2014, to U.S. Appl. No. 13/773,641.
Non-Final Office Action dated Jan. 17, 2017 for U.S. Appl. No. 14/996,086.
Non-Final Office action dated Jan. 26, 2018, to U.S. Appl. No. 15/184,755.
Non-Final Office Action dated Jun. 14, 2012, to U.S. Appl. No. 12/652,040.
Non-Final Office Action dated Jun. 29, 2018, to U.S. Appl. No. 15/605,806.
Non-Final Office Action dated Mar. 10, 2016 to U.S. Appl. No. 14/275,637.
Non-Final Office Action dated May 16, 2014, to U.S. Appl. No. 13/802,304.
Non-Final Office Action dated Nov. 20, 2015 for U.S. Appl. No. 14/637,301.
Non-Final Office Action dated Nov. 4, 2016 for U.S. Appl. No. 14/543,786.
Non-Final Office action dated Sep. 18, 2017, to U.S. Appl. No. 14/543,786.
Non-Final Office Action issued to U.S. Appl. No. 13/571,166 dated Oct. 8, 2014.
Non-Final Office Action dated Jul. 1, 2014, to U.S. Appl. No. 13/773,654.
Notice of Allowability dated Jun. 29, 2018, to U.S. Appl. No. 14/275,637.
Notice of Allowance dated Dec. 16, 2015 to U.S. Appl. No. 14/727,602.
Notice of Allowance dated Jan. 31, 2017 for U.S. Appl. No. 14/205,340.
Notice of Allowance dated Dec. 9, 2014 for U.S. Appl. No. 13/802,304.
Notice of Allowance dated Feb. 20, 2014, to U.S. Appl. No. 13/551,209.
Notice of Allowance dated Feb. 9, 2018, for U.S. Appl. No. 14/275,637.
Notice of Allowance dated Jul. 1, 2014, to U.S. Appl. No. 13/773,649.
Notice of Allowance dated Jul. 2, 2014, to U.S. Appl. No. 13/774,577.
Notice of Allowance dated Jun. 29, 2018, to U.S. Appl. No. 15/184,755.
Notice of Allowance dated Jun. 30, 2014, to U.S. Appl. No. 13/773,641.
Notice of Allowance dated Mar. 2, 2015 for U.S. Appl. No. 13/571,166.
Notice of Allowance dated Mar. 26, 2018, to U.S. Appl. No. 15/409,844.
Notice of Allowance dated May 16, 2016 to U.S. Appl. No. 14/637,301.
Notice of Allowance dated May 18, 2017 for U.S. Appl. No. 14/543,786.
Notice of Allowance dated Nov. 19, 2015, to U.S. Appl. No. 13/776,602.
Notice of Allowance dated Nov. 2, 2017, to U.S. Appl. No. 15/409,844.
Notice of Allowance dated Nov. 24, 2017, to U.S. Appl. No. 14/275,637.
Notice of Allowance dated Oct. 6, 2014 for U.S. Appl. No. 13/720,830.
Notice of Allowance dated Sep. 13, 2017, to U.S. Appl. No. 14/275,637.
Notice of Allowance dated Sep. 9, 2015, to U.S. Appl. No. 13/774,693.

(56) References Cited

OTHER PUBLICATIONS

Notice of Allowance dated Sep. 29, 2014, to U.S. Appl. No. 13/773,654.
Notification of Provisional Rejection dated Dec. 9, 2015, for Korean Patent Application No. 10-2015-7014277.
Notification of Provisional Rejection dated Jun. 14, 2016 for KR Application No. 10-2016-7014087.
Office action dated Feb. 2, 2018, to JP Patent Application No. 2016-519508.
Office Action dated Jun. 22, 2016 to CN Patent Application No. 201480045349.5
Office Action issued to CN Patent Application 201210596572 dated Mar. 23, 2015.
Office Action issued to Japanese Patent Application No. 2015-544055, dated Oct. 26, 2015.
Penultimate Office action dated Mar. 22, 2018, to JP Patent Application No. 2016-90252.
Provisional Rejection dated Jul. 6, 2018, to KR Patent Application No. 9-5-2018-046228232.
Provisional Rejection dated Mar. 14, 2018, to KR Patent Application No. 10-2018-7003619.
Provisional Rejection dated Oct. 17, 2017, to KR Patent Application No. 10-2015-7027963.
Search Report dated Jul. 29, 2015 to CN Patent Application 201310704315.X.
Second CN Office Action dated Jul. 31, 2017 for CN Patent Application No. 20140027671.5.
Second CN Office Action dated Sep. 27, 2017 for CN Patent Application No. 201610181336.1.
Second Notice of Allowance dated Feb. 10, 2017 for U.S. Appl. No. 14/205,340.
Second Office Action issued to CN Patent Application 201210596572 dated Oct. 8, 2015.
Second Provisional Rejection dated Feb. 27, 2017 for KR Patent Application No. 10-2016-7014087.
Street et al., "Jet Printing of Active-Matrix TFT Backplanes for Displays and Sensors", IS&T Archiving, Dec. 2005, vol. 20, No. 5, 16 pages.
Supplemental Notice of Allowability dated Jun. 7, 2017 for U.S. Appl. No. 14/543,786.
Supplemental Notice of Allowance dated Nov. 1, 2017, to U.S. Appl. No. 14/275,637.
Third Office Action dated Feb. 27, 2018, to CN Patent Application No. 201480027671.5.
Third Office Action issued to CN Patent Application 201210596572 dated Jan. 26, 2016.
TW Examination Report and Search Report dated Mar. 13, 2017 for TW Patent Application No. 105144240.
TW Examination Report issued to TW Patent Application 105117833, dated May 10, 2017.
Non-final Office action dated Jan. 28, 2019, to U.S. Appl. No. 14/996,086.
Notice of Allowance dated Jan. 24, 2019, to U.S. Appl. No. 15/605,806.
Notice of Allowance dated Jan. 24, 2019, U.S. Appl. No. 14/275,637.
Corrected Notice of Allowability dated Oct. 23, 2018, to U.S. Appl. No. 14/996,086.
Examination report dated Aug. 13, 2018, to TW Patent Application 106145084.
Interview Summary dated Oct. 23, 2018, to U.S. Appl. No. 14/996,086.
Non-Final Office action dated Oct. 17, 2018, to U.S. Appl. No. 15/446,984.
Notice of Allowance dated Oct. 18, 2018, to U.S. Appl. No. 14/543,786.
Notice of Allowance dated Sep. 17, 2018, to U.S. Appl. No. 15/184,755.
Notice of Allowance dated Sep. 24, 2018, to U.S. Appl. No. 14/275,637.
Notice of Allowance dated Sep. 26, 2018, to U.S. Appl. No. 14/996,086.
Provisional Rejection dated Sep. 10, 2018, to KR Patent Application No. 10-2018-7016567.
Rejection Decision dated Jul. 25, 2018, to TW Patent Application No. 103117122.
Final Office action dated Nov. 21, 2018, to JP Patent Application No. 2016-090252.
Notice of Allowance dated Dec. 13, 2018, to U.S. Appl. No. 15/184,755.
Notice of Allowance dated Dec. 19, 2018, to U.S. Appl. No. 15/409,844.
Notice of Allowance dated Nov. 21, 2018, to U.S. Appl. No. 14/996,086.
Notice of Allowance dated Nov. 7, 2018, to U.S. Appl. No. 15/409,844.
Office action dated Oct. 8, 2018, to CN Patent Application No. 201610837821.X.
Applicant Initiated Interview Summary dated Aug. 15, 2013, to U.S. Appl. No. 13/551,209.
Applicant-Initiated Interview Summary dated Aug. 20, 2014 for U.S. Appl. No. 13/802,304.
Applicant-Initiated Interview Summary dated Jun. 30, 2014 for U.S. Appl. No. 13/720,830.
Applicant-Initiated Interview Summary dated Oct. 19, 2012 for U.S. Appl. No. 12/652,040.
Applicant-Initiated Interview Summary dated Apr. 7, 2017 for U.S. Appl. No. 14/275,637.
Applicant-Initiated Interview Summary dated Dec. 22, 2016 to U.S. Appl. No. 14/543,786.
Applicant-Initiated Interview Summary dated May 30, 2018, to U.S. Appl. No. 15/184,755.
Applicant-Initiated Interview Summary dated Sep. 22, 2017, for U.S. Appl. No. 14/543,786.
CN Examination Report issued Aug. 13, 2015 for CN 201310704315.X.
CN Office Action dated Aug. 1, 2017 for CN Patent Application No. 201610692510.9.
CN Office Action dated Jan. 23, 2017 for CN Patent Application No. 201480027671.5.
CN Office Action dated Mar. 27, 2017 for CN Patent Application No. 201610181336.1.
CN Second Office Action dated Mar. 24, 2017 for CN Patent Application No. 201480045349.5.
CN Third Office Action dated Jul. 12, 2017 for CN Patent Application No. 201480045349.5.
Corrected Notice of Allowability dated Feb. 3, 2015 for U.S. Appl. No. 13/802,304.
Corrected Notice of Allowability dated Oct. 31, 2014 for U.S. Appl. No. 13/720,830.
Examination Report dated Apr. 12, 2017 for EP Patent Application No. 13858304.2.
Examination Report dated Apr. 19, 2017 for TW Patent Application No. 103108995.
Examination Report dated Apr. 26, 2016, to TW Patent Application 101148932.
Examination Report dated Oct. 8, 2015, to TW Patent Application No. 102143142.
Examination Report dated Mar. 22, 2018, to TW Patent Application No. 103117122.
Examiner Initiated Interview Summary dated Jun. 30, 2016 for U.S. Appl. No. 14/543,786.
Examiner-Initiated Interview Summary dated Apr. 5, 2018, to U.S. Appl. No. 14/275,637.
Extended European Search Report dated Jul. 1, 2016 for EP Application No. 13585304.2.
Extended European Search Report dated Apr. 12, 2017 for EP Patent Application No. 14810543.0.
Extended European Search Report dated Jun. 19, 2017 for EP Patent Application No. 14779907.6.
Final Office Action dated Jul. 19, 2017 for U.S. Appl. No. 15/409,844.
Final Office Action dated Jul. 28, 2017 for U.S. Appl. No. 14/996,086.
Final Office Action dated Oct. 14, 2016 for U.S. Appl. No. 14/205,340.
Final Office Action dated Jun. 10, 2014, to U.S. Appl. No. 13/773,649.
Final Office Action dated Jun. 12, 2014, to U.S. Appl. No. 13/773,641.

(56) References Cited

OTHER PUBLICATIONS

Final Office Action dated Jun. 18, 2014, to U.S. Appl. No. 13/774,577.
Final Office Action dated Mar. 7, 2018, to U.S. Appl. No. 14/543,786.
Final Office Action dated Nov. 8, 2013, to U.S. Appl. No. 13/551,209.
Final Office Action dated Oct. 7, 2016 for U.S. Appl. No. 14/275,637.
Forrest, Stephen R., "The Path to Ubiquitous and Low-cost Organic Electronic Appliances on Plastic," Nature, Apr. 29, 2004, vol. 428, 8 pages.
Fourth Office Action dated Mar. 25, 2016 for CN Application No. 201210596572.1.
International Search Report and Written Opinion for PCT Application No. PCT/US15/27835, dated Aug. 4, 2015.
International Search Report and Written Opinion dated Apr. 17, 2015, to PCT Application PCT/US15/11854.
International Search Report and Written Opinion dated Dec. 22, 2014, to PCT Application PCT/US14/023820.
International Search Report and Written Opinion dated Feb. 26, 2013 for PCT Application No. PCT/US12/70717.
International Search Report and Written Opinion dated Jan. 17, 2013 to PCT Application PCT/US12/050207.
International Search Report and Written Opinion dated Jun. 18, 2013 for PCT Application No. PCT/US13/031083.
International Search Report and Written Opinion dated Mar. 11, 2014, to PCT Application PCT/US13/063128.
International Search Report and Written Opinion dated Oct. 8, 2014, for corresponding PCT Application No. PCT/US2014/037722.
Japanese Official Action dated Jul. 28, 2016 for Japanese Patent Application No. 2014-548852.
JP Office Action dated Apr. 26, 2017 for JP Patent Application No. 2016-90252.
JP Office Action dated Jun. 1, 2017, to JP Patent Application No. 2016-501353.
Non-Final Office Action dated Feb. 13, 2018 for U.S. Appl. No. 14/996,086.
Non-Final Office Action dated Apr. 15, 2015 to U.S. Appl. No. 13/776,602.
Final Office action dated Mar. 22, 2019, to U.S. Appl. No. 15/446,984.
Non Final Office Action dated May 23, 2019 for U.S. Appl. No. 15/409,844.
Notice of Allowance dated Mar. 7, 2019 to U.S. Appl. No. 15/605,806.
Notice of Allowance dated Apr. 17, 2019 to U.S. Appl. No. 15/184,755.
Notice of Allowance dated Apr. 4, 2019 for U.S. Appl. No. 15/106,907.
Notice of Allowance dated Feb. 14, 2019 to U.S. Appl. No. 14/275,637.
Notice of Allowance dated Feb. 27, 2019, to U.S. Appl. No. 14/543,786.
Notice of allowance dated Mar. 4, 2019, to U.S. Appl. No. 15/409,844.
Notice of Allowance dated Mar. 8, 2019 to U.S. Appl. No. 14/275,637.
Notification of Provisional Rejection dated Apr. 4, 2019.
Office action dated Apr. 26, 2019, to CN Patent Application No. 201610837821.X.
Office action dated Feb. 28, 2019, to CN Patent Application No. 201810257998.1.
Office Action dated May 7, 2019 for JP Application 2018-142544.
Supplemental Notice of Allowability dated Feb. 28, 2019, to U.S. Appl. No. 15/184,755.
Second Office action dated Mar. 5, 2019, to CN Patent Application No. 201580023550.8.
European Search Report dated Mar. 25, 2019 to EP Patent Application No. 182012561.7.
European Search Report dated Apr. 17, 2019 for EP Application No. 19162637.3.
Examination Report dated Mar. 27, 2019 for TW Application No. 107102956.
Examination Report dated May 2, 2019 for TW Application No. 107116642.
Final Office Action dated Jul. 9, 2019 to U.S. Appl. No. 14/996,086.
Notice of Allowance dated May 31, 2019 to U.S. Appl. No. 14/275,637.
Notice of Allowance dated Aug. 5, 2019 to U.S. Appl. No. 15/421,190.
Notice of Allowance dated Aug. 5, 2019 to U.S. Appl. No. 15/446,984.
Notice of Allowance dated Jul. 10, 2019 to U.S. Appl. No. 15/106,907.
Notice of Allowance dated Jul. 22, 2019 to U.S. Appl. No. 15/417,583.
Notice of Allowance dated Jun. 14, 2019 to U.S. Appl. No. 15/446,984.
Notice of Allowance dated Jun. 24, 2019 to U.S. Appl. No. 15/184,755.
Notice of Final Rejection dated Jul. 19, 2019 for KR Application 10-2017-7031818.
Office Action dated Apr. 23, 2019 for JP Application No. 2018-140175.
Non Final Office Action dated Aug. 9, 2019 to U.S. Appl. No. 14/543,786.
Office Action dated Jul. 16, 2019 for JP Application 2018-115532.
Office Action dated Jun. 28, 2019 for JP Application No. 2018-156034.
Official Action dated Jul. 30, 2019 for JP Application No. 2018-107016.
Provisional Rejection dated Feb. 25, 2019 for KR 10-2018-7027231.
Second Office Action dated Jul. 2, 2019 to CN Application No. 201710914561.6.

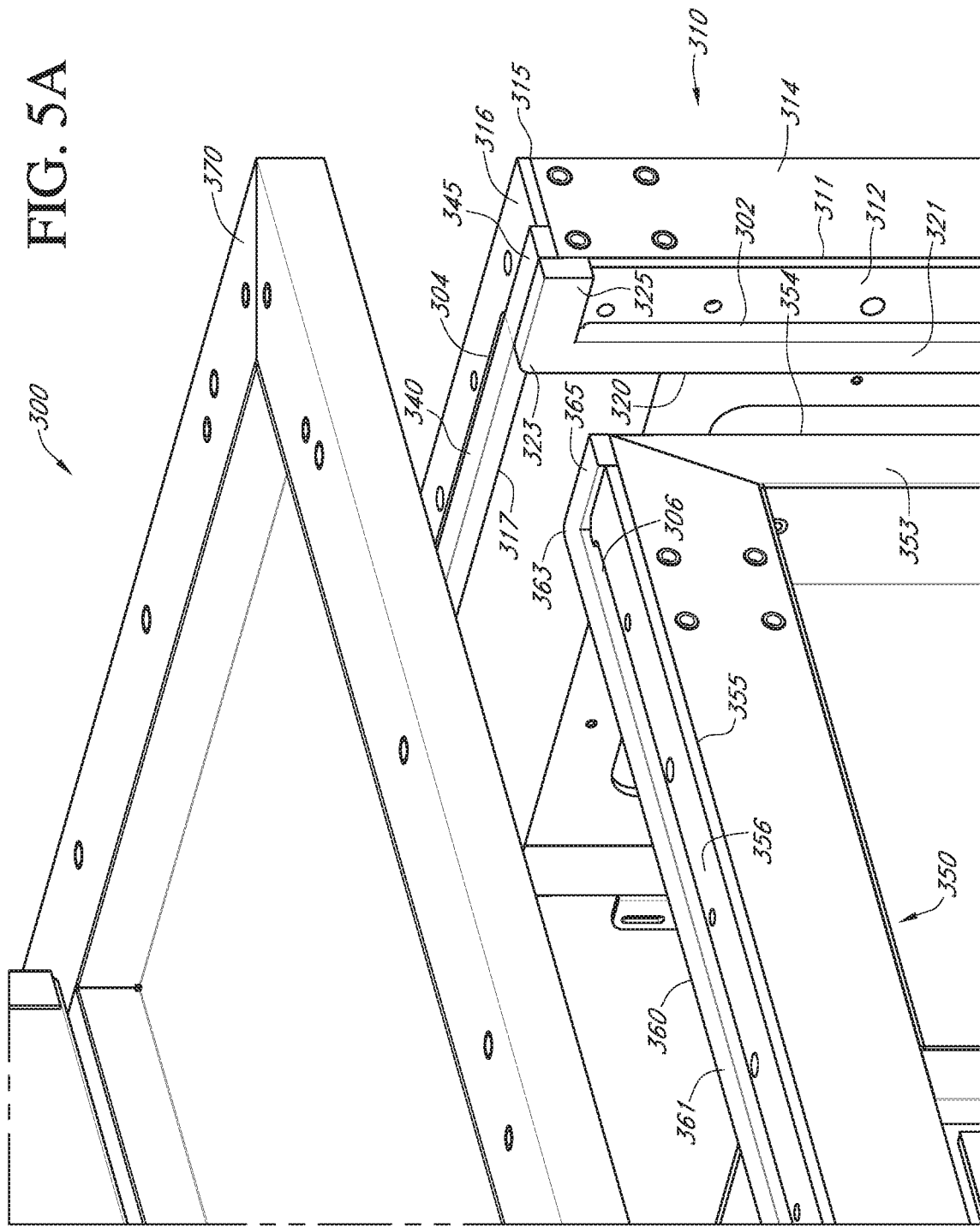

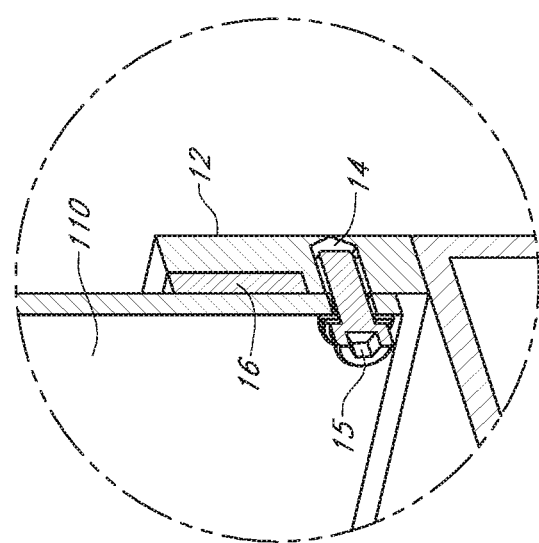
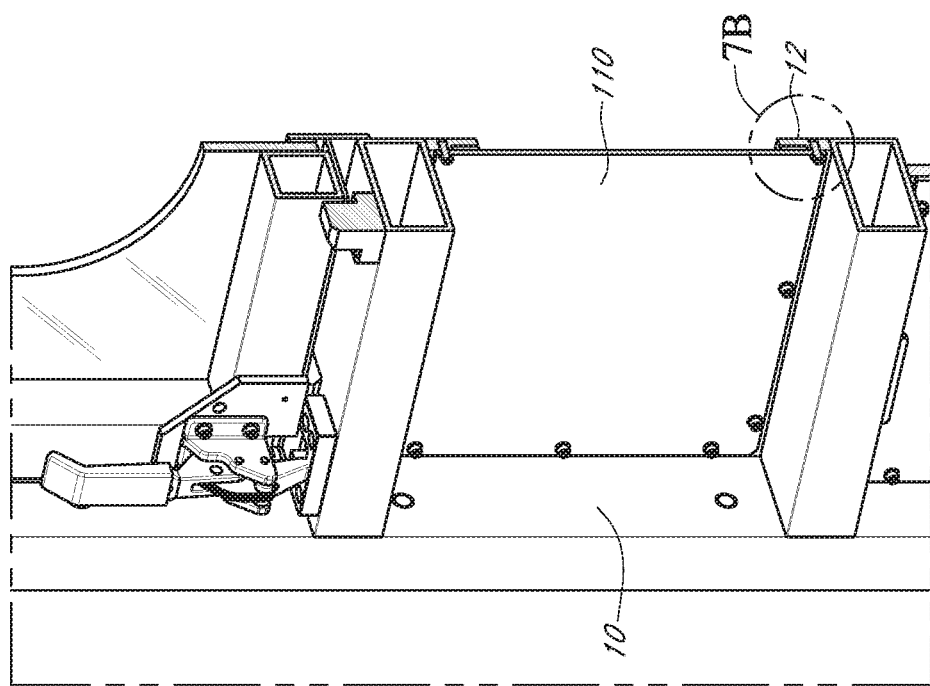
FIG. 7B
FIG. 7A

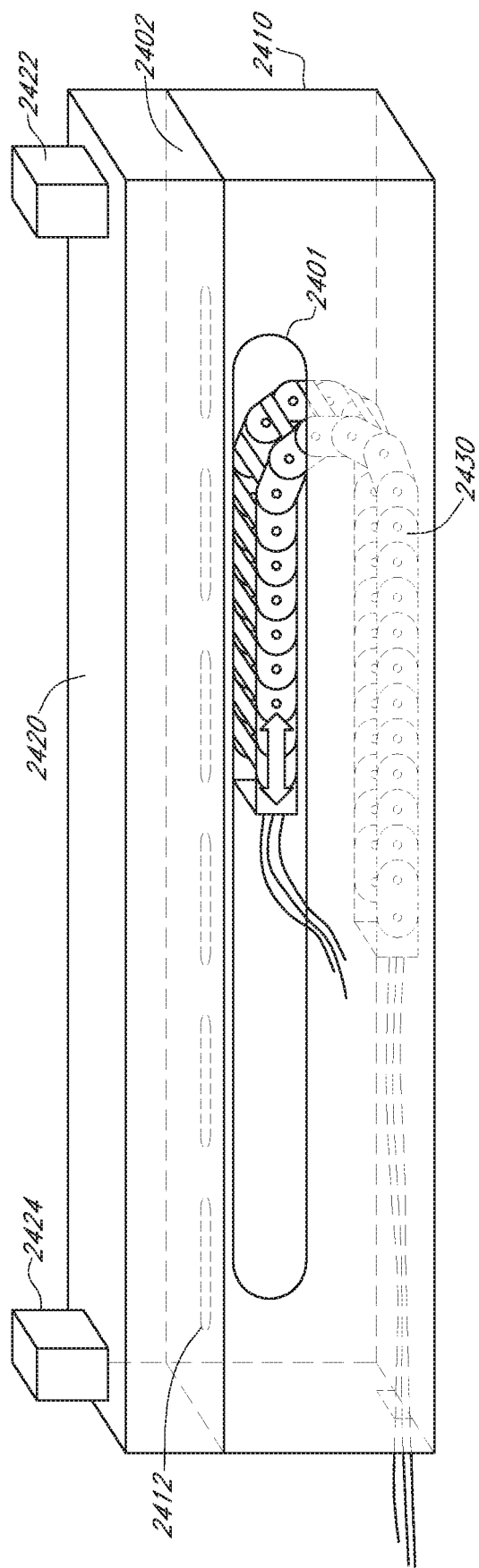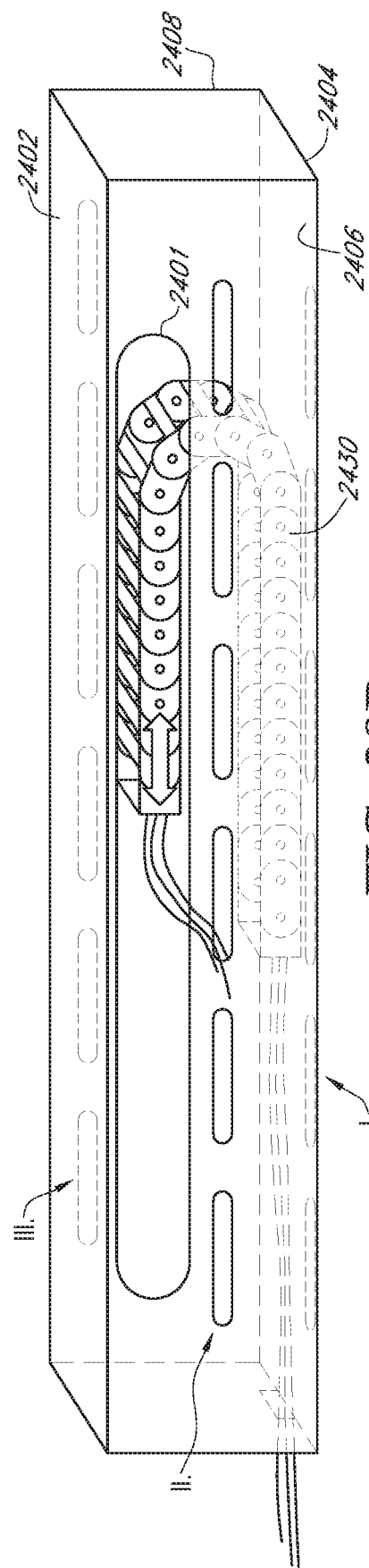

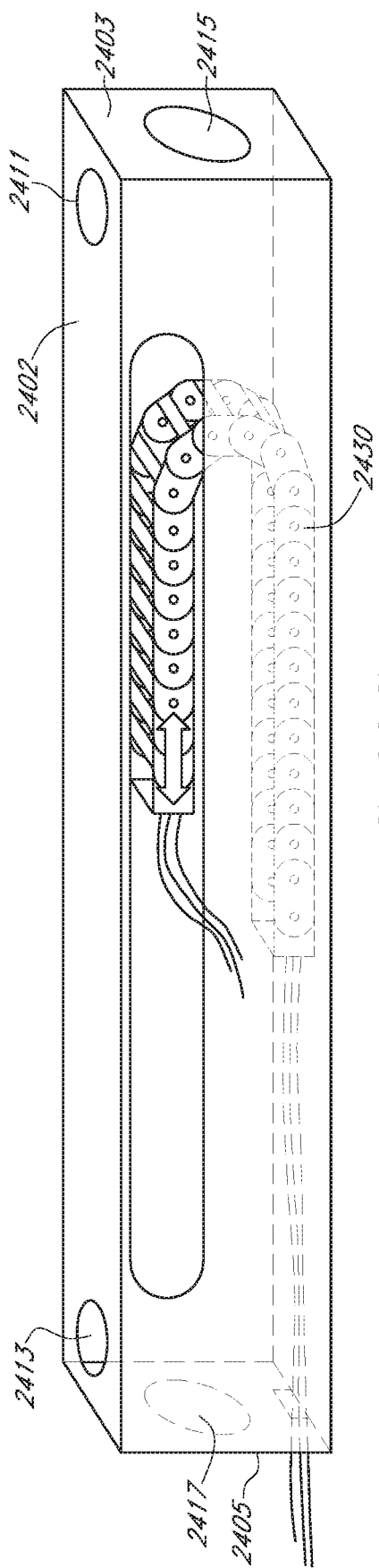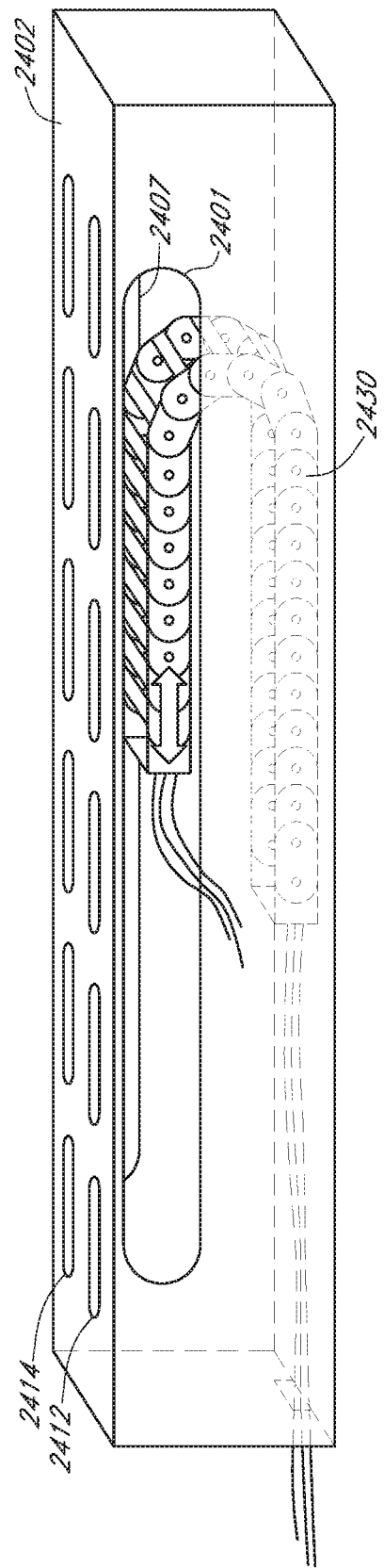
FIG. 29C
FIG. 29D

LOW-PARTICLE GAS ENCLOSURE SYSTEMS AND METHODS

CROSS REFERENCE TO RELATED CASES

This application is a divisional of U.S. Non-Provisional 14/275,637, filed May 12, 2014. U.S. Non-Provisional 14/275,637, claims the benefit of U.S. Provisional Application No. 61/833,398, filed Jun. 10, 2013. U.S. Non-Provisional 14/275,637 claims the benefit of U.S. Provisional Application No. 61/911,934, filed Dec. 4, 2013. U.S. Non-Provisional 14/275,637, claims the benefit of U.S. Provisional Application No. 61/925,578, filed Jan. 9, 2014. U.S. Non-Provisional 14/275,637, claims the benefit of U.S. Provisional Application No. 61/983,417, filed Apr. 23, 2014. US Non-Provisional 14/275,637, is a continuation-in-part of U.S. application Ser. No. 14/205,340, filed Mar. 11, 2014, issued on Mar. 28, 2017 as U.S. Pat. No. 9,604,245. U.S. application Ser. No. 14/205,340, is a continuation-in-part of U.S. application Ser. No. 13/802,304, filed Mar. 13, 2013, and issued on Jun. 2, 2015 as U.S. Pat. No. 9,048,344. U.S. application Ser. No. 13/802,304 is a continuation-in-part of U.S. application Ser. No. 13/720,830, filed Dec. 19, 2012; and issued on Dec. 2, 2014 as U.S. Pat. No. 8,899,171. U.S. application Ser. No. 13/720,830 claims the benefit of U.S. Provisional Application No. 61/579,233, filed Dec. 22, 2011. U.S. application Ser. No. 13/720,830, is a continuation-in-part of U.S. application Ser. No. 12/652,040, filed Jan. 5, 2010 and issued Feb. 26, 2013 as U.S. Pat. No. 8,383,202, which is a continuation-in-part to U.S. application Ser. No. 12/139,391, filed on Jun. 13, 2008, and published Dec. 18, 2008, as US 2008/0311307. U.S. application Ser. No. 12/652,040 also claims the benefit of U.S. Provisional Application No. 61/142,575, filed Jan. 5, 2009. All cross-referenced applications listed herein are incorporated by reference in their entirety.

FIELD

The present teachings relate to various embodiments of a gas enclosure system that have an inert, substantially low-particle environment for fabrication of OLED panels on a variety of substrates sizes and substrate materials.

OVERVIEW

Interest in the potential of organic light-emitting diode (OLED) display technology has been driven by OLED display technology attributes that include demonstration of display panels that have highly saturated colors, are high-contrast, ultrathin, fast-responding, and energy efficient. Additionally, a variety of substrate materials, including flexible polymeric materials, can be used in the fabrication of OLED display technology. Though the demonstration of displays for small screen applications, primarily for cell phones, has served to emphasize the potential of the technology, challenges remain in scaling high volume manufacturing across a range of substrate formats in high yield.

With respect to scaling of formats, a Gen 5.5 substrate has dimensions of about 130 cm ×150 cm and can yield about eight 26" flat panel displays. In comparison, larger format substrates can include using Gen 7.5 and Gen 8.5 mother glass substrate sizes. A Gen 7.5 mother glass has dimensions of about 195 cm×225 cm, and can be cut into eight 42" or six 47" flat panel displays per substrate. The mother glass used in Gen 8.5 is approximately 220 cm×250 cm, and can be cut to six 55" or eight 46" flat panel displays per substrate. One indication of the challenges that remain in scaling of OLED display manufacturing to larger formats is that the high-volume manufacture of OLED displays in high yield on substrates larger than Gen 5.5 substrates has proven substantially challenging.

In principle, an OLED device may be manufactured by the printing of various organic thin films, as well as other materials, on a substrate using an OLED printing system. Such organic materials can be susceptible to damage by oxidation and other chemical processes. Housing an OLED printing system in a fashion that can be scaled for various substrate sizes and can be done in an inert, substantially low-particle printing environment can present a variety of engineering challenges. Manufacturing tools for high throughput large-format substrate printing, for example, such as printing of Gen 7.5 and Gen 8.5 substrates, require substantially large facilities. Accordingly, maintaining a large facility under an inert atmosphere, requiring gas purification to remove reactive atmospheric species, such as water vapor and oxygen, as well as organic solvent vapors, as well as maintaining a substantially low-particle printing environment, has proven to be significantly challenging.

As such, challenges remain in scaling high volume manufacturing of OLED display technology across a range of substrate formats in high yield. Accordingly, there exists a need for various embodiments a gas enclosure system of the present teachings that can house an OLED printing system, in an inert, substantially low-particle environment, and can be readily scaled to provide for fabrication of OLED panels on a variety of substrates sizes and substrate materials. Additionally, various gas enclosure systems of the present teachings can provide for ready access to an OLED printing system from the exterior during processing and ready access to the interior for maintenance with minimal downtime.

BRIEF DESCRIPTION OF THE DRAWINGS

A better understanding of the features and advantages of the present disclosure will be obtained by reference to the accompanying drawings, which are intended to illustrate, not limit, the present teachings.

FIG. 5A and FIG. 5B are various perspective views that depict sealing of frame members according to various embodiments of a gas enclosure assembly of the present teachings.

FIG. 7A and FIG. 7B are enlarged perspective section views relating to sealing of a section panel for receiving an inset panel or window panel according to various embodiments of the present teachings.

FIG. 29A is schematic view of a service bundle housing exhaust system according to various embodiments of the present teachings. FIG. 29B, FIG. 29C, and FIG. 29D are schematic views of various embodiments of venting a service bundle housing according to various embodiments of the present teachings.

DETAILED DESCRIPTION OF THE DISCLOSURE

Figure 1A:
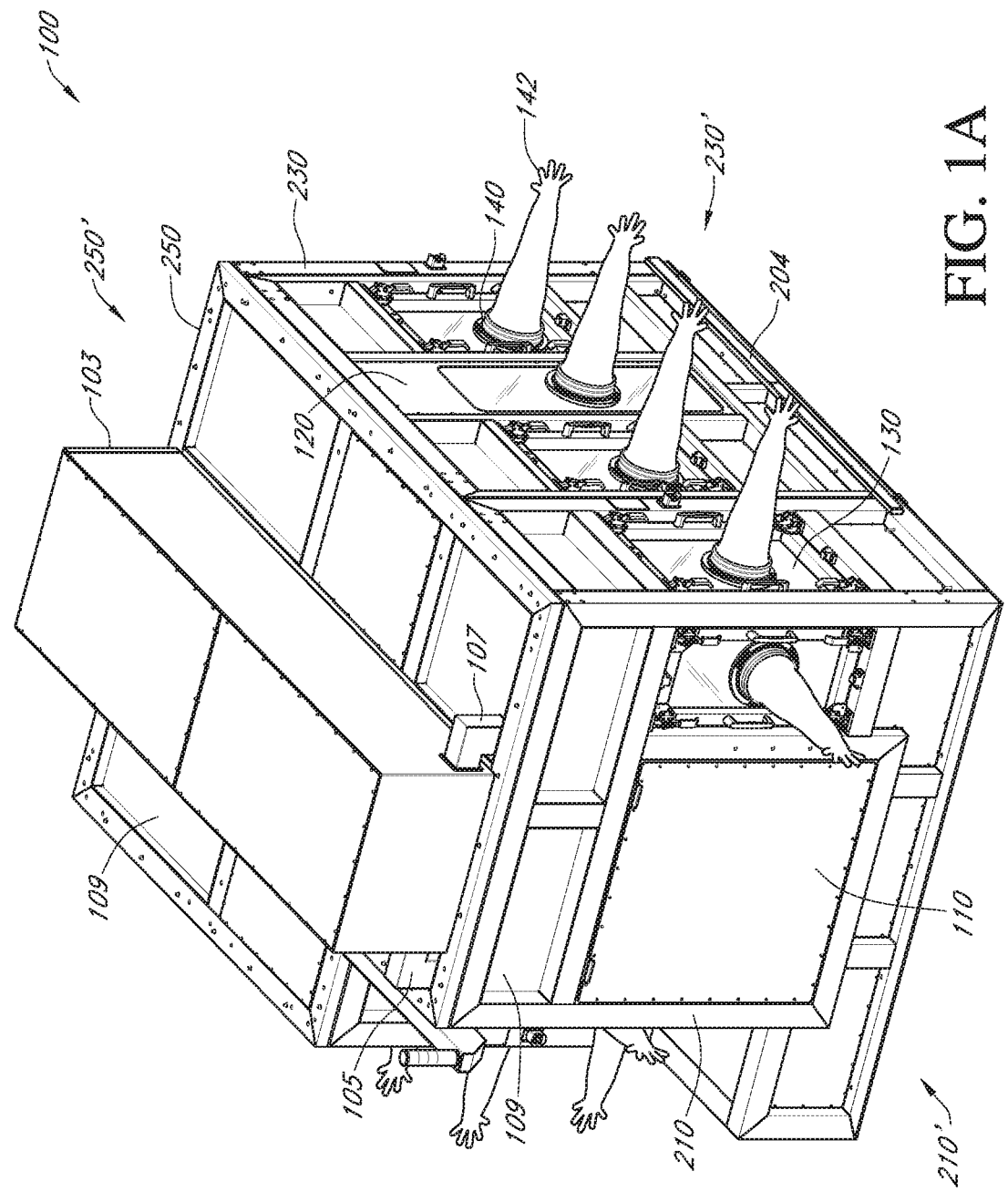
FIG. 1 is right, front perspective view of a gas enclosure assembly in accordance with various embodiments of the present teachings.

The present teachings disclose various embodiments of a gas enclosure assembly that can house an OLED printing system. Various embodiments of a gas enclosure assembly can be sealably constructed and integrated with various components that provide a particle control system, a gas circulation and filtration system, a gas purification system, and the like to form various embodiments of a gas enclosure system that can sustain an inert gas environment that is substantially low-particle for processes requiring such an environment.

Manufacturing tools that in principle can allow for the printing of a variety of substrate sizes that includes large-format substrate sizes, can require substantially large facilities for housing such OLED manufacturing tools. Accordingly, maintaining an entire large facility under an inert atmosphere presents engineering challenges, such as continual purification of a large volume of an inert gas. According to the present teachings, an inert gas may be any gas that does not undergo a chemical reaction under a defined set of conditions. Some commonly used non-limiting examples of an inert gas can include nitrogen, any of the noble gases, and any combination thereof. Additionally, providing a large facility that is essentially hermetically sealed to prevent contamination of various reactive atmospheric gases, such as water vapor and oxygen, as well as organic solvent vapors generated from various printing process poses an engineering challenge. According to the present teachings, an OLED printing facility would maintain levels for each species of various reactive species, including various reactive atmospheric gases, such as water vapor and oxygen, as well as organic solvent vapors at 100 ppm or lower, for example, at 10 ppm or lower, at 1.0 ppm or lower, or at 0.1 ppm or lower.

Continual maintenance of a large facility requiring an inert environment poses still additional challenges. For example, of a manufacturing facility can require a substantial length of various service bundles that can be operatively connected from various systems and assemblies to provide optical, electrical, mechanical, and fluidic connections required to operate, for example, but not limited by, a printing system. According to the present teachings, a service bundle can include, by way of non-limiting example, optical cables, electrical cables, wires and tubing, and the like. Various embodiments of a service bundle according to the present teachings can have a significant total dead volume as a result of a substantial number of void spaces created by bundling various cables, wires and tubing, and the like together in a service bundle. The total dead volume resulting from a substantial number of void spaces in a service bundle can result in the retention of a significant volume of reactive gaseous species occluded therein. Such a significant volume of occluded reactive gaseous species can present challenges for effectively bringing a gas enclosure into specification with respect to levels of reactive atmospheric constituents, such as oxygen and water vapor, as well as organic vapors. Moreover, such service bundles used in the operation of a printing system can be an ongoing source of particulate matter.

In that regard, providing and maintaining a substantially inert and low-particle environment in an OLED manufacturing facility provides additional challenges not presented for processes that can be done, for example, in atmospheric conditions under open air, high flow laminar flow filtration hoods. As such, various embodiments of systems and methods of the present teachings address the challenges presented for OLED printing of OED substrates of a variety of sizes and materials in an inert, substantially low-particle environment.

Regarding maintaining a substantially low-particle environment, various embodiments of a gas circulation and filtration system can be designed to provide a low particle inert gas environment for airborne particulates meeting the standards of International Standards Organization Standard (ISO) 14644-1:1999, "Cleanrooms and associated controlled environments—Part 1: Classification of air cleanliness," as specified by Class 1 through Class 5. However, controlling airborne particulate matter alone is not sufficient for providing a low-particle environment proximal to a substrate during, for example, but not limited by, a printing process, as particles generated proximal to a substrate during such a process can accumulate on a substrate surface before they can be swept through a gas circulation and filtration system.

Accordingly, various embodiments of a gas enclosure system of the present teachings can have a particle control system that can include components in addition to a gas circulation and filtration system that can provide a low-particle zone proximal to a substrate during processing in a printing step. According to various embodiments of a gas enclosure system of the present teachings, a particle control system for various embodiments of a gas enclosure system of the present teachings can include a gas circulation and filtration system, a low-particle-generating X-axis linear bearing system for moving a printhead assembly relative to a substrate, a service bundle housing exhaust system, and a printhead assembly exhaust system. In that regard, in addition to a circulation and filtration system for maintaining a substantially low-particle specification for airborne particulate matter, various embodiments of a gas enclosure system of the present teaching can have a particle control system that can include additional components for maintaining a substantially low-particle specification for particulate matter deposited on a substrate.

Various embodiments of systems and methods of the present teachings can maintain a substantially low-particle environment providing for an average on-substrate distribution of particles of a particular size range of interest that does not exceed an on-substrate deposition rate specification. An on-substrate deposition rate specification can be set for each of a particle size range of interest of between about 0.1 μm and greater to about 10 μm and greater. In various embodiments systems and methods of the present teachings, an on-substrate particle deposition rate specification can be expressed as a limit of the number of particles deposited per square meter of substrate per minute for each of a target particle size range.

Various embodiments of an on-substrate particle deposition rate specification can be readily converted from a limit of the number of particles deposited per square meter of substrate per minute to a limit of the number of particles deposited per substrate per minute for each of a target particle size range. Such a conversion can be readily done through a known relationship between substrates, for example, of a specific generation-sized substrate and the corresponding area for that substrate generation. For example, Table 1 below summarizes aspect ratios and areas for some known generation-sized substrates. It should be understood that a slight variation of aspect ratio and hence size may be seen from manufacturer to manufacturer. However, regardless of such variation, a conversion factor for a specific generation-sized substrate and an area in square meters can be obtained any of a variety of generation-sized substrates.

TABLE 1

Correlation between area and substrate size

| Generation ID | X (mm) | Y (mm) | Area (m2) |
|---|---|---|---|
| Gen 3.0 | 550 | 650 | 0.36 |
| Gen 3.5 | 610 | 720 | 0.44 |
| Gen 3.5 | 620 | 750 | 0.47 |
| Gen 4 | 680 | 880 | 0.60 |
| Gen 4 | 730 | 920 | 0.67 |
| Gen 5 | 1100 | 1250 | 1.38 |
| Gen 5 | 1100 | 1300 | 1.43 |
| Gen 5.5 | 1300 | 1500 | 1.95 |
| Gen 6 | 1500 | 1850 | 2.78 |
| Gen 7.5 | 1950 | 2250 | 4.39 |
| Gen 8 | 2160 | 2400 | 5.18 |
| Gen 8 | 2160 | 2460 | 5.31 |
| Gen 8.5 | 2200 | 2500 | 5.50 |
| Gen 9 | 2400 | 2800 | 6.72 |
| Gen 10 | 2850 | 3050 | 8.69 |

Additionally, an on-substrate particle deposition rate specification expressed as a limit of the number of particles deposited per square meter of substrate per minute can be readily converted to any of a variety of unit time expressions. It will be readily understood that an on-substrate particle deposition rate specification normalized to minutes can be readily converted to any other expression of time through know relationships of time, for example, but not limited by, such as second, hour, day, etc. Additionally, units of time specifically relating to processing can be used. For example, a print cycle can be associated with a unit of time. For various embodiments of a gas enclosure system according to the present teachings a print cycle can be a period of time in which a substrate is moved into a gas enclosure system for printing and then removed from a gas enclosure system after printing is complete. For various embodiments of a gas enclosure system according to the present teachings a print cycle can be a period of time from the initiation of the alignment of a substrate with respect to a printhead assembly to the delivery of a last ejected drop of ink onto the substrate. In the art of processing, total average cycle time or TACT can be an expression of a unit of time for a particular process cycle. According to various embodiments of systems and methods of the present teachings, TACT for a print cycle can be about 30 seconds. For various embodiments of systems and methods of the present teachings, TACT for a print cycle can be about 60 seconds. In various embodiments of systems and methods of the present teachings, TACT for a print cycle can be about 90 seconds. For various embodiments of systems and methods of the present teachings, TACT for a print cycle can be about 120 seconds. In various embodiments of systems and methods of the present teachings, TACT for a print cycle can be about 300 seconds.

With respect to airborne particulate matter and particle deposition within a system, a substantial number of variables can impact developing a general model that may adequately compute, for example, an approximation of a value for particle fallout rate on a surface, such as a substrate, for any particular manufacturing system. Variables such as the size of particles, the distribution of particles of particular size; surface area of a substrate and the time of exposure of a substrate within a system can vary depending on various manufacturing systems. For example, the size of particles and the distribution of particles of particular size can be substantially impacted by the source and location of particle-generating components in various manufacturing systems. Calculations based on various embodiments of gas enclosure systems of the present teachings suggest that without various particle control systems of the present teachings, on-substrate deposition of particulate matter per print cycle per square meter of substrate can be between more than about 1 million to more than about 10 million particles for particles in a size range of 0.1 µm and greater. Such calculations suggest that without various particle control systems of the present teachings, on-substrate deposition of particulate matter per print cycle per square meter of substrate can be between more than about 1000 to about more than about 10,000 particles for particles in a size range of about 2 µm and greater.

Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 10 µm in size. Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 5 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 2 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 1 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.5 µm in size. For various embodiments of a gas enclosure system of the present teachings, a low-particle environment can be maintained providing for an average on-substrate particle distribution that meets an on-substrate deposition rate specification of less than or equal to about 1000 particles per square meter of substrate per minute for particles greater than or equal to 0.3 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.1 µm in size.

As previously discussed herein, high volume manufacture of OLED displays in high yield on substrates larger than Gen 5.5 substrates, has proven to be substantially challenging. For clearer perspective regarding substrate sizes that can be used in manufacturing of various OLED devise, generations of mother glass substrate sizes have been undergoing evolution for flat panel displays fabricated by other-than OLED printing since about the early 1990's. The first generation of mother glass substrates, designated as Gen 1, is approximately 30 cm×40 cm, and therefore could produce a 15" panel. Around the mid-1990's, the existing technology for producing flat panel displays had evolved to a mother glass substrate size of Gen 3.5, which has dimensions of about 60 cm×72 cm. In comparison, a Gen 5.5 substrate has dimensions of about 130 cm×150 cm.

As generations have advanced, mother glass sizes for Gen 7.5 and Gen 8.5 are in production for other-than OLED printing fabrication processes. A Gen 7.5 mother glass has dimensions of about 195 cm×225 cm, and can be cut into eight 42" or six 47" flat panels per substrate. The mother glass used in Gen 8.5 is approximately 220×250 cm, and can be cut to six 55" or eight 46" flat panels per substrate. The promise of OLED flat panel display for qualities such as truer color, higher contrast, thinness, flexibility, transparency, and energy efficiency have been realized, at the same time that OLED manufacturing is practically limited to G 3.5 and smaller. Currently, OLED printing is believed to be the optimal manufacturing technology to break this limitation and enable OLED panel manufacturing for not only mother glass sizes of Gen 3.5 and smaller, but at the largest mother glass sizes, such as Gen 5.5, Gen 7.5, and Gen 8.5. One of the features of OLED panel display technology includes that a variety of substrate materials can be used, for example, but not limited by, a variety of glass substrate materials, as well as a variety of polymeric substrate materials. In that regard, sizes recited from the terminology arising from the use of glass-based substrates can be applied to substrates of any material suitable for use in OLED printing.

It is contemplated that a wide variety of ink formulations can be printed within the inert, substantially low-particle environment of various embodiments of a gas enclosure system of the present teachings. During the manufacture of an OLED display, an OLED pixel can be formed to include an OLED film stack, which can emit light of a specific peak wavelength when a voltage is applied. An OLED film stack structure between an anode and a cathode can include a hole injection layer (HIL), a hole transport layer (HTL), an emissive layer (EL), an electron transport layer (ETL) and an electron injection layer (EIL). In some embodiments of an OLED film stack structure, an electron transport layer (ETL) can be combined with an electron injection layer (EIL) to form an ETL/EIL layer. According to the present teachings, various ink formulations for an EL for various color pixel EL films of an OLED film stack can be printed using inkjet printing. Additionally, for example, but not limited by, the HIL, HTL, EML, and ETL/EIL layers can have ink formulations that can be printed using inkjet printing.

It is further contemplated that an organic encapsulation layer can be printed on an OLED panel using inkjet printing. It is contemplated that an organic encapsulation layer can be printed using inkjet printing, as inkjet printing can provide several advantages. First, a range of vacuum processing operations can be eliminated because such inkjet-based fabrication can be performed at atmospheric pressure. Additionally, during an inkjet printing process, an organic encapsulation layer can be localized to cover portions of an OLED substrate over and proximal to an active region, to effectively encapsulate an active region, including lateral edges of the active region. The targeted patterning using inkjet printing results in eliminating material waste, as well as eliminating additional processing typically required to achieve patterning of an organic layer. An encapsulation ink can comprise a polymer including, for example, but not limited by, an acrylate, methacrylate, urethane, or other material, as well as copolymers and mixtures thereof, which can be cured using thermal processing (e.g. bake), UV exposure, and combinations thereof.

With respect to OLED printing, according to the present teachings, maintaining substantially low levels of reactive species, for example, but not limited by, atmospheric constituents such as oxygen and water vapor, as well as various organic solvent vapors used in OLED inks, has been found to correlate to providing OLED flat panel displays meeting the requisite lifetime specifications. The lifetime specification is of particular significance for OLED panel technology, as this correlates directly to display product longevity; a product specification for all panel technologies, which has been challenging for OLED panel technology to meet. In order to provide panels meeting requisite lifetime specifications, levels of each of a reactive species, such as water vapor, oxygen, as well as organic solvent vapors, can be maintained at 100 ppm or lower, for example, at 10 ppm or lower, at 1.0 ppm or lower, or at 0.1 ppm or lower with various embodiments of a gas enclosure system of the present teachings.

The need for printing an OLED panel in a facility in which the levels of each of a reactive species, such as water vapor, oxygen, as well as organic solvent vapors, can be maintained at 100 ppm or lower, for example, at 10 ppm or lower, at 1.0 ppm or lower, or at 0.1 ppm or lower, can be illustrated in reviewing the information summarized in Table 2. The data summarized on Table 2 resulted from the testing of each of a test coupon comprising organic thin film compositions for each of red, green, and blue, fabricated in a large-pixel, spin-coated device format. Such test coupons are substantially easier to fabricate and test for the purpose of rapid evaluation of various formulations and processes. Though test coupon testing should not be confused with lifetime testing of a printed panel, it can be indicative of the impact of various formulations and processes on lifetime. The results shown in the table below represent variation in the process step in the fabrication of test coupons in which only the spin-coating environment varied for test coupons fabricated in a nitrogen environment where reactive species were less than 1 ppm compared to test coupons similarly fabricated but in air instead of a nitrogen environment.

It is evident through the inspection of the data in Table 2 for test coupons fabricated under different processing environments, particularly in the case of red and blue, that printing in an environment that effectively reduces exposure of organic thin film compositions to reactive species may have a substantial impact on the stability of various ELs, and hence on lifetime.

TABLE 2

Impact of inert gas processing on lifetime for OLED panels

| Color | Process Environment | V @ 10 mA/cm$^2$ | Cd/A | CIE (x, y) | T95 | T80 | T50 |
|---|---|---|---|---|---|---|---|
| | | | | @ 1000 Cd/m$^2$ | | | |
| Red | Nitrogen | 6 | 9 | (0.61, 0.38) | 200 | 1750 | 10400 |
| | Air | 6 | 8 | (0.60, 0.39) | 30 | 700 | 5600 |
| Green | Nitrogen | 7 | 66 | (0.32, 0.63) | 250 | 3700 | 32000 |
| | Air | 7 | 61 | (0.32, 0.62) | 250 | 2450 | 19700 |
| Blue | Nitrogen | 4 | 5 | (0.14, 0.10) | 150 | 750 | 3200 |
| | Air | 4 | 5 | (0.14, 0.10) | 15 | 250 | 1800 |

Additionally, maintaining a substantially low-particle environment for OLED printing is of particular importance, as even very small particles can lead to a visible defect on an OLED panel. In that regard, systems and methods of the present teachings provide for maintaining low levels of each of a reactive species, such as water vapor, oxygen, as well as organic solvent vapors, and additionally for maintaining a sufficiently low-particle environment for high-quality OLED panel manufacture. Various embodiments of a gas enclosure system can have a particle control system that can include components in addition to a gas circulation and filtration system to provide a low-particle zone proximal to a substrate during processing in a printing step.

Various embodiments of gas enclosure systems of the present teachings can have a particle control system providing a low-particle zone proximal to a substrate for which various particle-generating components proximal to a substrate can be contained and exhausted to prevent particles from accumulating on a substrate during a printing process. In various embodiments of a gas enclosure system, a particle control system can include a gas circulation and filtration system for maintaining airborne particulate levels meeting the standards of International Standards Organization Standard (ISO) 14644-1:1999, as specified by Class 1 through Class 5; both within a gas enclosure system, as well as proximal a substrate. Various embodiments of a particle control system can include a gas circulation and filtration system in fluid communication with particle-generating components that have been contained, so that such particle-containing components can be exhausted into the gas circulation and filtration system. For various embodiments of a particle control system, particle-generating components that have been contained can be exhausted into dead spaces, rendering such particulate matter inaccessible for recirculation within a gas enclosure system. Various embodiments of gas enclosure systems of the present teachings can have a particle control system for which various components can be intrinsically low-particle generating, thereby preventing particles from accumulating on a substrate during a printing process. Various components of a particle control system of the present teachings can utilize containment and exhausting of particle-generating components, as well as selection of components that are intrinsically low-particle generating to provide a low-particle zone proximal to a substrate.

For various embodiments of a low-particle gas enclosure system of the present teachings, maintaining a substantially low-particle environment in an enclosed system, for example, an enclosed OLED printing system provides additional challenges not presented by particle reduction for processes that can be done in atmospheric conditions, such as under open air, high flow laminar flow filtration hoods. Various embodiments of a gas enclosure system can provide substantially low-particle environments for example, but not limited by: 1) through elimination of areas proximal to a substrate where particulate matter can collect, 2) by containing and exhausting particle-generating components, such as a service bundle that can include bundled cables, wires and tubing, and the like, as well as various apparatuses, assemblies and systems which, for example, utilize components such as fans or linear motion systems that use friction bearings, within various embodiments of a particle control system of the present teachings, and 3) by using a variety of intrinsically low-particle generating pneumatically operated components, such as, but not limited by, substrate floatation tables, air bearings, and pneumatically operated robots, and the like. According to various embodiments of a gas enclosure system of the present teachings, a substantially low-particle environment can include a particle control system including components for providing a low-particle zone proximal to a substrate during printing.

As will be discussed in more detail subsequently herein, direct control of particle generation proximal to a substrate to provide a low-particle zone proximal to a substrate can be implemented by containment of particle-generating elements, by the use of low-particle generating components, and by a combination of containment of particle generation and use of low-particle generating components. Accordingly, various embodiments of a gas enclosure system can have a particle control system that can include a gas circulation and filtration system in fluid communication with a low-particle generating X-axis linear bearing system for moving a printhead assembly relative to a substrate, a service bundle housing exhaust system, and a printhead assembly exhaust system. For various embodiments of a service bundle housing exhaust system and a printhead assembly exhaust system, particles contained in such systems can be exhausted into a gas circulation and filtration system. In various embodiments of a service bundle housing exhaust system and a printhead assembly exhaust system, particles contained in such systems can be exhausted into a dead space, thereby rendering such particulate matter so exhausted into a dead space inaccessible for circulation within a gas enclosure system.

Additionally, system validation as well as ongoing system monitoring can be performed for both airborne and on-substrate particle monitoring. A determination of airborne particulate matter can be performed for various embodiments of a gas enclosure system before a printing process as a quality check, using, for example, a portable particle counting device. In various embodiments of a gas enclosure system, a determination of airborne particulate matter can be performed as an ongoing quality check in situ while a substrate is printed. For various embodiments of a gas enclosure system, a determination of airborne particulate matter can be performed as a quality check before a substrate is printed and additionally in situ while a substrate is printed. A determination of an on-substrate distribution of particulate matter on a substrate can be performed for various embodiments of a gas enclosure system before a substrate is printed for system validation, using, for example, a test substrate. In various embodiments of a gas enclosure system, a determination of an on-substrate distribution of particulate matter can be performed as an ongoing quality check in situ while a substrate is printed, for example, using a camera assembly mounted on an X-axis carriage assembly. For various embodiments of a gas enclosure system, a determination of an on-substrate distribution of particulate matter can be performed for system validation before a substrate is printed and additionally in situ while a substrate is printed.

Various embodiments of a gas enclosure system can have a particle control system that can maintain a substantially low-particle environment providing for an on-substrate particle specification for particles of between about 0.1 µm or greater to about 10 µm or greater. Various embodiments of an on-substrate particle specification can be readily converted from an average on-substrate particle distribution per square meter of substrate per minute to an average on-substrate particle distribution per substrate per minute for each of a target particle size range. As previously discussed herein, such a conversion can be readily done through a known relationship between substrates, for example, of a specific generation-sized substrate and the corresponding area for that substrate generation. Additionally, an average on-substrate particle distribution per square meter of substrate per minute can be readily converted to any of a variety of unit time expressions. For example, in addition to conversions between standard units of time; e.g. seconds, minutes, and days, units of time specifically relating to processing can be used. For example, as previously discussed herein, a print cycle can be associated with a unit of time.

Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 10 µm in size. Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 5 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 2 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 1 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.5 µm in size. For various embodiments of a gas enclosure system of the present teachings, a low-particle environment can be maintained providing for an average on-substrate particle distribution that meets an on-substrate deposition rate specification of less than or equal to about 1000 particles per square meter of substrate per minute for particles greater than or equal to 0.3 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.1 µm in size.

Additionally, it is contemplated that a gas enclosure system would have attributes that include, for example, but are not limited by, a gas enclosure assembly that can be readily scaled to provide an optimized working space for an OLED printing system, while providing minimized inert gas volume, and additionally providing ready access to an OLED printing system from the exterior during processing, while providing access to the interior for maintenance with minimal downtime. In that regard, various embodiments of a gas enclosure assembly having utility for various air-sensitive processes that require an inert environment can include a plurality of wall frame and ceiling frame members that can be sealed together. In some embodiments, a plurality of wall frame and ceiling frame members can be fastened together using reusable fasteners, for example, bolts and threaded holes. For various embodiments of a gas enclosure assembly according to the present teachings, a plurality of frame members, each frame member comprising a plurality of panel frame sections, can be constructed to define a gas enclosure frame assembly. Various embodiments of a gas enclosure assembly can include an auxiliary enclosure constructed as a section of a gas enclosure assembly that can be sealably isolated from a working volume of a gas enclosure system, such as a printing system enclosure. Such physical isolation of an auxiliary enclosure from, for example, a printing system enclosure, can enable various procedures, for example, but not limited by, various maintenance procedures on a printhead assembly, to be conducted with little or no interruption of a printing process, thereby minimizing or eliminating gas enclosure system downtime.

A gas enclosure assembly of the present teachings can be designed to accommodate a printing system, such as an OLED printing system, in a fashion that can minimize the volume of the enclosure around a system. Various embodiments of a gas enclosure assembly can be constructed in a fashion that minimizes the internal volume of a gas enclosure assembly, and at the same time optimizes the working space to accommodate various footprints of various OLED printing systems. An OLED printing system according to various embodiments of a gas enclosure system of the present teachings, can comprise, for example, a granite base, a moveable bridge that can support an OLED printing device, one or more devices and apparatuses running from various embodiments of a pressurized inert gas recirculation system, such as a substrate floatation table, air bearings, tracks, rails, an ink-jet printer system for depositing OLED film-forming material onto substrates, including an OLED ink supply subsystem and an inkjet printhead, one or more robots, and the like. Given the variety of components that can comprise OLED printing system, various embodiments of OLED printing system can have a variety of footprints and form factors. Various embodiments of a gas enclosure assembly so constructed additionally provide ready access to the interior of a gas enclosure assembly from the exterior during processing and readily access to the interior for maintenance, while minimizing downtime. In that regard, various embodiments of a gas enclosure assembly according to the present teachings can be contoured with respect to various footprints of various OLED printing systems. According to various embodiments, once the contoured fame members are constructed to form a gas enclosure frame assembly, various types of panels may be sealably installed in a plurality of panel sections comprising a frame member to complete the installation of a gas enclosure assembly. In various embodiments of a gas enclosure assembly, a plurality of frame members including, for example, but not limited by, a plurality of wall frame members and at least one ceiling frame member, as well as a plurality of panels for installation in panel frame sections, may be fabricated at one location or locations, and then constructed at another location. Moreover, given the transportable nature of components used to construct a gas enclosure assembly of the present teachings, various embodiments of a gas enclosure assembly can be repeatedly installed and removed through cycles of construction and deconstruction.

In order to ensure that a gas enclosure is hermetically sealed, various embodiments of a gas enclosure assembly of the present teaching provide for joining each frame member to provide frame sealing. The interior can be sufficiently sealed, for example, hermetically sealed, by tight-fitting intersections between the various frame members, which include gaskets or other seals. Once fully constructed, a sealed gas enclosure assembly can comprise an interior and a plurality of interior corner edges, at least one interior corner edge provided at the intersection of each frame member with an adjacent frame member. One or more of the frame members, for example, at least half of the frame members, can comprise one or more compressible gaskets fixed along one or more respective edges thereof. The one or more compressible gaskets can be configured to create an hermetically sealed gas enclosure assembly once a plurality of frame members are joined together, and gas-tight panels installed. A sealed gas enclosure assembly can be formed having corner edges of frame members sealed by a plurality of compressible gaskets. For each frame member, for example, but not limited by, an interior wall frame surface, a top wall frame surface, a vertical side wall frame surface, a bottom wall frame surface, and a combination thereof can be provided with one or more compressible gaskets.

For various embodiments of a gas enclosure assembly, each frame member can comprise a plurality of sections framed and fabricated to receive any of a variety of panel types that can be sealably installed in each section to provide a gas-tight panel seal for each panel. In various embodiments of a gas enclosure assembly of the present teachings, each section frame can have a section frame gasket that, with selected fasteners, ensures each panel installed in each section frame can provide a gas-tight seal for each panel, and therefore for a fully-constructed gas enclosure. In various embodiments, a gas enclosure assembly can have one or more of a window panel or service window in each of a wall panel; where each window panel or service window can have at least one gloveport. During assembly of a gas enclosure assembly, each gloveport can have a glove attached, so that the glove can extend into the interior. According to various embodiments, each gloveport can have hardware for mounting a glove, wherein such hardware utilizes gasket seals around each gloveport that provide a gas-tight seal to minimize leakage or molecular diffusion through the gloveport. For various embodiments of a gas enclosure assembly of the present teachings, the hardware is further designed for providing ease of capping and uncapping a gloveport to an end-user.

Various embodiments of a gas enclosure system according to the present teachings can include a gas enclosure assembly formed from a plurality of frame members and panel sections, as well as gas circulation, filtration and purification components. For various embodiments of a gas enclosure system, ductwork may be installed during the assembly process. According to various embodiments of the present teachings, ductwork can be installed within a gas enclosure frame assembly, which has been constructed from a plurality of frame members. In various embodiments, ductwork can be installed on a plurality of frame members before they are joined to form a gas enclosure frame assembly. Ductwork for various embodiments of a gas enclosure system can be configured such that substantially all gas drawn into the ductwork from one or more ductwork inlets is moved through various embodiments of a gas filtration loop for removing particulate matter internal to a gas enclosure system. Additionally, ductwork of various embodiments of a gas enclosure system can be configured to separate the inlets and outlets of a gas purification loop that is external to a gas enclosure assembly from a gas filtration loop that is internal to a gas enclosure assembly. According to various embodiments of a gas enclosure system of the present teachings, a gas circulation and filtration system can be in fluid communication with, for example, but not limited by, components of a particle control system. For various embodiments of a gas enclosure assembly, a gas circulation and filtration system can be in fluid communication with a service bundle housing exhaust system. For various embodiments of a gas enclosure assembly, a gas circulation and filtration system can be in fluid communication with a printhead assembly exhaust system. In various embodiments of a gas enclosure system, various components of a particle control system in fluid communication with a gas circulation and filtration system can provide a low-particle zone proximal to a substrate positioned in a printing system.

For example, a gas enclosure system can have a gas circulation and filtration system internal a gas enclosure assembly. Such an internal filtration system can have a plurality of fan filter units within the interior, and can be configured to provide a laminar flow of gas within the interior. The laminar flow can be in a direction from a top of the interior to a bottom of the interior, or in any other direction. Although a flow of gas generated by a circulating system need not be laminar, a laminar flow of gas can be used to ensure thorough and complete turnover of gas in the interior. A laminar flow of gas can also be used to minimize turbulence, such turbulence being undesirable as it can cause particles in the environment to collect in such areas of turbulence, preventing the filtration system from removing those particles from the environment. Further, to maintain a desired temperature in the interior, a thermal regulation system utilizing a plurality of heat exchangers can be provided, for example, operating with, adjacent to, or used in conjunction with, a fan or another gas circulating device. A gas purification loop can be configured to circulate gas from within the interior of a gas enclosure assembly through at least one gas purification component exterior the enclosure. In that regard, a circulation and filtration system internal to a gas enclosure assembly in conjunction with a gas purification loop external to a gas enclosure assembly can provide continuous circulation of a substantially low-particulate inert gas having substantially low levels of reactive species throughout a gas enclosure system. Various embodiments of a gas enclosure system having a gas purification system can be configured to maintain very low levels of undesired components, for example, organic solvents and vapors thereof, as well as water, water vapor, oxygen, and the like.

In addition to providing for the gas circulation, filtration and purification components, the ductwork can be sized and shaped to accommodate therein at least one service bundle. According to the present teachings, a service bundle can include, for example, but not limited by, optical cables, electrical cables, wires, as well as various fluid-containing tubings, and the like. Various embodiments of a service bundle of the present teachings can have a considerable dead volume created by void spaces that form between various components of a service bundle. The substantial dead volume which can be created in the bundling of various optical cables, electrical cables, wires, and fluid-containing tubings can have a substantial volume of reactive atmospheric species, such as water, water vapor, oxygen, and the like, trapped in void spaces. Such a substantial volume of occluded reactive atmospheric species can be difficult to remove rapidly by a purification system. Additionally, such service bundles are an identified source of particulate matter. In some embodiments, a combination of any of cables, electrical wires and wire bundles, and fluid-containing tubing can be disposed substantially within the ductwork and can be operatively associated with at least one of an optical system, an electrical system, a mechanical system, and a cooling system, respectively, which are housed within the interior of a gas enclosure system. As the gas circulation, filtration and purification components can be configured such that essentially all circulated inert gas is drawn through the ductwork, both particulate matter arising from such bundles, as well as atmospheric constituents trapped in the dead volume of variously bundled materials can be effectively removed by having such bundled components substantially contained within the ductwork.

Various embodiments of a gas enclosure system according to the present teachings can include a gas enclosure assembly formed from a plurality of frame members and panel sections, as well as a particle control system, gas circulation, filtration and purification components, and additionally various embodiments of a pressurized inert gas recirculation system. Such a pressurized inert gas recirculation system can be utilized in the operation of an OLED printing system for various pneumatically-driven devices and apparatuses, as will be discussed in more detail subsequently herein.

According to the present teachings, several engineering challenges were addressed in order to provide for various embodiments of a pressurized inert gas recirculation system in a gas enclosure system. First, under typical operation of a gas enclosure system without a pressurized inert gas recirculation system, a gas enclosure system can be maintained at a slightly positive internal pressure relative to an external pressure in order to safeguard against outside gas or air from entering the interior should any leaks develop in a gas enclosure system. For example, under typical operation, for various embodiments of a gas enclosure system of the present teachings, the interior of a gas enclosure system can be maintained at a pressure relative to the surrounding atmosphere external to the enclosure system, for example, of at least 2 mbarg, for example, at a pressure of at least 4 mbarg, at a pressure of at least 6 mbarg, at a pressure of at least 8 mbarg, or at a higher pressure. Maintaining a pressurized inert gas recirculation system within a gas enclosure system can be challenging, as it presents a dynamic and ongoing balancing act regarding maintaining a slight positive internal pressure of a gas enclosure system, while at the same time continuously introducing pressurized gas into a gas enclosure system. Further, variable demand of various devices and apparatuses can create an irregular pressure profile for various gas enclosure assemblies and systems of the present teachings. Maintaining a dynamic pressure balance for a gas enclosure system held at a slight positive pressure relative to the external environment under such conditions can provide for the integrity of an ongoing OLED printing process.

For various embodiments of a gas enclosure system, a pressurized inert gas recirculation system according to the present teachings can include various embodiments of a pressurized inert gas loop that can utilize at least one of a compressor, an accumulator, and a blower, and combinations thereof. Various embodiments of a pressurized inert gas recirculation system that include various embodiments of a pressurized inert gas loop can have a specially designed pressure-controlled bypass loop that can provide internal pressure of an inert gas in a gas enclosure system of the present teachings at a stable, defined value. In various embodiments of a gas enclosure system, a pressurized inert gas recirculation system can be configured to recirculate pressurized inert gas via a pressure-controlled bypass loop when a pressure of an inert gas in an accumulator of a pressurized inert gas loop exceeds a pre-set threshold pressure. The threshold pressure can be, for example, within a range from between about 25 psig to about 200 psig, or more specifically within a range of between about 75 psig to about 125 psig, or more specifically within a range from between about 90 psig to about 95 psig. In that regard, a gas enclosure system of the present teachings having a pressurized inert gas recirculation system with various embodiments of a specially designed pressure-controlled bypass loop can maintain a balance of having a pressurized inert gas recirculation system in an hermetically sealed gas enclosure.

According to the present teachings, various devices and apparatuses can be disposed in the interior and in fluid communication with various embodiments of a pressurized inert gas recirculation system having various pressurized inert gas loops that can utilize a variety of pressurized gas sources, such as at least one of a compressor, a blower, and combinations thereof. For various embodiments of a gas enclosure and system of the present teachings, the use of various pneumatically operated devices and apparatuses can be provide low-particle generating performance, as well as being low maintenance. Exemplary devices and apparatuses that can be disposed in the interior of a gas enclosure system and in fluid communication with various pressurized inert gas loops can include, for example, but not limited by, one or more of a pneumatic robot, a substrate floatation table, an air bearing, an air bushing, a compressed gas tool, a pneumatic actuator, and combinations thereof. A substrate floatation table, as well as air bearings can be used for various aspects of operating an OLED printing system in accordance with various embodiments of a gas enclosure system of the present teachings. For example, a substrate floatation table utilizing air-bearing technology can be used to transport a substrate into position in a printhead chamber, as well as to support a substrate during an OLED printing process.

FIG. 1A is a right, front perspective view of gas enclosure assembly 100 according to various embodiments of the present teachings. Gas enclosure assembly 100 can be integrated with various components to provide for various embodiments of a gas enclosure system of the present teachings. A gas enclosure system of the present teachings can contain one or more gases for maintaining an inert environment in a gas enclosure assembly interior, as well as components for maintaining a substantially low-particle environment. By way of non-limiting examples, various embodiments of a gas enclosure system can have a particle control system that can include a gas circulation and filtration system, as well as, purification components for removing reactive species from recirculated inert gas, and can have various embodiments of a pressurized inert gas recirculation system. As such, various embodiments of a gas enclosure system of the present teachings can be useful in maintaining an inert, substantially low-particle gas atmosphere in the interior.

Figure 1B:
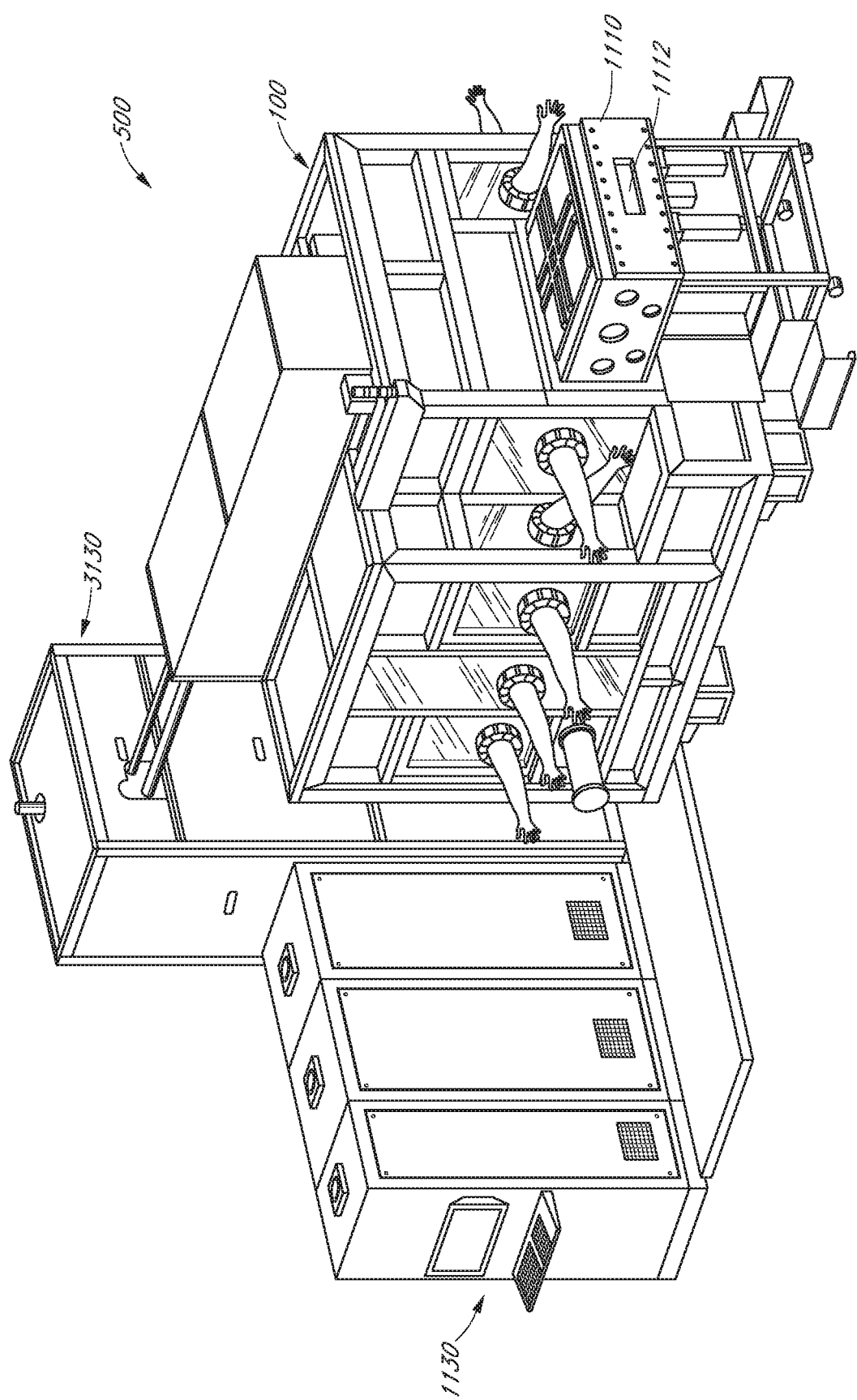

For example, FIG. 1B is a left front perspective view of various embodiments of gas enclosure system 500. FIG. 1B depicts gas enclosure system 500, which can include various embodiments of gas enclosure assembly 100. Gas enclosure system 500 can have load-locked inlet chamber 1110, which can have inlet gate 1112. Gas enclosure system 500 of FIG. 1B can include a gas purification system 3130 for providing gas enclosure assembly 100 with a constant supply of inert gas having substantially low levels of reactive atmospheric species, such as water vapor and oxygen, as well as organic solvent vapors that result from an OLED printing process. According to the present teachings, an inert gas may be any gas that does not undergo a chemical reaction under a defined set of conditions. Some commonly used non-limiting examples of an inert gas can include nitrogen, any of the noble gases, and any combination thereof. Various embodiments of a gas purification system according to the present teachings, such as gas purification system 3130 of FIG. 1B, can maintain levels for each species of various reactive species, including various reactive atmospheric gases, such as water vapor and oxygen, as well as organic solvent vapors at 100 ppm or lower, for example, at 10 ppm or lower, at 1.0 ppm or lower, or at 0.1 ppm or lower.

Gas enclosure system 500 of FIG. 1B can also have controller system 1130 for system control functions. For example, system controller 1130 can include one or more processor circuits (not shown) in communication with one or more memory circuits (not shown). System controller 1130 can also communicate with a load-locked inlet chamber 1110, an outlet chamber (not shown) and ultimately with a print nozzle of an OLED printing system, which can be housed in gas enclosure system 500. In this manner, system controller 1130 can coordinate, for example, the opening of gates 1112 in load-locked inlet chamber 1110, to allow the entry of a substrate into gas enclosure system 500. System controller 1130 can control a variety of system functions, such as controlling ink dispensing to a print nozzle of an OLED printing system. Gas enclosure system 500 of FIG. 1B is configured to encompass and protect an air-sensitive process, such as the printing of a variety of inks useful for creating an OLED stack using an industrial printing system. Examples of atmospheric gases that are reactive to OLED inks include water vapor and oxygen, as well as a variety of organic vapors from organic solvents used, for example, as carriers for various OLED inks. As previously discussed herein, gas enclosure assembly 100 can be configured to maintain a sealed atmosphere and allow a component or a printing system to operate effectively while gas enclosure system 500 can provide all components necessary for maintaining an inert environment. Additionally, gas enclosure 500 can have a particle control system providing a low-particle zone proximal to a substrate that can include components such as, by way of non-limiting examples, a gas circulation and filtration system, a low-particle-generating X-axis linear bearing system for moving a printhead assembly relative to a substrate, a service bundle housing exhaust system, and a printhead assembly exhaust system.

As depicted in FIG. 1A, various embodiments of gas enclosure assembly 100 can comprise component parts including a front or first wall panel 210', a left, or second wall panel (not shown), a right or third wall panel 230', a back or forth wall panel (not shown), and ceiling panel 250', which gas enclosure assembly can be attached to pan 204, which rests on a base (not shown). As will be discussed in more detail subsequently herein, various embodiments of a gas enclosure assembly 100 of FIG. 1A can be constructed from a front or first wall frame 210, a left, or second wall frame (not shown), a right or third wall frame 230, a back or forth wall panel (not shown), and a ceiling frame 250. Various embodiments of a ceiling frame 250 can include a fan filter unit cover 103, as well as first ceiling frame duct 105, and first ceiling frame duct 107. According to embodiments of the present teachings, various types of section panels may be installed in any of a plurality of panel section comprising a frame member. In various embodiments of gas enclosure 100 of FIG. 1, sheet metal panel sections 109 can be welded into a frame member during the construction of a frame. For various embodiments of gas enclosure assembly 100, types of section panels can that can be repeatedly installed and removed through cycles of construction and deconstruction of a gas enclosure assembly can include an inset panel 110, as indicated for wall panel 210', as well as a window panel 120 and readily-removable service window 130, as indicated for wall panel 230'.

Though readily-removable service window 130 can provide ready access to the interior of enclosure 100, any panel that is removable can be used to provide access to the interior of a gas enclosure system for the purpose of repair and regular service. Such access for service or repair is differentiated from the access provided by panels such as window panel 120 and readily-removable service window 130, which can provide an end-user glove access to the interior of a gas enclosure assembly during use from the exterior of a gas enclosure assembly. For example, any of the gloves, such as glove 142, which is attached to gloveport 140, as shown in FIG. 1A for panel 230, can provide an end-user access to the interior during use of a gas enclosure system.

Figure 2:
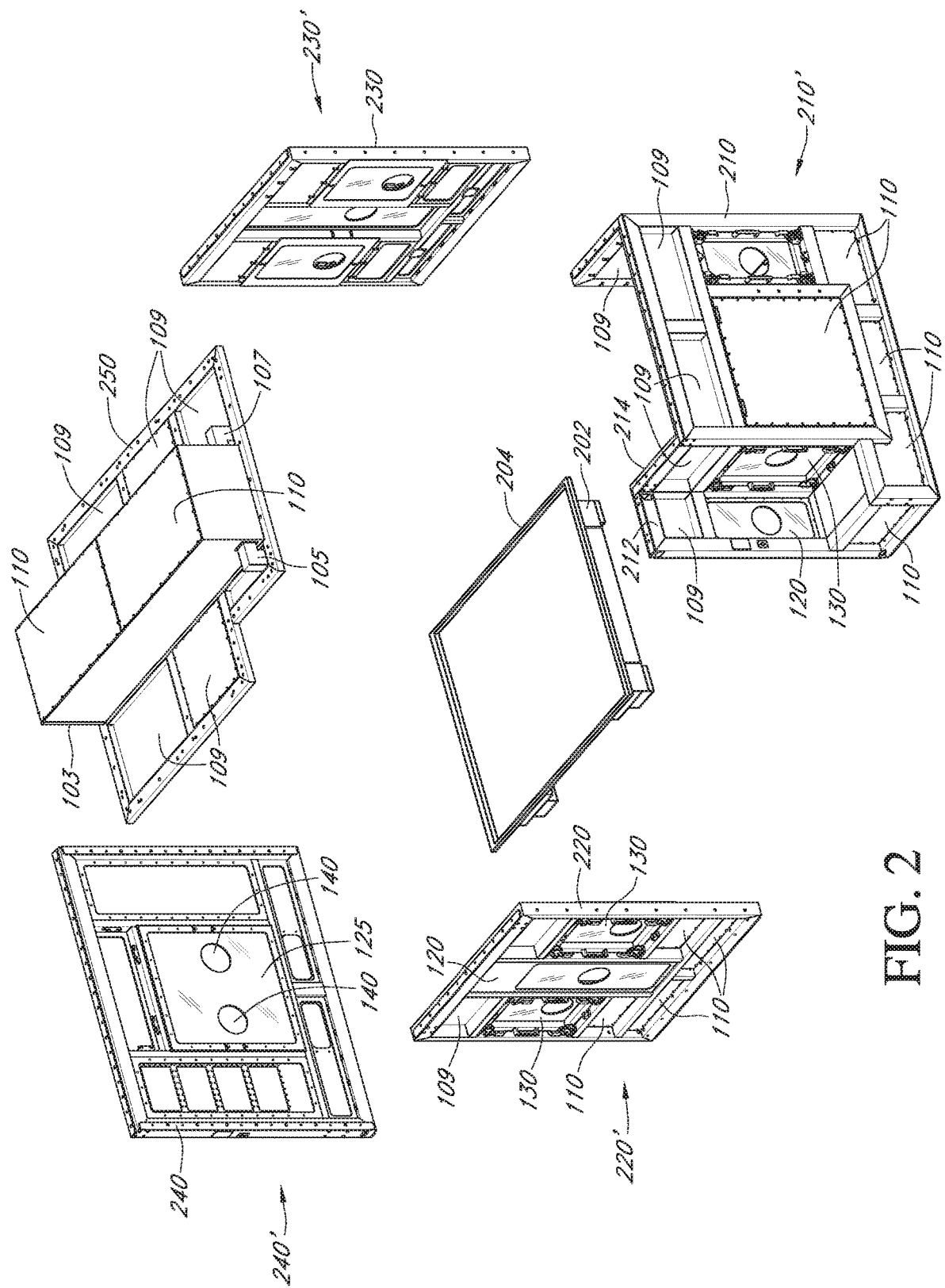
FIG. 2 depicts an exploded view of a gas enclosure assembly in accordance with various embodiments of the present teachings.

FIG. 2 depicts an exploded view of various embodiments of a gas enclosure assembly as depicted in FIG. 1A. Various embodiments of a gas enclosure assembly can have a plurality of wall panels, including outside perspective view of front wall panel 210', outside perspective view of left wall panel 220', interior perspective view of a right wall panel 230', interior perspective view of rear wall panel 240', and top perspective view of ceiling panel 250', which as shown in FIG. 1A can be attached to pan 204, which rests upon base 202. An OLED printing system can mounted on top of pan 204, which printing processes are known to be sensitive to atmospheric conditions. According to the present teachings, a gas enclosure assembly can be constructed from frame members, for example, wall frame 210 of wall panel 210', wall frame 220 of wall panel 220', wall frame 230 of wall panel 230', wall frame 240 of wall panel 240', and ceiling frame 250 of ceiling panel 250', in which a plurality of section panels can then be installed. In that regard, it can be desirable to streamline the design of section panels that can be repeatedly installed and removed through cycles of construction and deconstruction of various embodiments of a gas enclosure assembly of the present teachings. Moreover, contouring of a gas enclosure assembly 100 can be done to accommodate a footprint of various embodiments of an OLED printing system in order to minimize the volume of inert gas required in a gas enclosure assembly, as well as providing ready access to an end-user; both during use of a gas enclosure assembly, as well as during maintenance.

Using front wall panel 210' and left wall panel 220' as exemplary, various embodiments of a frame member can have sheet metal panel sections 109 welded into a frame member during frame member construction. Inset panel 110, window panel 120 and readily-removable service window 130 can be installed in each of a wall frame member, and can be repeatedly installed and removed through cycles of construction and deconstruction of gas enclosure assembly 100 of FIG. 2. As can be seen; in the example of wall panel 210' and wall panel 220', a wall panel can have a window panel 120 proximal to a readily-removable service window 130. Similarly, as depicted in the example rear wall panel 240', a wall panel can have a window panel such as window panel 125, which has two adjacent gloveports 140. For various embodiments of wall frame members according to the present teachings, and as seen for gas enclosure assembly 100 of FIG. 1A, such an arrangement of gloves provides easy access from the exterior of a gas enclosure to component parts within an enclosed system. Accordingly, various embodiments of a gas enclosure can provide two or more gloveports so that an end-user can extend a left glove and a right glove into the interior and manipulate one or more items in the interior, without disturbing the composition of the gaseous atmosphere within the interior. For example, any of window panel 120 and service window 130 can be positioned to facilitate easy access from the exterior of a gas enclosure assembly to an adjustable component in the interior of a gas enclosure assembly. According to various embodiments of a window panel, such as window panel 120 and service window 130, when end-user access through a gloveport glove is not indicated, such windows may not include a gloveport and gloveport assembly.

Various embodiments of wall and ceiling panels, as depicted in FIG. 2, can have a plurality of an inset panel 110. As can be seen in FIG. 2, inset panels can have a variety of shapes and aspect ratios. In addition to inset panels, ceiling panel 250' can have a fan filter unit cover 103 as well as first ceiling frame duct 105, and second ceiling frame duct 107, mounted, bolted, screwed, fixed, or otherwise secured to ceiling frame 250. As will be discussed in more detail subsequently herein, ductwork in fluid communication with duct 107 of ceiling panel 250' can be installed within the interior of a gas enclosure assembly. According to the present teachings, such ductwork can be part of a gas circulation system internal to a gas enclosure assembly, as well as providing for separating the flow stream exiting a gas enclosure assembly for circulation through at least one gas purification component external to a gas enclosure assembly.

Figure 3:
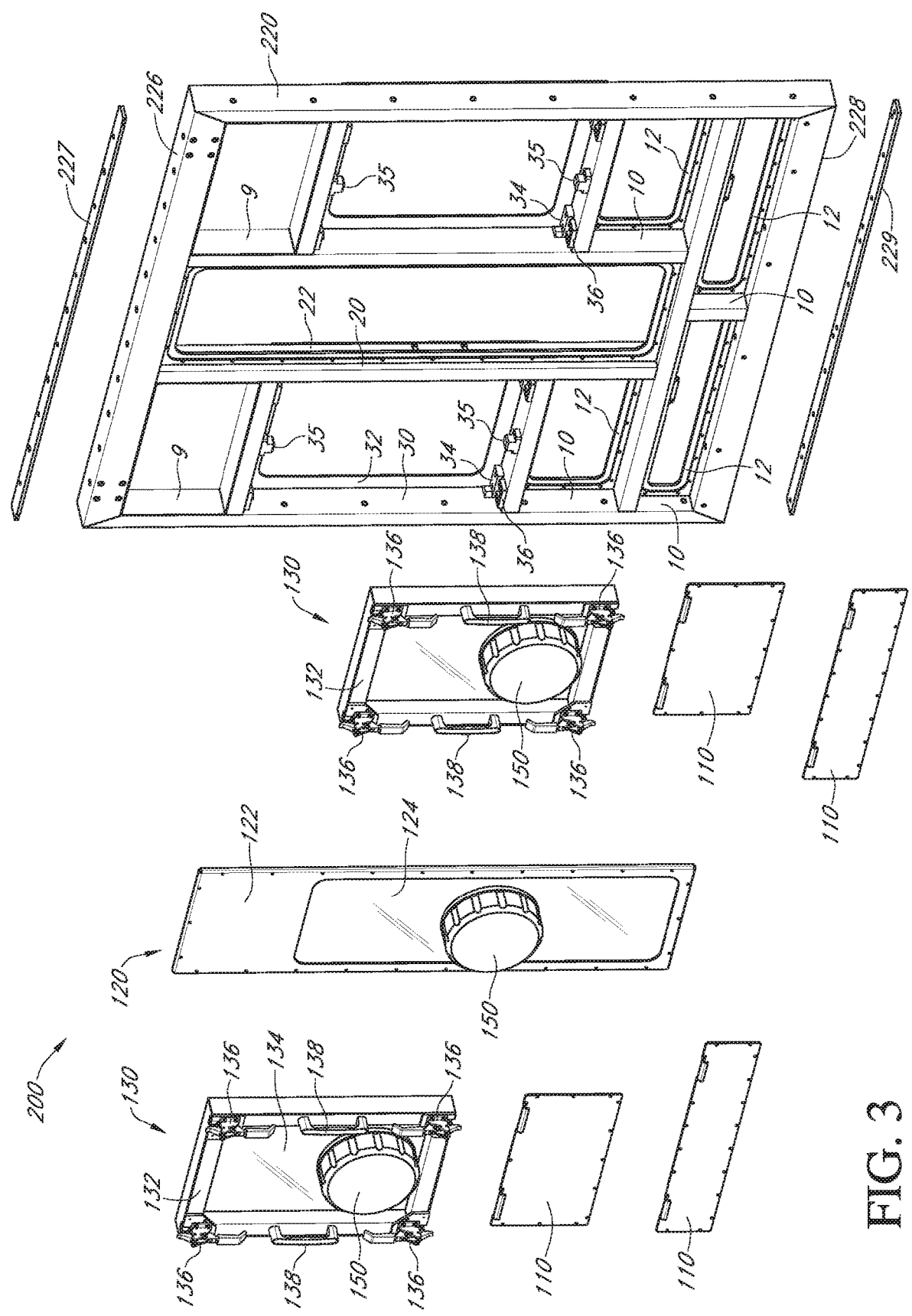
FIG. 3 is an exploded front perspective view of a frame member assembly depicting various panel frame sections, and section panels in accordance with various embodiments of the present teachings.

FIG. 3 is an exploded front perspective view of frame member assembly 200, in which wall frame 220 can be constructed to include a complete complement of panels. Though not limited to the design shown, frame member assembly 200, using wall frame 220, can be used as exemplary for various embodiments of a frame member assembly according to the present teachings. Various embodiments of a frame member assembly can be comprised of various frame members and section panels installed in various frame panel sections of various frame members according to the present teachings.

According to various embodiments of various frame member assemblies of the present teachings, frame member assembly 200 can be comprised of a frame member, such as wall frame 220. For various embodiments of a gas enclosure assembly, such as gas enclosure assembly 100 of FIG. 1A, processes that may utilize equipment housed in such a gas enclosure assembly may not only require an hermetically sealed enclosure providing an inert environment, but an environment substantially free of particulate matter. In that regard, a frame member according to the present teachings may utilize variously dimensioned metal tube materials for the construction of various embodiments of a frame. Such metal tube materials address desired material attributes, including, but not limited by, a high-integrity material that will not degrade to produce particulate matter, as well as producing a frame member having high strength, yet optimal weight, providing for ready transport, construction, and deconstruction from one site to another site of a gas enclosure assembly comprising various frame members and panel sections. According to the present teachings, any material satisfying these requirements can be utilized for creating various frame members according to the present teachings.

For example, various embodiments of a frame member according to the present teachings, such as frame member assembly 200, can be constructed from extruded metal tubing. According to various embodiments of a frame member, aluminum, steel, and a variety of metal composite materials may be utilized for constructing a frame member. In various embodiments, metal tubing having dimensions of, for example, but not limited by, 2"w×2"h, 4"w×2"h and 4"w×4"h and having ⅛" to ¼" wall thickness can be used to construct various embodiments of frame members according to the present teachings. Additionally, a variety of reinforced fiber polymeric composite materials of a variety of tube or other forms are available that have the material attributes including, but not limited by, a high-integrity material that will not degrade to produce particulate matter, as well as producing a frame member having high strength, yet optimal weight, providing for ready transport, construction, and deconstruction from one site to another site.

Regarding construction of various frame members from variously dimensioned metal tube materials, it is contemplated that welding to create various embodiments of frame weldments can be done. Additionally, construction of various frame members from variously dimensioned building materials can be done using an appropriate industrial adhesive. It is contemplated that the construction of various frame members should be done in a fashion that would not intrinsically create leak paths through a frame member. In that regard, construction of various frame members can be done using any approach that does not intrinsically create leak paths through a frame member for various embodiments of a gas enclosure assembly. Further, various embodiments of frame members according to the present teachings, such as wall frame 220 of FIG. 2, may be painted or coated. For various embodiments of a frame member made from a metal tubing material prone, for example, to oxidation, where material formed at the surface may create particulate matter, painting or coating, or other surface treatment, such as anodizing, to prevent the formation of particulate matter can be done.

A frame member assembly, such as frame member assembly 200 of FIG. 3, can have a frame member, such as wall frame 220. Wall frame 220 can have top 226, upon which a top wall frame spacer plate 227 can be fastened, as well as a bottom 228, upon which a bottom wall frame spacer plate 229 can be fastened. As will be discussed in more detail subsequently herein, spacer plates mounted on surfaces of a frame member are a part of a gasket sealing system, which in conjunction with the gasket sealing of panels mounted in frame member sections, provides for hermetic sealing of various embodiments of a gas enclosure assembly according to the present teachings. A frame member, such as wall frame 220 of frame member assembly 200 of FIG. 3, can have several panel frame sections, where each section can be fabricated to receive various types of panels, such as, but not limited by, an inset panel 110, a window panel 120 and a readily-removable service window 130. Various types of panel sections can be formed in the construction of a frame member. Types of panel sections can include, for example, but not limited by, an inset panel section 10, for receiving inset panel 110, a window panel section 20, for receiving window panel 120, and a service window panel section 30, for receiving readily-removable service window 130.

Each type of panel section can have a panel section frame to receive a panel, and can provide that each panel can be sealably fastened into each panel section in accordance with the present teachings for constructing an hermetically sealed gas enclosure assembly. For example, in FIG. 3 depicting a frame assembly according to the present teachings, inset panel section 10 is shown to have frame 12, window panel section 20 is shown to have frame 22, and service window panel section 30 is shown to have frame 32. For various embodiments of a wall frame assembly of the present teachings, various panel section frames can be a metal sheet material welded into the panel sections with a continuous weld-bead to provide a hermetic seal. For various embodiments of a wall frame assembly, various panel section frames can be made from a variety of sheet materials, including building materials selected from reinforced fiber polymeric composite materials, which can be mounted in a panel section using an appropriate industrial adhesive. As will be discussed in more detail in subsequent teachings concerning sealing, each panel section frame can have a compressible gasket disposed thereon to ensure that a gas-tight seal can be formed for each panel installed and fastened in each panel section. In addition to a panel section frame, each frame member section can have hardware related to positioning a panel, as well as to securely fastening a panel in a panel section.

Various embodiments of inset panel 110 and panel frame 122 for window panel 120 can be constructed from sheet metal material, such as, but not limited by, aluminum, various alloys of aluminum and stainless steel. The attributes for the panel material can be the same as they are for the structural material constituting various embodiments of frame members. In that regard, materials having attributes for various panel members include, but are not limited by, a high integrity material that will not degrade to produce particulate matter, as well as producing a panel having high strength, yet optimal weight, in order to provide for ready transport, construction, and deconstruction from one site to another site. Various embodiments of, for example, honeycomb core sheet material can have the requisite attributes for use as panel material for construction of inset panel 110 and panel frame 122 for window panel 120. Honeycomb core sheet material can be made of a variety of materials; both metal, as well as metal composite and polymeric, as well as polymer composite honeycomb core sheet material. Various embodiments of removable panels when fabricated from a metal material can have ground connections included in the panel to ensure that when a gas enclosure assembly is constructed that the entire structure is grounded.

Given the transportable nature of components used to construct a gas enclosure assembly of the present teachings, any of the various embodiments of section panels of the present teachings can be repeatedly installed and removed during use of a gas enclosure system to provide access to the interior of a gas enclosure assembly.

For example, panel section 30 for receiving a readily-removable service window panel 130 can have a set of four spacers, of which one is indicated as window guide spacer 34. Additionally, panel section 30, which is constructed for receiving a readily-removable service window panel 130, can have a set of four clamping cleats 36, which can be used to clamp service window 130 into service window panel section 30 using a set of four of a reverse acting toggle clamp 136 mounted on service window frame 132 for each of a readily removable service window 130. Further, two of each of a window handle 138 can be mounted on readily-removable service window frame 132 to provide an end-user ease of removal and installation of service window 130. The number, type, and placement of removable service window handles can be varied. Additionally, service window panel section 30 for receiving a readily-removable service window panel 130 can have at least two of a window clamp 35, selectively installed in each service window panel section 30. Though depicted as in the top and bottom of each of service window panel section 30, at least two window clamps can be installed in any fashion that acts to secure service window 130 in panel section frame 32. A tool can be used to remove and install window clamp 35, in order to allow service window 130 to be removed and reinstalled.

Reverse acting toggle clamp 136 of service window 130, as well as hardware installed on panel section 30, including clamping cleat 36, window guide spacer 34, and window clamp 35, can be constructed of any suitable material, as well as combination of materials. For example, one or more such elements can comprise at least one metal, at least one ceramic, at least one plastic, and a combination thereof. Removable service window handle 138 can be constructed of any suitable material, as well as a combination of materials. For example, one or more such elements can comprise at least one metal, at least one ceramic, at least one plastic, at least one rubber, and a combination thereof. Enclosure windows, such as window 124 of window panel 120, or window 134 of service window 130, can comprise any suitable material as well as a combination of materials. According to various embodiments of a gas enclosure assembly of the present teachings, enclosure windows can comprise a transparent and a translucent material. In various embodiments of a gas enclosure assembly, enclosure windows can comprise silica-based materials, for example, but not limited by, such as glass and quartz, as well as various types of polymeric-based materials, for example, but not limited by, such as various classes of polycarbonate, acrylic, and vinyl. According to systems and methods of the present teachings, transparent and translucent properties of various composites and combinations thereof are desirable attributes for exemplary window materials.

As will be discussed in the following teachings for FIGS. 8A-9B, wall and ceiling frame member seals in conjunction with gas-tight section panel frame seals together provide for various embodiments of an hermetically-sealed gas enclosure assembly for air-sensitive processes that require an inert environment. Components of a gas enclosure system that contribute to providing substantially low concentrations of reactive species, as well as substantially low particulate environment can include, but are not limited by, an hermetically sealed gas enclosure assembly, as well as a highly effective gas circulation and particle filtration system, including ductwork. Providing effective hermetic seals for a gas enclosure assembly can be challenging; especially where three frame members come together to form a three-sided joint. As such, three-sided joint sealing presents a particularly difficult challenge with respect to providing readilyinstallable hermetic sealing for a gas enclosure assembly that can be assembled and disassembled through cycles of construction and deconstruction.

In that regard, various embodiments of a gas enclosure assembly according to the present teachings provide for hermetic sealing of a fully-constructed gas enclosure system through effective gasket sealing of joints, as well as providing effective gasket sealing around load bearing building components. Unlike conventional joint sealing, joint sealing according to the present teachings: 1) includes uniform parallel alignment of abutted gasket segments from orthogonally oriented gasket lengths at top and bottom terminal frame joint junctures where three frame members are joined, thereby avoiding angular seam alignment and sealing, 2) provides for forming the abutted lengths across an entire width of a joint, thereby increasing the sealing contact area at three-sided joint junctures, 3) is designed with spacer plates that provide uniform compression force across all vertical, and horizontal, as well as top and bottom three-sided joint gasket seals. Additionally, the selection of the gasket material can impact the effectiveness of providing an hermetic seal, which will be discussed subsequently herein.

Figure 4B:
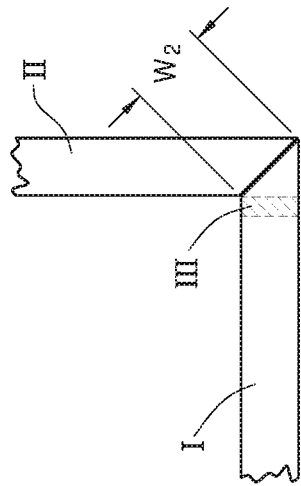
FIG. 4A trough FIG. 4C are top schematic views of various embodiments of gasket seals for forming joints.
Figure 4C:
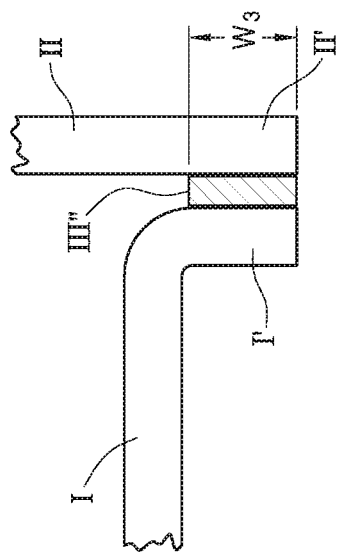
Figure 4A:
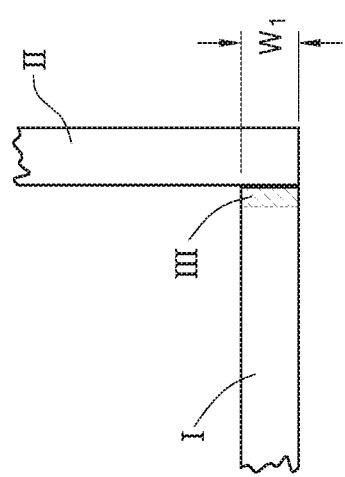

FIG. 4A through FIG. 4C are top schematic views that depict a comparison of conventional three-sided joint seals to three-sided joint seals according to the present teachings. According to various embodiments of a gas enclosure assembly the present teachings, there can be, for example, but not limited by, at least four wall frame members, a ceiling frame member and a pan, that can be joined to form a gas enclosure assembly, creating a plurality of vertical, horizontal, and three-sided joints requiring hermetic sealing. In FIG. 4A, a top schematic view of a conventional three-sided gasket seal formed from a first gasket I, which is orthogonally oriented to gasket II in the X-Y plane. As shown in FIG. 4A, a seam formed from the orthogonal orientation in the X-Y plane has a contact length $W_1$ between the two segments defined by the dimension of width of the gasket. Additionally, a terminal end portion of gasket III, which is a gasket orthogonally oriented to both gasket I and gasket II in the vertical direction, can abut gasket I and gasket II, as indicated by the hatching. In FIG. 4B, a top schematic view of a conventional three-sided joint gasket seal formed from a first gasket length I, which is orthogonal to a second gasket length II, and has a seam joining 45° faces of both lengths, where the seam has a contact length $W_2$ between the two segments that is greater than the width of the gasket material. Similarly to the configuration of FIG. 4A, an end portion of gasket III, which is orthogonal to both gasket I and gasket II in the vertical direction can abut gasket I and gasket II, as indicated by the hatching. Assuming that the gaskets widths are the same in FIG. 4A and FIG. 4B, the contact length $W_2$ for FIG. 4B is greater than the contact length $W_1$ for FIG. 4A.

FIG. 4C is a top schematic view of a three-sided joint gasket seal according to the present teachings. A first gasket length I can have a gasket segment I' formed orthogonally to the direction of gasket length I, where gasket segment I' has a length that can be approximately the dimension of the width of a structural component being joined, such as a 4"w×2"h or 4"w×4"h metal tube used to form various wall frame members of a gas enclosure assembly of the present teachings. Gasket II is orthogonal to gasket I in the X-Y plane, and has gasket segment II', which has an overlapping length with gasket segment I' that is approximately the width of structural components being joined. The width of gasket segments I' and II' are the width of a compressible gasket material selected. Gasket III is orthogonally oriented to both gasket I and gasket II in the vertical direction. Gasket segment III' is an end portion of gasket III. Gasket segment III' is formed from the orthogonal orientation of gasket segment III' to the vertical length of gasket III. Gasket segment III' can be formed so that it has approximately the same length as gasket segments I' and II', and a width that is the thickness of a compressible gasket material selected. In that regard, the contact length $W_3$ for the three aligned segments shown in FIG. 4C is greater than for the conventional three-corner joint seals shown in either FIG. 4A or FIG. 4B, having contact length $W_1$ and $W_2$, respectively.

In that regard, three-sided joint gasket sealing according to the present teachings creates uniform parallel alignment of gasket segments at terminal joint junctures from what would otherwise be orthogonally aligned gaskets, as shown in the case of FIG. 4A and FIG. 4B. Such uniform parallel alignment of the three-sided joint gasket sealing segments provides for applying a uniform lateral sealing force across the segments to promote an hermetic three-sided joint seal at the top and bottom corners of joints formed from wall frame members. Additionally, each segment of the uniformly aligned gasket segments for each three-sided joint seal is selected to be approximately the width of the structural components being joined, providing for a maximum length of contact of the uniformly aligned segments. Moreover, joint sealing according to the present teachings is designed with spacer plates that provide a uniform compression force across all vertical, horizontal, and three-sided gasket seals of a building joint. It may be argued that the width of the gasket material selected for conventional three-sided seals given for the examples of FIGS. 6A and 6B could be at least the width of structural components being joined.

The exploded perspective view of FIG. 5A, depicts sealing assembly 300 according to the present teachings before all frame members have been joined, so that the gaskets are depicted in an uncompressed state. In FIG. 5A, a plurality of wall frame members, such as wall frame 310, wall frame 350, as well as ceiling frame 370 can be sealably joined in a first step of the construction of a gas enclosure from various components of a gas enclosure assembly. Frame member sealing according to the present teachings is a substantial part of providing that a gas enclosure assembly once fully constructed is hermetically sealed, as well as providing sealing that can be implemented through cycles of construction and deconstruction of a gas enclosure assembly. Though the example given in the following teachings for FIGS. 7A-7B are for the sealing of a portion of a gas enclosure assembly, such teachings apply to the entirety of any of a gas enclosure assembly of the present teachings.

First wall frame 310 depicted in FIG. 5A can have interior side 311 on which spacer plate 312 is mounted, vertical side 314, and top surface 315 on which spacer plate 316 is mounted. First wall frame 310 can have first gasket 320 disposed in and adhered to a space formed from spacer plate 312. Gap 302, remaining after first gasket 320 is disposed in and adhered to a space formed from spacer plate 312, can run a vertical length of first gasket 320, as shown in FIG. 5A. As depicted in FIG. 5A, compliant gasket 320 can be disposed in and adhered to the space formed from spacer plate 312, and can have vertical gasket length 321, curvilinear gasket length 323, and gasket length 325 that is formed 90° in plane to vertical gasket length 321 on interior frame member 311 and terminates at vertical side 314 of wall frame 310. In FIG. 5A, first wall frame 310 can have top surface 315 on which spacer plate 316 is mounted, thereby forming a space on surface 315 on which second gasket 340 is disposed in and adhered to proximal to inner edge 317 of wall frame 310. Gap 304, remaining after second gasket 340 is disposed in and adhered to a space formed from spacer plate 316, can run a horizontal length of second gasket 340, as shown in FIG. 5A. Further, as indicated by the hatched line, length 345 of gasket 340 is uniformly parallel and contiguously aligned with length 325 of gasket 320.

Second wall frame 350 depicted in FIG. 5A can have exterior frame side 353, vertical side 354, and top surface 355 on which spacer plate 356 is mounted. Second wall frame 350 can have first gasket 360 disposed in and adhered to first gasket a space, which is formed from spacer plate 356. Gap 306, remaining after first gasket 360 is disposed in and adhered to a space formed from spacer plate 356, can run a horizontal length of first gasket 360, as shown in FIG. 5A. As depicted in FIG. 5A, compliant gasket 360 can have horizontal length 361, curvilinear length 363, and length 365 that is formed 90° in plane on top surface 355 and terminates at exterior frame member 353.

As indicated in the exploded perspective view of FIG. 5A, interior frame member 311 of wall frame 310 can be joined to vertical side 354 of wall frame 350 to form one building joint of a gas enclosure frame assembly. Regarding the sealing of a building joint so formed, in various embodiments of gasket sealing at terminal joint junctures of wall frame members according to the present teachings as depicted in FIG. 5A, length 325 of gasket 320, length 365 of gasket 360 and length 345 of gasket 340 are all contiguously and uniformly aligned. Additionally, as will be discussed in more detail subsequently herein, various embodiments of a spacer plate of the present teachings can provide for a uniform compression of between about 20% to about 40% deflection of a compressible gasket material used for hermetically sealing various embodiments of a gas enclosure assembly of the present teachings.

Figure 5B:
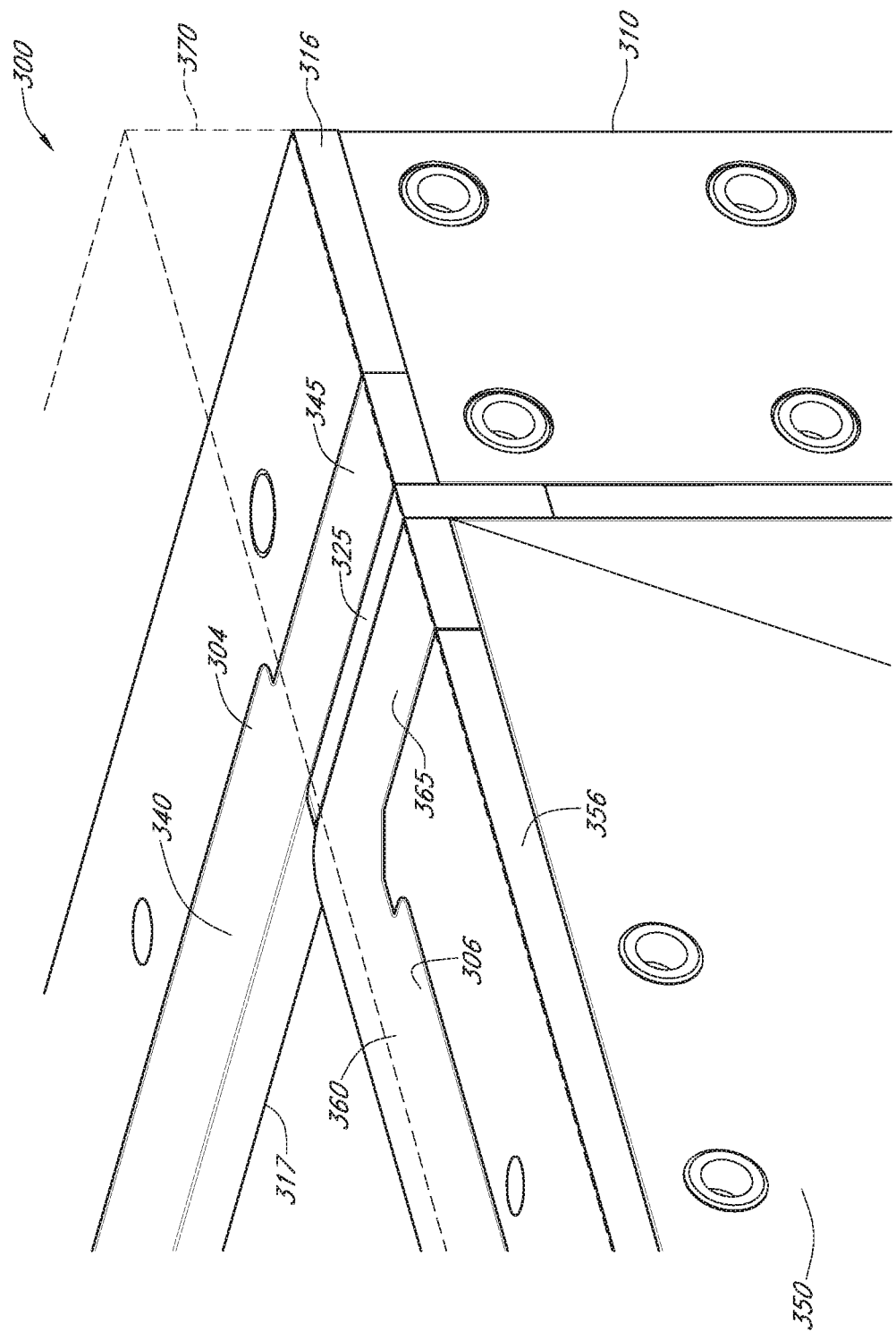

FIG. 5B depicts sealing assembly 300 according to the present teachings after all frame members have been joined, so that the gaskets are depicted in a compressed state. FIG. 5B is perspective view that shows the detail of corner seal of a three-sided joint formed at the top terminal joint juncture between first wall frame 310, second wall frame 350 and ceiling frame 370; which is shown in phantom view. As shown in FIG. 5B, the gasket spaces defined by the spacer plates can be determined to be a width, such that upon joining wall frame 310, wall frame 350 and ceiling frame 370; shown in phantom view, a uniform compression of between about 20% to about 40% deflection of a compressible gasket material for forming vertical, horizontal, and three-sided gasket seals ensures that gasket sealing at all surfaces sealed at joints of wall frame members can provide hermetic sealing. Additionally gasket gaps 302, 304, and 306 (not shown) are dimensioned, so that upon optimal compression of between about 20% to about 40% deflection of a compressible gasket material, each gasket can fill a gasket gap as shown for gasket 340 and gasket 360 in FIG. 5B. As such, in addition to providing uniform compression by defining a space in which each gasket is disposed in and adhered to, various embodiments of a spacer plate designed to provide a gap also ensure that each compressed gasket can conform within the spaces defined by a spacer plate without wrinkling or bulging or otherwise irregularly forming in a compressed state in a fashion that could form leak paths.

According to various embodiments of a gas enclosure assembly of the present teachings, various types of section panels can be sealed using compressible gasket material disposed on each of a panel section frame. In conjunction with the frame member gasket sealing, the locations and materials of the compressible gaskets used to form seals between the various section panels and panel section frames can provide for an hermetically sealed gas enclosure assembly with little or no gas leakage. Additionally, the sealing design for all types of panels, such as inset panel 110, window panel 120 and readily-removable service window 130 of FIG. 3, can provide for durable panel sealing after repeated removal and installation of such panels that may be required as to access the interior of a gas enclosure assembly, for example, for maintenance.

Figure 6A:
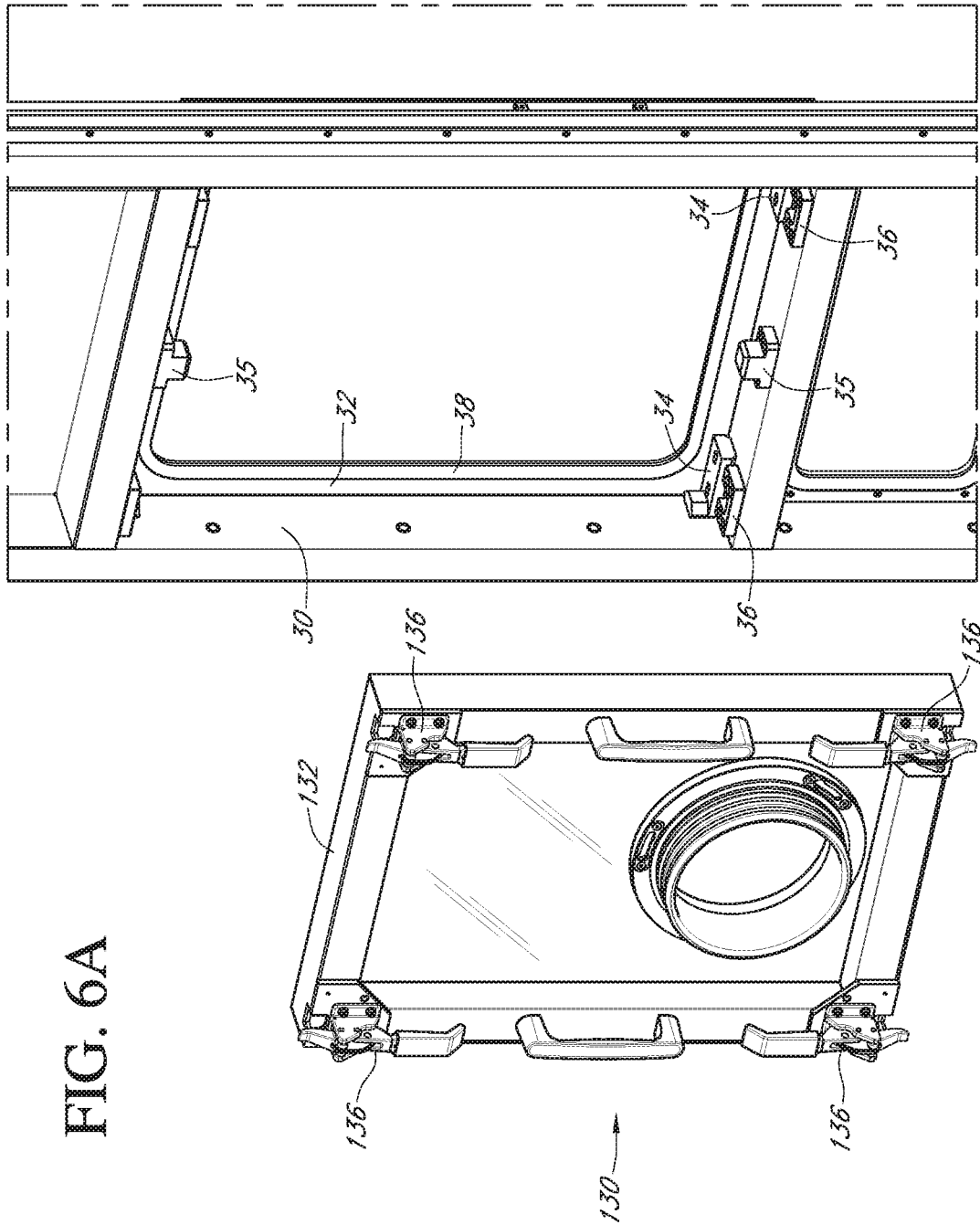
FIG. 6A and FIG. 6B are various views relating to sealing of a section panel for receiving a readily-removable service window according to various embodiments of a gas enclosure assembly of the present teachings.

For example, FIG. 6A, is an exploded view depicting service window panel section 30, and readily-removable service window 130. As previously discussed herein, service window panel section 30 can be fabricated for receiving readily-removable service window 130. For various embodiments of a gas enclosure assembly, a panel section, such as removable service panel section 30, can have panel section frame 32, as well as compressible gasket 38 disposed on panel section frame 32. In various embodiments, hardware related to fastening readily-removable service window 130 in removable service window panel section 30 can provide ease of installation and reinstallation to an end-user, and at the same time ensure that a gas-tight seal is maintained when readily-removable service window 130 is installed and reinstalled in panel section 30 as needed by an end-user requiring direct access to the interior of a gas enclosure assembly. Readily-removable service window 130 can include rigid window frame 132, which can be constructed from, for example, but not limited by, a metal tube material as described for constructing any of the frame members of the present teachings. Service window 130 can utilize quick-acting fastening hardware, for example, but not limited by reverse acting toggle clamp 136 in order to provide an end-user ready removal and reinstallation of service window 130.

Figure 6B:
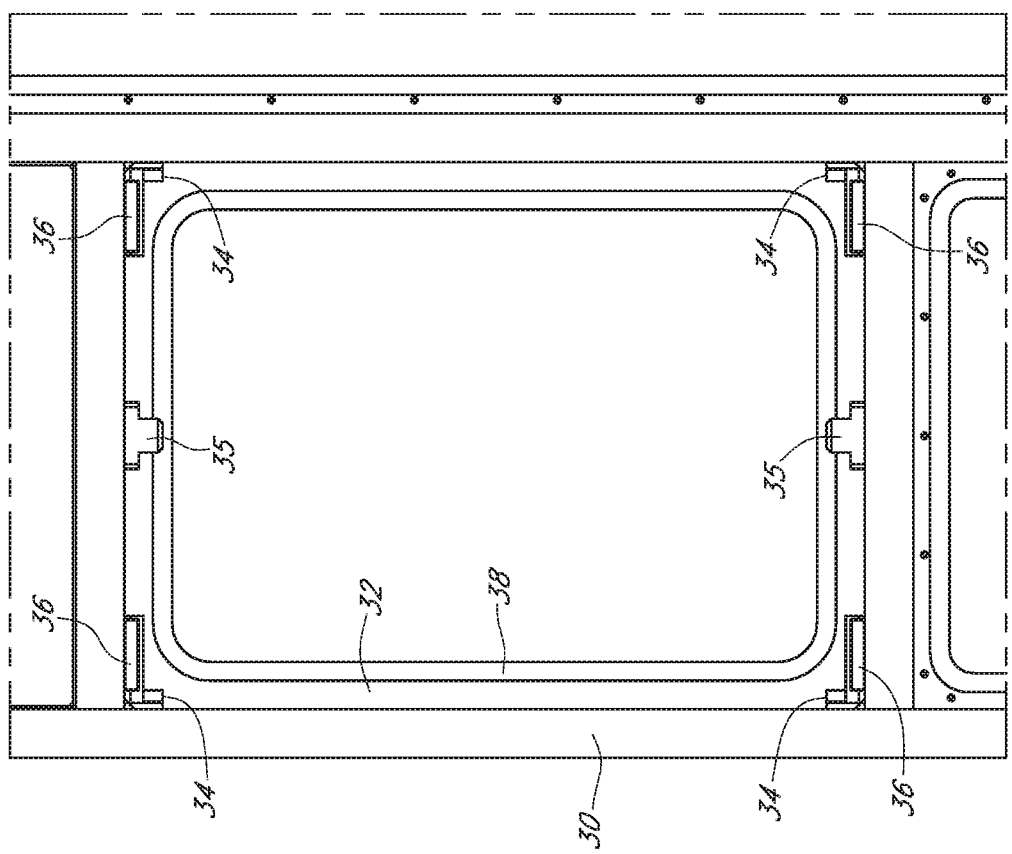

As shown in front view of removable service window panel section 30 of FIG. 6A, readily-removable service window 130 can have a set of four toggle clamps 136 secured on window frame 132. Service window 130 can be positioned into panel section frame 30 at a defined distance for insuring a proper compression force against gasket 38. Using a set of four window guide spacers 34, as shown in FIG. 6B, of which can be installed in each corner of panel section 30 for positioning service window 130 in panel section 30. A set of each of a clamping cleat 36 can be provided to receive reverse acting toggle clamp 136 of readily removable service window 136. According to various embodiments for the hermetic sealing of service window 130 through cycles of installation and removal, the combination of the mechanical strength of service window frame 132, in conjunction with the defined position of service window 130 provided by a set of window guide spacers 34 with respect to compressible gasket 38 can ensure that once service window 130 is secured in place with, for example, but not limited by, using reverse action toggle clamps 136 fastened in respective clamping cleats 36, service window frame 132 can provide an even force over panel section frame 32 with defined compression as set by a set of window guide spacers 34. The set of window guide spacers 34 are positioned so that the compression force of window 130 on gasket 38 deflects compressible gasket 38 between about 20% to about 40%. In that regard, the construction of service window 130, as well as fabrication of panel section 30 provide for a gas-tight seal of service window 130 in panel section 30. As previously discussed herein, window clamps 35 can be installed into panel section 30 after service window 130 is fastened into panel section 30, and removed when service window 130 needs to be removed.

Reverse acting toggle clamp 136 can be secured to a readily-removable service window frame 132 using any suitable means, as well as a combination of means. Examples of suitable securing means that can be used include at least one adhesive, for example, but not limited by an epoxy, or a cement, at least one bolt, at least one screw, at least one other fastener, at least one slot, at least one track, at least one weld, and a combination thereof. Reverse acting toggle clamp 136 can be directly connected to removable service window frame 132 or indirectly through an adaptor plate. Reverse acting toggle clamp 136, clamping cleat 36, window guide spacer 34, and window clamp 35 can be constructed of any suitable material, as well as a combination of materials. For example, one or more such elements can comprise at least one metal, at least one ceramic, at least one plastic, and a combination thereof.

In addition to sealing a readily-removable service window, gas-tight sealing can also be provided for inset panels and window panels. Other types of section panels that can be repeatedly installed and removed in panel sections include, for example, but not limited by, inset panels 110 and window panels 120, as shown in FIG. 3. As can be seen in FIG. 3, panel frame 122 of window panel 120 is constructed similarly to inset panel 110. As such, according to various embodiments of a gas enclosure assembly, the fabrication of panel sections for receiving inset panels and window panels can be the same. In that regard, the sealing of inset panels and window panel can be implemented using the same principles.

With reference to FIG. 7A and FIG. 7B, and according to various embodiments of the present teachings, any of the panels of gas enclosure, such as gas enclosure assembly 100 of FIG. 1, can include one or more inset panel sections 10, which can have frames 12 configured to receive a respective inset panel 110. FIG. 7A is a perspective view indicating an enlarged portion shown in FIG. 9B. In FIG. 7A inset panel 110 is depicted positioned with respect to inset frame 12. As can be seen in FIG. 7B, inset panel 110 is affixed to frame 12, where frame 12 can be, for example, constructed of a metal. In some embodiments, the metal can comprise aluminum, steel, copper, stainless steel, chromium, an alloy, and combinations thereof, and the like. A plurality of a blind tapped hole 14 can be made in inset panel section frame 12. Panel section frame 12 is constructed so as to comprise a gasket 16 between inset panel 110 and frame 12, in which compressible gasket 18 can be disposed. Blind tapped hole 14 can be of the M5 variety. Screw 15 can be received by blind tapped hole 14, compressing gasket 16 between inset panel 110 and frame 12. Once fastened into place against gasket 16, inset panel 110 forms a gas-tight seal within inset panel section 10. As previously discussed herein, such panel sealing can be implemented for a variety of section panels, including, but not limited by, inset panels 110 and window panels 120, as shown in FIG. 3.

According to various embodiments of compressible gaskets according to the present teachings, compressible gasket material for frame member sealing and panel sealing can be selected from a variety of compressible polymeric materials, for example, but not limited by, any in the class of closed-cell polymeric materials, also referred to in the art as expanded rubber materials or expanded polymer materials. Briefly, a closed-cell polymer is prepared in a fashion whereby gas is enclosed in discrete cells; where each discrete cell is enclosed by the polymeric material. Properties of compressible closed-cell polymeric gasket materials that are desirable for use in gas-tight sealing of frame and panel components include, but are not limited by, that they are robust to chemical attack over a wide range of chemical species, possess excellent moisture-barrier properties, are resilient over a broad temperature range, and they are resistant to a permanent compression set. In general, compared to open-cell-structured polymeric materials, closed-cell polymeric materials have higher dimensional stability, lower moisture absorption coefficients, and higher strength. Various types of polymeric materials from which closed-cell polymeric materials can be made include, for example, but not limited by, silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof.

The desirable material properties of closed-cell polymers are maintained only if the cells comprising the bulk material remain intact during use. In that regard, using such material in a fashion that can exceed material specifications set for a closed-cell polymer, for example, exceeding the specification for use within a prescribed temperature or compression range may cause degradation of a gasket seal. In various embodiments of closed-cell polymer gaskets used for sealing frame members and section panels in frame panel sections, compression of such materials should not exceed between about 50% to about 70% deflection, and for optimal performance can be between about 20% to about 40% deflection.

In addition to close-cell compressible gasket materials, another example of a class of compressible gasket material having desired attributes for use in constructing embodiments of a gas enclosure assembly according to the present teachings includes the class of hollow-extruded compressible gasket materials. Hollow-extruded gasket materials as a class of materials have the desirable attributes, including, but not limited by, that they are robust to chemical attack over a wide range of chemical species, possess excellent moisture-barrier properties, are resilient over a broad temperature range, and they are resistant to a permanent compression set. Such hollow-extruded compressible gasket materials can come in a wide variety of form factors, such as for example, but not limited by, U-cell, D-cell, square-cell, rectangular-cell, as well as any of a variety of custom form factor hollow-extruded gasket materials. Various hollow-extruded gasket materials can be fabricated from polymeric materials that are used for closed-cell compressible gasket fabrication. For example, but not limited by, various embodiments of hollow-extruded gaskets can be fabricated from silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof. Compression of such hollow cell gasket materials should not exceed about 50% deflection in order to maintain the desired attributes. While the class of close-cell compressible gasket materials and the class of hollow-extruded compressible gasket materials have been given as examples, any compressible gasket material having the desired attributes can be used for sealing structural components, such as various wall and ceiling frame members, as well as sealing various panels in panel section frames, as provided by the present teachings.

Figure 8:
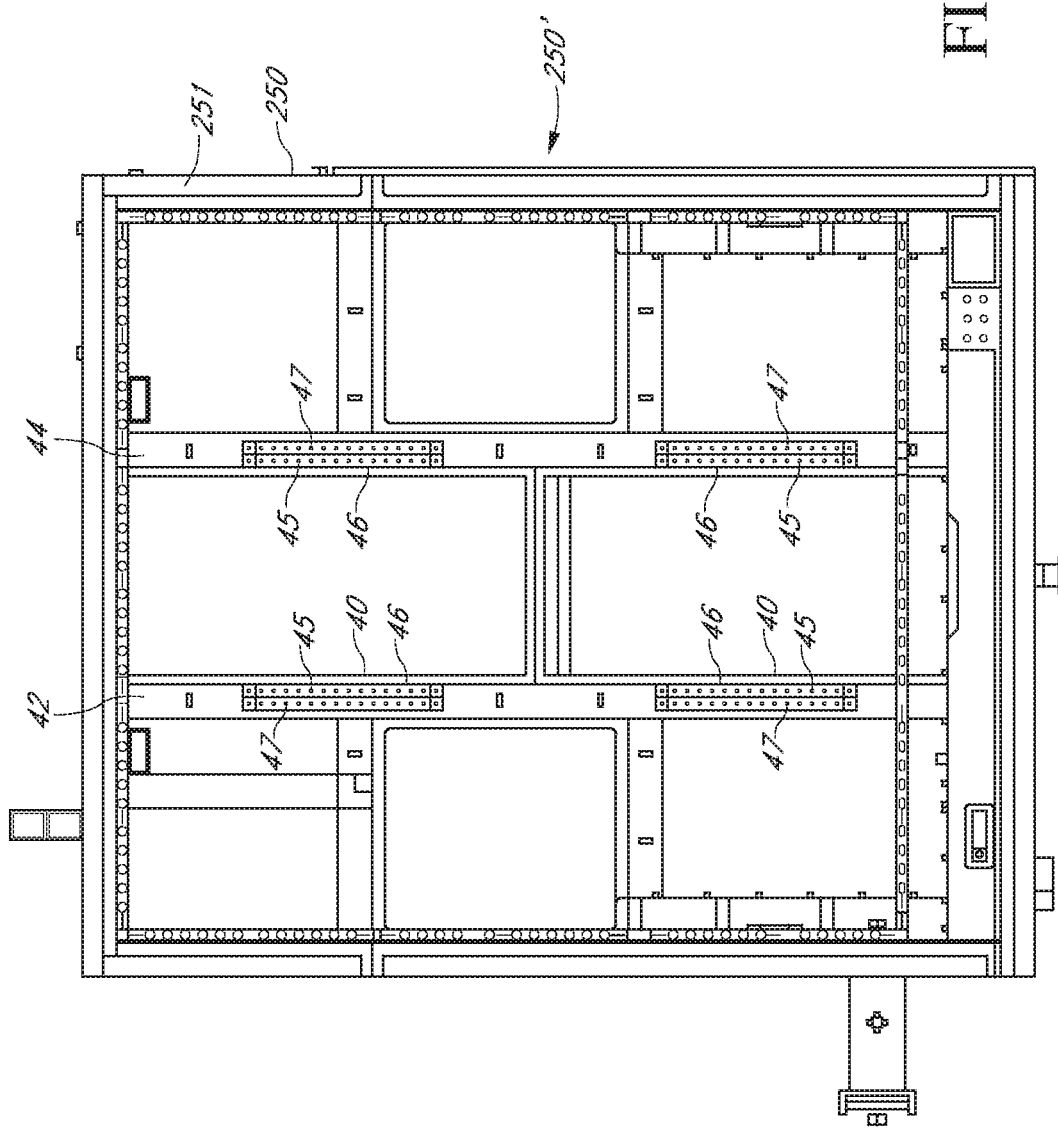
FIG. 8 is a view of a ceiling including a lighting system for various embodiments of a gas enclosure system in accordance with the present teachings.

FIG. 8 is a bottom view of various embodiments of a ceiling panel of the present teaching, for example, such as ceiling panel 250' of gas enclosure assembly 100 of FIG. 1A. According to various embodiments of the present teachings for the assembly of a gas enclosure, lighting can be installed on the interior top surface of a ceiling panel, such as ceiling panel 250' of gas enclosure assembly 100 of FIG. 1A. As depicted in FIG. 8, ceiling frame 250, having interior portion 251, can have lighting installed on the interior portion of various frame members. For example, ceiling frame 250 can have two ceiling frame sections 40, which have in common two ceiling frame beams 42 and 44. Each ceiling frame section 40 can have a first side 41, positioned towards the interior of ceiling frame 250, and a second side 43, positioned towards the exterior of ceiling frame 250. For various embodiments according to the present teaching of providing lighting for a gas enclosure, pairs of lighting elements 46 can be installed. Each pair of lighting elements 46 can include a first lighting element 45, proximal to first side 41 and second lighting element 47 proximal to second side 43 of a ceiling frame section 40. The number, positioning, and grouping of lighting elements shown in FIG. 8 are exemplary. The number and grouping of lighting elements can be varied in any desired or suitable manner. In various embodiments, the lighting elements can be mounted flat, while in other embodiments that can be mounted so that they can be moved to a variety of positions and angles. The placement of lighting elements is not limited to the top panel ceiling 433 but can located, in addition or in the alternative, on any other interior surface, exterior surface, and combination of surfaces of gas enclosure assembly 100 shown in FIG. 1A.

Figure 9:
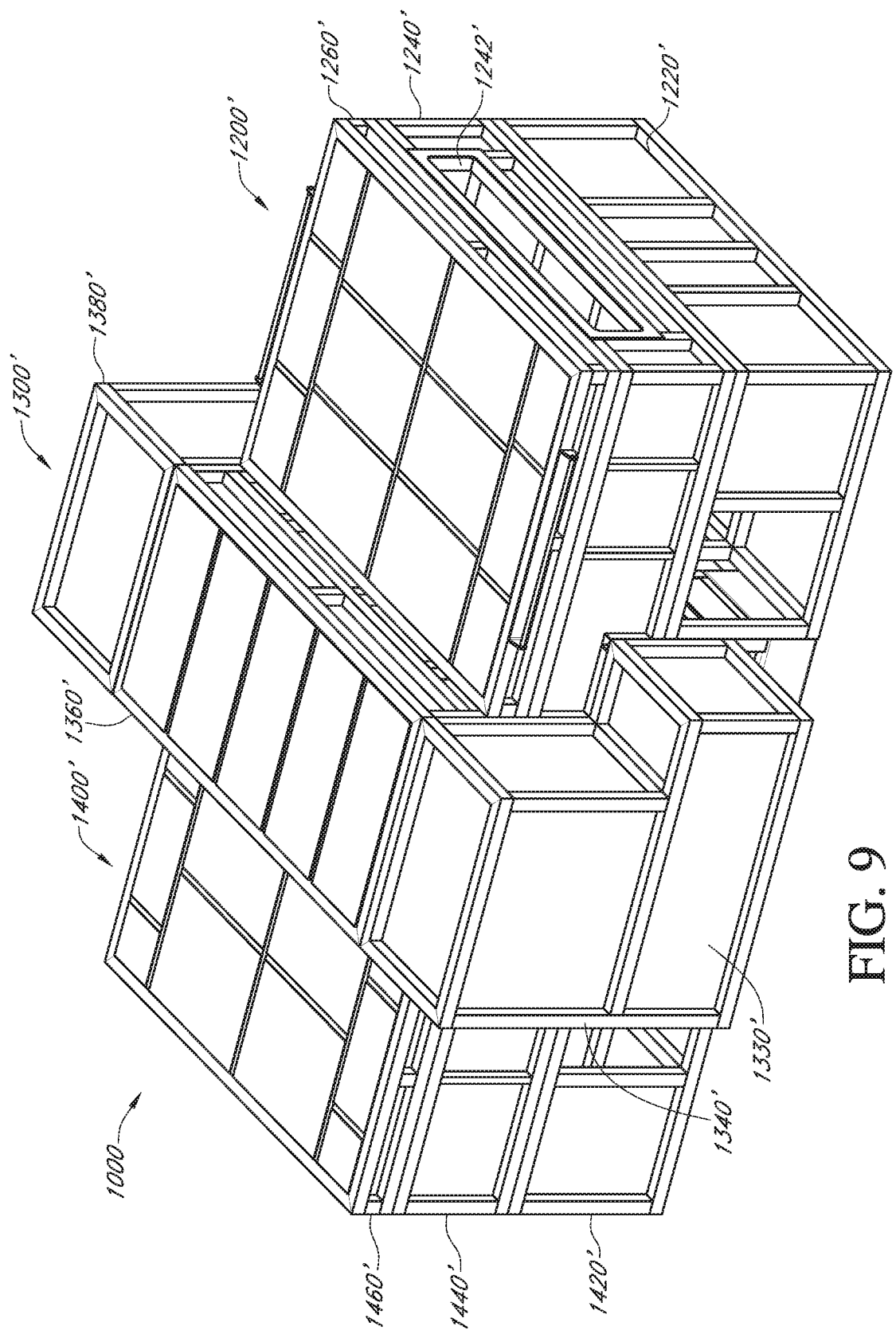
FIG. 9 is a front perspective view of view of a gas enclosure assembly in accordance with various embodiments of the present teachings.

The various lighting elements can comprise any number, type, or combination of lights, for example, halogen lights, white lights, incandescent lights, arc lamps, or light emitting diodes or devices (LEDs). For example, each lighting element can comprise from 1 LED to about 100 LEDs, from about 10 LEDs to about 50 LEDs, or greater than 100 LEDs. LED or other lighting devices can emit any color or combination of colors in the color spectrum, outside the color spectrum, or a combination thereof. According to various embodiments of a gas enclosure assembly used for inkjet printing of OLED materials, as some materials are sensitive to some wavelengths of light, a wavelength of light for lighting devices installed in a gas enclosure assembly can be specifically selected to avoid material degradation during processing. For example, a 4X cool white LED can be used as can a 4X yellow LED or any combination thereof. An example of a 4X cool white LED is an LF1 B-D4S-2THWW4 available from IDEC Corporation of Sunnyvale, Ca. An example of a 4X yellow LED that can be used is an LF1B-D4S-2SHY6 also available from IDEC Corporation. LEDs or other lighting elements can be positioned or hung from any position on interior portion 251 of ceiling frame 250 or on another surface of a gas enclosure assembly. Lighting elements are not limited to LEDs. Any suitable lighting element or combination of lighting elements can be used. FIG. 9 is a graph of an IDEC LED light spectra and shows the X-axis corresponding to intensity when peak intensity is 100% and the Y-axis corresponding to wavelength in nanometers. Spectra for LF1 B yellow type, a yellow fluorescent lamp, a LF1 B white type LED, a LF1 B cool white type LED, and an LF1 B red type LED are shown. Other light spectra and combinations of light spectra can be used in accordance with various embodiments of the present teachings.

Recalling, various embodiments of a gas enclosure assembly be constructed in a fashion minimizes the internal volume of a gas enclosure assembly, and at the same time optimizes the working space to accommodate various footprints of various OLED printing systems. Various embodiments of a gas enclosure assembly so constructed additionally provide ready access to the interior of a gas enclosure assembly from the exterior during processing and readily access to the interior for maintenance, while minimizing downtime. In that regard, various embodiments of a gas enclosure assembly according to the present teachings can be contoured with respect to various footprints of various OLED printing systems.

According to systems and methods of the present teachings, frame member construction, panel construction, frame and panel sealing, as well as construction of a gas enclosure, such as gas enclosure 100 of FIG. 1A, can be applied to a gas enclosure of a variety of sizes and designs. Various embodiments of a gas enclosure assembly can have various frame members that are constructed to provide contour for a gas enclosure assembly. Various embodiments of a gas enclosure assembly of the present teachings can accommodate an OLED printing system, while optimizing the working space to minimize inert gas volume, and also allowing ready access to an OLED printing system from the exterior during processing. In that regard, various gas enclosure assemblies of the present teachings can vary in contoured topology and volume. As a non-limiting example, various embodiments of a contoured gas enclosure according to the present teachings can have a gas enclosure volume of between about 6 m$^3$ to about 95 m$^3$ for housing various embodiments of a printing system capable of printing substrate sizes from Gen 3.5 to Gen 10. By way a further non-limiting example, various embodiments of a contoured gas enclosure according to the present teachings can have a gas enclosure volume of between about 15 m$^3$ to about 30 m$^3$ for housing various embodiments of a printing system capable of printing, for example, Gen 5.5 to Gen 8.5 substrate sizes. Such embodiments of a contoured gas enclosure can be between about 30% to about 70% savings in volume in comparison to a non-contoured enclosure having non-contoured dimensions for width, length and height.

Gas enclosure assembly 1000 of FIG. 9 can have all the features recited in the present teachings for exemplary gas enclosure assembly 100 of FIG. 1A. For example, but not limited by, gas enclosure assembly 1000 can utilize the sealing according to the present teachings that provide an hermetic-sealed enclosure through cycles of construction and deconstruction. Various embodiments of a gas enclosure system based on gas enclosure assembly 1000 can have a gas purification system that can maintain levels for each species of various reactive species, including various reactive atmospheric gases, such as water vapor and oxygen, as well as organic solvent vapors at 100 ppm or lower, for example, at 10 ppm or lower, at 1.0 ppm or lower, or at 0.1 ppm or lower.

Additionally, as will be discussed in more detail subsequently herein, various embodiments of a gas enclosure system based on, for example, but not limited by, gas enclosure assembly 100 of FIG. 1A and gas enclosure assembly 1000 of FIG. 9 can have a circulation and filtration system that can provide a laminar flow environment that can minimize turbulence and can create a substantially low particle environment by maintaining airborne particulate levels meeting the standards of International Standards Organization Standard (ISO) 14644-1:1999, as specified by Class 1 through Class 5. A determination of airborne particulate matter can be performed for various embodiments of a gas enclosure system before a printing process for system validation, using, for example, a portable particle counting device. In various embodiments of a gas enclosure system, a determination of airborne particulate matter can be performed as an ongoing quality check in situ while a substrate is printed. For various embodiments of a gas enclosure system, a determination of airborne particulate matter can be performed for system validation before a substrate is printed and additionally in situ while a substrate is printed.

Additionally, for various embodiments of a gas enclosure system of the present teachings, a substantially low-particle environment can provide for a substantially low-particle substrate surface. Modeling based on various embodiments of gas enclosure systems of the present teachings suggests that without various particle control systems of the present teachings, on-substrate deposition per print cycle per square meter of substrate can be between more than about 1 million to more than about 10 million particles for particles in a size range of 0.1 μm and greater. Such calculations suggest that without various particle control systems of the present teachings, on-substrate deposition per print cycle per square meter of substrate can be between more than about 1000 to about more than about 10,000 particles for particles in a size range of about 2 μm and greater. A determination of an on-substrate distribution of particulate matter on a substrate can be performed for various embodiments of a gas enclosure system before a substrate is printed for system validation, using, for example, a test substrate. In various embodiments of a gas enclosure system, a determination of an on-substrate distribution of particulate matter can be performed as an ongoing quality check in situ while a substrate is printed. For various embodiments of a gas enclosure system, a determination of an on-substrate distribution of particulate matter can be performed for system validation before a substrate is printed and additionally in situ while a substrate is printed.

Various embodiments of a gas enclosure system can have a particle control system that can maintain a substantially low-particle environment providing for an on-substrate particle specification for particles of between about 0.1 μm or greater to about 10 μm or greater. Various embodiments of an on-substrate particle specification can be readily converted from an average on-substrate particle distribution per square meter of substrate per minute to an average on-substrate particle distribution per substrate per minute for each of a target particle size range. As previously discussed herein, such a conversion can be readily done through a known relationship between substrates, for example, of a specific generation-sized substrate and the corresponding area for that substrate generation. Additionally, an average on-substrate particle distribution per square meter of substrate per minute can be readily converted to any of a variety of unit time expressions. For example, in addition to conversions between standard units of time; e.g. seconds, minutes, and days, units of time specifically relating to processing can be used. For example, as previously discussed herein, a print cycle can be associated with a unit of time.

Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 10 μm in size. Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 5 μm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 2 μm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 1 μm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.5 μm in size. For various embodiments of a gas enclosure system of the present teachings, a low-particle environment can be maintained providing for an average on-substrate particle distribution that meets an on-substrate deposition rate specification of less than or equal to about 1000 particles per square meter of substrate per minute for particles greater than or equal to 0.3 μm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.1 μm in size.

FIG. 9 depicts a perspective view gas enclosure assembly 1000 in accordance with various embodiments of a gas enclosure assembly of the present teachings. Gas enclosure assembly 1000 can include front panel assembly 1200', middle panel assembly 1300' and rear panel assembly 1400'. Front panel assembly 1200' can include front ceiling panel assembly 1260', front wall panel assembly 1240', which can have opening 1242 for receiving a substrate, and front base panel assembly 1220'. Rear panel assembly 1400' can include rear ceiling panel assembly 1460', rear wall panel assembly 1440' and rear base panel assembly 1420'. Middle panel assembly 1300' can include first middle enclosure panel assembly 1340', middle wall and ceiling panel assembly 1360' and second middle enclosure panel assembly 1380', as well as middle base panel assembly 1320'.

Additionally, middle panel assembly 1300' can include first printhead management system auxiliary panel assembly 1330', as well as a second printhead management system auxiliary panel assembly (not shown). As previously discussed herein, various embodiments of an auxiliary enclosure constructed as a section of a gas enclosure assembly can be sealably isolated from the working volume of a gas enclosure system. Such physical isolation of an auxiliary enclosure from, for example, a printing system enclosure, can enable various procedures, for example, but not limited by, various maintenance procedures on a printhead assembly, to be conducted with little or no interruption of a printing process, thereby minimizing or eliminating gas enclosure system downtime.

Figure 10A:
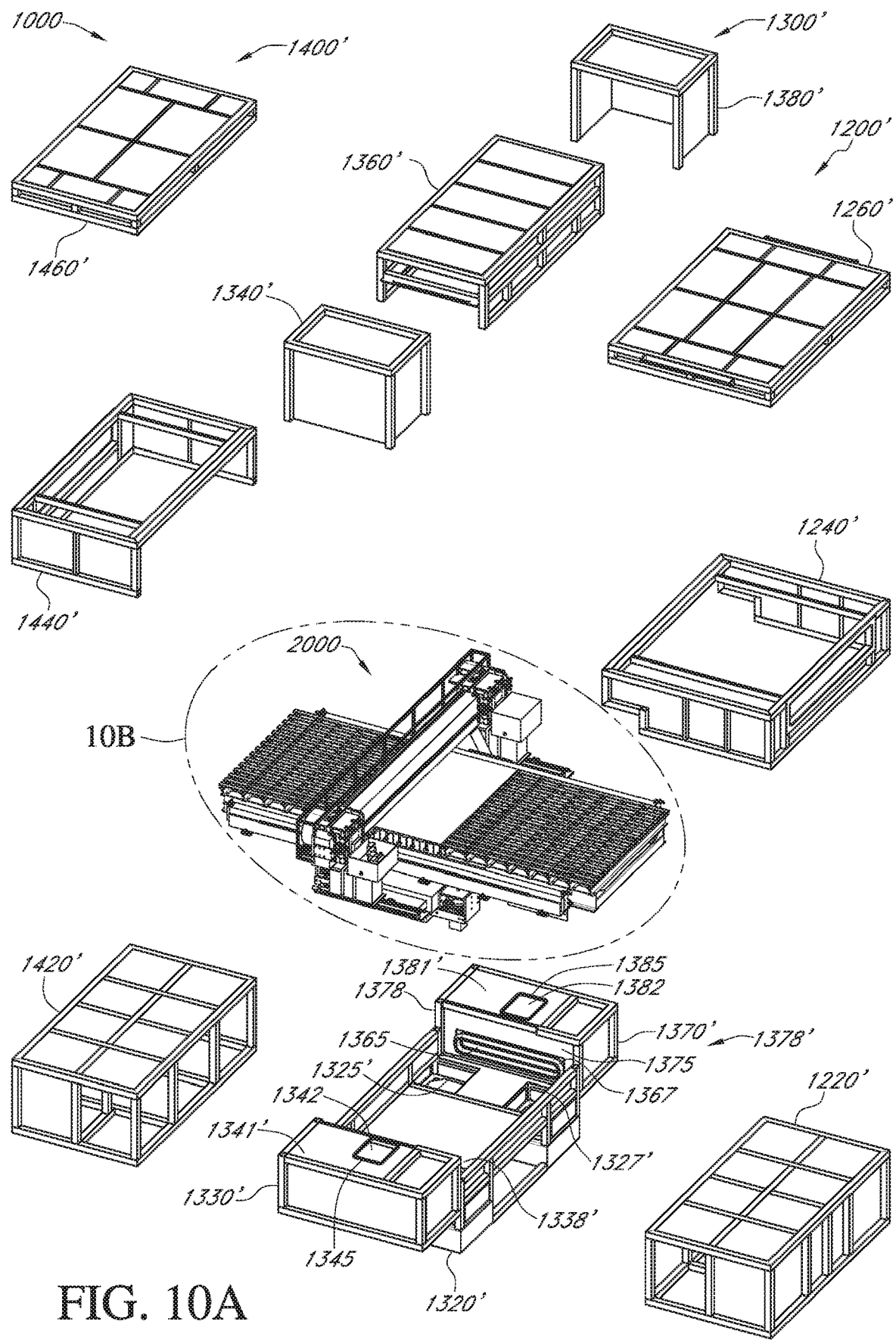
FIG. 10A depicts an exploded view of various embodiments of a gas enclosure assembly as depicted in FIG. 9 and related printing in accordance with various embodiments of the present teachings.

As depicted in FIG. 10A, gas enclosure assembly 1000 can include front base panel assembly 1220', middle base panel assembly 1320', and rear base panel assembly 1420', which when fully-constructed form a contiguous base or pan on which OLED printing system 2000 can be mounted. In a similar fashion as described for gas enclosure assembly 100 of FIG. 1A, the various frame members and panels comprising front panel assembly 1200', middle panel assembly 1300', and rear panel assembly 1400' of gas enclosure assembly 1000 can be joined around OLED printing system 2000 to form a printing system enclosure. Accordingly, a fully constructed gas enclosure assembly, such as gas enclosure assembly 1000, when integrated with various environmental control systems can form various embodiments of a gas enclosure system including various embodiments of OLED printing system 2000. According to various embodiments of a gas enclosure system of the present teachings as previously described, environmental control of an interior volume defined by a gas enclosure assembly can include control of lighting, for example, by the number and placement of lights of a specific wavelength, control of particulate matter using various embodiments of a particle control system, control of reactive gas species using various embodiments of a gas purification system, and temperature control of a gas enclosure assembly using various embodiments of a thermal control system.

Figure 10B:
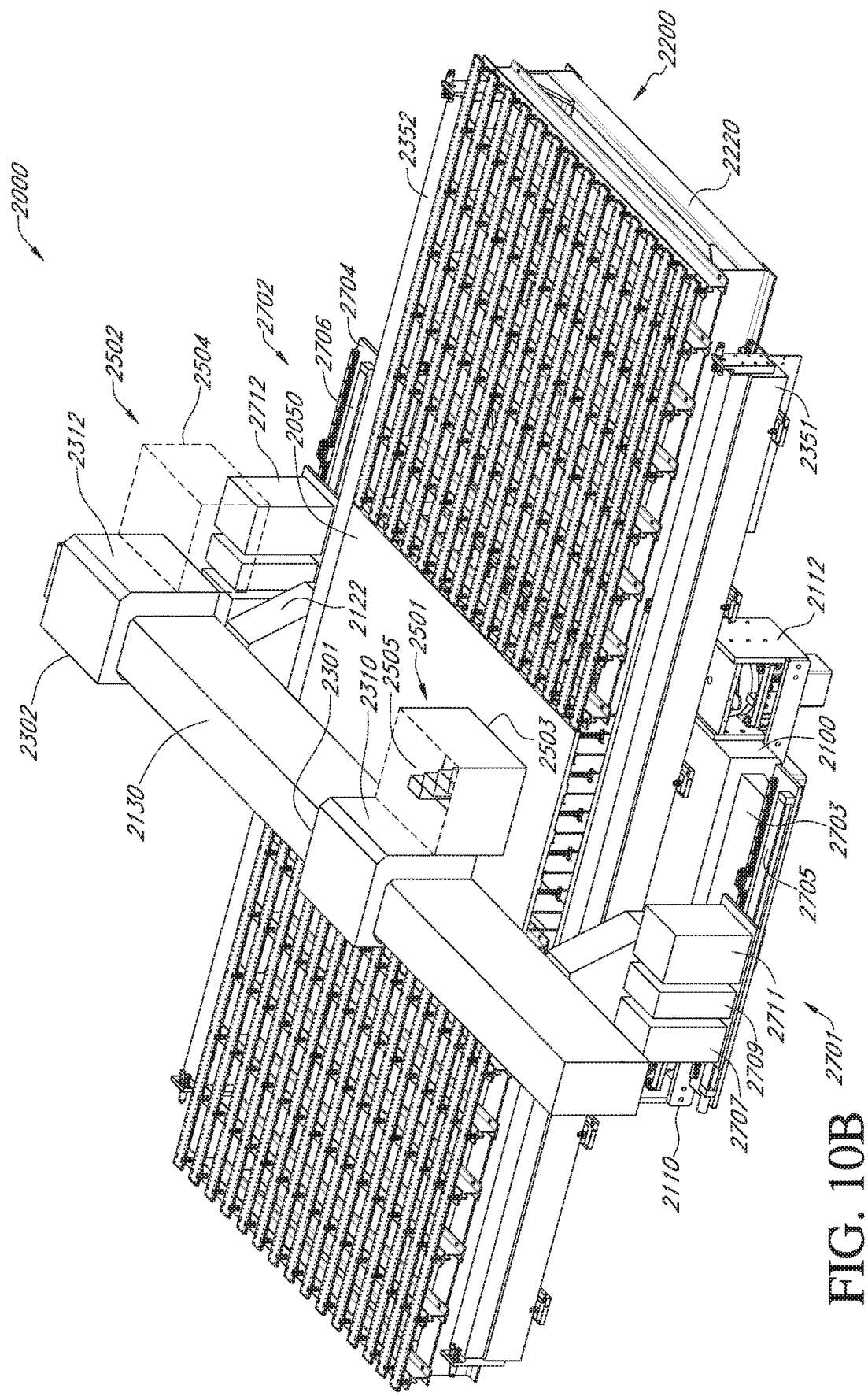
FIG. 10B depicts an expanded iso perspective view of the printing system depicted in FIG. 10A.

An OLED inkjet printing system, such as OLED printing system 2000 of FIG. 10A, shown in expanded view in FIG. 10B, can be comprised of several devices and apparatuses, which allow the reliable placement of ink drops onto specific locations on a substrate. These devices and apparatuses can include, but are not limited to, a printhead assembly, ink delivery system, a motion system for providing relative motion between a printhead assembly and a substrate, substrate support apparatus, substrate loading and unloading system, and printhead management system.

A printhead assembly can include at least one inkjet head, with at least one orifice capable of ejecting droplets of ink at a controlled rate, velocity, and size. The inkjet head is fed by an ink supply system which provides ink to the inkjet head. As shown in an expanded view of FIG. 10B, OLED inkjet printing system 2000 can have a substrate, such as substrate 2050, which can be supported by a substrate support apparatus, such as a chuck, for example, but not limited by, a vacuum chuck, a substrate floatation chuck having pressure ports, and a substrate floatation chuck having vacuum and pressure ports. In various embodiments of systems and methods of the present teachings, a substrate support apparatus can be a substrate floatation table. As will be discussed in more detail subsequently herein, substrate floatation table 2200 of FIG. 10B can be used for supporting substrate 2050, and in conjunction with a Y-axis motion system, can be part of a substrate conveyance system providing for the frictionless conveyance of substrate 2050. A Y-axis motion system of the present teachings can include first Y-axis track 2351 and second Y-axis track 2352, which can include a gripper system (not shown) for holding a substrate. Y-axis motion can be provided by either a linear air bearing or linear mechanical system. Substrate floatation table 2200 of OLED inkjet printing system 2000 shown in FIG. 10A and FIG. 10B can define the travel of substrate 2050 through gas enclosure assembly 1000 of FIG. 9 during a printing process.

Printing requires relative motion between the printhead assembly and the substrate. This is accomplished with a motion system, typically a gantry or split axis XYZ system. Either the printhead assembly can move over a stationary substrate (gantry style), or both the printhead and substrate can move, in the case of a split axis configuration. In another embodiment, a printhead assembly can be substantially stationary; for example, in the X and Y axes, and the substrate can move in the X and Y axes relative to the printheads, with Z axis motion provided either by a substrate support apparatus or by a Z-axis motion system associated with a printhead assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. A printhead management system can be comprised of several subsystems which allow for such measurement tasks, such as the checking for nozzle firing, as well as the measurement of drop volume, velocity and trajectory from every nozzle in a printhead, and maintenance tasks, such as wiping or blotting the inkjet nozzle surface of excess ink, priming and purging a printhead by ejecting ink from an ink supply through the printhead and into a waste basin, and replacement of printheads. Given the variety of components that can comprise an OLED printing system, various embodiments of OLED printing system can have a variety of footprints and form factors.

With respect to FIG. 10B, printing system base 2100, can include first riser (not visible) and second riser 2122, upon which bridge 2130 is mounted. For various embodiments of OLED printing system 2000, bridge 2130 can support first X-axis carriage assembly 2301 and second X-axis carriage assembly 2302, which can control the movement of first printhead assembly 2501 and second printhead assembly 2502, respectively across bridge 2130. For various embodiments of printing system 2000, first X-axis carriage assembly 2301 and second X-axis carriage assembly 2302 can utilize a linear air bearing motion system, which are intrinsically low-particle generating. According to various embodiments of a printing system of the present teachings, an X-axis carriage can have a Z-axis moving plate mounted thereupon. In FIG. 10B, first X-axis carriage assembly 2301 is depicted with first Z-axis moving plate 2310, while second X-axis carriage assembly 2302 is depicted with second Z-axis moving plate 2312. Though FIG. 10B depicts two carriage assemblies and two printhead assemblies, for various embodiments of OLED inkjet printing system 2000, there can be a single carriage assembly and a single printhead assembly. For example, either of first printhead assembly 2501 and second printhead assembly 2502 can be mounted on an X,Z-axis carriage assembly, while a camera system for inspecting features of substrate 2050 can be mounted on a second X,Z-axis carriage assembly. Various embodiments of OLED inkjet printing system 2000 can have a single printhead assembly, for example, either of first printhead assembly 2501 and second printhead assembly 2502 can be mounted on an X,Z-axis carriage assembly, while a UV lamp for curing an encapsulation layer printed on substrate 2050 can be mounted on a second X,Z-axis carriage assembly. For various embodiments of OLED inkjet printing system 2000, there can be a single printhead assembly, for example, either of first printhead assembly 2501 and second printhead assembly 2502, mounted on an X,Z-axis carriage assembly, while a heat source for curing an encapsulation layer printed on substrate 2050 can be mounted on a second carriage assembly.

In FIG. 10B, first X,Z-axis carriage assembly 2301 can be used to position first printhead assembly 2501, which can be mounted on first Z-axis moving plate 2310, over substrate 2050, which is shown supported on substrate floatation table 2200. Second X,Z-axis carriage assembly 2302 with second Z-axis moving plate 2312 can be similarly configured for controlling the X-Z axis movement of second printhead assembly 2502 relative to substrate 2050. Each printhead assembly, such as first printhead assembly 2501 and second printhead assembly 2502 of FIG. 10B, can have a plurality of printheads mounted in at least one printhead device, as depicted in partial view for first printhead assembly 2501, which depicts a plurality of printhead 2505. A printhead device can include, for example, but not limited by, fluidic and electronic connections to at least one printhead; each printhead having a plurality of nozzles or orifices capable of ejecting ink at a controlled rate, velocity and size. For various embodiments of printing system 2000, a printhead assembly can include between about 1 to about 60 printhead devices, where each printhead device can have between about 1 to about 30 printheads in each printhead device. A printhead, for example, an industrial inkjet head, can have between about 16 to about 2048 nozzles, which can expel a droplet volume of between about 0.1 pL to about 200 pL.

According to various embodiments of a gas enclosure system of the present teachings, given the sheer number of printhead devices and printheads, first printhead management system 2701 and second printhead management system 2702 can be housed in an auxiliary enclosure, which can be isolated from a printing system enclosure during a printing process for performing various measurement and maintenance tasks with little or no interruption to the printing process. As can be seen in FIG. 10B, first printhead assembly 2501 can be seen positioned relative to first printhead management system 2701 for ready performance of various measurement and maintenance procedures that can be performed by first printhead management system apparatuses 2707, 2709 and 2711. Apparatuses 2707, 2709, and 2011 can be any of a variety of subsystems or modules for performing various printhead management functions. For example apparatuses 2707, 2709, and 2011 can be any of a drop measurement module, a printhead replacement module, a purge basin module, and a blotter module.

Figure 10C:
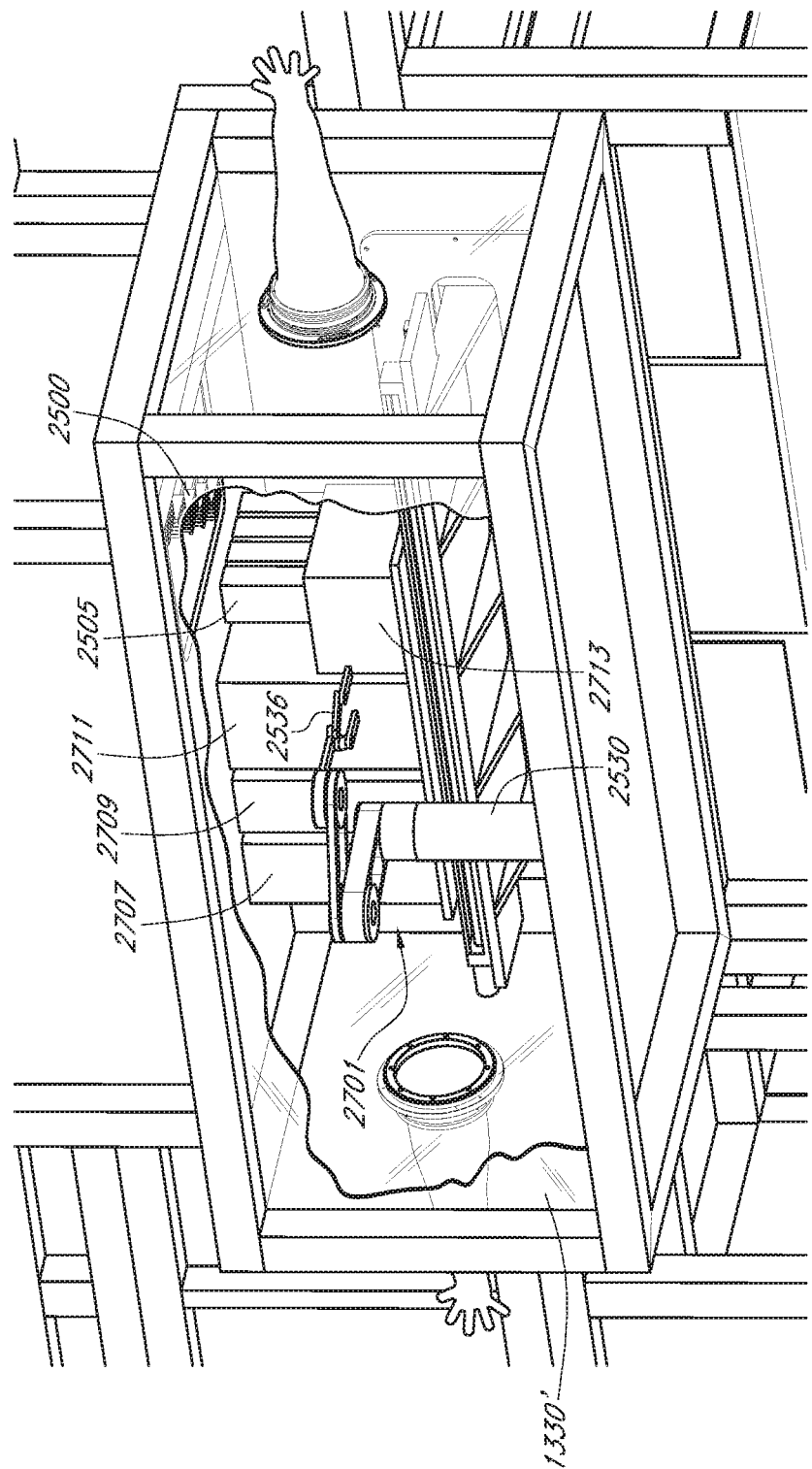
FIG. 10C shows an expanded iso perspective view of an auxiliary enclosure depicted in FIG. 10A.

FIG. 10C depicts an expanded view of first printhead management system 2701 housed within first printhead management system auxiliary panel assembly 1330' in accordance with various embodiments of a gas enclosure assembly and system of the present teachings. As depicted in FIG. 10C, auxiliary panel assembly 1330' is shown as a cut-away view to more clearly see the details of first printhead management system 2701. Various embodiments of a printhead management system according to the present teachings, such as first printhead management system 2701 of FIG. 10C, apparatuses 2707, 2709, and 2011 can be a variety of subsystems or modules for performing various functions. For example apparatuses 2707, 2709, and 2011 can be a drop measurement module, a printhead purge basin module and a blotter module. As depicted in FIG. 10C, printhead replacement module 2713 can provide locations for docking at least one printhead device 2505. In various embodiments of first printhead management system 2701, first printhead management system auxiliary panel assembly 1330' can be maintained to the same environmental specifications that gas enclosure assembly 1000 (see FIG. 19) is maintained. First printhead management system auxiliary panel assembly 1330' can have handler 2530 positioned for the carrying out tasks associated with various printhead management procedures. For example, each subsystem can have various parts that are consumable by nature, and require replacement, such as replacing blotter paper, ink, and waste reservoirs. Various consumable parts can be packaged for ready insertion, for example, in a fully automated mode using a handler. As a non-limiting example, blotter paper can be packaged in a cartridge format, which can be readily inserted for use into a blotting module. By way of another non-limiting example ink can be packaged in a replaceable reservoir, as well as a cartridge format for use in a printing system. Various embodiments of a waste reservoir can be packaged in a cartridge format, which can be readily inserted for use into a purge basin module. Additionally, parts of various components of a printing system subject to on-going use can require periodic replacement. During a printing process, expedient management of a printhead assembly, for example, but not limited by, an exchange of a printhead device or printhead, can be desirable. A printhead replacement module can have parts, such as a printhead device or printhead, which can be readily inserted for use into a printhead assembly. A drop measurement module used for checking for nozzle firing, as well as the measurement based on optical detection of drop volume, velocity and trajectory from every nozzle can have a source and a detector, which can require periodic replacement after use. Various consumable and high-usage parts can be packaged for ready insertion, for example, in a fully automated mode using a handler. Handler 2530 can have end effector 2536 mounted to arm 2534. Various embodiments of an end effector configuration can be used, for example, a blade-type end effector, a clamp-type end effector, and a gripper-type end effector. Various embodiments of an end effector can include mechanical grasping and clamping, as well as pneumatic or vacuum-assisted assemblies to either actuate portions of the end effector or otherwise retain a printhead device or a printhead from a printhead device.

Regarding the replacement of a printhead device or printhead, printhead replacement module 2713 of printhead management system 2701 FIG. 10C can include a docking station for a printhead device having at least one printhead, as well as a storage receptacle for a printhead. As each printhead assembly (see FIG. 10B) can include between about 1 to about 60 printhead devices, and as each printhead device can have between about 1 to about 30 printheads, then various embodiments of a printing system of the present teachings can have between about 1 to about 1800 printheads. In various embodiments of printhead replacement module 2713, while a printhead device is docked, each printhead mounted to the printhead device can be maintained in an operable condition while not in use in a printing system. For example, when placed in a docking station, each printhead on each printhead device can be connected to an ink supply and an electrical connection. Electrical power can be provided to each printhead on each printhead device, so that a periodic firing pulse to each nozzle of each printhead can be applied while docked in order to ensure that the nozzles remain primed and do not clog. Handler 2530 of FIG. 10C can be positioned proximal to printhead assembly 2500. Printhead assembly 2500 can be docked over first printhead management system auxiliary panel assembly 1330', as depicted in FIG. 10C. During a procedure for exchanging a printhead, handler 2530 can remove a target part; either a printhead or printhead device having at least one printhead, from printhead assembly 2500. Handler 2530 can retrieve a replacement part, such as a printhead device or a printhead, from printhead replacement module 2713, and complete the replacement process. The removed part can be placed in printhead replacement module 2713 for retrieval.

With respect to various embodiments of a gas enclosure assembly having an auxiliary enclosure that can be closed off from, as well as sealably isolated from a first working volume, for example, a printing system enclosure, reference is made again to FIG. 10A. As depicted in FIG. 10B, there can be four isolators on OLED printing system 2000; first isolator set 2110 (second not shown on opposing side) and second isolator set 2112 (second not shown on opposing side), which support substrate floatation table 2200 of OLED printing system 2000. For gas enclosure assembly 1000 of FIG. 10A, first isolator set 2110 and second isolator set 2112 can be mounted in each of a respective isolator well panel, such as first isolator wall panel 1325' and second isolator wall panel 1327' of middle base panel assembly 1320'.For gas enclosure assembly 1000 of FIG. 10A, middle base assembly 1320' can include first printhead management system auxiliary panel assembly 1330', as well as second printhead management system auxiliary panel assembly 1370'. FIG. 10A of gas enclosure assembly 1000 depicts first printhead management system auxiliary panel assembly 1330' that can include first back wall panel assembly 1338'. Similarly, also depicted is second printhead management system auxiliary panel assembly 1370' that can include second back wall panel assembly 1378'. First back wall panel assembly 1338' of first printhead management system auxiliary panel assembly 1330' can be constructed in a similar fashion as shown for second back wall panel assembly 1378'. Second back wall panel assembly 1378' of second printhead management system auxiliary panel assembly 1370' can be constructed from second back wall frame assembly 1378 having second seal-support panel 1375 sealably mounted to second back wall frame assembly 1378. Second seal-support panel 1375 can have second passage 1365, which is proximal to a second end of base 2100 (not shown). Second seal 1367 can be mounted on second seal-support panel 1375 around second passage 1365. A first seal can be similarly positioned and mounted around a first passage for first printhead management system auxiliary panel assembly 1330'. Each passage in auxiliary panel assembly 1330' and auxiliary panel assembly 1370' can accommodate having each maintenance system platform, such as first and second maintenance system platforms 2703 and 2704 of FIG. 10B pass through the passages. As will be discussed in more detail subsequently herein, in order to sealably isolate auxiliary panel assembly 1330' and auxiliary panel assembly 1370' the passages, such as second passage 1365 of FIG. 10A must be sealable. It is contemplated that various seals, such as an inflatable seal, a bellows seal and a lip seal can be used for sealing a passage, such as second passage 1365 of FIG. 10A, around a maintenance platform affixed to a printing system base.

First printhead management system auxiliary panel assembly 1330' and second printhead management system auxiliary panel assembly 1370' can include first printhead assembly opening 1342 of first floor panel assembly 1341' and second printhead assembly opening 1382 of second floor panel assembly 1381'; respectively. First floor panel assembly 1341' is depicted in FIG. 10A as part of first middle enclosure panel assembly 1340' of middle panel assembly 1300'. First floor panel assembly 1341' is a panel assembly in common with both first middle enclosure panel assembly 1340' and first printhead management system auxiliary panel assembly 1330'. Second floor panel assembly 1381' is depicted in FIG. 10A as part of second middle enclosure panel assembly 1380' of middle panel assembly 1300'. Second floor panel assembly 1381' is a panel assembly in common with both second middle enclosure panel assembly 1380' and second printhead management system auxiliary panel assembly 1370'.

As previously discussed herein, first printhead assembly 2501 can be housed in first printhead assembly enclosure 2503, and second printhead assembly 2502 can be housed in second printhead assembly enclosure 2504. According to systems and methods of the present teachings, first printhead assembly enclosure 2503 and second printhead assembly enclosure 2504 can have an opening at the bottom that can have a rim (not shown), so that various printhead assemblies can be positioned for printing during a printing process. Additionally, the portions of first printhead assembly enclosure 2503 and second printhead assembly enclosure 2504 forming a housing can be constructed as previously described for various panel assemblies, so that the frame assembly members and panels are capable of providing an hermetically-sealed enclosure.

A compressible gasket, such as previously described for the hermetic sealing of various frame members, can be affixed around each of first printhead assembly opening 1342 and second printhead assembly opening 1382, or alternatively around the rim of first printhead assembly enclosure 2503 and second printhead assembly enclosure 2504.

As depicted in FIG. 10A, first printhead assembly docking gasket 1345 and second printhead assembly docking gasket 1385 can be affixed around first printhead assembly opening 1342 and second printhead assembly opening 1382, respectively. During various printhead measurement and maintenance procedures, first printhead assembly 2501 and second printhead assembly 2502 can be positioned by first X,Z-axis carriage assembly 2301 and second X,Z-axis carriage assembly 2302, respectively, over first printhead assembly opening 1342 of first floor panel assembly 1341' and second printhead assembly opening 1382 of second floor panel assembly 1381', respectively. In that regard, for various printhead measurement and maintenance procedures, first printhead assembly 2501 and second printhead assembly 2502 can be positioned over first printhead assembly opening 1342 of first floor panel assembly 1341' and second printhead assembly opening 1382 of second floor panel assembly 1381', respectively, without covering or sealing first printhead assembly opening 1342 and second printhead assembly opening 1382. First X,Z-axis carriage assembly 2301 and second X,Z-axis carriage assembly 2302 can dock first printhead assembly enclosure 2503 and second printhead assembly enclosure 2504, respectively, with first printhead management system auxiliary panel assembly 1330' and second printhead management system auxiliary panel assembly 1370', respectively. In various printhead measurement and maintenance procedures, such docking may effectively close first printhead assembly opening 1342 and second printhead assembly opening 1382 without the need for sealing first printhead assembly opening 1342 and second printhead assembly opening 1382. For various printhead measurement and maintenance procedures, the docking can include the formation of a gasket seal between each of the printhead assembly enclosures and the printhead management system panel assemblies. In conjunction with sealably closing passages, such as second passage 1365 and a complementary first passage of FIG. 10A, when first printhead assembly enclosure 2503 and second printhead assembly enclosure 2504 are docked with first printhead management system auxiliary panel assembly 1330' and second printhead management system auxiliary panel assembly 1370' to sealably close first printhead assembly opening 1342 and second printhead assembly opening 1382, the combined structures so formed are hermetically sealed.

Additionally, according to the present teachings, an auxiliary enclosure can be isolated from, for example, another interior enclosure volume, such as the printing system enclosure, as well as the exterior of a gas enclosure assembly, by using a structural closure to sealably close a passageway, such as first printhead assembly opening 1342 and second printhead assembly opening 1382 of FIG. 10A.

According to the present teachings, a structural closure can include a variety of sealable coverings for an opening or passageway; such opening or passageway including non-limiting examples of an enclosure panel opening or passageway. According to systems and methods of the present teachings, a gate can be any structural closure that can be used to reversibly cover or reversibly sealably close any opening or passageway using pneumatic, hydraulic, electrical, or manual actuation. As such, first printhead assembly opening 1342 and second printhead assembly opening 1382 of FIG. 10A can be reversibly covered or reversibly sealably closed using a gate.

In the expanded view of OLED printing system 2000 of FIG. 10B, various embodiments of a printing system can include substrate floatation table 2200, supported by substrate floatation table base 2220. Substrate floatation table base 2220 can be mounted on printing system base 2100. Substrate floatation table 2200 of OLED printing system can support substrate 2050, as well as defining the travel over which substrate 2050 can be moved through gas enclosure assembly 1000 during the printing of an OLED substrate. A Y-axis motion system of the present teachings can include first Y-axis track 2351 and second Y-axis track 2352, which can include a gripper system (not shown) for holding a substrate. Y-axis motion can be provided by either a linear air bearing or linear mechanical system. In that regard, in conjunction with a motion system; as depicted in FIG. 10B, a Y-axis motion system, substrate floatation table 2200 can provide frictionless conveyance of substrate 2050 through a printing system.

Figure 11:
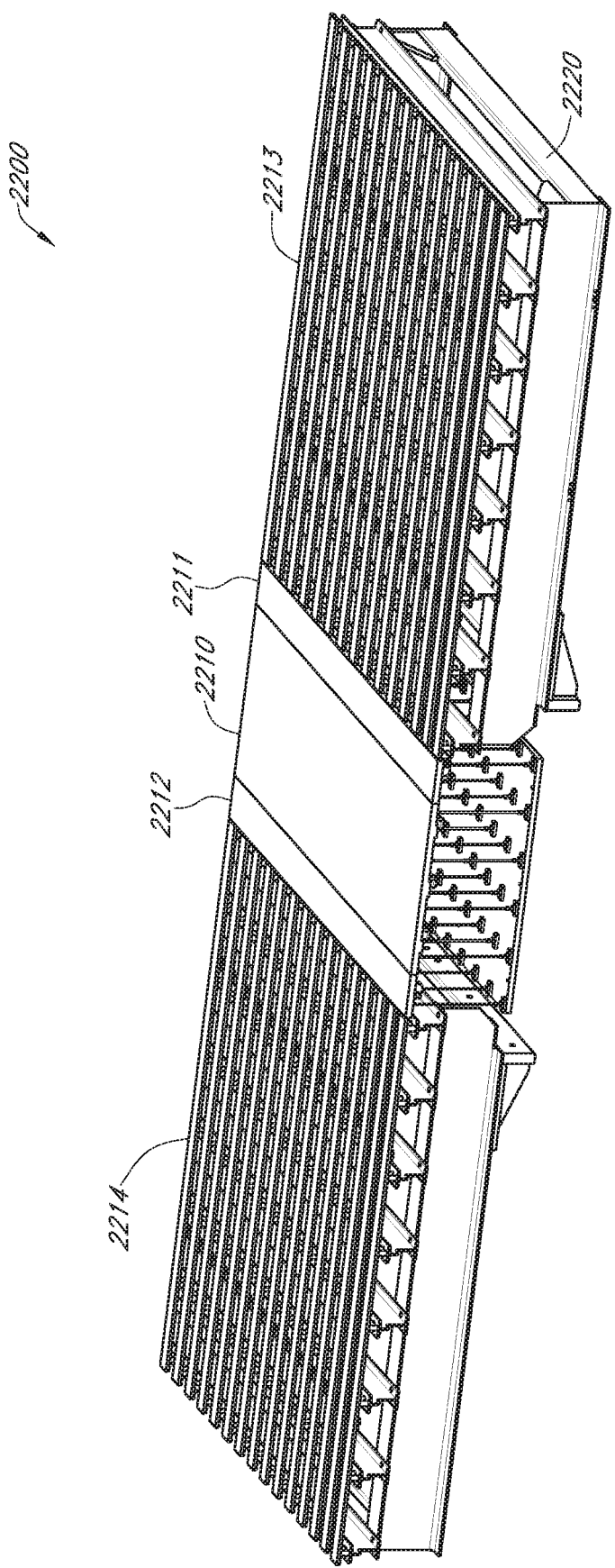
FIG. 11 depicts a perspective view of a floatation table according to various embodiments of the present teachings.

FIG. 11 depicts a floatation table according to various embodiments of the present teachings for the frictionless support, and in conjunction with a conveyance system, the stable conveyance of a load, such as substrate 2050 of FIG. 10B. Various embodiments of a floatation table can be used in any of the various embodiments of a gas enclosure system of the present teachings. As previously discussed herein, various embodiments of a gas enclosure system of the present teachings can process a range of sizes of OLED flat panel display substrates from smaller than a Gen 3.5 substrate, which has dimensions of about 61 cm×72 cm, as well as the progression of larger generation sizes. It is contemplated that various embodiments of gas enclosure system can process substrate sizes of Gen 5.5, having dimensions of about 130 cm×150 cm, as well as a Gen 7.5 substrate, having dimensions of about 195 cm×225 cm, and can be cut into eight 42" or six 47" flat panels per substrate and larger. A Gen 8.5 substrate is approximately 220 cm×250 cm, and can be cut to six 55" or eight 46" flat panels per substrate. However, substrate generation sizes keep advancing, so that a currently-available Gen 10 substrate, having dimensions of about 285 cm×305 cm, does not appear to be the ultimate generation of substrate sizes. Additionally, sizes recited from the terminology arising from the use of glass-based substrates can be applied to substrates of any material suitable for use in OLED printing. For various embodiments of an OLED inkjet printing system, a variety of substrate materials can be used for substrate 2050, for example, but not limited by, a variety of glass substrate materials, as well as a variety of polymeric substrate materials. Accordingly, there are a variety of substrate sizes and materials requiring stable conveyance during printing in various embodiments of gas enclosure systems of the present teachings.

As depicted if FIG. 11, substrate floatation table 2200 according to various embodiments of the present teachings can have floatation table base 2220 for supporting a plurality of floatation table zones. Substrate floatation table 2200 can have zone 2210 in which both pressure and vacuum can be applied through a plurality of ports. Such a zone having both pressure and vacuum control can effectively provide a fluidic spring between zone 2210 and a substrate (not shown). Zone 2210 having both pressure and vacuum control is a fluidic spring with bidirectional stiffness. The gap that exits between a load and a floatation table surface is referred to as the fly height. A zone such as zone 2210 of substrate floatation table 2200 of FIG. 11, in which a fluidic spring having bidirectional stiffness is created using a plurality of pressure and vacuum ports, can provide a controllable fly height for a load, such as a substrate.

Proximal to zone 2210 are first and second transition zones; 2211 and 2212, respectively, and then proximal first and second transition zones 2211 and 2212 are pressure-only zones, 2213 and 2214, respectively. In the transition zones, the ratio of pressure to vacuum nozzles increases gradually towards the pressure only zones to provide for a gradual transition from zone 2210 to zones 2213 and 2214. For various embodiments of a substrate floatation table, for example, as depicted in FIG. 11, pressure-only zones 2213, 2214 are depicted as comprised of rail structures. For various embodiments of a substrate floatation table, pressure only zones, such as pressure-only zones 2213, 2214 of FIG. 11, can be comprised of a continuous plate, such as that depicted for pressure-vacuum zone 2210 of FIG. 11.

For various embodiments of a floatation table as depicted in FIG. 11, there can be essentially uniform height between the pressure-vacuum zone, the transition zone, and the pressure only zone, so that within tolerances, the three zones lie essentially in one plane and can vary in length. For example, but not limited by, in order to provide a sense of scale and proportion, for various embodiments of a floatation table of the present teachings, a transition zone can be about 400 mm, while the pressure-only zone can be about 2.5 m, and the pressure-vacuum zone can be about 800 mm. In FIG. 11, the pressure-only zones 2213 and 2214 do not provide a fluidic spring having bidirectional stiffness, and therefore do not provide the control that zone 2210 can provide. Accordingly, the fly height of a load can be typically greater over pressure-only zones than the fly height of a substrate over a pressure-vacuum zone, in order to allow enough height so that a load will not collide with a floatation table in the pressure-only zones. For example, but not limited by, it can be desirable for processing an OLED panel substrate to have a fly height of between about 150µ to about 300µ above pressure-only zones, such as zones 2213 and 2214, and then between about 30µ to about 50µ above a pressure-vacuum zone, such as zone 2210.

Various embodiments of a gas enclosure system of the present teachings can utilize a variety of devices, apparatuses and systems in addition a gas circulation and filtration system for maintaining a controlled gas enclosure environment. For example, in addition to a gas circulation and filtration system for providing a thorough and complete turnover of gas in the interior of a gas enclosure, a thermal regulation system utilizing a plurality of heat exchangers can be provided to maintain a desired temperature in the interior of a gas enclosure. For example, a plurality of heat exchangers can be provided operating with, adjacent to, or used in conjunction with, a fan or another gas circulating device. A gas purification loop can be configured to circulate gas from within the interior of a gas enclosure assembly through at least one gas purification component exterior the enclosure. In that regard, a circulation and filtration system internal a gas enclosure assembly in conjunction with a gas purification loop external a gas enclosure assembly can provide continuous circulation of a substantially low-particulate inert gas having substantially low levels of reactive species throughout a gas enclosure system. According to the present teachings, an inert gas may be any gas that does not undergo a chemical reaction under a defined set of conditions. Some commonly used non-limiting examples of an inert gas can include nitrogen, any of the noble gases, and any combination thereof. Various embodiments of a gas enclosure system having a gas purification system can be configured to maintain very low levels of undesired components, for example, organic solvents and vapors thereof, as well as water, water vapor, oxygen, and the like. Such embodiments of a gas enclosure system can maintain levels for each species of various reactive species, including various reactive atmospheric gases, such as water vapor and oxygen, as well as organic solvent vapors at 100 ppm or lower, for example, at 10 ppm or lower, at 1.0 ppm or lower, or at 0.1 ppm or lower.

Figure 12:
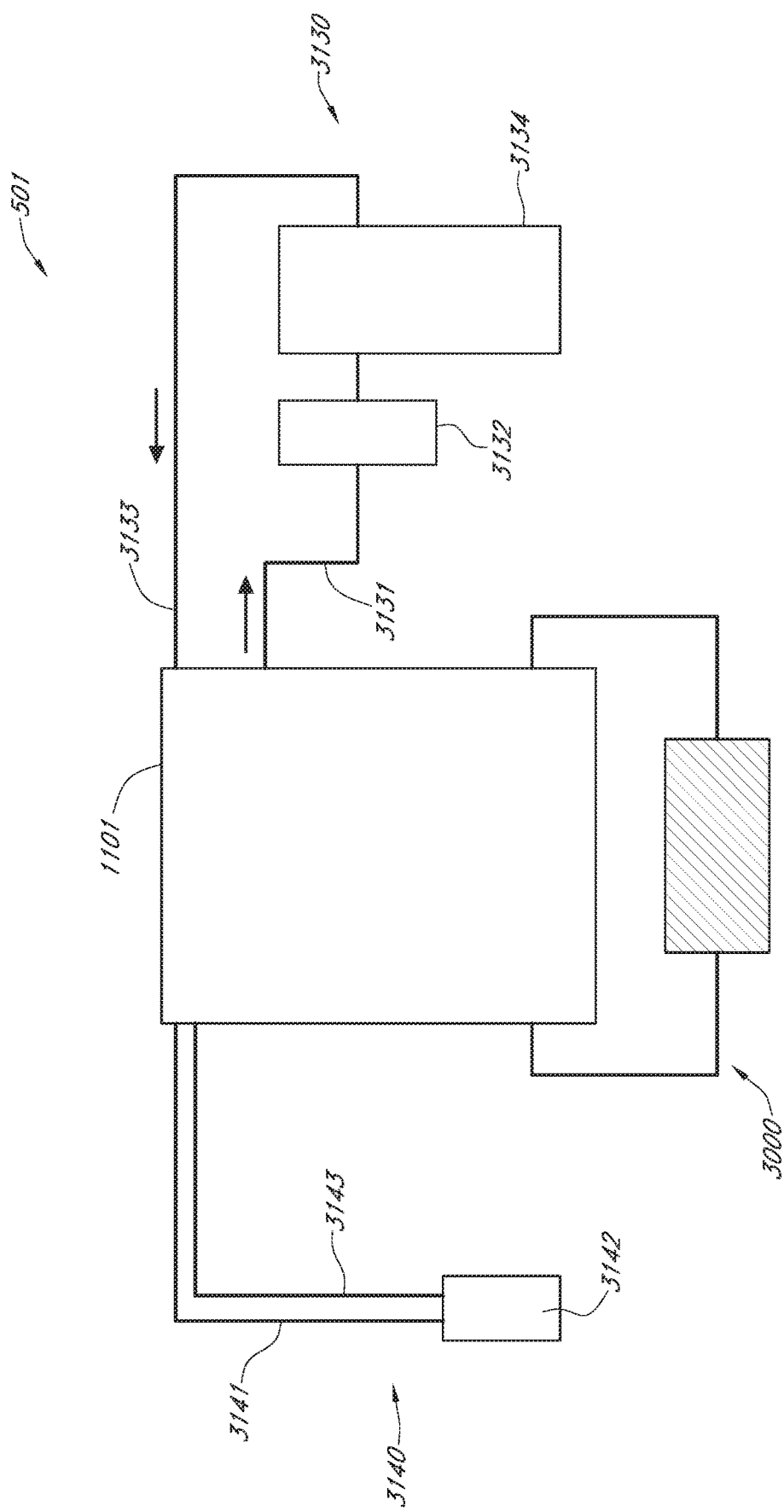
FIG. 12 is a schematic view of various embodiments of gas enclosure assembly and related system components the present teachings.

FIG. 12 is a schematic diagram showing a gas enclosure system 501. Various embodiments of a gas enclosure system 501 according to the present teachings can comprise gas enclosure assembly 1101 for housing a printing system, gas purification loop 3130 in fluid communication gas enclosure assembly 1101, and at least one thermal regulation system 3140. Additionally, various embodiments of gas enclosure system 501 can have pressurized inert gas recirculation system 3000, which can supply inert gas for operating various devices, such as a substrate floatation table for an OLED printing system. Various embodiments of a pressurized inert gas recirculation system 3000 can utilize a compressor, a blower and combinations of the two as sources for various embodiments of pressurized inert gas recirculation system 3000, as will be discussed in more detail subsequently herein. Additionally, gas enclosure system 501 can have a circulation and filtration system internal to gas enclosure system 501 (not shown).

As depicted in FIG. 12, for various embodiments of a gas enclosure assembly according to the present teachings, the design of the ductwork can separate the inert gas circulated through gas purification loop 3130 from the inert gas that is continuously filtered and circulated internally for various embodiments of a gas enclosure assembly. Gas purification loop 3130 includes outlet line 3131 from gas enclosure assembly 1101, to a solvent removal component 3132 and then to gas purification system 3134. Inert gas purified of solvent and other reactive gas species, such as oxygen and water vapor, are then returned to gas enclosure assembly 1101 through inlet line 3133. Gas purification loop 3130 may also include appropriate conduits and connections, and sensors, for example, oxygen, water vapor and solvent vapor sensors. A gas circulating unit, such as a fan, blower or motor and the like, can be separately provided or integrated, for example, in gas purification system 3134, to circulate gas through gas purification loop 3130. According to various embodiments of a gas enclosure assembly, though solvent removal system 3132 and gas purification system 3134 are shown as separate units in the schematic shown in FIG. 12, solvent removal system 3132 and gas purification system 3134 can be housed together as a single purification unit.

Gas purification loop 3130 of FIG. 12 can have solvent removal system 3132 placed upstream of gas purification system 3134, so that inert gas circulated from gas enclosure assembly 1101 passes through solvent removal system 3132 via outlet line 3131. According to various embodiments, solvent removal system 3132 may be a solvent trapping system based on adsorbing solvent vapor from an inert gas passing through solvent removal system 3132 of FIG. 12. A bed or beds of a sorbent, for example, but not limited by, such as activated charcoal, molecular sieves, and the like, may effectively remove a wide variety of organic solvent vapors. For various embodiments of a gas enclosure system cold trap technology may be employed to remove solvent vapors in solvent removal system 3132. As previously discussed herein, for various embodiments of a gas enclosure system according to the present teachings, sensors, such as oxygen, water vapor and solvent vapor sensors, may be used to monitor the effective removal of such species from inert gas continuously circulating through a gas enclosure system, such as gas enclosure system 501 of FIG. 12. Various embodiments of a solvent removal system can indicate when sorbent, such as activated carbon, molecular sieves, and the like, has reached capacity, so that the bed or beds of sorbent can be regenerated or replaced. Regeneration of a molecular sieve can involve heating the molecular sieve, contacting the molecular sieve with a forming gas, a combination thereof, and the like. Molecular sieves configured to trap various species, including oxygen, water vapor, and solvents, can be regenerated by heating and exposure to a forming gas that comprises hydrogen, for example, a forming gas comprising about 96% nitrogen and 4% hydrogen, with said percentages being by volume or by weight. Physical regeneration of activated charcoal can be done using a similar procedure of heating under an inert environment.

Any suitable gas purification system can be used for gas purification system 3134 of gas purification loop 3130 of FIG. 12. Gas purification systems available, for example, from MBRAUN Inc., of Statham, N.H., or Innovative Technology of Amesbury, Mass., may be useful for integration into various embodiments of a gas enclosure assembly according to the present teachings. Gas purification system 3134 can be used to purify one or more inert gases in gas enclosure system 501, for example, to purify the entire gas atmosphere within a gas enclosure assembly. As previously discussed herein, in order to circulate gas through gas purification loop 3130, gas purification system 3134 can have a gas circulating unit, such as a fan, blower or motor, and the like. In that regard, a gas purification system can be selected depending on the volume of the enclosure, which can define a volumetric flow rate for moving an inert gas through a gas purification system. For various embodiments of gas enclosure system having a gas enclosure assembly with a volume of up to about 4 $m^3$; a gas purification system that can move about 84 $m^3/h$ can be used. For various embodiments of gas enclosure system having a gas enclosure assembly with a volume of up to about 10 $m^3$; a gas purification system that can move about 155 $m^3/h$ can be used. For various embodiments of a gas enclosure assembly having a volume of between about 52-114 $m^3$, more than one gas purification system may be used.

Any suitable gas filters or purifying devices can be included in the gas purification system 3134 of the present teachings. In some embodiments, a gas purification system can comprise two parallel purifying devices, such that one of the devices can be taken off line for maintenance and the other device can be used to continue system operation without interruption. In some embodiments, for example, the gas purification system can comprise one or more molecular sieves. In some embodiments, the gas purification system can comprise at least a first molecular sieve, and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously discussed herein, molecular sieves may be regenerated and reused.

Thermal regulation system 3140 of FIG. 12 can include at least one chiller 3142, which can have fluid outlet line 3141 for circulating a coolant into a gas enclosure assembly, and fluid inlet line 3143 for returning the coolant to the chiller. An at least one fluid chiller 3142 can be provided for cooling the gas atmosphere within gas enclosure system 501. For various embodiments of a gas enclosure system of the present teachings, fluid chiller 3142 delivers cooled fluid to heat exchangers within the enclosure, where inert gas is passed over a filtration system internal the enclosure. At least one fluid chiller can also be provided with gas enclosure system 501 to cool heat evolving from an apparatus enclosed within gas enclosure system 501. For example, but not limited by, at least one fluid chiller can also be provided for gas enclosure system 501 to cool heat evolving from an OLED printing system. Thermal regulation system 3140 can comprise heat-exchange or Peltier devices and can have various cooling capacities. For example, for various embodiments of a gas enclosure system, a chiller can provide a cooling capacity of from between about 2 kW to about 20 kW. Various embodiments of a gas enclosure system can have a plurality of fluid chillers that can chill one or more fluids. In some embodiments, the fluid chillers can utilize a number of fluids as coolant, for example, but not limited by, water, anti-freeze, a refrigerant, and a combination thereof as a heat exchange fluid. Appropriate leak-free, locking connections can be used in connecting the associated conduits and system components.

As previously discussed herein, the present teachings disclose various embodiments of a gas enclosure system that can include a printing system enclosure defining a first volume and an auxiliary enclosure defining a second volume. Various embodiments of a gas enclosure system can have an auxiliary enclosure that can be sealably constructed as a section of gas enclosure assembly. According to systems and methods of the present teachings, an auxiliary enclosure can be sealable isolated from a printing system enclosure, and can be opened to an environment external a gas enclosure assembly without exposing a printing system enclosure to the external environment. Such physical isolation of an auxiliary enclosure to perform, for example, but not limited by, various printhead management procedures, can be done to eliminate or minimize the exposure of a printing system enclosure to contamination, such as air and water vapor and various organic vapors, as well as particulate contamination. Various printhead management procedures that can include measurement and maintenance procedures on a printhead assembly can be done with little or no interruption of a printing process, thereby minimizing or eliminating gas enclosure system downtime.

For various embodiments of systems and methods of the present teachings, an auxiliary enclosure can be less than or equal to about 1% of the enclosure volume of a gas enclosure system. In various embodiments of systems and methods of the present teachings, an auxiliary enclosure can be can be less than or equal to about 2% of the enclosure volume of a gas enclosure system. For various embodiments of systems and methods of the present teachings, an auxiliary enclosure can be less than or equal to about 5% of the enclosure volume of a gas enclosure system. In various embodiments of systems and methods of the present teachings, an auxiliary enclosure can be less than or equal to about 10% of the enclosure volume of a gas enclosure system. In various embodiments of systems and methods of the present teachings, an auxiliary enclosure can be less than or equal to about 20% of the enclosure volume of a gas enclosure system. Should the opening of an auxiliary enclosure to an ambient environment containing reactive gases be indicated for performing, for example, a maintenance procedure, isolating an auxiliary enclosure from the working volume of a gas enclosure can prevent contamination of the entire volume of a gas enclosure. Further, given the relatively small volume of an auxiliary enclosure in comparison to the printing system enclosure portion of a gas enclosure, the recovery time for an auxiliary enclosure can take significantly less time than recovery time for an entire printing system enclosure.

For a gas enclosure system having a printing system enclosure defining a first volume and an auxiliary enclosure defining a second volume, both volumes can be readily integrated with gas circulation, filtration and purification components to form a gas enclosure system that can sustain an inert, substantially low-particle environment for processes requiring such an environment with little or no interruption of a printing process. According to various systems and methods of the present teachings, a printing system enclosure may be introduced to a level of contamination that is sufficiently low that a purification system can remove the contamination before it can affect a printing process. Various embodiments of an auxiliary enclosure can be a substantially smaller volume of the total volume of a gas enclosure assembly and can be readily integrated with gas circulation, filtration and purification components to form an auxiliary enclosure system that can rapidly recover an inert, of a low-particle environment after exposure to an external environment, thereby providing little or no interruption of a printing process.

According to systems and methods of the present teachings, various embodiments of a printing system enclosure and an auxiliary enclosure constructed as sections of a gas enclosure assembly can be constructed in a fashion to provide for separately-functioning frame member assembly sections. In addition to having all elements disclosed, by way of non-limiting examples, for gas enclosure systems 500 and 501, gas enclosure system 502 of FIG. 13, can have first gas enclosure assembly section 1101-S1 of gas enclosure assembly 1101 defining a first volume and second gas enclosure assembly section 1101-S2 of gas enclosure assembly 1101 defining a second volume. If all valves, $V_1$, $V_2$, $V_3$ and $V_4$ are opened, then gas purification loop 3130 operates essentially as previously described for gas enclosure assembly and system 1101 of FIG. 12. With closure of $V_3$ and $V_4$, only first gas enclosure assembly section 1101-S1 is in fluid communication with gas purification loop 3130. This valve state may be used, for example, but not limited by, when second gas enclosure assembly section 1101-S2 is sealably closed and thereby isolated from first gas enclosure assembly section 1101-S1 during various measurement and maintenances procedure requiring that second gas enclosure assembly section 1101-S2 be opened to the atmosphere. With closure of $V_1$ and $V_2$, only second gas enclosure assembly section 1101-S2 is in fluid communication with gas purification loop 3130. This valve state may be used, for example, but not limited by, during recovery of second gas enclosure assembly section 1101-S2 after the section has been opened to the atmosphere. As previously discussed herein for the present teachings related to FIG. 12, the requirements for gas purification loop 3130 are specified with respect to the total volume of gas enclosure assembly 1101. Therefore, by devoting the resources of a gas purification system to the recovery of a gas enclosure assembly section, such as second gas enclosure assembly section 1101-S2, which is depicted for gas enclosure system 502 of FIG. 13 to be significantly less in volume than the total volume of gas enclosure 1101, the recovery time can be substantially reduced.

Additionally, various embodiments of an auxiliary enclosure can be readily integrated with a dedicated set of environmental regulation system components, such as lighting, gas circulation and filtration, gas purification, and thermostating components. In that regard, various embodiments of a gas enclosure system that include an auxiliary enclosure that can be sealably isolated as a section of gas enclosure assembly can have a controlled environment that is set to be uniform with a first volume defined by a gas enclosure assembly housing a printing system. Further, various embodiments of a gas enclosure system including an auxiliary enclosure that can be sealably isolated as a section of gas enclosure assembly can have a controlled environment that is set to be different than the controlled environment of a first volume defined by a gas enclosure assembly housing a printing system.

Recalling, various embodiments of a gas enclosure assembly utilized in embodiments of a gas enclosure system of the present teachings can be constructed in a contoured fashion that minimizes the internal volume of a gas enclosure assembly, and at the same time optimizes the working volume for accommodating various footprints of OLED printing systems designs. For example, various embodiments of a contoured gas enclosure assembly according to the present teachings can have a gas enclosure volume of between about 6 m$^3$ to about 95 m$^3$ for various embodiments of a gas enclosure assembly of the present teachings covering, for example, substrate sizes from Gen 3.5 to Gen 10. Various embodiments of a contoured gas enclosure assembly according to the present teachings can have a gas enclosure volume of, for example, but not limited by, of between about 15 m$^3$ to about 30 m$^3$, which might be useful for OLED printing of, for example, Gen 5.5 to Gen 8.5 substrate sizes. Various embodiments of an auxiliary enclosure can be constructed as a section of gas enclosure assembly and readily integrated with gas circulation and filtration, as well as purification components to form a gas enclosure system that can sustain an inert, substantially low-particle environment for processes requiring such an environment.

Figure 13:
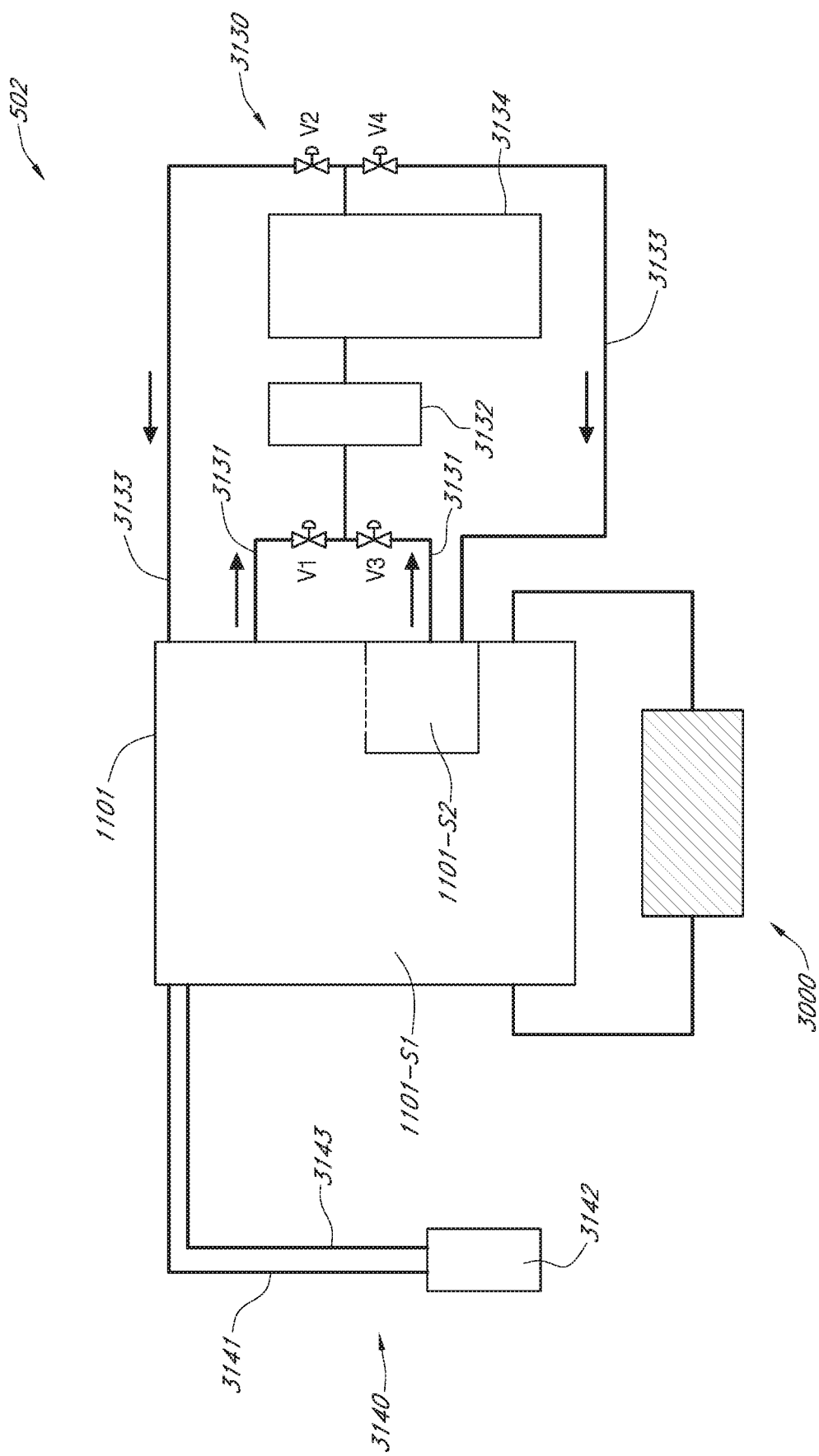
FIG. 13 is a schematic view of various embodiments of gas enclosure assembly and related system components the present teachings.

As shown in FIG. 12 and FIG. 13, various embodiments of a gas enclosure system can include a pressurized inert gas recirculation system 3000. Various embodiments of a pressurized inert gas recirculation loop can utilize a compressor, a blower and combinations thereof.

Figure 14:
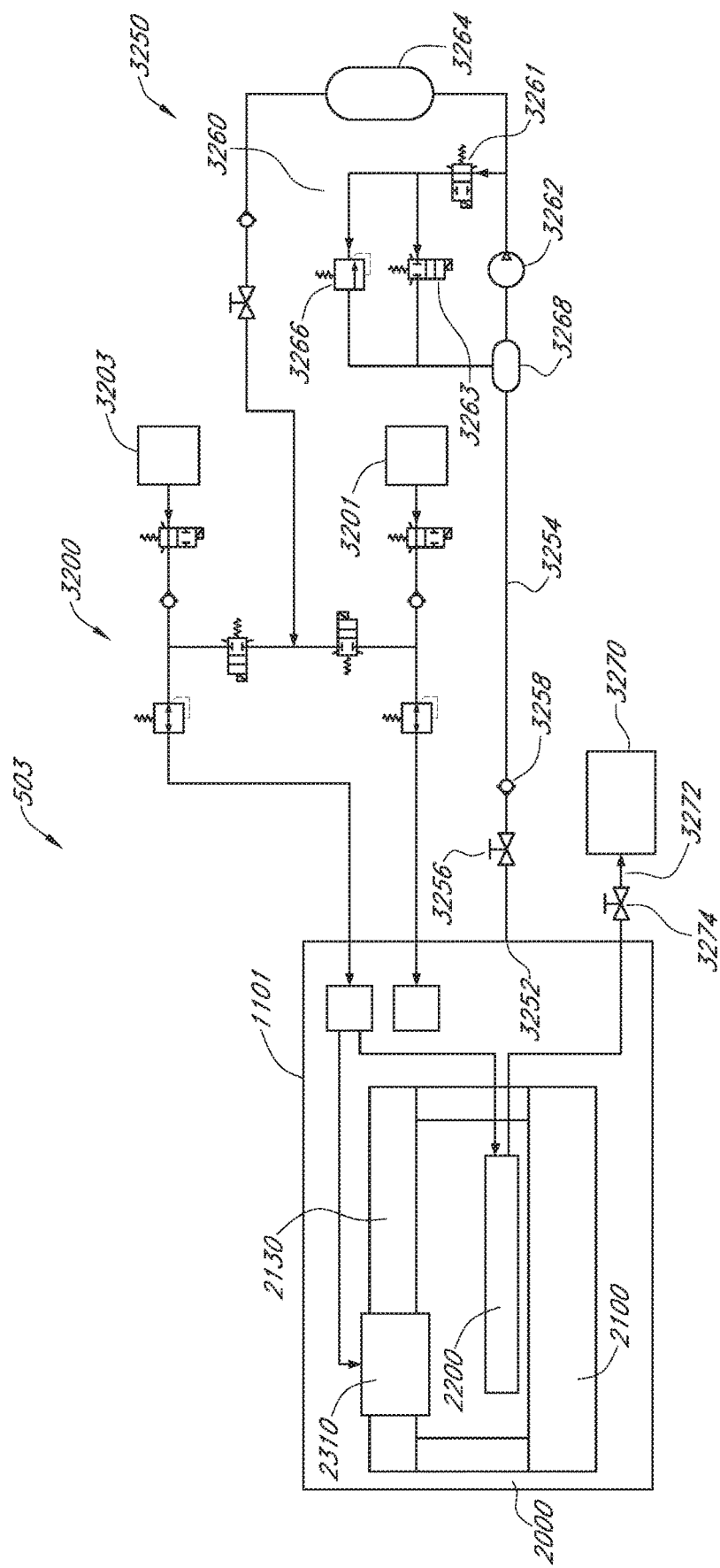
FIG. 14 is a schematic of a gas enclosure system in accordance with various embodiments of the present teachings.
Figure 15:
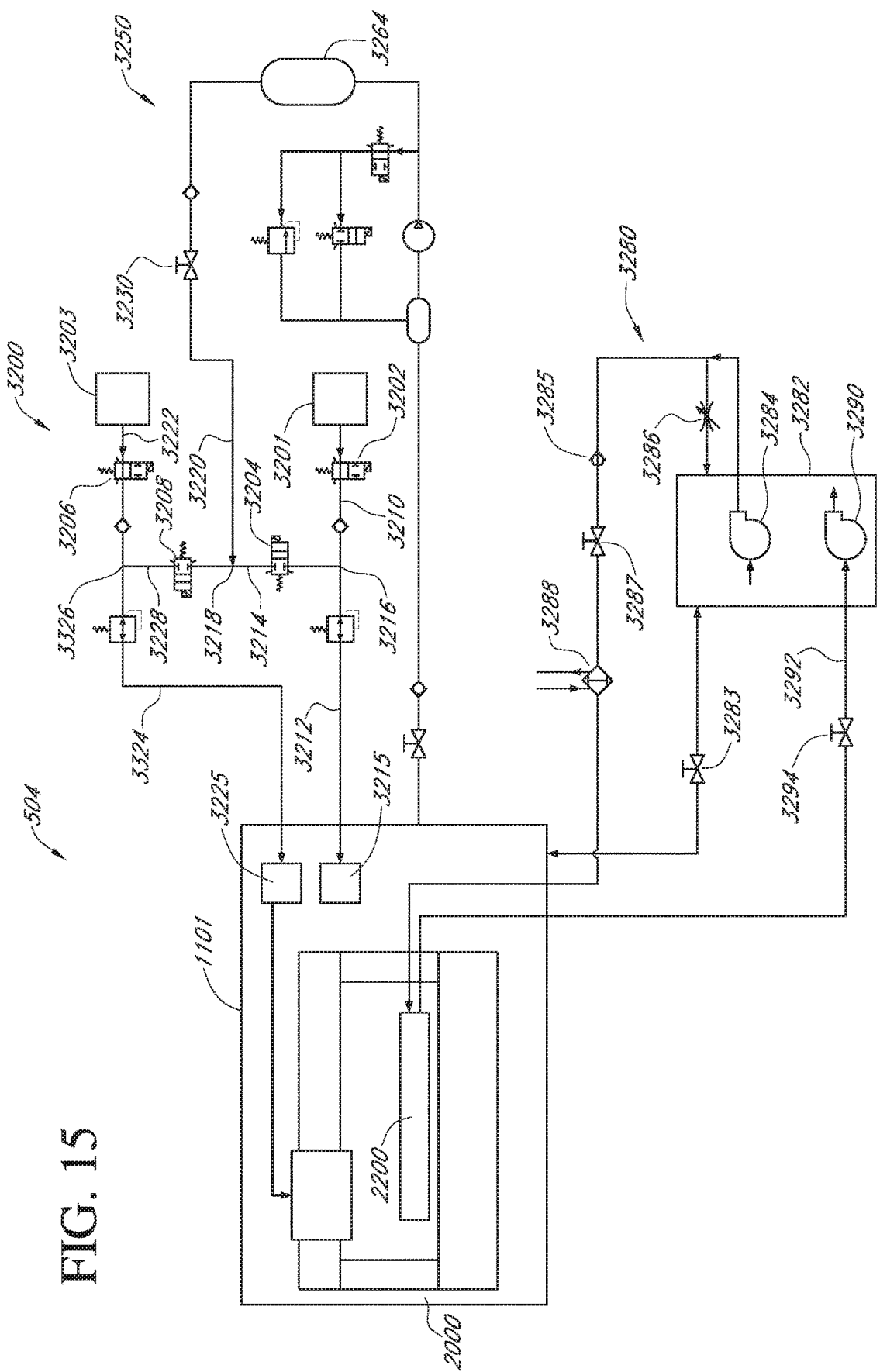
FIG. 15 is a schematic of a gas enclosure system in accordance with various embodiments of the present teachings.

For example, as shown in FIG. 14 and FIG. 15, various embodiments of gas enclosure system 503 and gas enclosure system 504 can have external gas loop 3200 for integrating and controlling inert gas source 3201 and clean dry air (CDA) source 3203 for use in various aspects of operation of gas enclosure system 503 and gas enclosure system 504. Gas enclosure system 503 and gas enclosure system 504 can also include various embodiments of an internal particle filtration and gas circulation system, as well as various embodiments of an external gas purification system, as previously described. Such embodiments of a gas enclosure system can include a gas purification system for purifying various reactive species from an inert gas. Some commonly used non-limiting examples of an inert gas can include nitrogen, any of the noble gases, and any combination thereof. Various embodiments of a gas purification system according to the present teachings can maintain levels for each species of various reactive species, including various reactive atmospheric gases, such as water vapor and oxygen, as well as organic solvent vapors at 100 ppm or lower, for example, at 10 ppm or lower, at 1.0 ppm or lower, or at 0.1 ppm or lower. In addition to external loop 3200 for integrating and controlling inert gas source 3201 and CDA source 3203, gas enclosure system 503 and gas enclosure system 504 can have compressor loop 3250, which can supply inert gas for operating various devices and apparatuses that can be disposed in the interior of gas enclosure system 503 and gas enclosure system 504.

Compressor loop 3250 of FIG. 14 can include compressor 3262, first accumulator 3264 and second accumulator 3268, which are configured to be in fluid communication. Compressor 3262 can be configured to compress inert gas withdrawn from gas enclosure assembly 1101 to a desired pressure. An inlet side of compressor loop 3250 can be in fluid communication with gas enclosure assembly 1101 via gas enclosure assembly outlet 3252 through line 3254, having valve 3256 and check valve 3258. Compressor loop 3250 can be in fluid communication with gas enclosure assembly 1101 on an outlet side of compressor loop 3250 via external gas loop 3200. Accumulator 3264 can be disposed between compressor 3262 and the junction of compressor loop 3250 with external gas loop 3200 and can be configured to generate a pressure of 5 psig or higher. Second accumulator 3268 can be in compressor loop 3250 for providing dampening fluctuations due to compressor piston cycling at about 60 Hz. For various embodiments of compressor loop 3250, first accumulator 3264 can have a capacity of between about 80 gallons to about 160 gallons, while second accumulator can have a capacity of between about 30 gallons to about 60 gallons. According to various embodiments of gas enclosure system 503, compressor 3262 can be a zero ingress compressor. Various types of zero ingress compressors can operate without leaking atmospheric gases into various embodiments of a gas enclosure system of the present teachings. Various embodiments of a zero ingress compressor can be run continuously, for example, during an OLED printing process utilizing the use of various devices and apparatuses requiring compressed inert gas.

Accumulator 3264 can be configured to receive and accumulate compressed inert gas from compressor 3262. Accumulator 3264 can supply the compressed inert gas as needed in gas enclosure assembly 1101. For example, accumulator 3264 can provide gas to maintain pressure for various components of gas enclosure assembly 1101, such as, but not limited by, one or more of a pneumatic robot, a substrate floatation table, an air bearing, an air bushing, a compressed gas tool, a pneumatic actuator, and combinations thereof. As shown in FIG. 14 for gas enclosure system 503, gas enclosure assembly 1101 can have an OLED printing system 2000 enclosed therein. As schematically depicted in FIG. 14, inkjet printing system 2000 can be supported by printing system base 2100, which can be a granite stage. Printing system base 2100 can support a substrate support apparatus, such as a chuck, for example, but not limited by, a vacuum chuck, a substrate floatation chuck having pressure ports, and a substrate floatation chuck having vacuum and pressure ports. In various embodiments of the present teachings, a substrate support apparatus can be a substrate floatation table, such as substrate floatation table 2200 indicated in FIG. 14. Substrate floatation table 2200 can be used for the frictionless support of a substrate. In addition to a low-particle generating floatation table, for frictionless Y-axis conveyance of a substrate, printing system 2000 can have a Y-axis motion system utilizing air bushings. Additionally, printing system 2000 can have at least one X,Z-axis carriage assembly with motion control provided by a low-particle generating X-axis air bearing assembly. Various components of a low-particle generating motion system, such as an X-axis air bearing assembly, can be used in place of, for example, various particle-generating linear mechanical bearing systems. For various embodiments of a gas enclosure and system of the present teachings, the use of a variety of pneumatically operated devices and apparatuses can provide low-particle generating performance, as well as being low maintenance. Compressor loop 3250 can be configured to continuously supply pressurized inert gas to various devices and apparatuses of gas enclosure system 503. In addition to a supply of pressurized inert gas, substrate floatation table 2200 of inkjet printing system 2000, which utilizes air bearing technology, also utilizes vacuum system 3270, which is in communication with gas enclosure assembly 1101 through line 3272 when valve 3274 is in an open position.

A pressurized inert gas recirculation system according to the present teachings can have pressure-controlled bypass loop 3260 as shown in FIG. 14 for compressor loop 3250, which acts to compensate for variable demand of pressurized gas during use, thereby providing dynamic balance for various embodiments of a gas enclosure system of the present teachings. For various embodiments of a gas enclosure system according to the present teachings, a bypass loop can maintain a constant pressure in accumulator 3264 without disrupting or changing the pressure in enclosure 1101. Bypass loop 3260 can have first bypass inlet valve 3261 on an inlet side of bypass loop, which is closed unless bypass loop 3260 is used. Bypass loop 3260 can also have back pressure regulator 3266, which can be used when second valve 3263 is closed. Bypass loop 3260 can have second accumulator 3268 disposed at an outlet side of bypass loop 3260. For embodiments of compressor loop 3250 utilizing a zero ingress compressor, bypass loop 3260 can compensate for small excursions of pressure that can occur over time during use of a gas enclosure system. Bypass loop 3260 can be in fluid communication with compressor loop 3250 on an inlet side of bypass loop 3260 when bypass inlet valve 3261 is in an opened position. When bypass inlet valve 3261 is opened, inert gas shunted through bypass loop 3260 can be recirculated to the compressor if inert gas from compressor loop 3250 is not in demand within the interior of gas enclosure assembly 1101. Compressor loop 3250 is configured to shunt inert gas through bypass loop 3260 when a pressure of the inert gas in accumulator 3264 exceeds a pre-set threshold pressure. A pre-set threshold pressure for accumulator 3264 can be from between about 25 psig to about 200 psig at a flow rate of at least about 1 cubic feet per minute (cfm), or from between about 50 psig to about 150 psig at a flow rate of at least about 1 cubic feet per minute (cfm), or from between about 75 psig to about 125 psig at a flow rate of at least about 1 cubic feet per minute (cfm) or between about 90 psig to about 95 psig at a flow rate of at least about 1 cubic feet per minute (cfm).

Various embodiments of compressor loop 3250 can utilize a variety of compressors other than a zero ingress compressor, such as a variable speed compressor or a compressor that can be controlled to be in either an on or off state. As previously discussed herein, a zero ingress compressor ensures that no atmospheric reactive species can be introduced into a gas enclosure system. As such, any compressor configuration preventing atmospheric reactive species from being introduced into a gas enclosure system can be utilized for compressor loop 3250. According to various embodiments, compressor 3262 of gas enclosure system 503 can be housed in, for example, but not limited by, an hermetically-sealed housing. The housing interior can be configured in fluid communication with a source of inert gas, for example, the same inert gas that forms the inert gas atmosphere for gas enclosure assembly 1101. For various embodiments of compressor loop 3250, compressor 3262 can be controlled at a constant speed to maintain a constant pressure. In other embodiments of compressor loop 3250 not utilizing a zero ingress compressor, compressor 3262 can be turned off when a maximum threshold pressure is reached, and turned on when a minimum threshold pressure is reached.

In FIG. 15 for gas enclosure system 504, blower loop 3280 utilizing vacuum blower 3290 is shown for the operation of substrate floatation table 2200 of inkjet printing system 2000, which are housed in gas enclosure assembly 1101. As previously discussed herein for compressor loop 3250, blower loop 3280 can be configured to continuously supply pressurized inert gas to a substrate floatation table 2200 of printing system 2000.

Various embodiments of a gas enclosure system that can utilize a pressurized inert gas recirculation system can have various loops utilizing a variety of pressurized gas sources, such as at least one of a compressor, a blower, and combinations thereof. In FIG. 15 for gas enclosure system 504, compressor loop 3250 can be in fluid communication with external gas loop 3200, which can be used for the supply of inert gas for high consumption manifold 3225, as well as low consumption manifold 3215. For various embodiments of a gas enclosure system according to the present teachings as shown in FIG. 15 for gas enclosure system 504, high consumption manifold 3225 can be used to supply inert gas to various devices and apparatuses, such as, but not limited by, one or more of a substrate floatation table, a pneumatic robot, an air bearing, an air bushing, and a compressed gas tool, and combinations thereof. For various embodiments of a gas enclosure system according to the present teachings, low consumption 3215 can be used to supply inert gas to various apparatuses and devises, such as, but not limited by, one or more of an isolator, and a pneumatic actuator, and combinations thereof.

For various embodiments of gas enclosure system 504 of FIG. 15, blower loop 3280 can be utilized to supply pressurized inert gas to various embodiments of substrate floatation table 2200, while compressor loop 3250; in fluid communication with external gas loop 3200, can be utilized to supply pressurized inert gas to, for example, but not limited by, one or more of a pneumatic robot, an air bearing, an air bushing, and a compressed gas tool, and combinations thereof. In addition to a supply of pressurized inert gas, substrate floatation table 2200 of OLED inkjet printing system 2000, which utilizes air bearing technology, also utilizes blower vacuum 3290, which is in communication with gas enclosure assembly 1101 through line 3292 when valve 3294 is in an open position. Housing 3282 of blower loop 3280 can maintain first blower 3284 for supplying a pressurized source of inert gas to substrate floatation table 2200, and second blower 3290, acting as a vacuum source for substrate floatation table 2200, which is housed in an inert gas environment in gas enclosure assembly 1101. Attributes that can make blowers suitable for use as a source of either pressurized inert gas or vacuum for various embodiments a substrate floatation table include, for example, but not limited by, that they have high reliability; making them low maintenance, have variable speed control, and have a wide range of flow volumes; various embodiments capable of providing a volume flow of between about 100 m³/h to about 2,500 m³/h. Various embodiments of blower loop 3280 additionally can have first isolation valve 3283 at an inlet end of blower loop 3280, as well as check valve 3285 and a second isolation valve 3287 at an outlet end of blower loop 3280. Various embodiments of blower loop 3280 can have adjustable valve 3286, which can be, for example, but not limited by, a gate, butterfly, needle or ball valve, as well as heat exchanger 3288 for maintaining inert gas from blower loop 3280 to substrate floatation table 2200 at a defined temperature.

FIG. 15 depicts external gas loop 3200, also shown in FIG. 14, for integrating and controlling inert gas source 3201 and clean dry air (CDA) source 3203 for use in various aspects of operation of gas enclosure system 503 of FIG. 14 and gas enclosure system 504 of FIG. 15. External gas loop 3200 of FIG. 14 and FIG. 15 can include at least four mechanical valves. These valves comprise first mechanical valve 3202, second mechanical valve 3204, third mechanical valve 3206, and fourth mechanical valve 3208. These various valves are located at positions in various flow lines that allow control of both an inert gas and an air source such as clean dry air (CDA). According to the present teachings, an inert gas may be any gas that does not undergo a chemical reaction under a defined set of conditions. Some commonly used non-limiting examples of an inert gas can include nitrogen, any of the noble gases, and any combination thereof. From a house inert gas source 3201, a house inert gas line 3210 extends. House inert gas line 3210 continues to extend linearly as low consumption manifold line 3212, which is in fluid communication with low consumption manifold 3215. A cross-line first section 3214 extends from a first flow juncture 3216, which is located at the intersection of house inert gas line 3210, low consumption manifold line 3212, and cross-line first section 3214. Cross-line first section 3214 extends to a second flow juncture 3218. A compressor inert gas line 3220 extends from accumulator 3264 of compressor loop 3250 and terminates at second flow juncture 3218. A CDA line 3222 extends from a CDA source 3203 and continues as high consumption manifold line 3224, which is in fluid communication with high consumption manifold 3225. A third flow juncture 3226 is positioned at the intersection of a cross-line second section 3228, clean dry air line 3222, and high consumption manifold line 3224. Cross-line second section 3228 extends from second flow juncture 3218 to third flow juncture 3226. Various components that are high consumption can be supplied CDA during maintenance, by means high consumption manifold 3225. Isolating the compressor using valves 3204, 3208, and 3230 can prevent reactive species, such as oxygen and water vapor from contaminating an inert gas within the compressor and accumulator.

The continual circulation and filtration of inert gas various embodiments of a gas enclosure assembly are a part of a particle control system that can provide for maintaining a substantially low-particle environment within various embodiments of a gas enclosure system. Various embodiments of a gas circulation and filtration system can be designed to provide a low particle environment for airborne particulates meeting the standards of International Standards Organization Standard (ISO) 14644-1:1999, "Cleanrooms and associated controlled environments—Part 1: Classification of air cleanliness," as specified by Class 1 through Class 5. Additionally, various components of a particle control system can exhaust particulate matter into a gas circulation and filtration system in order to maintain a low-particle zone proximal to a substrate. A determination of airborne particulate matter can be performed for various embodiments of a gas enclosure system before a printing process for system validation, using, for example, a portable particle counting device. In various embodiments of a gas enclosure system, a determination of airborne particulate matter can be performed as an ongoing quality check in situ while a substrate is printed. For various embodiments of a gas enclosure system, a determination of airborne particulate matter can be performed for system validation before a substrate is printed and additionally in situ while a substrate is printed.

Figure 16:
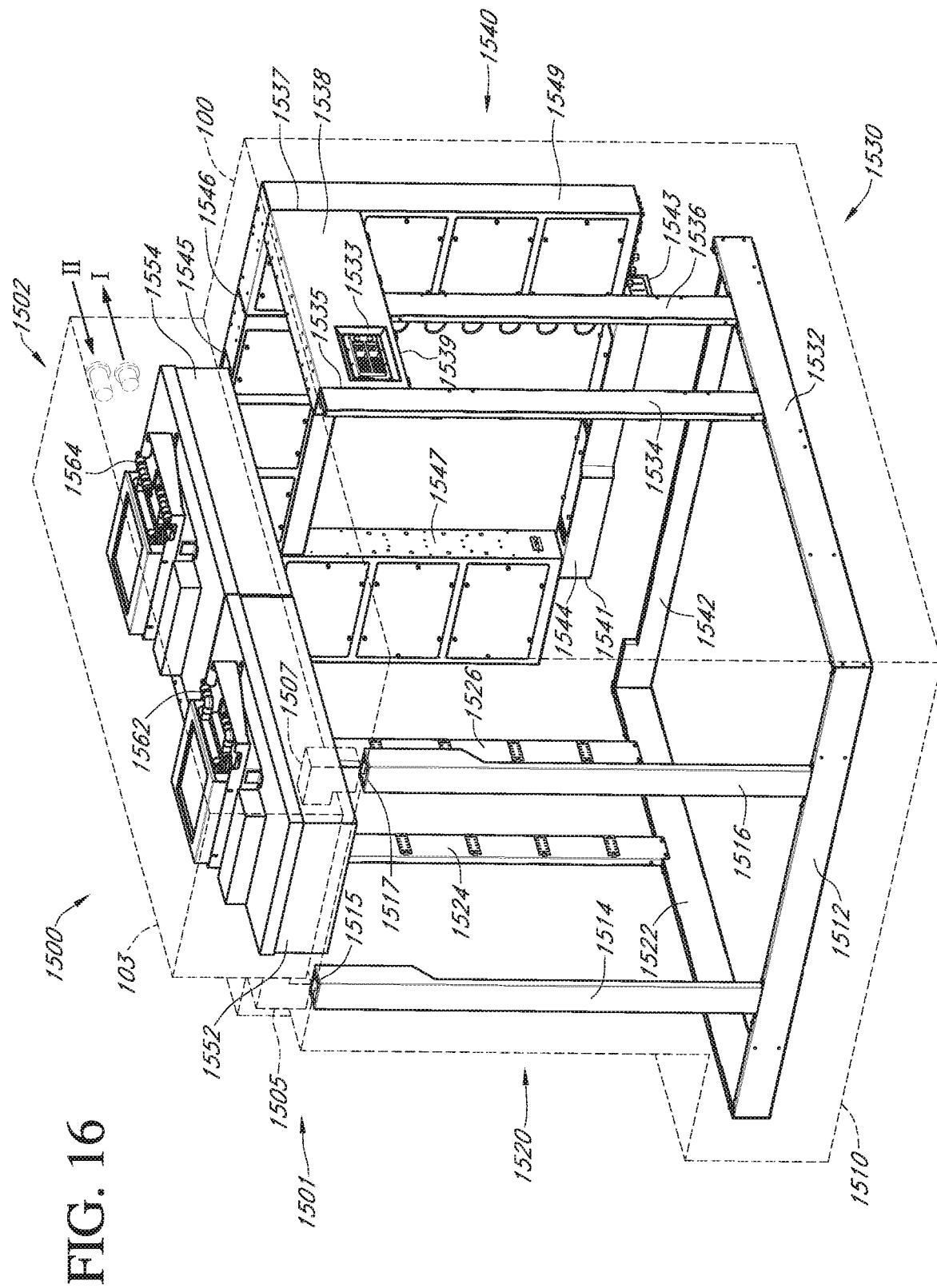
FIG. 16 is a phantom front perspective view of a gas enclosure assembly, which depicts ductwork installed in the interior of a gas enclosure assembly in accordance with various embodiments of the present teachings.
Figure 17:
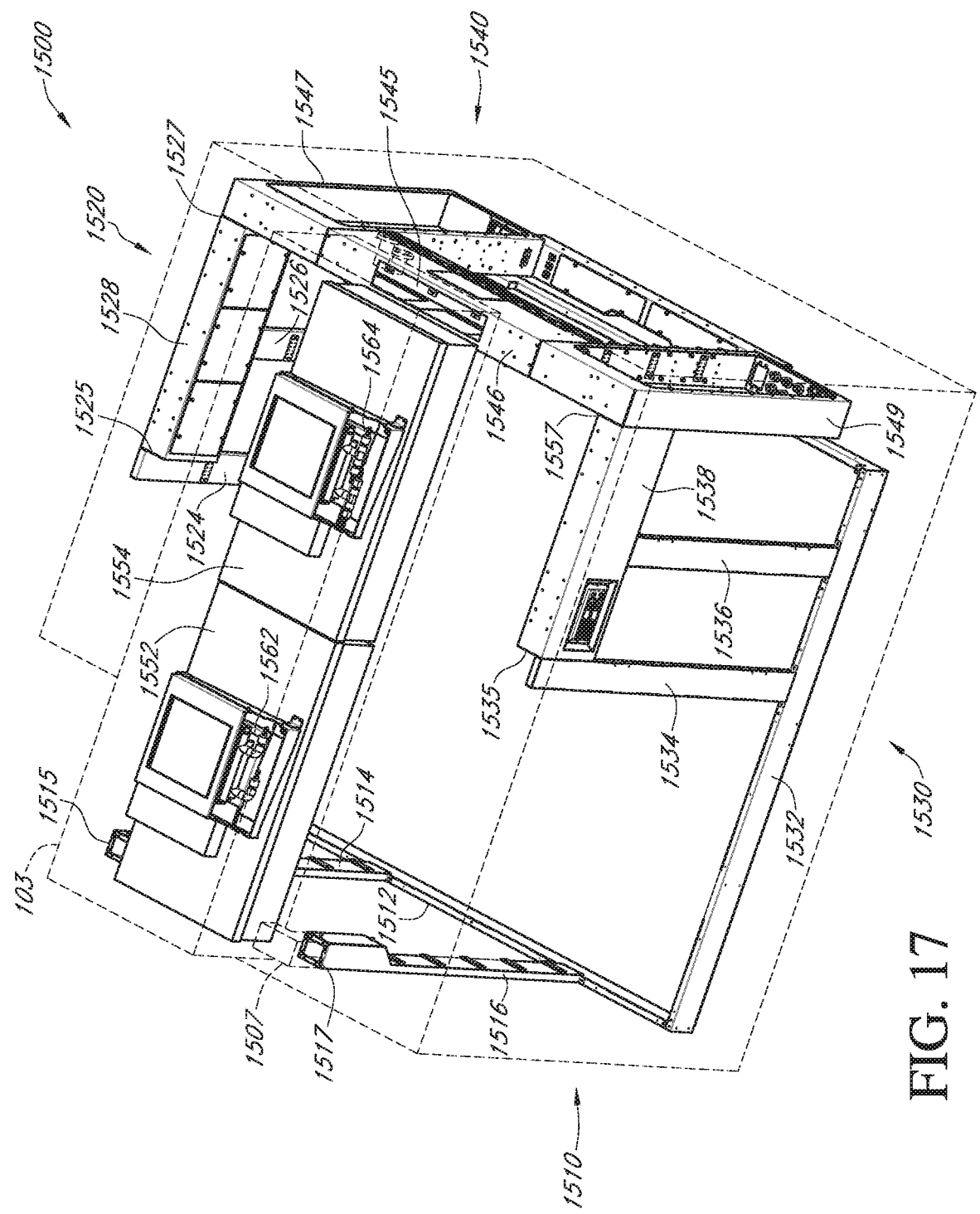
FIG. 17 is a phantom top perspective view of a gas enclosure assembly, which depicts ductwork installed in the interior of a gas enclosure assembly in accordance with various embodiments of the present teachings.
Figure 18:
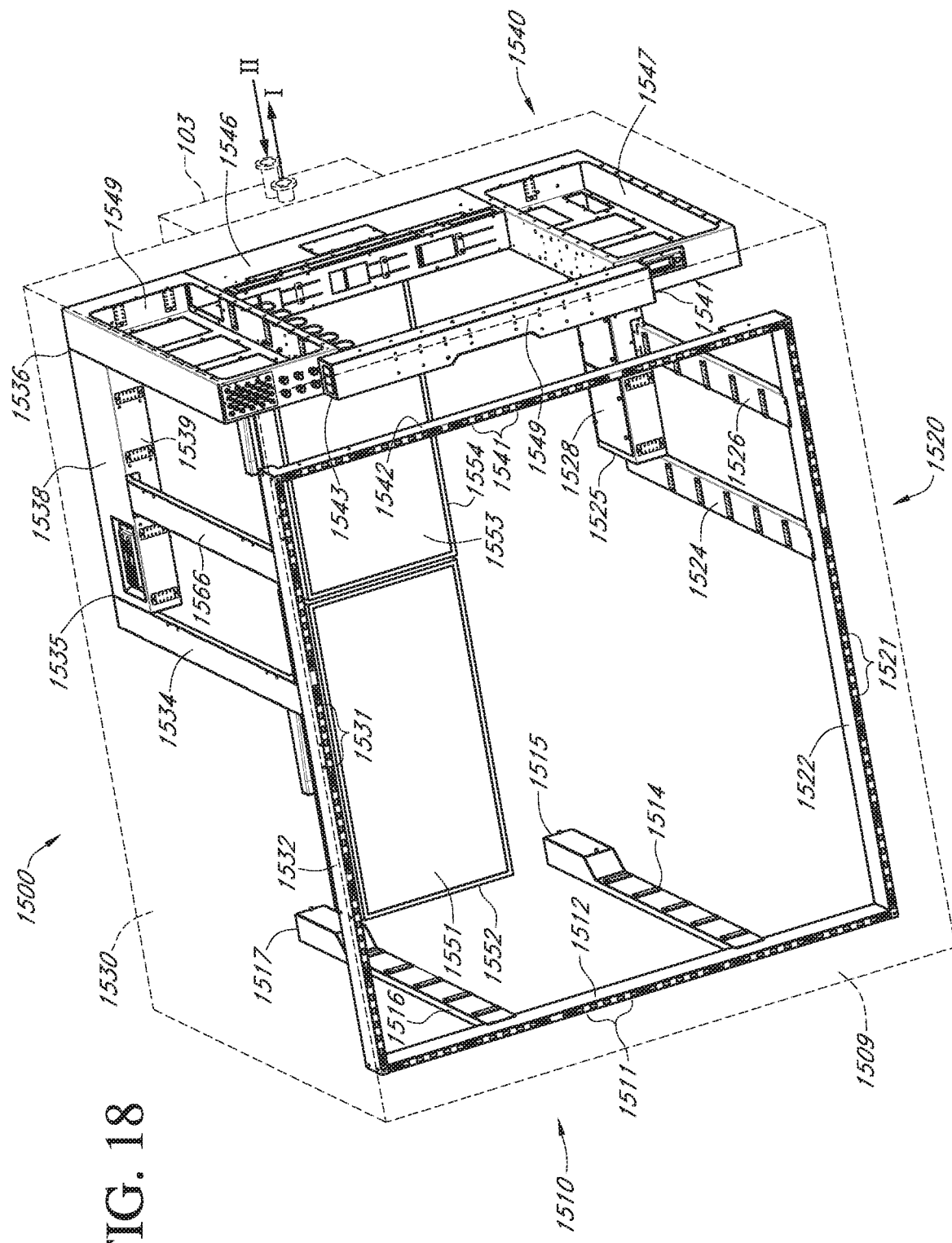
FIG. 18 is a phantom bottom perspective view of a gas enclosure assembly, which depicts ductwork installed in the interior of a gas enclosure assembly in accordance with various embodiments of the present teachings.

Various embodiments of a gas circulation and filtration system are depicted in FIG. 16 through FIG. 18. According to various embodiments of a gas circulation and filtration system of the present teachings, ductwork can be installed in an interior portion formed by the joining of wall frame and ceiling frame members. For various embodiments of a gas enclosure assembly, ductwork may be installed during the construction process. According to various embodiments of the present teachings, ductwork may be installed within a gas enclosure frame assembly, which has been constructed from a plurality of frame members. In various embodiments, ductwork can be installed on a plurality of frame members before they are joined to form a gas enclosure frame assembly. Ductwork for various embodiments of a gas enclosure system can be configured such that substantially all gas drawn into the ductwork from one or more ductwork inlets is moved through various embodiments of a gas filtration loop for removing particulate matter internal a gas enclosure assembly. Additionally, ductwork of various embodiments of a gas enclosure system can be configured to separate the inlets and outlets of a gas purification loop external to a gas enclosure assembly from the gas filtration loop for removing particulate matter internal to a gas enclosure assembly. Various embodiments of ductwork in accordance with the present teachings can be fabricated from metal sheet, for example, but not limited by, aluminum sheet having a thickness of about 80 mil.

FIG. 16 depicts a right front phantom perspective view of circulation and filtration system 1500, which can include ductwork assembly 1501 and fan filter unit assembly 1502 of gas enclosure assembly 100. Enclosure ductwork assembly 1501 can have front wall panel ductwork assembly 1510. As shown front wall panel ductwork assembly 1510 can have front wall panel inlet duct 1512, first front wall panel riser 1514 and second front wall panel riser 1516, both of which are in fluid communication with front wall panel inlet duct 1512. First front wall panel riser 1514 is shown having outlet 1515, which is sealably engaged with ceiling duct 1505 of fan filter unit cover 103. In a similar fashion, second front wall panel riser 1516 is shown having outlet 1517, which is sealably engaged with ceiling duct 1507 of fan filter unit cover 103. In that regard, front wall panel ductwork assembly 1510 provides for circulating inert gas within a gas enclosure system from the bottom, utilizing front wall panel inlet duct 1512, through each front wall panel riser, 1514 and 1516, and delivering the air through outlets 1505 and 1507, respectively, so that the air can be filtered by, for example, fan filter unit 1552 of fan filter unit assembly 1502. Proximal fan filter unit 1552 is heat exchanger 1562, which as part of a thermal regulation system, can maintain inert gas circulating through gas enclosure assembly 100 at a desired temperature.

Right wall panel ductwork assembly 1530 can have right wall panel inlet duct 1532, which is in fluid communication with right wall panel upper duct 1538 through right wall panel first riser 1534 and right wall panel second riser 1536.

Right wall panel upper duct 1538, can have first duct inlet end 1535 and second duct outlet end 1537, which second duct outlet end 1537 is in fluid communication with rear wall panel upper duct 1546 of rear wall ductwork assembly 1540. Left wall panel ductwork assembly 1520 can have the same components as described for right wall panel assembly 1530, of which left wall panel inlet duct 1522, which is in fluid communication with left wall panel upper duct (not shown) through first left wall panel riser 1524 and first left wall panel riser 1524 are apparent in FIG. 16. Rear wall panel ductwork assembly 1540 can have rear wall panel inlet duct 1542, which is in fluid communication with left wall panel assembly 1520 and right wall panel assembly 1530. Additionally, rear wall panel ductwork assembly 1540, can have rear wall panel bottom duct 1544, which can have rear wall panel first inlet 1541 and rear wall panel second inlet 1543. Rear wall panel bottom duct 1544 can be in fluid communication with rear wall panel upper duct 1546 via first bulkhead 1547 and second bulkhead 1549, which bulkhead structures can be used to feed, for example, but not limited by, a service from the exterior of gas enclosure assembly 100 into the interior. According to the present teachings, a service bundle can include, for example, but not limited by, optical cables, electrical cables, wires and tubing, and the like. Recalling, a manufacturing facility can require a substantial length of various service bundles that can be operatively connected from various systems and assemblies to provide optical, electrical, mechanical, and fluidic connections required to operate a printing system. Duct opening 1533 provides for moving at least one service bundle out of rear wall panel upper duct 1546, which can be passed through rear wall panel upper duct 1546 via bulkhead 1549. Bulkhead 1547 and bulkhead 1549 can be hermetically sealed on the exterior using a removable inset panel, as previously described. Rear wall panel upper duct is in fluid communication with, for example, but not limited by, fan filter unit 1554 through vent 545, of which a corner is shown in FIG. 16. In that regard, left wall panel ductwork assembly 1520, right wall panel ductwork assembly 1530, and rear wall panel ductwork assembly 1540 provide for circulating inert gas within a gas enclosure assembly from the bottom, utilizing wall panel inlet ducts 1522, 1532, and 1542, respectively, as well as rear panel lower duct 1544, which are in fluid communication with vent 1545 through various risers, ducts, bulkhead passages, and the like as previously described. Accordingly, air can be filtered by, for example, fan filter unit 1554 of fan filter unit assembly 1502 of circulation and filtration system 1500. Proximal fan filter unit 1554 is heat exchanger 1564, which as part of a thermal regulation system, can maintain inert gas circulating through gas enclosure assembly 100 at a desired temperature. As will be discussed in more detail subsequently herein, the number, size and shape of fan filter units for a fan filter unit assembly, such as fan filter unit assembly 1502 including fan filter unit 1552 and 1554 of circulation and filtration system 1500, can be selected in accordance with the physical position of a substrate in a printing system during processing. The number, size and shape of fan filter units for a fan filter unit assembly selected with respect to the physical travel of a substrate can be an element of a low-particle gas enclosure system, which can provide a low-particle zone proximal a substrate during a substrate manufacturing process.

In FIG. 16, cable feed through opening 1533 is shown. As will be discussed in more detail subsequently herein, various embodiments of a gas enclosure assembly of the present teachings provide for bringing a service bundle through ductwork. In order to eliminate leak paths formed around such service bundles, various approaches for sealing differently sized cables, wires, and tubings in a service bundle using conforming material can be used. Also shown in FIG. 16 for enclosure ductwork assembly 1501 is conduit I and conduit II, which are shown as part of fan filter unit cover 103. Conduit I provides an outlet of inert gas to an external gas purification system, while conduit II provides a return of purified inert gas to the circulation and filtration loop internal gas enclosure assembly 100.

In FIG. 17, a top phantom perspective view of enclosure ductwork assembly 1501 is shown. The symmetric nature of left wall panel ductwork assembly 1520 and right wall panel ductwork assembly 1530 can be seen. For right wall panel ductwork assembly 1530, right wall panel inlet duct 1532, is in fluid communication with right wall panel upper duct 1538 through right wall panel first riser 1534 and right wall panel second riser 1536. Right wall panel upper duct 1538, can have first duct inlet end 1535 and second duct outlet end 1537, which second duct outlet end 1537 is in fluid communication with rear wall panel upper duct 1546 of rear wall ductwork assembly 1540. Similarly, left wall panel ductwork assembly 1520 can have left wall panel inlet duct 1522, which is in fluid communication with left wall panel upper duct 1528 through left wall panel first riser 1524 and left wall panel second riser 1526. Left wall panel upper duct 1528, can have first duct inlet end 1525 and second duct outlet end 1527, which second duct outlet end 1527 is in fluid communication with rear wall panel upper duct 1546 of rear wall ductwork assembly 1540. Additionally, rear wall panel ductwork assembly can have rear wall panel inlet duct 1542, which is in fluid communication with left wall panel assembly 1520 and right wall panel assembly 1530. Additionally, rear wall panel ductwork assembly 1540, can have rear wall panel bottom duct 1544, which can have rear wall panel first inlet 1541 and rear wall panel second inlet 1543. Rear wall panel bottom duct 1544 can be in fluid communication with rear wall panel upper duct 1546 via first bulkhead 1547 and second bulkhead 1549. Ductwork assembly 1501 as shown in FIG. 16 and FIG. 17 can provide effective circulation of inert gas from front wall panel ductwork assembly 1510, which circulates inert gas from front wall panel inlet duct 1512 to ceiling panel ducts 1505 and 1507 via front wall panel outlets 1515 and 1517, respectively, as well as from left wall panel assembly 1520, right wall panel assembly 1530 and rear wall panel ductwork assembly 1540, which circulate air from inlet ducts 1522, 1532, and 1542, respectively to vent 1545. Once inert gas is exhausted via ceiling panel ducts 1505 and 1507 and vent 1545 into the enclosure area under fan filter unit cover 103 of enclosure 100, the inert gas so exhausted can be filtered through fan filter units 1552 and 1554 of fan filter unit assembly 1502. Additionally, the circulated inert gas can be maintained at a desired temperature by heat exchangers 1562 and 1564, which are part of a thermal regulation system.

FIG. 18 is a bottom phantom view of enclosure ductwork assembly 1501. Inlet ductwork assembly 1509 includes front wall panel inlet duct 1512, left wall panel inlet duct 1522, right wall panel inlet duct 1532, and rear wall panel inlet duct 1542, which are in fluid communication with one another. As previously discussed herein, conduit I provides an outlet of inert gas to an external gas purification system, while conduit II provides a return of purified inert gas to the circulation and filtration loop internal to gas enclosure assembly 100.

For each inlet duct included in inlet ductwork assembly 1509, there are apparent openings evenly distributed across the bottom of each duct, sets of which are specifically highlighted for the purpose of the present teachings, as openings 1511 of front wall panel inlet duct 1512, openings 1521 of left wall panel inlet duct 1522, openings 1531 of right wall panel inlet duct 1532, and openings 1541 of right wall panel inlet duct 1542. Such openings, as are apparent across the bottom of each inlet duct, provide for effective uptake of inert gas within enclosure 100 for continual circulation and filtration. The continual circulation and filtration of inert gas various embodiments of a gas enclosure assembly are a part of a particle control system that can provide for maintaining a substantially low-particle environment within various embodiments of a gas enclosure system. Various embodiments of a gas circulation and filtration system can be designed to provide a low particle environment for maintaining airborne particulate levels meeting the standards of International Standards Organization Standard (ISO) 14644-1:1999, as specified by Class 1 through Class 5. Additionally, a service bundle that can include cables, wires, and tubings and the like, bundled together, can act as a source of particulate matter. Accordingly, having service bundles fed through ductwork can contain an identified source of particles within the ductwork and exhaust the particulate matter through a circulation and filtration system.

Various embodiments of a gas enclosure system can have a particle control system that can maintain a substantially low-particle environment providing for an on-substrate particle specification for particles of between about 0.1 µm or greater to about 10 µm or greater. Various embodiments of an on-substrate particle specification can be readily converted from an average on-substrate particle distribution per square meter of substrate per minute to an average on-substrate particle distribution per substrate per minute for each of a target particle size range. As previously discussed herein, such a conversion can be readily done through a known relationship between substrates, for example, of a specific generation-sized substrate and the corresponding area for that substrate generation. Additionally, an average on-substrate particle distribution per square meter of substrate per minute can be readily converted to any of a variety of unit time expressions. For example, in addition to conversions between standard units of time; e.g. seconds, minutes, and days, units of time specifically relating to processing can be used. For example, as previously discussed herein, a print cycle can be associated with a unit of time.

Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 10 µm in size. Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 5 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 2 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 1 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.5 µm in size. For various embodiments of a gas enclosure system of the present teachings, a low-particle environment can be maintained providing for an average on-substrate particle distribution that meets an on-substrate deposition rate specification of less than or equal to about 1000 particles per square meter of substrate per minute for particles greater than or equal to 0.3 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.1 µm in size.

A manufacturing facility can require a substantial length of various service bundles that can be operatively connected from various apparatuses and systems to provide optical, electrical, mechanical, and fluidic connections required, for example, to operate a printing system. According to the present teachings, a service bundle can include, for example, but not limited by, optical cables, electrical cables, wires and tubing, and the like. Various embodiments of a service bundle according to the present teachings can have a significant total dead volume as a result of a substantial number of void spaces created by bundling various cables, wires and tubing, and the like together in a service bundle. The total dead volume resulting from a substantial number of void spaces in a service bundle can result in the retention of a significant volume of reactive gaseous species occluded therein. Such a substantial source of reactive atmospheric gases can significantly increase recovery time of a gas enclosure assembly, for example, after maintenance.

Accordingly, in addition to providing a component of a particle control system, feeding a service bundle through ductwork can reduce the recovery time of a gas enclosure assembly with respect to reactive species; thereby more rapidly bringing a gas enclosure assembly back within the specifications for performing an air-sensitive process. For various embodiments of a gas enclosure system of the present teachings useful for printing OLED devices, each species of various reactive species, including various reactive atmospheric gases, such as water vapor and oxygen, as well as organic solvent vapors can be maintained at 100 ppm or lower, for example, at 10 ppm or lower, at 1.0 ppm or lower, or at 0.1 ppm or lower.

Figure 19B:
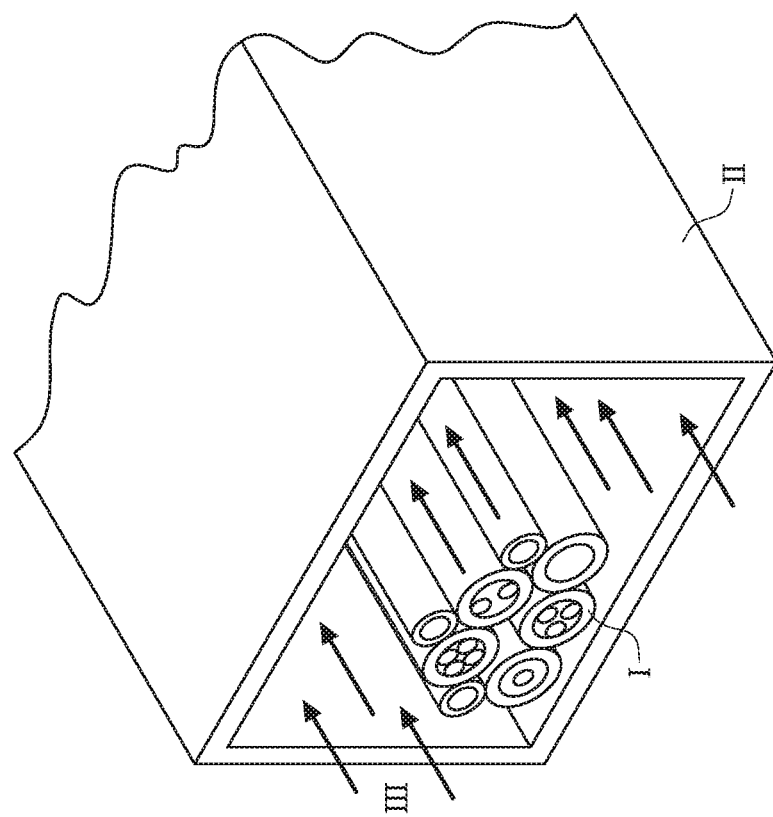
FIG. 19B depicts gas sweeping past a service bundle that is fed through various embodiments of ductwork according to the present teachings.
Figure 19A:
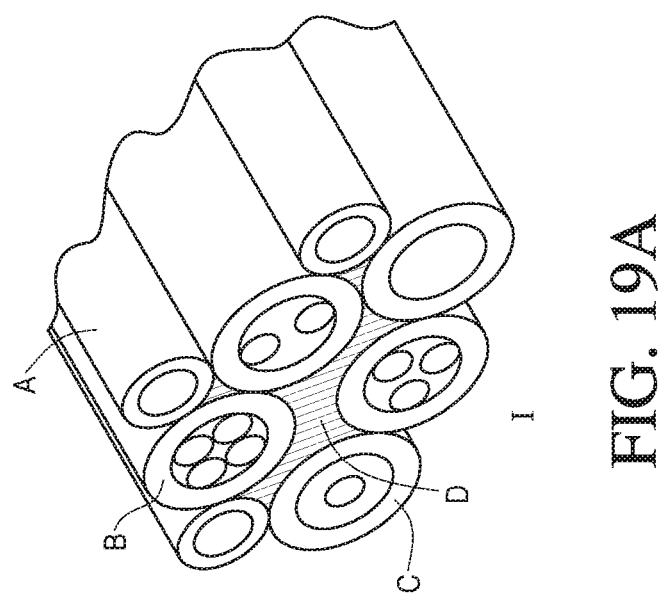
FIG. 19A is a schematic representation showing a service bundle according to various embodiments of the present teachings.
Figure 20:
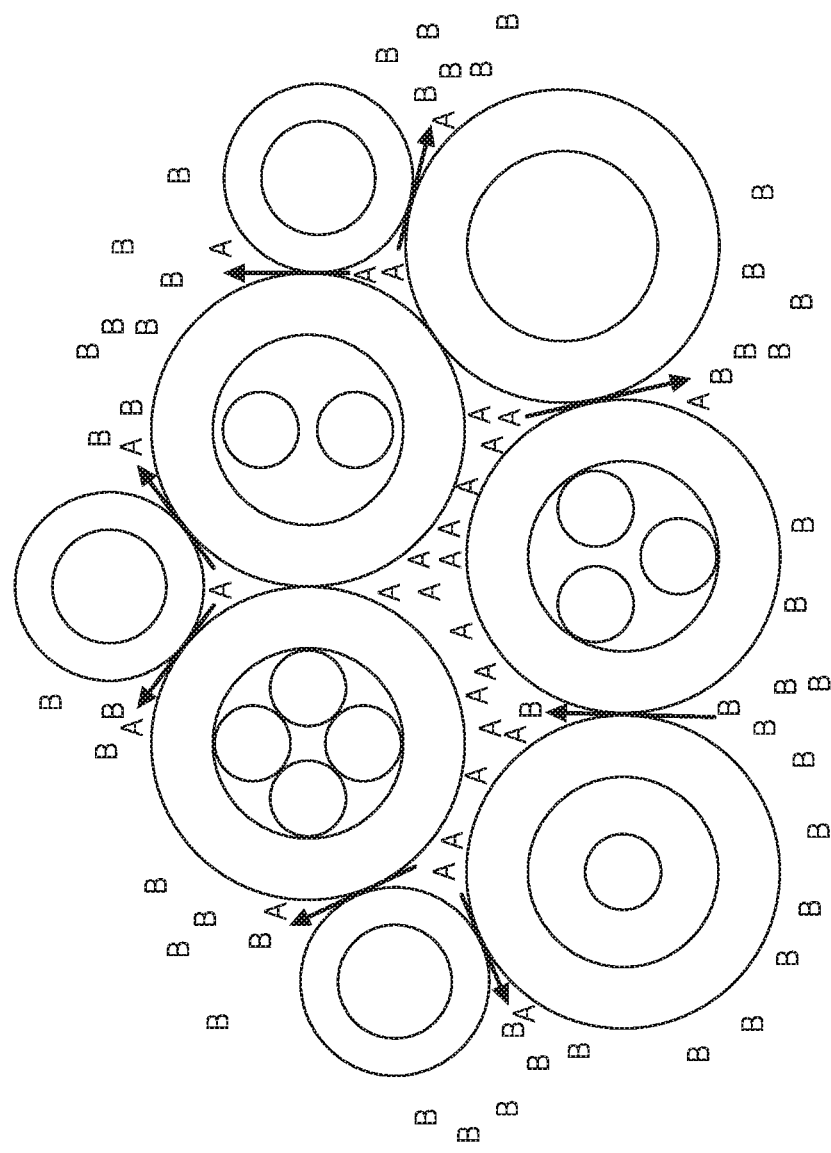
FIG. 20 is a schematic representation showing how reactive species (A) occluded in dead-spaces of a service bundle are actively purged from inert gas (B) sweeping through a duct through which the bundles have been routed.

To understand how cabling fed through ductwork can result in decreasing the time it takes to purge occluded reactive atmospheric gases from dead volumes created by void spaces in a service bundle, which are created as a result of bundling various optical cables, electrical cables, wires and fluidic tubing, and the like, reference is made to FIGS. 19A, 19B and 20. FIG. 19A depicts an expanded view of service bundle I, which can be a bundle that can include tubing, such as tubing A, which could be, for example, for delivering various inks, solvents and the like, to a printing system, such as printing system 1050 of FIG. 13A. Service bundle 1 of FIG. 19A can additionally include electrical wiring, such as electrical wire B or cabling, such as cable C, which can be a coaxial or optical cable. Such tubings, wires and cables included in a service bundle can be routed from the exterior to the interior to be connected to various devices and apparatuses comprising an OLED printing system. As seen in the hatched area of FIG. 19A, void spaces in a service bundle can create an appreciable dead volume D. In the schematic perspective view of FIG. 19B, when service bundle I is fed through duct II, inert gas III can continuously sweep past the bundle. The expanded section view of FIG. 20 depicts how effectively inert gas continuously sweeping past bundled tubings, wires and cables can increase the rate of removal of occluded reactive species from dead volume formed in a service bundle. The rate of diffusion of a reactive species A out of a dead volume, indicated in FIG. 20 by the collective area occupied by species A, is inversely proportional to the concentration of the reactive species outside of the dead volume, indicated in FIG. 20 by the collective area occupied by inert gas species B. That is, if the concentration of a reactive species is high in a volume just outside the dead volume, then the rate of diffusion is decreased. If a reactive species concentration in such an area is continuously decreased from the volume just outside dead volume space by a flow stream of inert gas, then by mass action, the rate at which the reactive species diffuses from the dead volume is increased. Additionally, by the same principle, inert gas can diffuse into the dead volume as occluded reactive species are effectively removed out of those spaces.

Figure 21A:
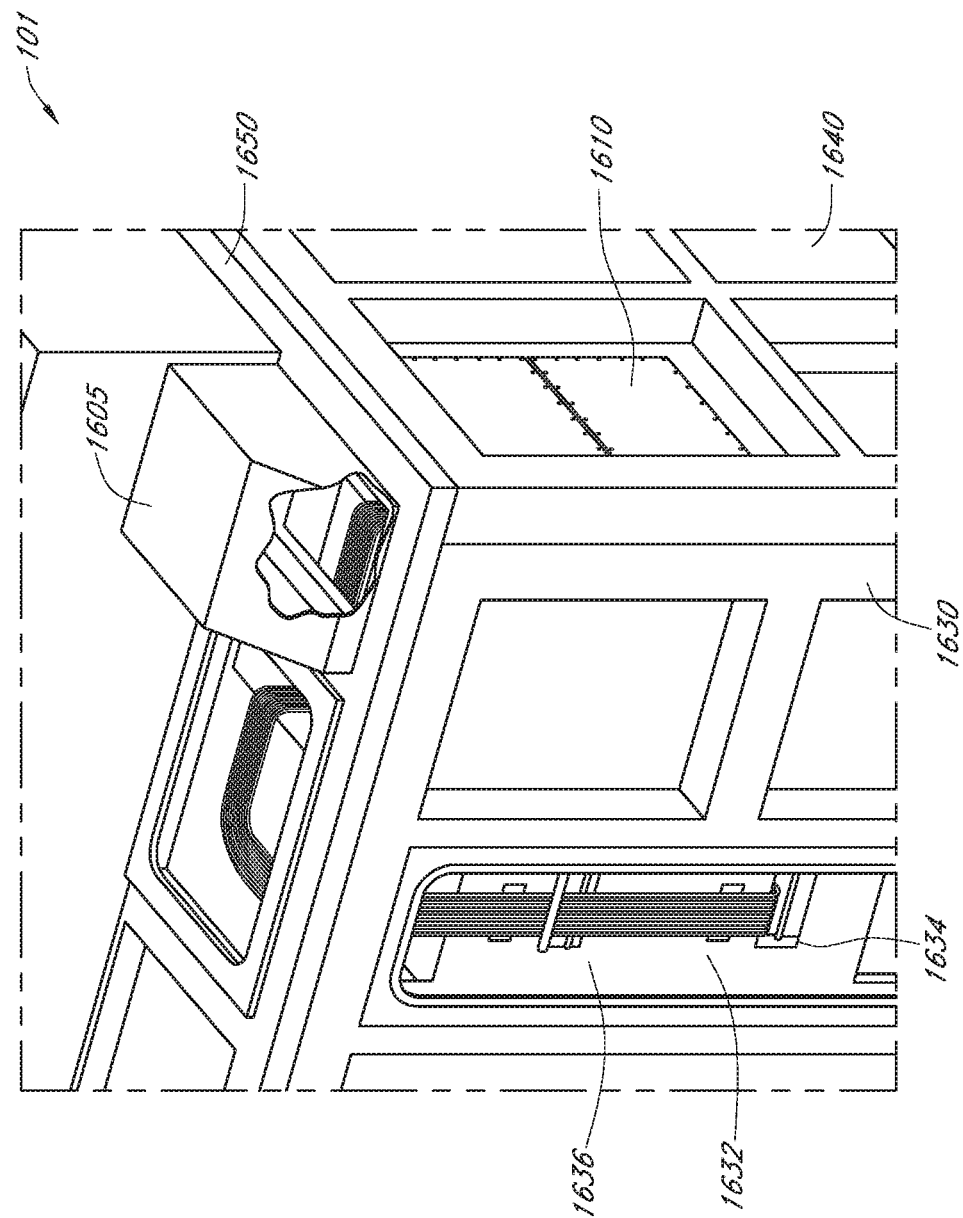
FIG. 21A is a phantom perspective view of cables and tubing routed through ductwork according to various embodiments of a gas enclosure system of the present teachings.
Figure 21B:
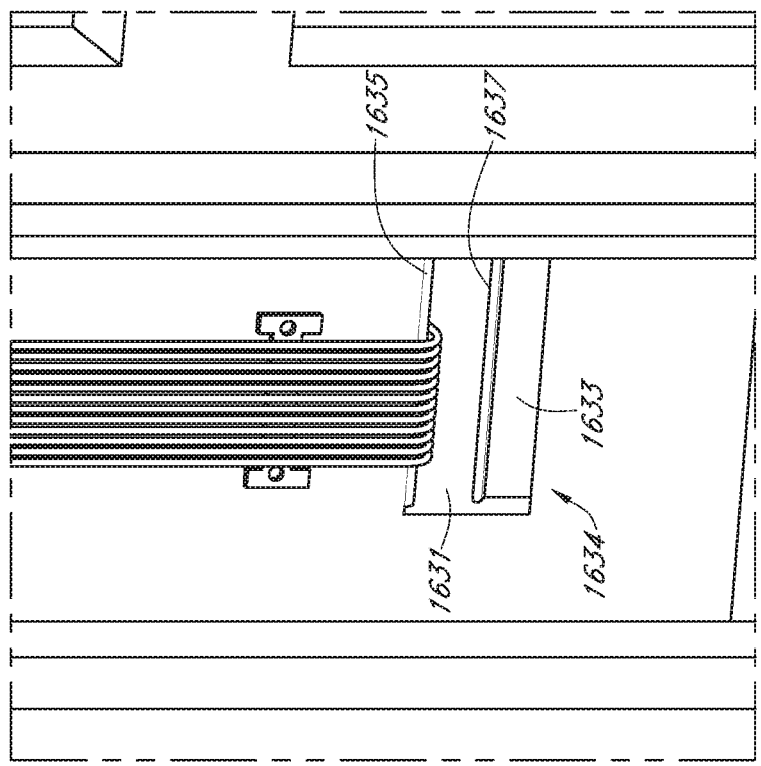
FIG. 21 B is an enlarged view of an opening shown in FIG. 21A, showing detail of a cover for closure over the opening, according to various embodiments of a gas enclosure system of the present teachings.

FIG. 21A is a perspective view of a rear corner of various embodiments of gas enclosure assembly 101, with a phantom view through return duct 1605 into the interior of gas enclosure assembly 101. For various embodiments of gas enclosure assembly 101, rear wall panel 1640 can have inset panel 1610, which is configured to provide access to, for example, an electrical bulkhead. A service bundle can be fed through a bulkhead into a cable routing duct, such as duct 1632 shown in right wall panel 1630, for which a removable inset panel has been removed to reveal a service bundle routed into a first service bundle duct entry 636. From there, the service bundle can be fed into the interior of gas enclosure assembly 101, and is shown in the phantom view through return duct 1605 in the interior of gas enclosure assembly 101. Various embodiments of a gas enclosure assembly for service bundle routing can have more than one service bundle entry, such as shown in FIG. 21A, which depicts a first service bundle duct entry 1634 and a second service bundle duct entry 1636, for still another service bundle. FIG. 21B depicts an expanded view of first service bundle duct entry 1634 for a cable, wire, and tubing bundle. First service bundle duct entry 1634 can have opening 1631, which is designed to form a seal with sliding cover 1633. In various embodiments, opening 1631 can accommodate a flexible sealing module, such as those provided by Roxtec Company for cable entry seals, which can accommodate various diameters of cable, wire, and tubing and the like in a service bundle. Alternatively, top 1635 of sliding cover 1633 and upper portion 1637 of opening 1631 may have a conforming material disposed on each surface, so that the conforming material can form a seal around various-sized diameters of cable, wire, and tubing and the like in a service bundle fed through an entry, such as first service bundle duct entry 1634.

Figure 22:
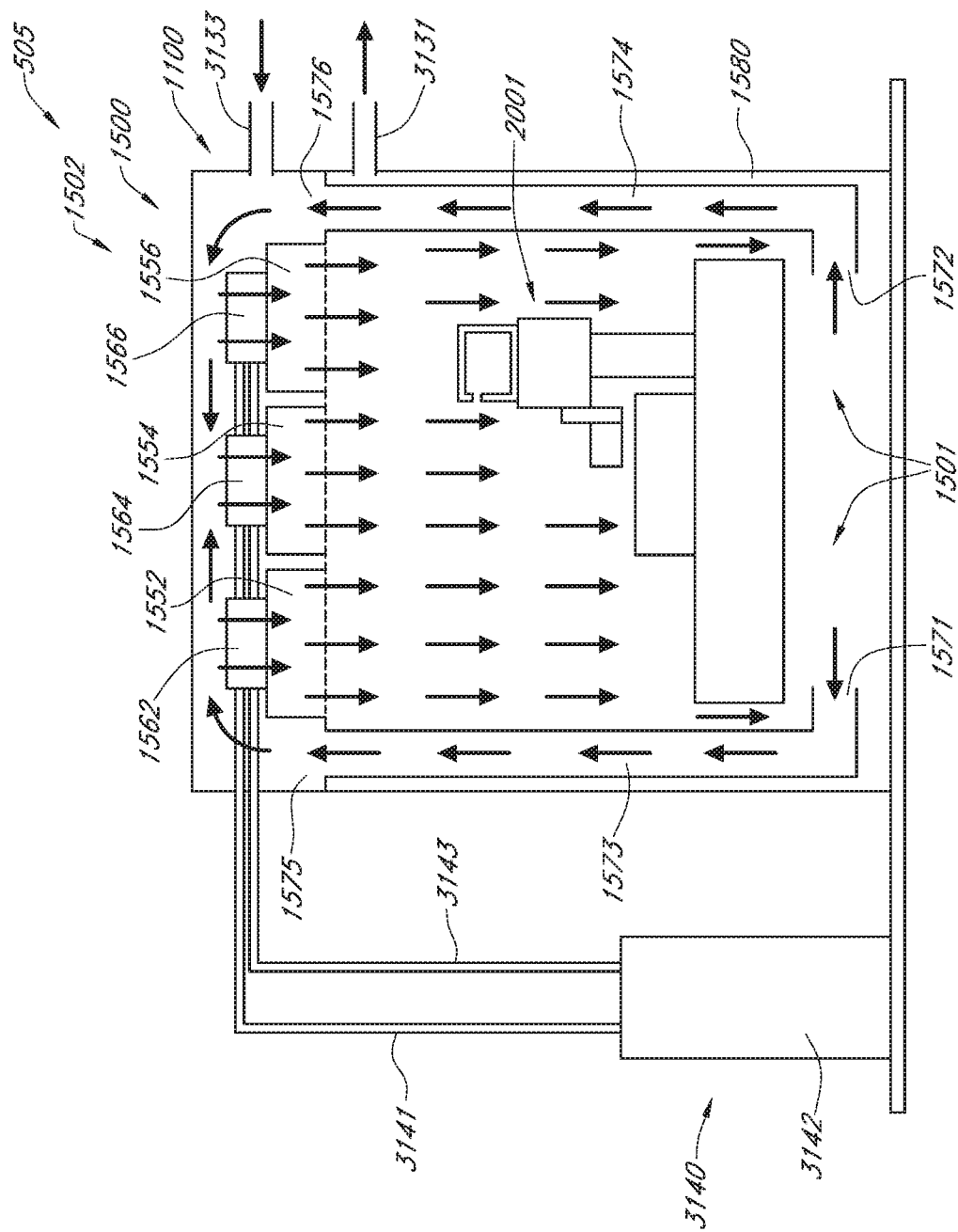
FIG. 22 is a schematic side section view of a gas enclosure system depicting an embodiment of gas circulation through a gas enclosure assembly according to various embodiments of the present teachings.
Figure 23:
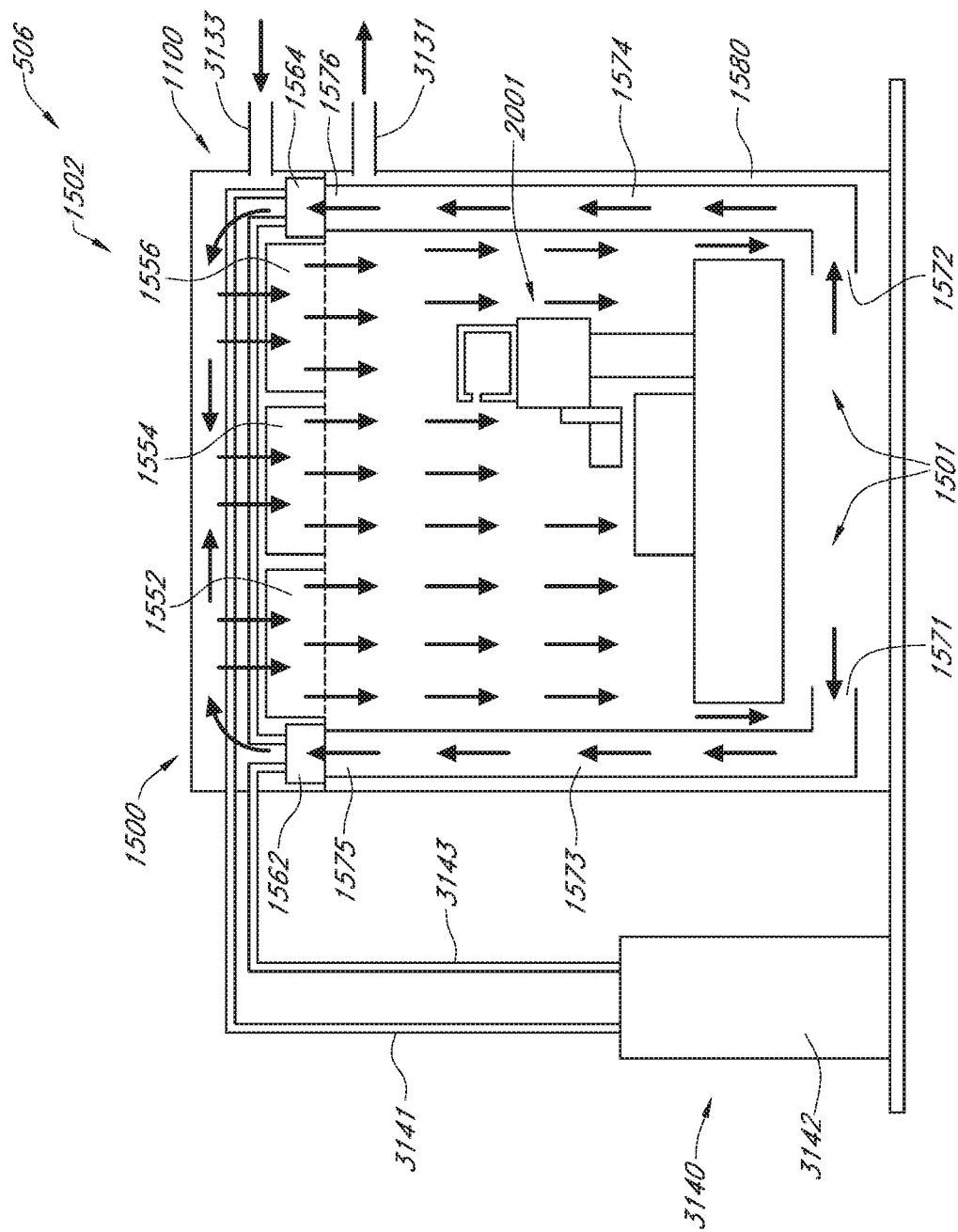
FIG. 23 is a schematic side section view of a gas enclosure system depicting an embodiment of gas circulation through a gas enclosure assembly according to various embodiments of the present teachings.

As depicted in FIG. 22 and FIG. 23, the one or more fan filter units can be configured to provide a substantially laminar flow of gas through the interior of a gas enclosure assembly. According to various embodiments of a circulation and filtration system for a gas enclosure assembly of the present teachings, one or more fan units are disposed adjacent a first interior surface of a gas enclosure assembly, and the one or more ductwork inlets are disposed adjacent a second, opposite interior surface of a gas enclosure assembly. For example, a gas enclosure assembly can comprise an interior ceiling and a bottom interior periphery, the one or more fan units can be disposed adjacent the interior ceiling, and the one or more ductwork inlets can comprise a plurality of inlet openings disposed adjacent the bottom interior periphery that are part of a ductwork system, as shown in FIGS. 16-18.

FIG. 22 is a cross-sectional view taken along the length of a gas enclosure system 505, according to various embodiments of the present teachings. Gas enclosure system 505 of FIG. 22 can include a gas enclosure assembly 1100, which can house an OLED inkjet printing system 2001, as well as circulation and filtration system 1500, gas purification system 3130 (FIG. 12 and FIG. 13), and thermal regulation system 3140. Circulation and filtration system 1500 can include ductwork assembly 1501 and fan filter unit assembly 1502. Thermal regulation system 3140 can include fluid chiller 3142, which is in fluid communication with chiller outlet line 3141 and with chiller inlet line 3143. Chilled fluid can exit fluid chiller 3142, flow through chiller outlet line 3141, and be delivered heat exchangers, which for various embodiments of a gas enclosure system, as shown in FIG. 22, can be located proximal to each of a plurality of fan filter units. Fluid to can be returned from the heat exchangers proximal to the fan filter unit to chiller 3142 through chiller inlet line 3143 to be maintained at a constant desired temperature. As previously discussed herein, chiller outlet line 3141 and chiller inlet line 3143 are in fluid communication with a plurality of heat exchangers including first heat exchanger 1562, second heat exchanger 1564, and third heat exchanger 1566. According to various embodiments of gas enclosure system 505 as shown in FIG. 22, first heat exchanger 1562, second heat exchanger 1564, and third heat exchanger 1566 are in thermal communication with a first fan filter unit 1552, a second fan filter unit 1554, and a third fan filter unit 1556, respectively, of fan filter unit assembly 1502 of circulation and filtration system 1500.

In FIG. 22, the many arrows depict flow of air in circulation and filtration system 1500 provides low-particle filtered air within gas enclosure assembly 1100. In FIG. 22, ductwork assembly 1501 can that include first ductwork conduit 1573 and second ductwork conduit 1574 as depicted in the simplified schematic of FIG. 22. First ductwork conduit 1573 can receive gas through a first ductwork inlet 1571 and can exit through a first ductwork outlet 1575. Similarly, second ductwork conduit 1574 can receive gas through second ductwork inlet 1572 exit through second ductwork outlet 1576. Additionally, as shown in FIG. 22, ductwork assembly 1501 separates inert gas that is recirculated internally through fan filter unit assembly 1502 by effectively defining space 1580, which can be in fluid communication with gas purification system 3130 via gas purification outlet line 3131 and gas purification inlet line 3133. Such a circulatory system including various embodiments of a ductwork system as described for FIGS. 16-18, provides substantially laminar flow, minimizes turbulent flow, promotes circulation, turnover and filtration of particulate matter of the gas atmosphere in the interior of the enclosure and provides for circulation through a gas purification system exterior a gas enclosure assembly.

FIG. 23 is a cross-sectional view taken along the length of a gas enclosure system 506, according to various embodiments of a gas enclosure system according to the present teachings. Like gas enclosure system 505 of FIG. 22, gas enclosure system 506 of FIG. 23 can include a gas enclosure assembly 1100, which can house an OLED inkjet printing system 2001, as well as circulation and filtration system 1500, gas purification system 3130 (FIG. 15), and thermal regulation system 3140. Circulation and filtration system 1500 can include ductwork assembly 1501 and fan filter unit assembly 1502. For various embodiments of gas enclosure system 506, thermal regulation system 3140, which can include fluid chiller 3142 in fluid communication with chiller outlet line 3141 and with chiller inlet line 3143, can be in fluid communication with a plurality of heat exchangers, for example, first heat exchanger 1562, and second heat exchanger 1564, as depicted in FIG. 23. According to various embodiments of gas enclosure system 506 as shown in FIG. 22, various heat exchangers, such as first heat exchanger 1562 and second heat exchanger 1564 can be in thermal communication with circulating inert gas by being positioned proximal to duct outlets, such as first ductwork outlet 1575 and second ductwork outlet 1576 of ductwork assembly 1501. In that regard, inert gas being returned for filtration from duct inlets, such as duct inlets, such as first ductwork inlet 1571 and second ductwork inlet 1572 of ductwork assembly 1501 can be thermally regulated prior to being circulated through, for example, a first fan filter unit 1552, a second fan filter unit 1554, and a third fan filter unit 1556, respectively, of fan filter unit assembly 1502 of FIG. 23.

As can be seen from the arrows showing direction of inert gas circulation through the enclosure in FIG. 22 and FIG. 23 the fan filter units can be configured to provide substantially laminar flow downwardly from a top of the enclosure toward the bottom. Fan filter units available, for example, from Flanders Corporation, of Washington, North Carolina, or Envirco Corporation of Sanford, North Carolina, may be useful for integration into various embodiments of a gas enclosure assembly according to the present teachings Various embodiments of a fan filter unit can exchange between about 350 cubic feet per minute (CFM) to about 700 CFM of inert gas through each unit. As shown in FIG. 22 and FIG. 23, as the fan filter units are in a parallel and not series arrangement, the amount of inert gas that can be exchanged in a system comprising a plurality of fan filter units is proportional to the number of units used.

Near the bottom of the enclosure the flow of gas is directed toward a plurality of ductwork inlets, indicated schematically in FIG. 22 and FIG. 23 as first ductwork inlet 1571 and second ductwork inlet 1572 of ductwork assembly 1501. As previously discussed herein for FIGS. 16-18, positioning the duct inlets substantially at the bottom of the enclosure, and causing downward flow of gas from upper fan filter units facilitates good turnover of the gas atmosphere within the enclosure and promotes thorough turnover and movement of the entire gas atmosphere through the gas purification system used in connection with the enclosure. By circulating the gas atmosphere through the ductwork and promoting laminar flow and thorough turnover of the gas atmosphere in the enclosure using circulation and filtration system 1500, which ductwork assembly 1501 separates the inert gas flow for circulation through gas purification loop 3130, levels of each of a reactive species, such as water and oxygen, as well as each of a solvent can be maintained in various embodiments of a gas enclosure assembly at 100 ppm or lower, for example 1 ppm or lower, for example, at 0.1 ppm or lower.

Figure 24:
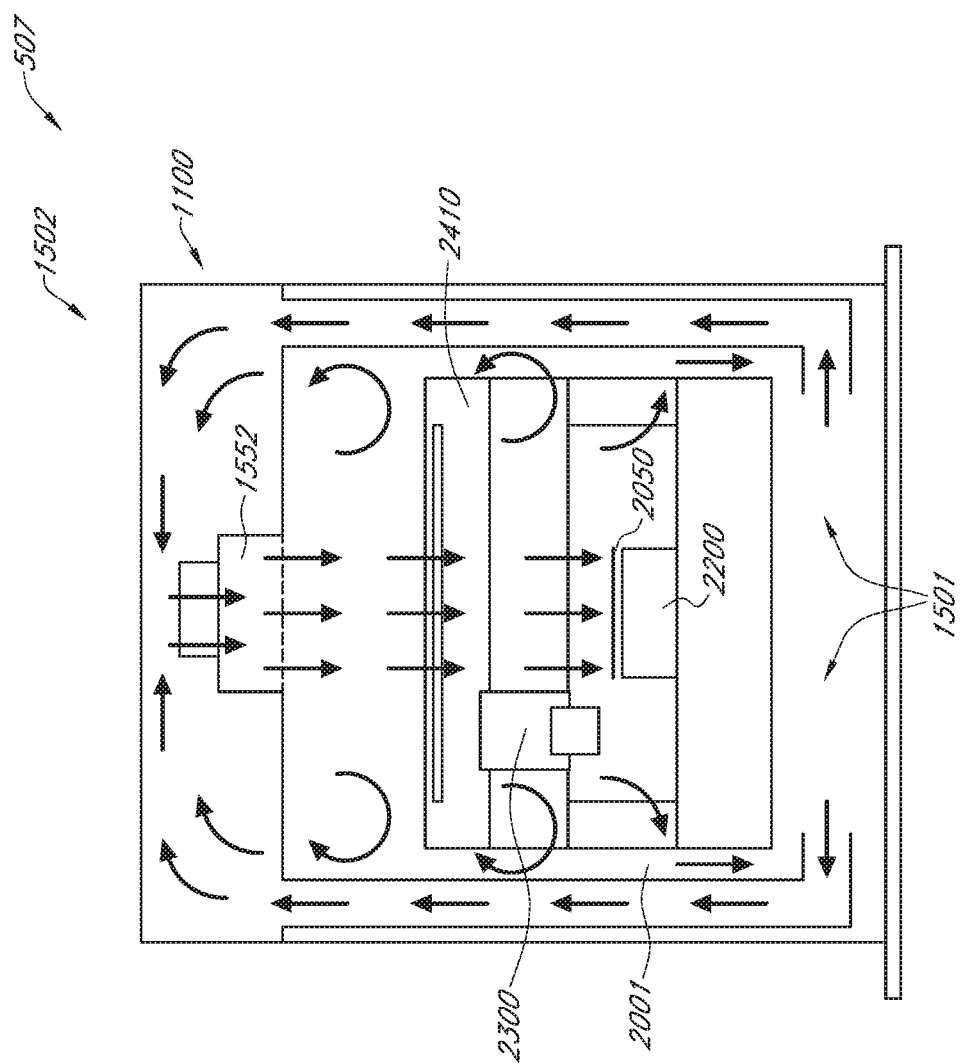
FIG. 24 is a schematic front section view of a gas enclosure depicting an embodiment of gas circulation through a gas enclosure assembly according to various embodiments of the present teachings.

FIG. 24 is a front schematic view of gas enclosure system 507, which can be a front schematic view of gas enclosure system 505 of FIG. 22. In FIG. 24, more detail can be seen of printing system 2001, which is depicted enclosed within gas enclosure system 507. Various embodiments of a gas enclosure system of the present teachings having a particle control system can provide a low-particle zone proximal to a substrate, such as substrate 2050 of FIG. 24, which can be supported by substrate support apparatus 2200. Substrate support apparatus 2200 of printing system 2001 for various embodiments of a printing system can be a chuck or a floatation table. As previously discussed herein, various embodiments of a gas circulation and filtration system according to the present teachings can include a ductwork assembly, such as ductwork assembly 1501 of FIG. 24, as well as a fan filter unit assembly that can have a plurality of fan filter units, such as fan filter unit assembly 1502, in which fan filter unit 1552 is shown in the front schematic view of FIG. 24. The gas flow indicated by the arrows depicts a laminar flow of filtered gas proximal to substrate 2050. Recalling, a laminar flow environment can minimize turbulence and can create a substantially low particle environment that can maintain airborne particulate levels meeting the standards of International Standards Organization Standard (ISO) 14644-1:1999, as specified by Class 1 through Class 5.

As will be discussed in more detail subsequently herein, for various embodiments of a gas enclosure system of the present teachings, an effective gas circulation and filtration system can be a part of a particle control system. However, various particle control systems of the present teachings also guard against particle generation proximal to a substrate during a printing process. As depicted in FIG. 24 for gas enclosure assembly 1100 of gas enclosure system 507, substrate 2050 can be proximal to various components of printing system 2001 that can be particle-generating. For example, X,Z carriage assembly 2300 can include components such as linear bearing systems that can be particle generating. Service bundle housing 2410 can contain particle-generating service bundles operatively connected from various apparatuses and system to a gas enclosure system including a printing system. Various embodiments of a service bundle can include bundled optical cables, electrical cables, wires and tubing, and the like, for providing optical, electrical, mechanical, and fluidic functions for various assemblies and systems disposed within the interior of the gas enclosure system.

A gas enclosure system of the present teachings can have various components that provide a particle control system. Various embodiments of a particle control system can include a gas circulation and filtration system in fluid communication with particle-generating components that have been contained, so that such particle-containing components can be exhausted into the gas circulation and filtration system. For various embodiments of a particle control system, particle-generating components that have been contained can be exhausted into dead spaces, rendering such particulate matter inaccessible for recirculation within a gas enclosure system. Various embodiments of gas enclosure systems of the present teachings can have a particle control system for which various components can be intrinsically low-particle generating, thereby preventing particles from accumulating on a substrate during a printing process. Various components of a particle control system of the present teachings can utilize containment and exhausting of particle-generating components, as well as selection of components that are intrinsically low-particle generating to provide a low-particle zone proximal to a substrate.

Figure 25:
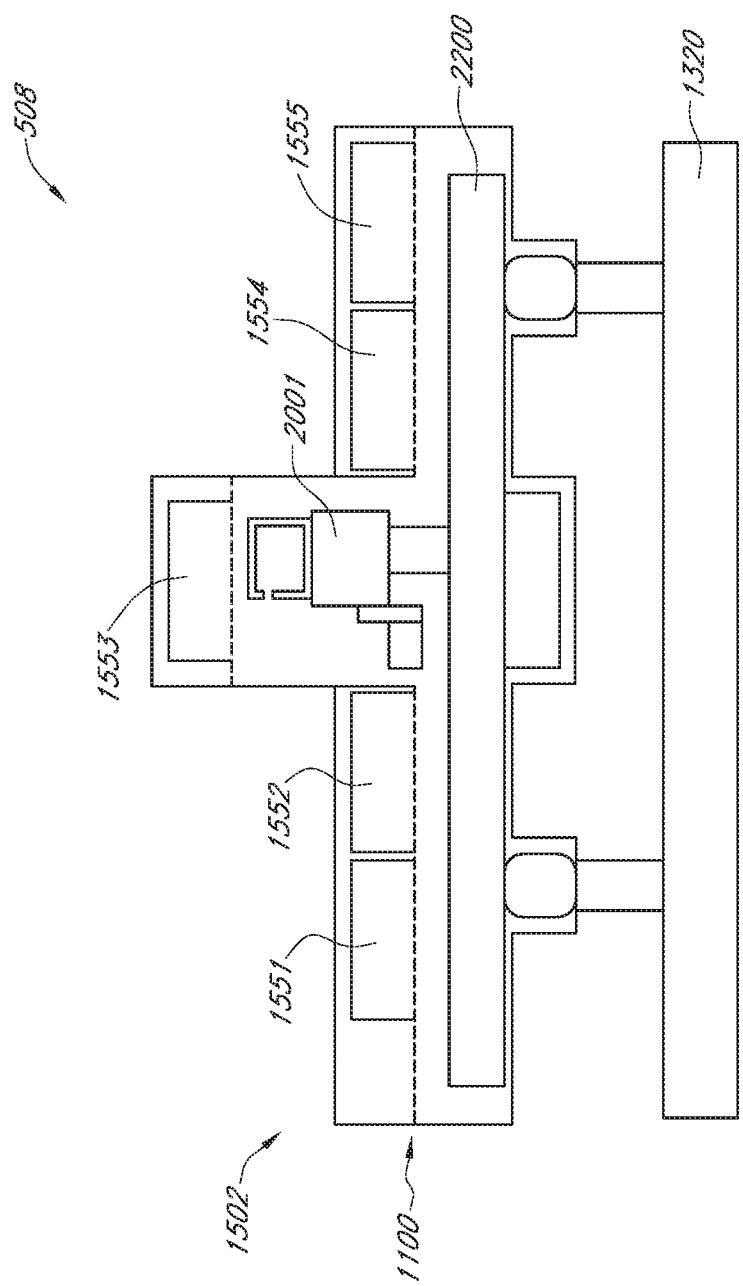
FIG. 25 is a cross-sectional schematic view of a gas enclosure assembly with system components in accordance with various embodiments of the present teachings.

According to various embodiments of a gas enclosure system used for OLED printing systems, the number of fan filter units can be selected in accordance with the physical position of a substrate in a printing system during processing. As such, the number of fan filter units can vary according to the travel of a substrate through a gas enclosure system. For example, FIG. 25 is a cross-sectional view taken along the length of a gas enclosure system 508, which is a gas enclosure system similar to that depicted in FIG. 9. Gas enclosure system 508 can include gas enclosure assembly 1100, which houses OLED inkjet printing system 2001 supported on gas enclosure assembly base 1320. Substrate floatation table 2200 of OLED printing system defines the travel over which a substrate can be moved through gas enclosure system 508 during the processing of a substrate. As such, fan filter unit assembly 1502 of gas enclosure system 508 has an appropriate number of fan filter units; shown as 1551-1555, corresponding to the physical travel of a substrate through inkjet printing system 2001 during processing. Additionally, the schematic section view of FIG. 25 depicts the contouring of various embodiments of a gas enclosure, which can effectively decrease the volume of inert gas required during an OLED printing process, and at the same time provide ready access to the interior of gas enclosure assembly 1100; either remotely during processing, for example, using gloves installed in various gloveports, or directly by various removable panels in the case of a maintenance operation.

Figure 26:
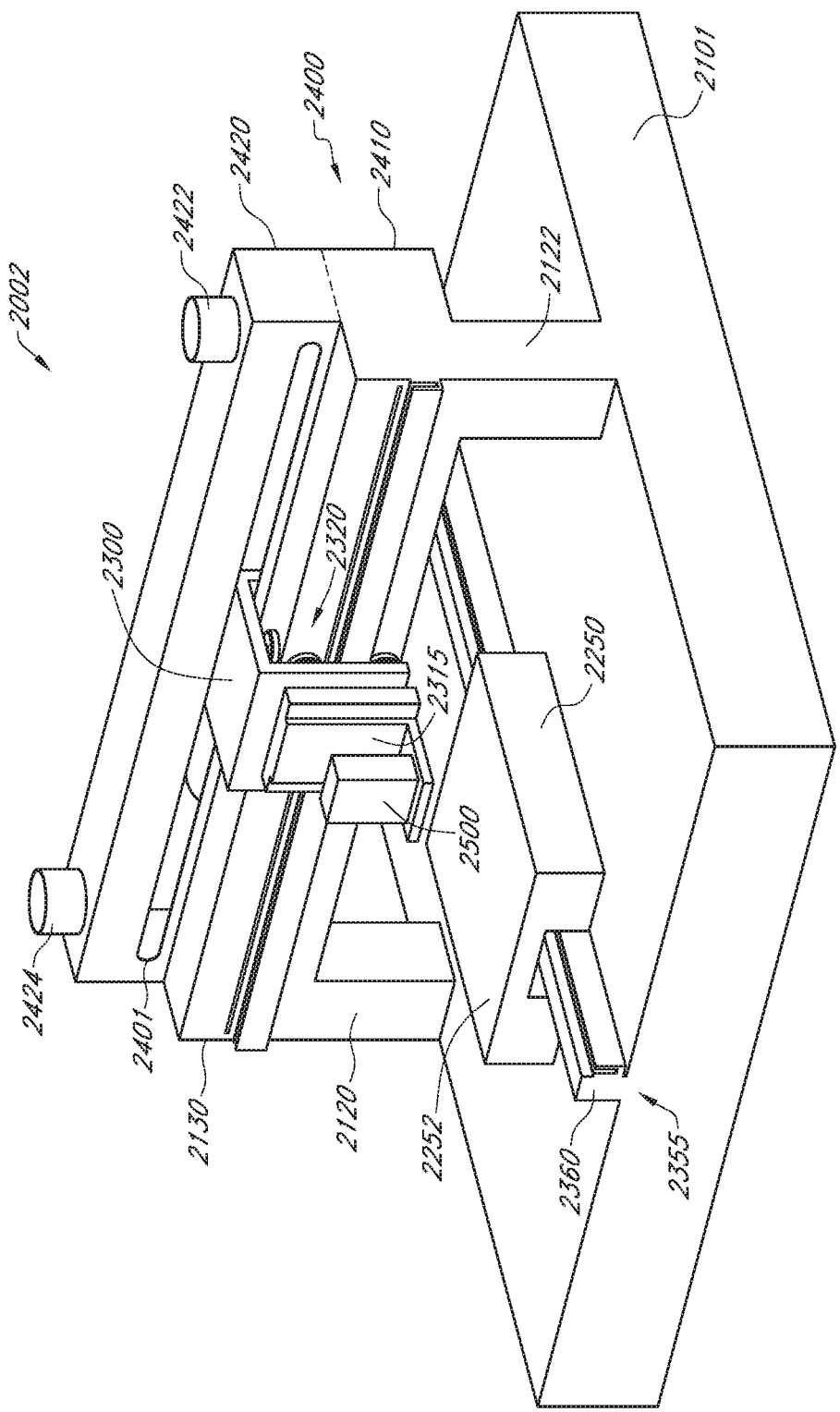
FIG. 26 is a perspective view of a printing system depicting various embodiments of a particle control system of the present teaching, which can include a low-particle X-axis motion system and service bundle housing exhaust system.

FIG. 26 depicts printing system 2002, according to various embodiments of a printing system of the present teachings. Printing system 2002 can have many of the features as previously described for printing system 2000 of FIG. 10B. Printing system 2002 can be supported by printing system base 2101. Orthogonal to printing system base 2101 and mounted upon it can be first riser 2120 and second riser 2122, upon which bridge 2130 can be mounted. For various embodiments of inkjet printing system 2002, bridge 2130 can support a at least one X-axis carriage assembly 2300 which can move in an X-axis direction relative to substrate support apparatus 2250 through service bundle carrier run 2401. As will be discussed in more detail subsequently herein, for various embodiments of printing system 2002, X-axis carriage assembly 2300 can utilize a linear air bearing motion system, which is intrinsically low-particle generating. According to various embodiments of a printing system of the present teachings, an X-axis carriage can have a Z-axis moving plate mounted thereupon. In FIG. 26, X-axis carriage assembly 2300 is depicted with first Z-axis moving plate 2315. In various embodiments of printing system 2002, a second X-axis carriage assembly can be mounted on bridge 2130, which can also have a Z-axis moving plate mounted thereupon. In that regard, similarly to printing system 2000 of FIG. 10B, for various embodiments of OLED inkjet printing system 2002, there can be two carriage assemblies each with a printhead assembly, for example, printhead assembly 2500 of FIG. 26, as well as a second printhead assembly mounted on a second X,Z-axis carriage assembly (not shown). In various embodiments of printing system 2002, a first printhead assembly, such as printhead assembly 2500 of FIG. 26, can be mounted on a first X,Z-axis carriage assembly, while a camera system for inspecting features of substrate 2050 can be mounted on a second X,Z-axis carriage assembly (not shown). In various embodiments of printing system 2002 of FIG. 26, a printhead assembly, such as printhead assembly 2500 of FIG. 26 can be mounted on an X,Z-axis carriage assembly, while either a UV lamp or a heat source for curing an encapsulation layer printed on substrate 2050 can be mounted on a second X,Z-axis carriage assembly (not shown).

According to various embodiments of printing system 2002, substrate support apparatus 2250 can be a floatation table, similar to floatation table 2200 of printing system 2000 of FIG. 10B, in which a substrate can be contained in the X,Y plane and a floatation table can be used to fix a stable Z-axis fly height. In various embodiments of printing system 2002, substrate support apparatus 2250 can be a chuck. In various embodiments of printing system 2002, a chuck can have top surface 2252 for mounting a substrate. In various embodiments of printing system 2002, top surface 2252 can support a top plate that can be replaceable, enabling easy exchangeability between different substrate sizes and types. In various embodiments of printing system 2002, a top plate can accommodate multiple substrates of different sizes and types. In various embodiments of printing system 2002 that can utilize a chuck as a substrate support apparatus, a substrate can be securely held on a chuck during a printing process using vacuum, magnetic or mechanical means known in the art. A precision XYZ motion system can have various components for the positioning of a substrate mounted on substrate support apparatus 2250 relative to printhead assembly 2500, which can include Y-axis motion assembly 2355, as well as X,Z carriage assembly 2300. Substrate support apparatus 2250 can be mounted on Y-axis motion assembly 2355 and can be moved on rail system 2360 using, for example, but not limited by, a linear bearing system; either utilizing mechanical bearings or air bearings. For various embodiments of gas enclosure systems, an air bearing motion system helps facilitation frictionless conveyance in the Y-axis direction for a substrate placed on substrate support apparatus 2250. Y-axis motion system 2355 can also optionally use dual rail motion, once again, provided by a linear air bearing motion system or a linear mechanical bearing motion system. According to the present teachings, other precision XYZ motion systems can be used, such as, for example, but not limited by, various embodiments of a 3-axis gantry system. For example, various embodiments of a 3-axis gantry system can have an X,Z carriage assembly mounted on a gantry bridge for precision X,Z axis movement, where the gantry can be moved precisely in the Y-axis direction.

In addition to a gas circulation and filtration system for maintaining a low-particle environment within a gas enclosure system, various embodiments of a printing system, such as printing system 2000 of FIG. 10B and printing system 2002 of FIG. 26, can have additional components integrated into a gas enclosure system that guard against particle generation proximal to a substrate during a printing process. For example, printing system 2000 of FIG. 10B and printing system 2002 of FIG. 26 can have an intrinsically low-particle generating X-axis motion system, in which X,Z carriage assembly 2300 can be mounted and positioned on bridge 2130 using linear air-bearing system 2320. Additionally, printing system 2000 of FIG. 10B and printing system 2002 of FIG. 26 can have service bundle housing exhaust system 2400 for containing and exhausting particles generated from a service bundle.

According to the present teachings, a service bundle can include, by way of non-limiting example, optical cables, electrical cables, wires and tubing, and the like. Various embodiments of a service bundle of the present teachings can be operatively connected to various devices and apparatuses in a gas enclosure system to provide optical, electrical, mechanical and fluidic connections required in the operation of, for example, but not limited by, various devices and apparatuses associated with a printing system. Given the size and complexity of various service bundles, various motion systems often require a service bundle carrier to manage a service bundle as it are moved along with the motion system. For various embodiments of a gas enclosure system of the present teachings, a service bundle carrier can be flexible ties for tying bundles of cabling, wires and tubing, and the like, together at regular intervals. For various embodiments of a gas enclosure system of the present teachings, a service bundle carrier can be a sheath or jacket that can that can cover bundles of cabling, wires and tubing, and the like, of a service bundle. In various embodiments of a gas enclosure system of the present teachings a service bundle carrier can molded together bundles of cabling, wires and tubing, and the like, of a service bundle. In various embodiments, a service bundle carrier can be a segmented or flexible chain that can support and carry bundles of cabling, wires and tubing, and the like.

According to various embodiments of gas enclosure systems of the present teachings, a service bundle housing, which can include a service bundle managed using a service bundle carrier, can contain particulate matter generated from a service bundle and service bundle carrier within a service bundle housing. Additionally, as will be discussed in more detail subsequently herein, movement of a service bundle carrier can compress air volume in a piston-like fashion as it moves within a service bundle housing, creating a positive pressure differential between the interior service bundle housing and the surrounding environment exterior the service bundle housing that can allow particulate matter formed from particle-generating components associated with the service bundle carrier to escape through, for example, the opening formed by a carrier run. Such particulate matter just proximal a substrate has a substantial probability of contaminating a substrate surface before being swept away into a circulation and filtration system. Accordingly, a service bundle housing exhaust system can be a component of various embodiments of a particle control system of a gas enclosure system that can contain and exhaust a service bundle housing in order to ensure a substantially low-particle printing environment.

As shown in FIG. 26, and indicated by the dashed line, for various embodiments of service bundle housing exhaust system 2400, service bundle housing 2410 and service bundle housing exhaust plenum 2420 can be a unitary assembly. For such embodiments, service bundle housing exhaust system 2400 can ensure that a positive pressure differential between the inlet portions and the outlet portions of a service bundle housing can be maintained for exhausting particles generated in service bundle housing 2410 into a gas circulation and filtration system through service bundle housing exhaust plenum first duct 2422 and service bundle housing exhaust plenum second duct 2424. Alternatively, for various embodiments, service bundle housing exhaust system 2400 can include service bundle housing exhaust plenum 2420, which can be mounted to and in fluid communication with service bundle housing 2410. Service bundle housing 2410 can contain particles generated by a service bundle that can include bundled optical cables, electrical cables, wires and tubing, and the like. Various embodiments of a service bundle of the present teachings can provide a gas enclosure system, which can include a printing system, with at least one of optical, electrical, mechanical, and fluidic functions for various assemblies and systems disposed within the interior of a gas enclosure. For various embodiments of printing system 2002, service bundle housing exhaust system 2400 can ensure that a positive pressure differential between the inlet portions and the outlet portions of a service bundle housing can be maintained for exhausting particles contained in service bundle housing 2410 into service bundle housing exhaust plenum 2420. Service bundle housing exhaust plenum 2420 can be in fluid communication with a gas circulation and filtration system through service bundle housing exhaust plenum first duct 2422 and service bundle housing exhaust plenum second duct 2424. Alternatively, service bundle housing exhaust plenum first duct 2422 and service bundle housing exhaust plenum second duct 2424 can be fitted with flexible exhaust hose, so that particles contained by a service bundle housing can be exhausted through a service bundle housing exhaust plenum and directed via flexible exhaust hosing into a targeted dead space.

Furthermore, in addition to maintaining a positive pressure differential between the inlet portions and outlet portions of a service bundle housing exhaust system, for various embodiments of a service bundle housing exhaust system, a relatively neutral or negative pressure differential can be further maintained between the interior of the service bundle housing exhaust system and the surrounding environment. Such a relatively neutral or negative pressure differential that can be maintained between the interior of the service bundle housing exhaust system and the surrounding environment can prevent the leakage of particles from the service bundle housing exhaust system through cracks, seams and the like. The leakage of particles through cracks, seems and the like, just proximal to a substrate has a substantial probability of contaminating a substrate surface before being swept away into a circulation and filtration system.

Figure 27A:
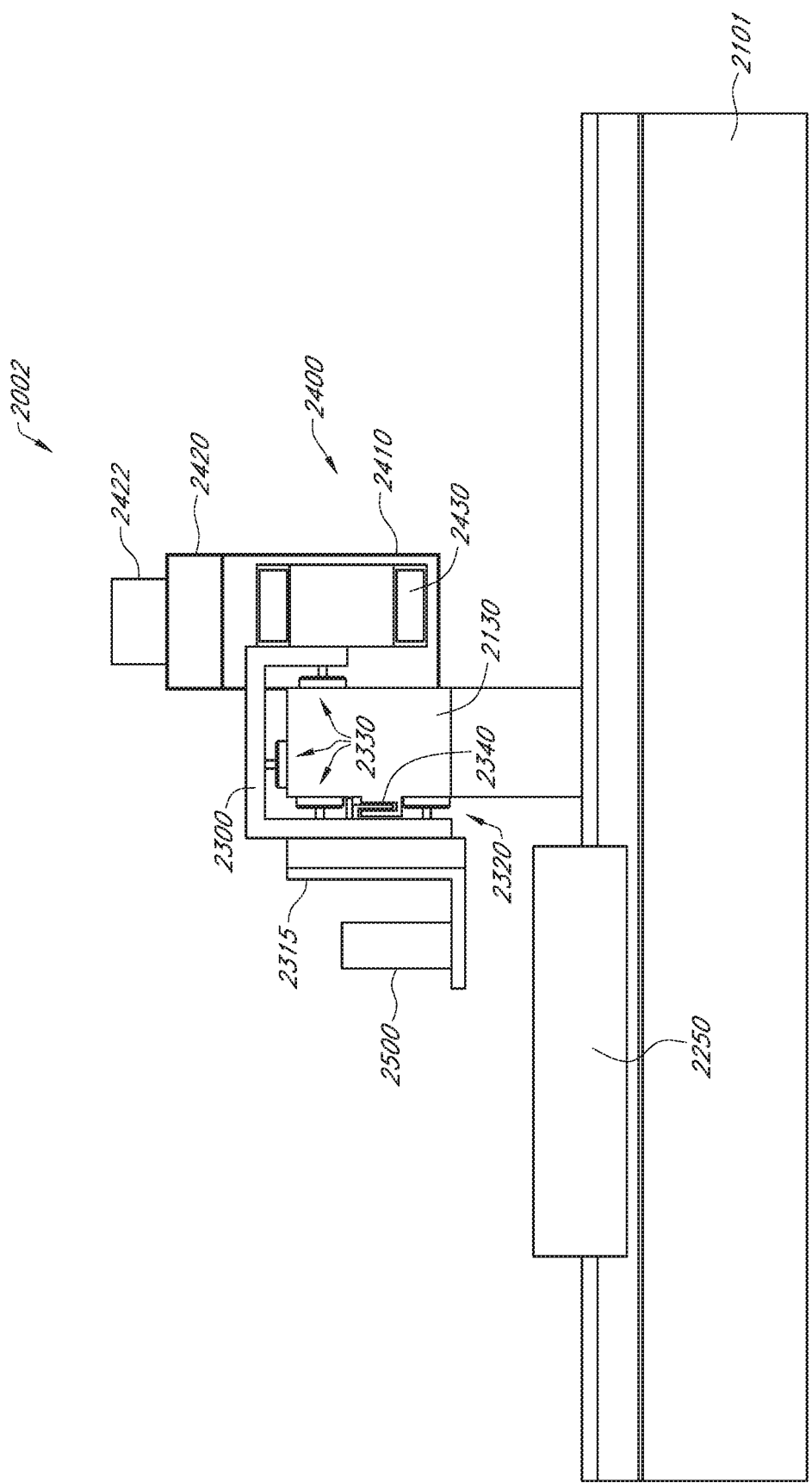
FIG. 27A and FIG. 27B are section views of a low-particle X-axis motion system according to various embodiments of the present teachings.

FIG. 27A depicts a side section view of low-particle generating X-axis motion system 2320 according to various embodiments of the present teachings. In FIG. 27A, low-particle generating X-axis motion system 2320 is depicted in relationship to service bundle housing exhaust system 2400, which as shown in FIG. 27A, can have service bundle housing 2410, and service bundle housing exhaust plenum 2420, which is in fluid communication with service bundle housing exhaust plenum first duct 2422. Printing system 2002 can include base 2101, upon which substrate support apparatus 2250 can be mounted. X,Z-carriage assembly 2300 can be mounted to bridge 2130. As can be seen in the section view presented in FIG. 27A, X-axis motion system 2320 can be a linear air bearing motion system, which is intrinsically low-particle generating. X-axis motion system 2320 can include a plurality of air bearing pucks 2330 and brushless linear motor 2340. Service bundle carrier 2430 can be mounted to X,Z-carriage assembly 2300, and can be housed in service bundle housing 2410. As depicted in FIG. 27A, service bundle housing exhaust plenum 2420 can be in fluid communication with service bundle housing 2410, as well as being in fluid communication with a gas circulation and filtration system through ductwork, such as service bundle housing exhaust plenum first duct 2422. In that regard, service bundle housing 2410 can exhaust particles that are generated from various embodiments of a service bundle. A service bundle according to the present teachings can be a bundle that can include, for example, but not limited by, optical cables, electrical cables, wires and tubing, and the like, which can be managed using various embodiments of service bundle carrier 2430. Various embodiments of a service bundle of the present teachings can be operatively connected to a printing system to provide various optical, electrical, mechanical and fluidic connections required to operate, for example, but not limited by, a printing system.

For various embodiments of a gas enclosure of the present teachings, a service bundle carrier, such as service bundle carrier 2430, can be supported by service bundle housing bottom side 2404. For various embodiments of a gas enclosure of the present teachings, a service bundle carrier, such as service bundle carrier 2430, can be supported by a tray or a shelf.

Figure 27B:
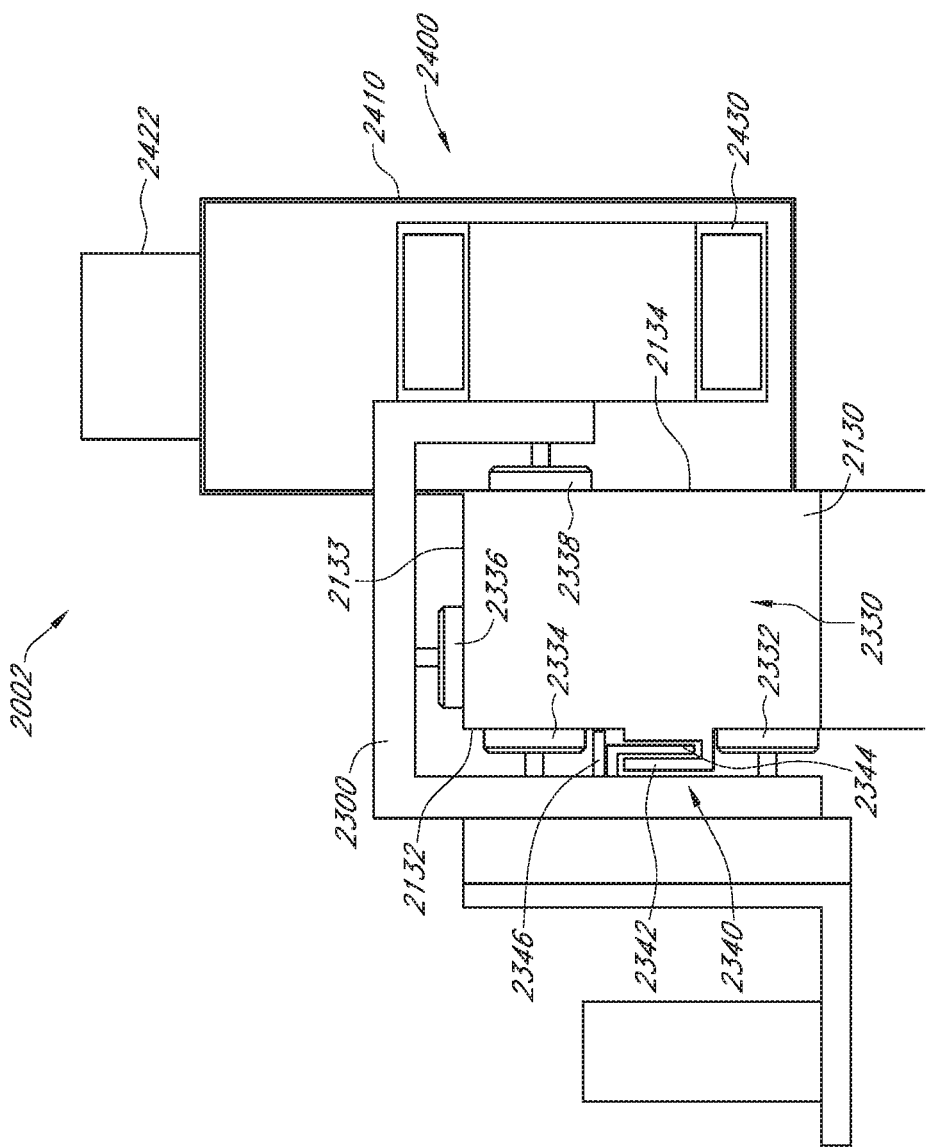

FIG. 27B is an expanded view of FIG. 27A, which depicts low-particle generating X-axis motion system 2320 of printing system 2002 in more detail. A plurality of air bearing pucks 2330 can be mounted to the interior surface of X,Z-axis carriage assembly 2300. In that regard, various embodiments of low-particle generating X-axis motion system 2320 can provide frictionless travel of X,Z-axis carriage assembly 2300 over bridge 2130. In FIG. 27A, first puck 2332 and second puck 2334 are shown proximal to first side 2132 of bridge 2130. Third puck 2336 of FIG. 27B can be proximal to top surface 2133 of bridge 2130, while forth puck 2338 can be proximal to second side 2134 of bridge 2130. Brushless linear motor can include X,Z-axis carriage assembly magnet track 2342, which can be mounted on bridge 2130, and linear motor winding 2344, which can be mounted to X,Z-axis carriage assembly 2300. Encoder read head 2346 can be associated with linear motor winding 2344 for positioning linear motor 2340. In various embodiments of brushless linear motor 2340, encoder read head 2346 can be an optical encoder. As will be discussed in more detail subsequently herein, various embodiments of low-particle X-axis motion system 2320 utilizing on frictionless air bearing pucks can be integrated with various embodiments of a compressor loop, as shown and described for FIG. 33 and FIG. 34. Finally, as shown in FIG. 27B, service bundle housing exhaust system 2400 can include service bundle housing 2410, which can house service bundle carrier 2430. Service bundle housing exhaust system 2400 can contain and exhaust can exhaust particles from service bundle housing 2410, which can be generated a service bundle, which can be managed using a service bundle carrier, such as service bundle carrier 2430.

Figure 28A:
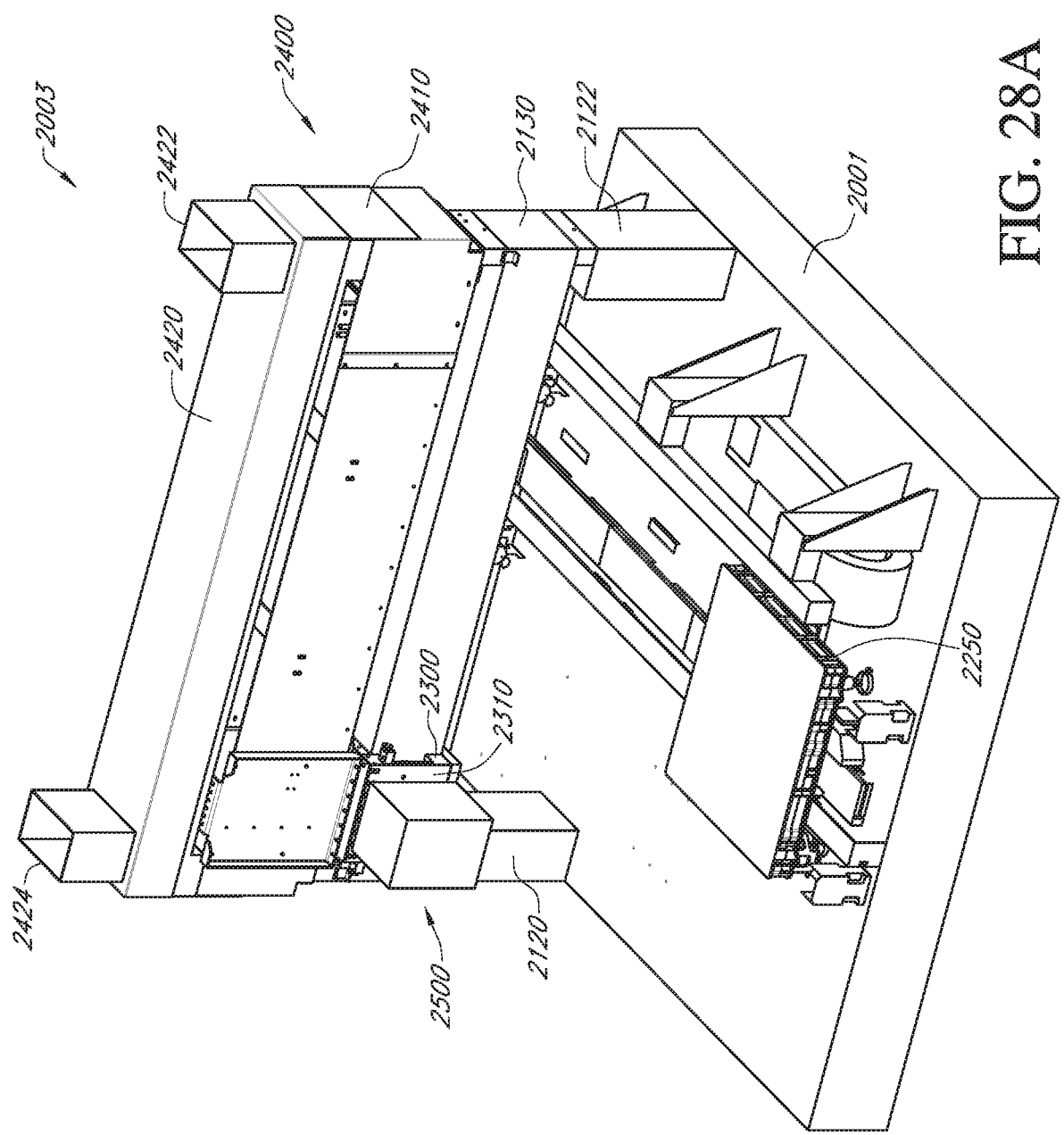
FIG. 28A and FIG. 28B are various perspective views of a service bundle housing exhaust system for a printing system according to various embodiments of the present teachings.

FIG. 28A is a front perspective view of printing system 2003, which is shown having service bundle housing exhaust system 2400 mounted on top of bridge 2130. Various embodiments of printing system 2003 can have many features as previously described for printing system 2000 of FIG. 10B and printing system 2002 of FIG. 26. For example, printing system 2003 can be supported by printing system base 2101. Orthogonal to printing system base 2101 and mounted upon it can be first riser 2120 and second riser 2122, upon which bridge 2130 can be mounted. For various embodiments of inkjet printing system 2003, bridge 2130 can support a at least one X-axis carriage assembly 2300 which can move in an X-axis direction relative to substrate support apparatus 2250 through service bundle carrier run 2401. According to various embodiments of a printing system of the present teachings, X-axis carriage 2300 can have Z-axis moving plate 2310 mounted thereupon. In that regard, various embodiments of carriage assembly 2300 can provide precision X,Z positioning of printhead assembly 2500 with respect to substrate support apparatus 2250. In various embodiments of printing system 2003, a second X-axis carriage assembly can be mounted on bridge 2130, which second X-axis carriage can have a Z-axis moving plate mounted thereupon. For embodiments of printing system 2003 having two X-axis carriage assemblies, either a printhead assembly can be mounted on each X,Z-axis carriage, or various other devices, for example, as a camera, a UV lamp, and a heat source, as described for printing system 2000 of FIG. 10B and 2002 of FIG. 26, can be mounted on the two X,Z-axis carriage assemblies. According to various embodiments of printing system 2003, substrate support apparatus 2250 for supporting a substrate can be a floatation table, similar to floatation table 2200 of printing system 2000 of FIG. 10B, or it can be a chuck, as previously described for printing system 2002 of FIG. 26. Printing system 2003 of FIG. 28A can have an intrinsically low-particle generating X-axis motion system, in which X,Z carriage assembly 2300 can be mounted and positioned on bridge 2130 using an air bearing linear slider assembly. For various printing systems of the present teachings, an air bearing linear slider assembly can wrap around the entirety of bridge 2130, allowing frictionless movement of X,Z carriage assembly 2300 on bridge 2130, as well providing three point mounting that can preserve accuracy of travel for X,Z carriage assembly 2300, as well as resisting skew.

Regarding the precise movement of a substrate relative to a printhead assembly, various embodiments of printing system 2003 of FIG. 28A can have a precision XYZ motion system, which can include Y-axis motion assembly 2355, in addition to X,Z carriage assembly 2300. Substrate support apparatus 2250 can be mounted on Y-axis motion assembly 2355 and can be moved on rail system 2360 using, for example, but not limited by, a linear bearing system; either utilizing mechanical bearings or air bearings. For various embodiments of gas enclosure systems, an air bearing motion system helps facilitation frictionless conveyance in the Y-axis direction for a substrate placed on substrate support apparatus 2250. Y-axis motion system 2355 can also optionally use dual rail motion, once again, provided by a linear air bearing motion system or a linear mechanical bearing motion system. According to the present teachings, other precision XYZ motion systems can be used, such as, for example, but not limited by, various embodiments of a 3-axis gantry system. For example, various embodiments of a 3-axis gantry system can have an X,Z carriage assembly mounted on a gantry bridge for precision X,Z axis movement, where the gantry can be moved precisely in the Y-axis direction.

As depicted in FIG. 28A, for various embodiments of printing system 2003, service bundle housing exhaust system 2400 can be mounted over bridge 2130. Service bundle housing exhaust system 2400 can include service bundle housing exhaust plenum 2420, which can be mounted to and in fluid communication with service bundle housing 2410. Service bundle housing 2410 can contain particles generated by service bundles that can include bundled optical cables, electrical cables, wires and tubing. Various embodiments of a service bundle of the present teachings can provide a gas enclosure system including a printing system with at least one of optical, electrical, mechanical, and fluidic functions for various assemblies and systems disposed within the interior. For various embodiments of printing system 2003, service bundle housing exhaust system 2400 can ensure that a positive pressure differential between the inlet portions and outlet portions of a service bundle housing exhaust system can be maintained for exhausting particles contained in service bundle housing 2410 into service bundle housing exhaust plenum 2420. Service bundle housing exhaust plenum 2420 can be in fluid communication with a gas circulation and filtration system through service bundle housing exhaust plenum first duct 2422 and service bundle housing exhaust plenum second duct 2424. Alternatively, service bundle housing exhaust plenum first duct 2422 and service bundle housing exhaust plenum second duct 2424 can be fitted with flexible exhaust hose, so that particles contained by a service bundle housing can be exhausted through a service bundle housing exhaust plenum and directed via flexible exhaust hosing into a targeted dead space.

For various embodiments of a service bundle housing exhaust system, in addition to maintaining a positive pressure differential between the inlet portions and outlet portions of a service bundle housing exhaust system, a relatively neutral or negative pressure differential can be further maintained between the interior of the service bundle housing exhaust system and the surrounding environment. Such a relatively neutral or negative pressure differential that can be maintained between the interior of the service bundle housing exhaust system and the surrounding environment can prevent the leakage of particles from the service bundle housing exhaust system through cracks, seams and the like. The leakage of particles through cracks, seems and the like, just proximal to a substrate has a substantial probability of contaminating a substrate surface before being swept away into a circulation and filtration system.

Figure 28B:
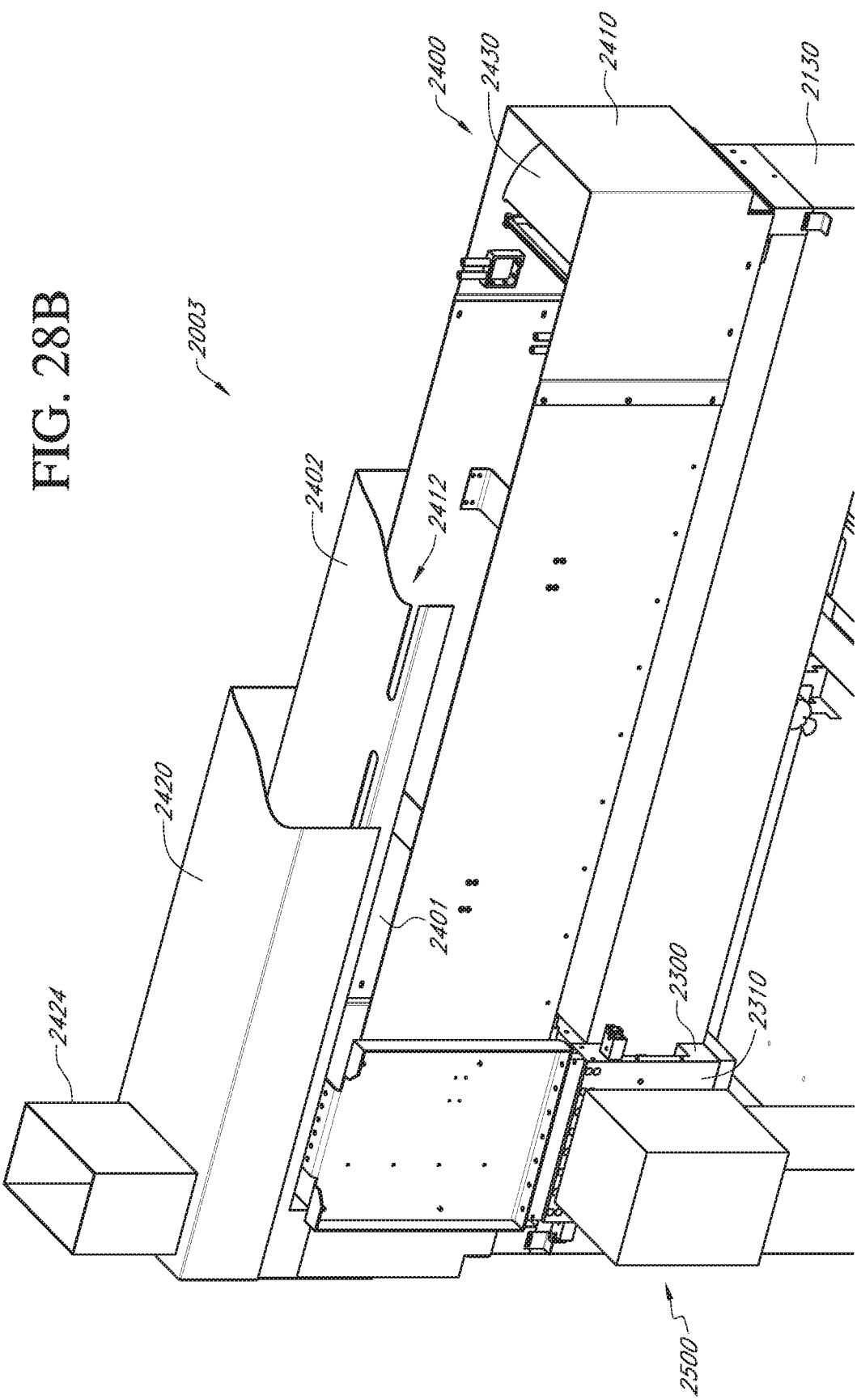

FIG. 28B depicts an expanded partial cut-away front perspective view of printing system 2003. In FIG. 28B, X,Z carriage assembly 2300, which can utilize an air bearing linear slider assembly for positioning X,Z carriage assembly 2300 carriage on bridge 2130. The movement of X,Z carriage assembly 2300 moves in a X-axis direction over a distance defined by service bundle carrier run 2401. Service bundle carrier run 2401 is an opening that allows movement of optical cables, electrical cables, wires and tubing, and the like, which are bundled into a service bundle, which is housed in service bundle housing 2410 and can be connected, for example, but not limited by, to printhead assembly 2500. Given the size and complexity of various service bundles, various motion systems often require a service bundle carrier to manage a service bundle as it are moved along with the motion system. In that regard, service bundle carrier 2430 is shown housed in service bundle housing 2410 of FIG. 28B. During printing, as a carriage assembly moves to precisely position a printhead assembly in an X-axis direction relative to a substrate positioned below it, the movement of service bundles that can include cables, wires and tubing, and the like, as well as the movement of a service bundle carrier itself, can create particulate matter just proximal to a substrate positioned below a service bundle housing. Moreover the movement of a service bundle carrier can compress air volume in a piston-like fashion as it moves within a service bundle housing, creating a positive pressure that can allow particulate matter formed from particle-generating components associated with a service bundle carrier to escape through, for example, carrier run 2401. Such particulate matter just proximal a substrate has a substantial probability of contaminating a substrate surface before being swept away into a circulation and filtration system. Accordingly, a service bundle housing exhaust system can be a component of various embodiments of a particle control system of a gas enclosure system that can ensure a substantially low-particle printing environment.

In FIG. 28B, service bundle housing top surface 2402 is shown having a set of slots 2414, forming a slotted top surface. For various embodiments of service bundle housing exhaust system 2400 of FIG. 28B, two requirements of such a system for ensuring that particulate matter formed from particle-generating components associated with a service bundle carrier is swept into a circulation and filtration system: 1) the exhaust flow through a service bundle housing exhaust system should be greater than the volumetric change on the gas compression side of a service bundle carrier as it move in a service bundle housing; and 2) there should be an even distribution of a constant exhaust flow to effectively sweep a service bundle housing volume. Various embodiments a service bundle housing exhaust system of the present teachings ensure that these two requirements are met.

For example, as depicted in FIG. 29A, various embodiments of a service bundle housing exhaust system can include service bundle housing 2410, which can be used to house service bundle carrier 2430. In FIG. 29A, service bundle carrier 2430 is depicted as a segmented flexible chain-type of service bundle carrier, various other types of service bundle carriers that can be used can behave similarly, thereby requiring the use of various embodiments of a service bundle housing exhaust system of the present teachings. Service bundle carrier run 2401 is an opening that can allow particulate matter formed from particle-generating components associated with a service bundle carrier to escape a service bundle housing as a result of a positive pressure created by the movement of a service bundle carrier. Service bundle housing exhaust plenum 2420 can be maintained at a positive pressure that can ensure that particle-generating components associated with a service bundle carrier can be exhausted through service bundle housing exhaust plenum first duct 2422 and service bundle housing exhaust plenum second duct 2424 and into a circulation and filtration system. A set of service bundle housing slots 2412 formed in service bundle housing top surface 2402 as shown in FIG. 29A can ensure an even distribution of a constant exhaust flow to effectively sweep the volume of service bundle housing 2410.

Though service bundle housing slots 2412 are shown in FIG. 29A formed across service bundle housing top side 2402, it can be appreciated that a set of slots can be located on various surfaces of a service bundle housing, as depicted in FIG. 29B. As depicted in FIG. 29B, a set of slots can be located on service bundle housing bottom side 2404 (set I.), service bundle housing first side 2406 (set II.), as well as service bundle housing second side 2408 (set III.) Moreover, as depicted in FIG. 29C, though slots can be one type of opening for promoting the even distribution of a constant exhaust flow to effectively sweep a service bundle housing volume, openings having various shapes, aspect ratios and locations can be used. As shown in FIG. 29C, substantially circular openings, such as first service bundle housing opening 2411 and second service bundle housing opening 2413 depicted as formed in service bundle housing top side 2402 can be used to promote the even distribution of a constant exhaust flow to effectively sweep a service bundle housing volume. As depicted in FIG. 29C, an alternative placement for substantially circular openings can be on ends of a service bundle housing. In FIG. 29C, first service bundle housing opening 2411 and second service bundle housing opening 2413 depicted as formed in service bundle housing first end 2415 and service bundle housing second end 2417, respectively, can be used to promote the even distribution of a constant exhaust flow to effectively sweep a service bundle housing volume. Additionally, various embodiments of a service bundle housing may have first service bundle carrier 2401 and a second service bundle carrier run 2407. Service bundle housing top surface 2402 can have a first set of slots 2412 and a second set of slots 2414, proximal to first service bundle carrier 2401 and a second service bundle carrier run 2407, respectively, can be used to promote the even distribution of a constant exhaust flow to effectively sweep a service bundle housing volume. Finally, as shown in FIG. 27B, when a service bundle housing exhaust system includes a housing that is a single piece, a uniform distribution of a constant exhaust flow can be promoted by consideration of an effective exhaust gas flow.

Figure 30B:
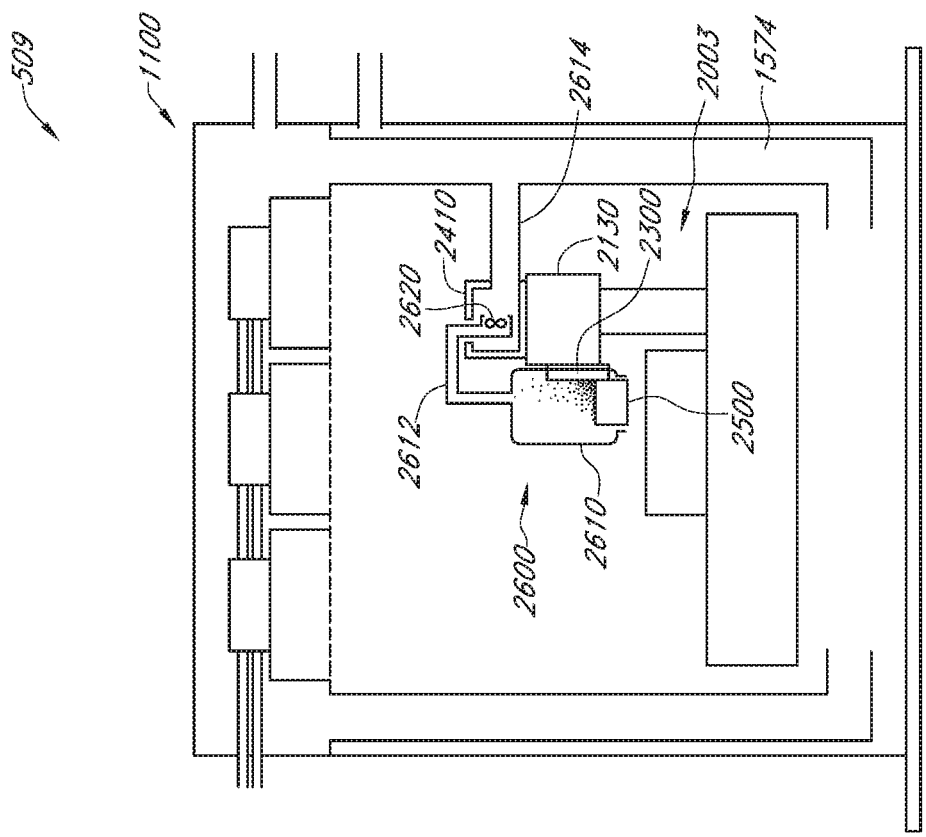
FIG. 30A and FIG. 30B are schematic diagrams of a gas enclosure system depicting an embodiment of gas circulation and particle collection around a printhead assembly in a gas enclosure assembly according to various embodiments of the present teachings.
Figure 30A:
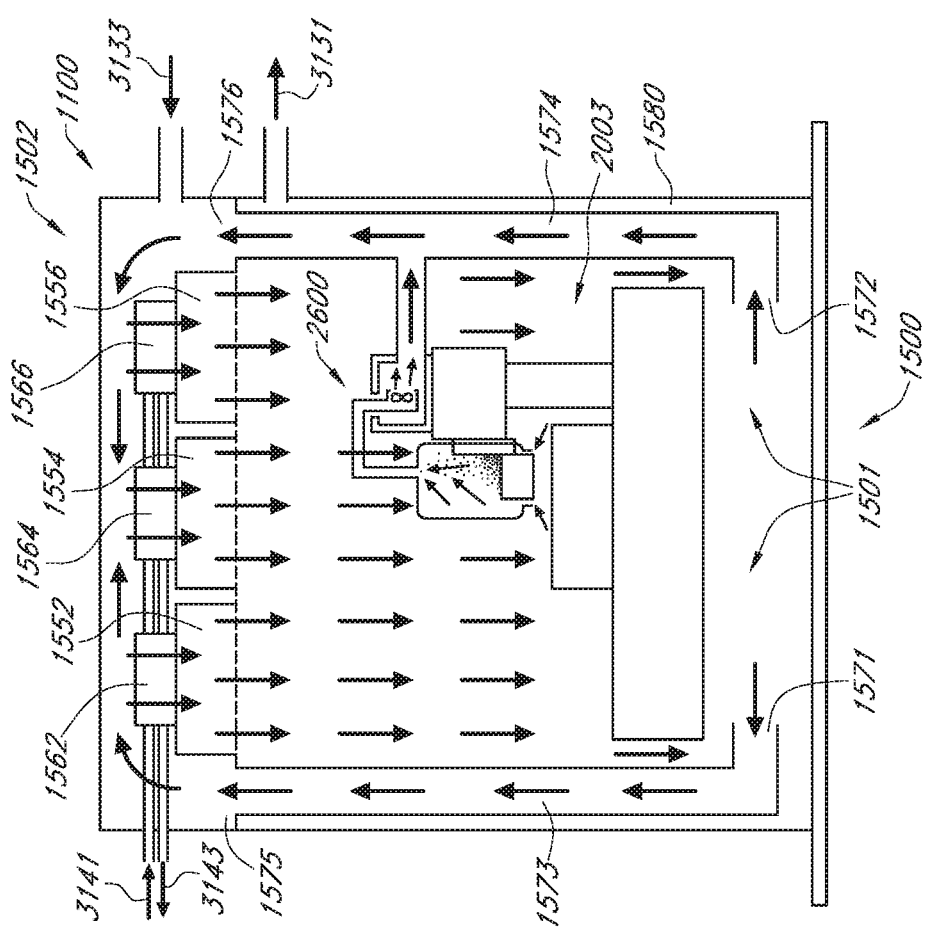
Figures 32A, 32B:
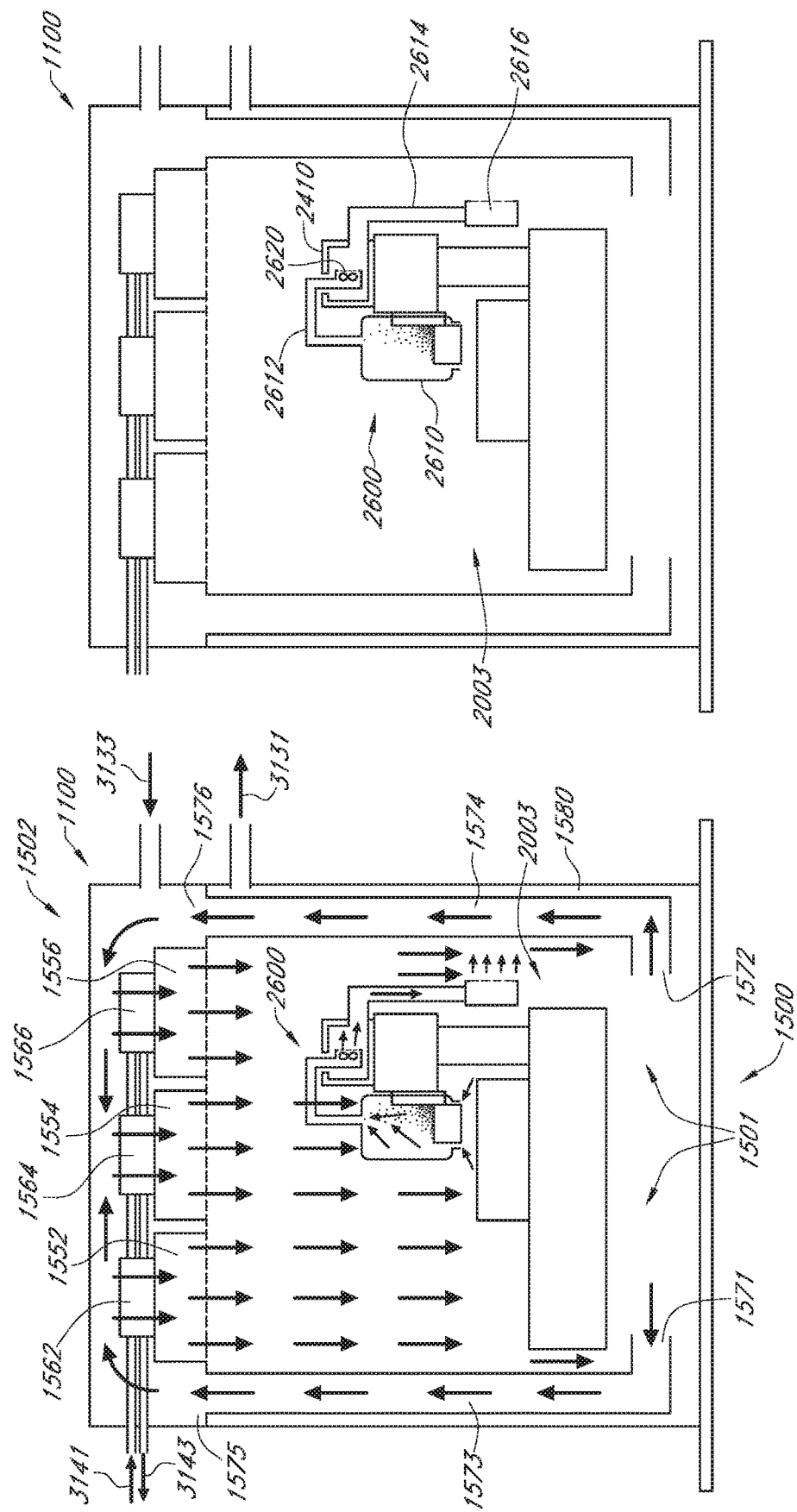
FIG. 32A and FIG. 32B are schematic diagrams of a gas enclosure system depicting an embodiment of gas circulation and particle collection around a printhead assembly in a gas enclosure assembly according to various embodiments of the present teachings.

Various embodiments of a gas enclosure system of the present teachings as depicted in FIG. 30A/30B through FIG. 32A/32B can have features as previously discussed herein with respect to FIG. 22, FIG. 23 and FIG. 24 regarding a gas circulation and filtration system that can promote laminar flow and thorough turnover of the gas atmosphere in the enclosure, thereby ensuring that a substantially low-particle environment for airborne particulate matter can be maintained. As previously discussed herein, a circulation and filtration system for maintaining low-particulate airborne specifications is one part of a particulate control system for various embodiments of a gas enclosure system of the present teachings. A particle control system of the present teachings can also include a low-particle generating X-axis motion system utilizing air bearings, as well as utilizing a service bundle housing exhaust system. Various embodiments of a low-particle generating X-axis motion system utilizing air bearings can substantially eliminate the generation of particulate matter. Further, various embodiments of a service bundle housing exhaust system can be utilized to ensure that particulate matter generated just proximal a substrate during the printing process can contained and then swept into the circulation and filtration system for removal. Additionally, as depicted in FIG. 30A/30B through FIG. 32A/32B, for controlling particulate matter formed by various devices, apparatuses, service bundles and the like that can be positioned proximal a substrate during a printing process, various embodiments of a particle control system of the present teachings can have a printhead assembly exhaust system.

Figure 31B:
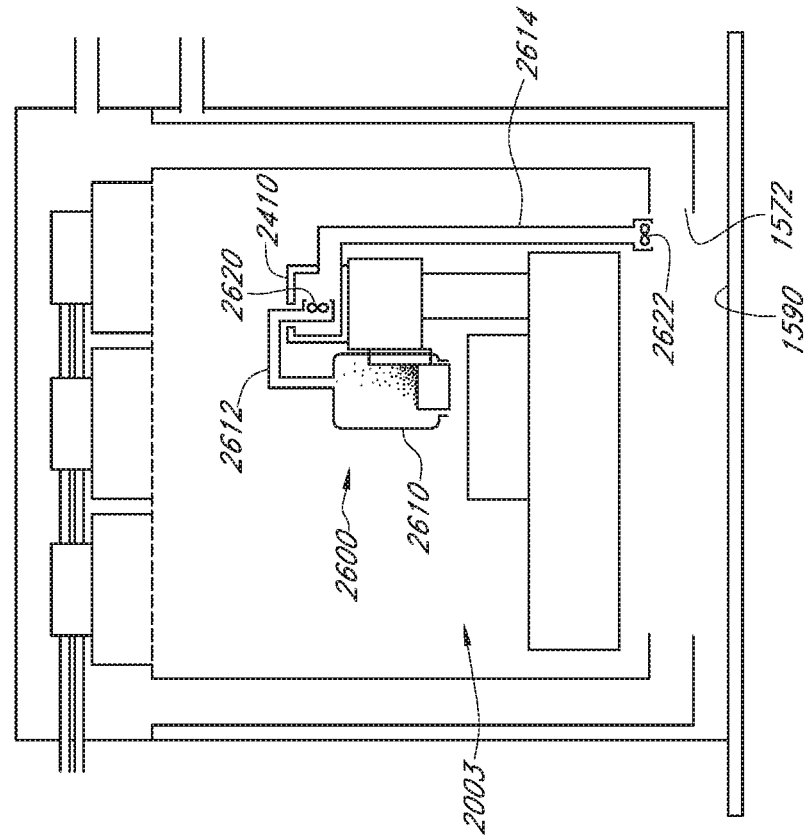
FIG. 31A and FIG. 31B are schematic diagrams of a gas enclosure system depicting an embodiment of gas circulation and particle collection around a printhead assembly in a gas enclosure assembly according to various embodiments of the present teachings.
Figure 31A:
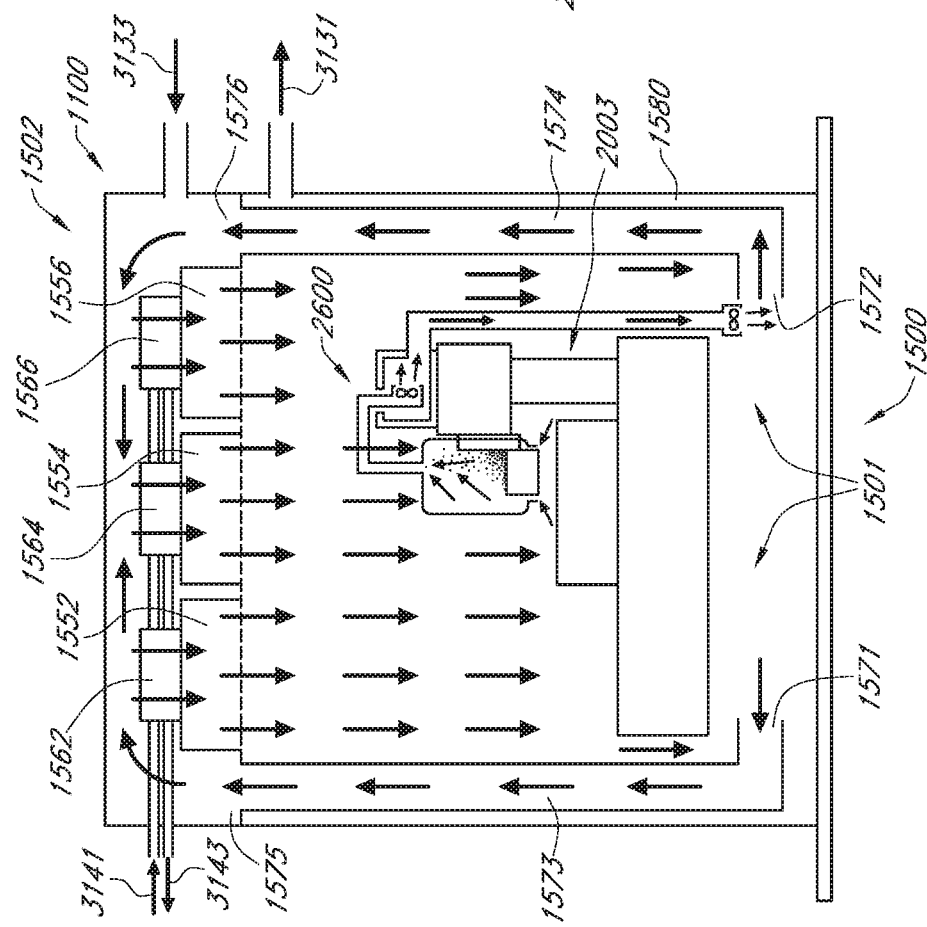

FIG. 30A/30B depict gas enclosure system 509, while FIG. 31A/31B depict gas enclosure system 510, and FIG. 32A/32B depict gas enclosure system 511, all of which can have features as previously described for FIG. 22, and FIG. 23, as shown. Gas enclosure systems 509 through 511 can have circulation and filtration system 1500, gas purification system 3130, and thermal regulation system 3140. Circulation and filtration system 1500 can include ductwork assembly 1501 and fan filter unit assembly 1502. Ductwork assembly 1501 can separate inert gas that is recirculated internally through fan filter unit assembly 1502 and externally to gas purification system 3130 by effectively defining space 1580, which is effectively a conduit in fluid communication with gas purification system 3130. Space 1580 can be in fluid communication with a gas purification system 3130 (FIG. 12 and FIG. 13) through gas purification outlet line 3131 and gas purification inlet line 3133. Such a circulatory system including various embodiments of a ductwork system as described for FIGS. 16-18, provides substantially laminar flow, minimizes turbulent flow, promotes circulation, turnover and filtration of particulate matter of the gas atmosphere in the interior of a gas enclosure and provides for circulation through a gas purification system exterior to a gas enclosure assembly.

Additionally, gas enclosure systems 509 through 511 as depicted in FIG. 30A/30B through FIG. 32A/32B, respectively, can have printhead assembly exhaust system 2600, which can be utilized to contain and exhaust particulates formed by various assemblies associated with printing system 2003. For various embodiments of gas enclosure systems 509, 510 and 511, printhead assembly exhaust system 2600 can house, for example, but not limited by carriage assembly 2300 onto which printhead assembly 2500 can be affixed, as depicted in FIG. 30A/30B, FIG. 31A/31B, and FIG. 32A/32B, respectively. Such a moving plate can utilize friction bearings, which as previously discussed herein, can generate particles during operation of an OLED printing system. Additionally, as previously discussed herein, a carriage assembly can be used to mount an apparatus such as a UV lamp assembly or heat source assembly for curing an encapsulation layer. Either a UV lamp or a heat source may require cooling using a fan.

Accordingly, printhead assembly exhaust system 2600 of gas enclosure systems 509, 510 and 511 can be part of a particulate control system used for containing and exhausting particulate matter formed by various devices, apparatuses, service bundles and the like that can be positioned proximal a substrate during a printing process. Various embodiments of a printhead assembly exhaust system, such as printhead assembly exhaust system 2600 of gas enclosure systems 509, 510 and 511 can ensure that a positive pressure differential can be maintained between the inlet portions and the outlet portions of a printhead assembly exhaust housing for exhausting particles generated by various components of a printhead assembly into a gas circulation and filtration system. For various embodiments of a printhead assembly exhaust system, a positive pressure differential can be maintained between the inlet portions and the outlet portions of a printhead assembly exhaust housing for exhausting particles generated by various components of a printhead assembly into a dead space. As will be discussed in more detail subsequently herein, a positive pressure differential for exhausting particles generated by various components of a printhead assembly can be created, by use of fans as well as other system components, such as, but not limited by, providing fluid communication between a printhead assembly exhaust housing and a circulation and filtration system.

For various embodiments of a printhead assembly exhaust system, in addition to maintaining a positive pressure differential between the inlet portions and outlet portions of a printhead exhaust assembly, a relatively neutral or negative pressure differential can be further maintained between the interior of the printhead exhaust assembly and the surrounding environment. Such a relatively neutral or negative pressure differential that can be maintained between the interior of the printhead exhaust assembly and the surrounding environment can prevent the leakage of particles from the printhead exhaust assembly through cracks, seams and the like. The leakage of particles through cracks, seams and the like, just proximal to a substrate has a substantial probability of contaminating a substrate surface before being swept away into a circulation and filtration system.

As depicted in FIG. 30A and FIG. 30B, service bundle housing 2410 can be supported on bridge 2130 of printing system 2003. As previously discussed herein in reference to printing system 2000 of FIG. 10B, carriage assembly 2300 can have components for controlling X-Z axis movement, including a Z-axis moving plate onto which printhead assembly 2500 can be affixed. Printhead assembly exhaust system housing 2610 can be in fluid communication with service bundle housing 2410, for example, but not limited by, printhead assembly exhaust system first conduit 2612. Service bundle housing 2410 can be in fluid communication with ductwork assembly 1501 through, for example, but not limited printhead assembly exhaust system second conduit 2614, which can be in fluid communication with second ductwork conduit 1574. Printhead assembly exhaust system 2600 of FIG. 30A and FIG. 30B, which can contain components at risk of generating particles, such as a moving plate, can have at least one fan, such as fan 2620, for promoting gas movement through printhead assembly exhaust system 2600 and into service bundle housing 2410.

In that regard, the entirety of air contained in printhead assembly exhaust system 2600 and service bundle housing 2410 can be effectively filtered by circulation and filtration system 1500, as depicted in FIG. 30A.

According to the present teachings, particulate matter collecting in a dead space area away from a substrate mounted on substrate support apparatus cannot be recirculated within a gas enclosure system. In that regard, various embodiments of a gas enclosure system depicted in FIG. 31A/31B and FIG. 32A/32B may utilize directing particulate matter into a ductwork system, as well as into dead space. During regular gas enclosure system maintenance, such particulate matter can be removed from a dead space.

In that regard, for various embodiments of a gas enclosure system, such as gas enclosure system 510 of FIG. 31A and FIG. 31B, service bundle housing 2410 can be in fluid communication with circulation and filtration system 1500. As depicted in FIG. 31B, printhead assembly exhaust system housing 2610 can be in fluid communication with service bundle housing 2410, for example, but not limited by, printhead assembly exhaust system first conduit 2612. Service bundle housing 2410 can be in fluid communication with printhead assembly exhaust system second conduit 2614, which can have an outlet end proximal to second ductwork inlet 1572 of ductwork assembly 1501. In that regard, printhead assembly exhaust system second conduit 2614 can be in fluid communication with ductwork assembly via second ductwork conduit 1574. Printhead assembly exhaust system first conduit 2612 can have a fan, such as fan 2620, for promoting gas movement through printhead assembly exhaust system first conduit 2612. Additionally, printhead assembly exhaust system second conduit 2614 can have fan 2622 for promoting gas movement through printhead assembly exhaust system 2614, so that particles contained by printhead assembly exhaust system 2600 and service bundle housing 2410 can be effectively filtered by circulation and filtration system 1500, as depicted in FIG. 31A. For various embodiments of a gas enclosure system, such as gas enclosure system 510 of FIG. 31A and FIG. 31B, any particulate matter not streamed into second ductwork inlet 1572 would have a trajectory towards dead space 1590.

As depicted for gas enclosure system 511 of FIG. 32A and FIG. 32B, service bundle housing 2410 can be in fluid communication with circulation and filtration system 1500. As depicted in FIG. 32B, printhead assembly exhaust system housing 2610 can be in fluid communication with service bundle housing 2410, for example, but not limited by, printhead assembly exhaust system first conduit 2612, which can have a fan, such as fan 2620, for promoting gas movement through printhead assembly exhaust system first conduit 2612. Service bundle housing 2410 can be in fluid communication with printhead assembly exhaust system second conduit 2614, which can have filter head 2616. Filter head 2616 can filter particulate matter emanating from printhead assembly exhaust system 2600 and into service bundle housing 2410, and direct the low-particle gas stream flowing from filter head 2616 directly into gas enclosure system 511. In that regard, printhead assembly exhaust system second conduit 2614 can exhaust low-particle gas into gas enclosure system 511, which can then be circulate through circulation and filtration system 1500 of gas enclosure system 511, as depicted in FIG. 32A.

Various gas enclosure systems of the present teachings, such as gas enclosure system 501 of FIG. 12 and gas enclosure and enclosure system 502 of FIG. 13, can utilize various gas enclosures, for example, but not limited by, gas enclosure 100 of FIG. 1A and gas enclosure 1000 of FIG. 9. Further, various gas enclosures, such as gas enclosure 100 of FIG. 1A and gas enclosure 1000 of FIG. 9, can house a various printing systems, such as printing system 2000 of FIG. 10B, printing system 2002 of FIG. 26 and FIG. 2003 of FIG. 28A. For gas enclosure systems and methods of the present teachings, monitoring a controlled environment of a gas enclosure is an important aspect of maintaining a controlled environment of a gas enclosure.

One parameter of a controlled environment that can be monitored is effectiveness of the control of particulate matter. System validation as well as ongoing in situ system monitoring can be performed for both airborne and on-substrate particle monitoring.

A determination of airborne particulate matter can be performed for various embodiments of a gas enclosure system before a printing process for system validation, using, for example, a portable particle counting device. In various embodiments of a gas enclosure system, a determination of airborne particulate matter can be performed as an ongoing quality check in situ while a substrate is printed. For various embodiments of a gas enclosure system, a determination of airborne particulate matter can be performed for system validation before a substrate is printed and additionally in situ while a substrate is printed.

Figure 33:
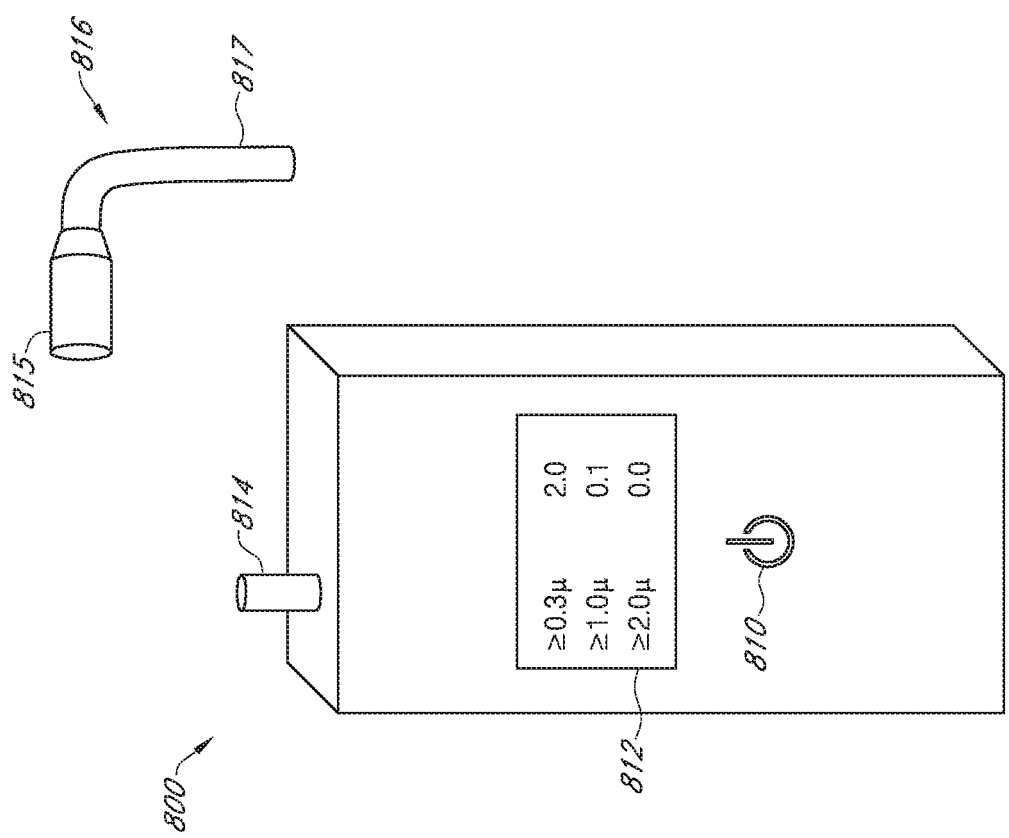
FIG. 33 is an embodiment of a portable airborne particle counting device according to the present teachings.

FIG. 33 depicts a device for measuring airborne particulate matter. According to the present teachings, various embodiments of particle counter 800 of FIG. 33 can be hand held or otherwise portable. As depicted in FIG. 33, particle counter 800 can have power button 810, as well as display 812 for real-time visual monitoring of various parameters, such as the particle size being monitored, as well as the current count of particulate matter of that size. Portable particle counters of the present teachings can have multiple channels for monitoring several particle size ranges during an analysis. By way of a non-limiting example, display 812 of particle counter 800 is depicted monitoring three distinct particle size ranges. For various embodiments of systems and methods of the present teachings, monitoring particles in the size range of about ≥0.3 μm can be useful for monitoring system quality, as a sudden spike in particles in that size range may be an early indication, for example, of a malfunction in the filtration system of a gas enclosure system. Various embodiments of a particle counter according to the present teachings can have a cable or wireless connection (not shown) from the particle counter to, by way of a non-limiting example, a computer, which can provide ongoing collection and storage of data from the particle counter. Particle counter 800 can have inlet nozzle 814 for drawing an air sample into particle counter 800. Various embodiments of a particle counter for measuring airborne particulate matter can have an isokinetic sampling probe, such as sampling probe 816 of FIG. 33, which can reduce count errors related to the sample flow velocity and the aerodynamics of particles; particularly small particles. To obtain a result that is accurate with respect particulate matter in a flow stream, the flow of the sample through the sampling system should be such that the velocity at the sampling point inlet is the same as the velocity of flow stream gas at that point. An isokinetic sampling probe can have inlet probe 815, which can be attached to inlet nozzle 814, using sampling probe connector 817. For various embodiments of sampling probe 816, sampling probe connector 817 can be a section of flexible tubing. For sampling in various embodiments of a gas enclosure system of the present teachings, inlet probe 815 of sampling probe 816 can face directly into the air flow.

Though various commercial particle counters can be based on various measurement principles that can include light blocking, direct imaging and light scattering, the measurement based on light scattering from a particle is well suited to yield information of interest, including particle size. In principle, particle size down to about 1 nm can be determined using light scattering.

Figure 34:
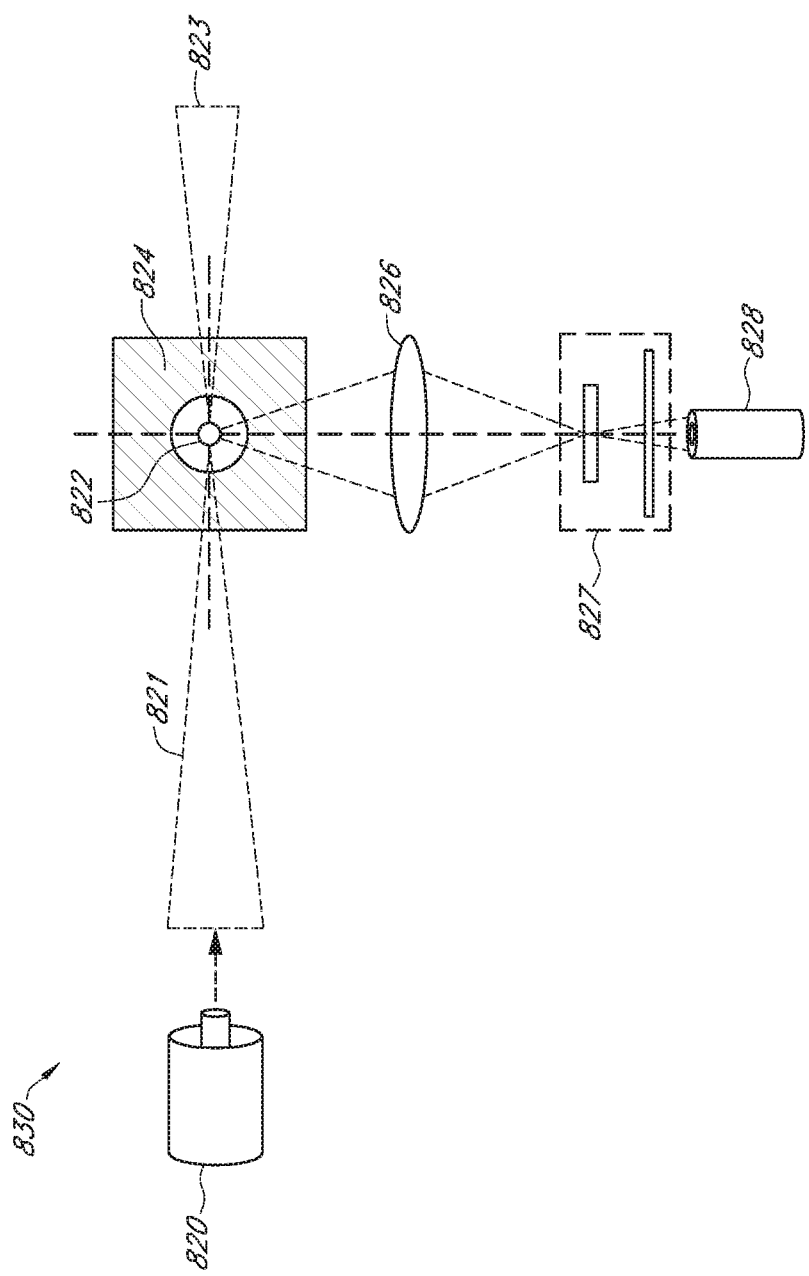
FIG. 34 is a schematic representation of the principle of operation of various portable airborne particle counting devices based on scattering of electromagnetic radiation.

FIG. 34 is a schematic depiction of particle counter detector 830 based on light scattering. A particle counter detector based on light scattering can have a source of electromagnetic radiation of known wavelength range of known wavelength, such as light source 820. For various embodiments of particle counter detector 830, light source 820 can be a laser source emitting light of a known wavelength. For various embodiments of a particle counter; especially for, but not exclusively for handheld and portable particle counting devices, light source 820 can be a light-emitting diode (LED) that emits light of a known wavelength of between about 600 nm to about 850 nm. Emitted source light 821 can be focused at detection area 822 of flow path 824, which is depicted in FIG. 34 as a top section view. Any particle in detection area 822 can scatter light, creating forward scattered light 823 or light scattered in a number of angular directions, including orthogonal to the direction of emitted source light 821, as depicted for light path 825. Light scattered orthogonally by a particle in detection area 822 can be focused using focusing lens 826, and can be filtered using at least one optical filter, for example, a spatial or an optical bandpass filter, or combinations thereof, before being detected by detector 828, which can be various types of a photometer detectors, for example, based on photodiode technology. Various embodiments of a particle counter can be calibrated using a calibration standard, such as an aerosol having particulate matter of defined distribution of particles in various size ranges, where each size range has a defined concentration.

For example, various commercial particle counters based on light scattering can detect airborne particle sizes in the range of about ≥0.3 µm to about ≥10 µm, and report number of particles of a specified size per volume of air; generally as cubic feet or cubic meters. Various commercial particle counters can count up to between about 1 million to about 3 million particles of a specified size. In that regard, various commercial calibration standards can have a distribution of particles covering of about ≥0.3 µm to about ≥10 µm, for example a bimodal or trimodal distribution of species covering that range, where each population of particles has a defined concentration that can be up to a detection limit of about 1 million to about 3 million particles. As previously discussed herein, various particle counters for determining airborne particulate matter can have multiple channels for monitoring a number of particle size ranges. Though shown with one light source and one detector, various embodiments of a particle counter for determining airborne particulate matter can have more than one light source, and multiple detectors at various positions for monitoring light scattered at various angles. Such airborne particle counters can monitor and report over a large dynamic particle size range for airborne particulate matter of about ≥0.1 µm to about ≥10.0 µm.

Figure 35:
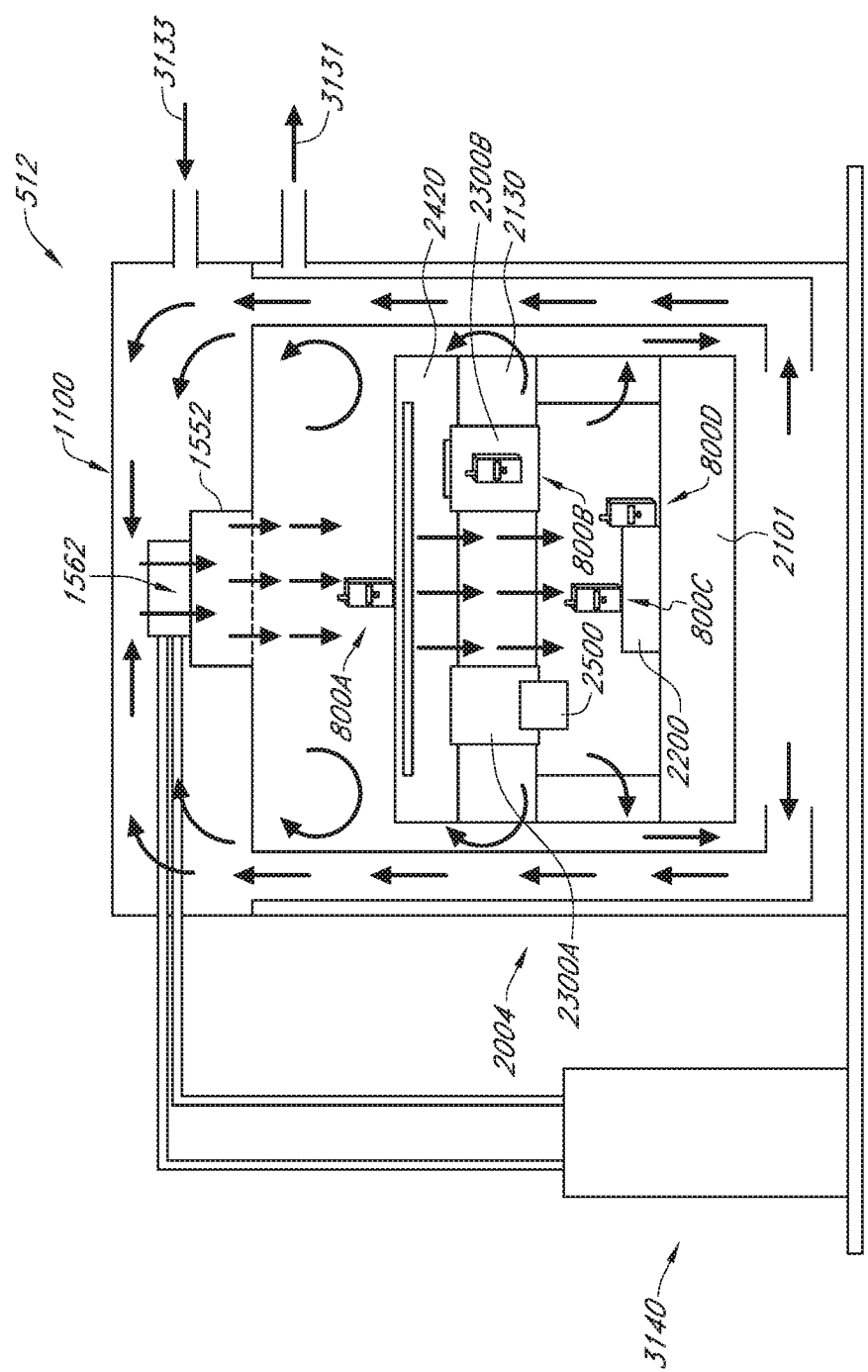
FIG. 35 is a schematic representation depicting various areas where a portable airborne particle counting device can be located in various printing systems of the present teachings.

FIG. 35 is a schematic representation using particle counter icons 800A through 800D and is meant to convey where various embodiments of a particle counting device can be located with respect to a low-particle zone of a printing system, which is proximal to a substrate. Gas enclosure system 512 of FIG. 35 can have components as previously described herein for gas enclosure systems 500-511, including, but not limited by, gas enclosure assembly 1100, thermal regulation system 3140 that can be integrated with a circulation and filtration system, as indicated by fan filter unit 1552, which is proximal to heat exchanger 1562. Gas enclosure system 512 of FIG. 35 can have outlet line 3131 and inlet line 3133 to a gas purification system (not shown), as well as housing printing system 2004. Printing system 2004 can have base 2101, upon which substrate support apparatus 2200 can be mounted. Printing system 2004 can additionally have bridge 2130, which can have first carriage assembly 2300A and second carriage assembly 2300B mounted thereupon. Printing system 2004 can also have service cable housing 2410 for housing a service cable (not shown).

Regarding FIG. 35, at least one particle counter can be positioned or mounted on, for example, service bundle housing 2410, as indicated by particle counter icon 800A, depicted in the laminar flow stream of fan filter unit 1552. A particle counter so positioned in a laminar flow stream of gas from a fan filter unit can allow for monitoring the effectiveness of a filtration system of a gas enclosure system. Additionally, bridge 2130 of printing system 2004 can support first X,Z axis carriage assembly 2300A, to which printhead assembly 2500 can be mounted. Second X,Z axis carriage assembly 2300B can have at least one particle counter mounted thereupon, as indicated by particle counter icon 800B. Monitoring at a position proximal to various printing devices and apparatuses such as carriage assemblies may be useful monitoring various sources of particle generation, such as a service bundle. A particle counter mounted as depicted by particle counter icon 800C could be useful for procedure development, and gas enclosure system validation runs. A particle counter mounted as depicted by particle counter icon 800D could be useful for procedure development, and gas enclosure system validation runs as well as in situ monitoring of airborne particulate matter during a printing process.

According to various systems and methods of the present teachings, a particle counting device could be mounted or placed on a substrate support apparatus to measure particles under defined conditions in an immediate area where a substrate can be located during printing. For example, as depicted in FIG. 35, particle counter could be placed or mounted on top of substrate support apparatus 2200, as indicated by the position of particle counter icon 800C. In various embodiments of systems and methods of the present teachings, monitoring of particulate matter using a particle counter placed or mounted on top of a substrate support apparatus can be done for various types of procedure development or gas enclosure system validation run studies. By way of another non-limiting example, a particle counter could be mounted on a side of substrate support apparatus 2200 as indicated by the position of particle counter icon 800D. By using a particle counter with a sampling probe having a flexible connector, such as particle counter 800 of FIG. 33, having sampling probe 816, a particle counter mounted to the side of a substrate support apparatus can have a sampling probe placed just at the height of a substrate.

A particle counter mounted on a side of a substrate support apparatus, as indicated by particle counter icon 800D, could be useful for procedure development, and gas enclosure system validation runs, as well as in situ monitoring of airborne particulate matter during a printing process. For example, in FIG. 36, printing system 2003, as previously described for FIG. 26 and FIG. 28A, can have X-axis carriage assembly 2300 mounted on bridge 2130, which can also include Z-axis moving plate 2310 for the Z-axis positioning of printhead assembly 2500. In that regard, various embodiments of carriage assembly 2300 can provide precision X,Z positioning of printhead assembly 2500 with respect to substrate 2050. For various embodiments of printing system 2003, have X-axis carriage assembly 2300 can utilize a linear air bearing motion system, which is intrinsically low-particle generating. Printing system 2003 of FIG. 36 can have can have service bundle housing exhaust system 2400 for containing and exhausting particles generated from service bundles, which can include service bundle housing 2410 for housing a service bundle. According to the present teachings, a service bundle can be operatively connected to a printing system to provide various optical, electrical, mechanical and fluidic connections required to operate various devices and apparatuses in a gas enclosure system, for example, but not limited by, various devices and apparatuses associated with a printing system. Printing system 2003 of FIG. 36 can have substrate support apparatus 2250 for supporting substrate 2050, which can be positioned with precision in the Y-axis direction using Y-axis positioning system 2355. Both substrate support apparatus 2250 and Y-axis positioning system 2355 are supported by printing system base 2101.

Figure 36:
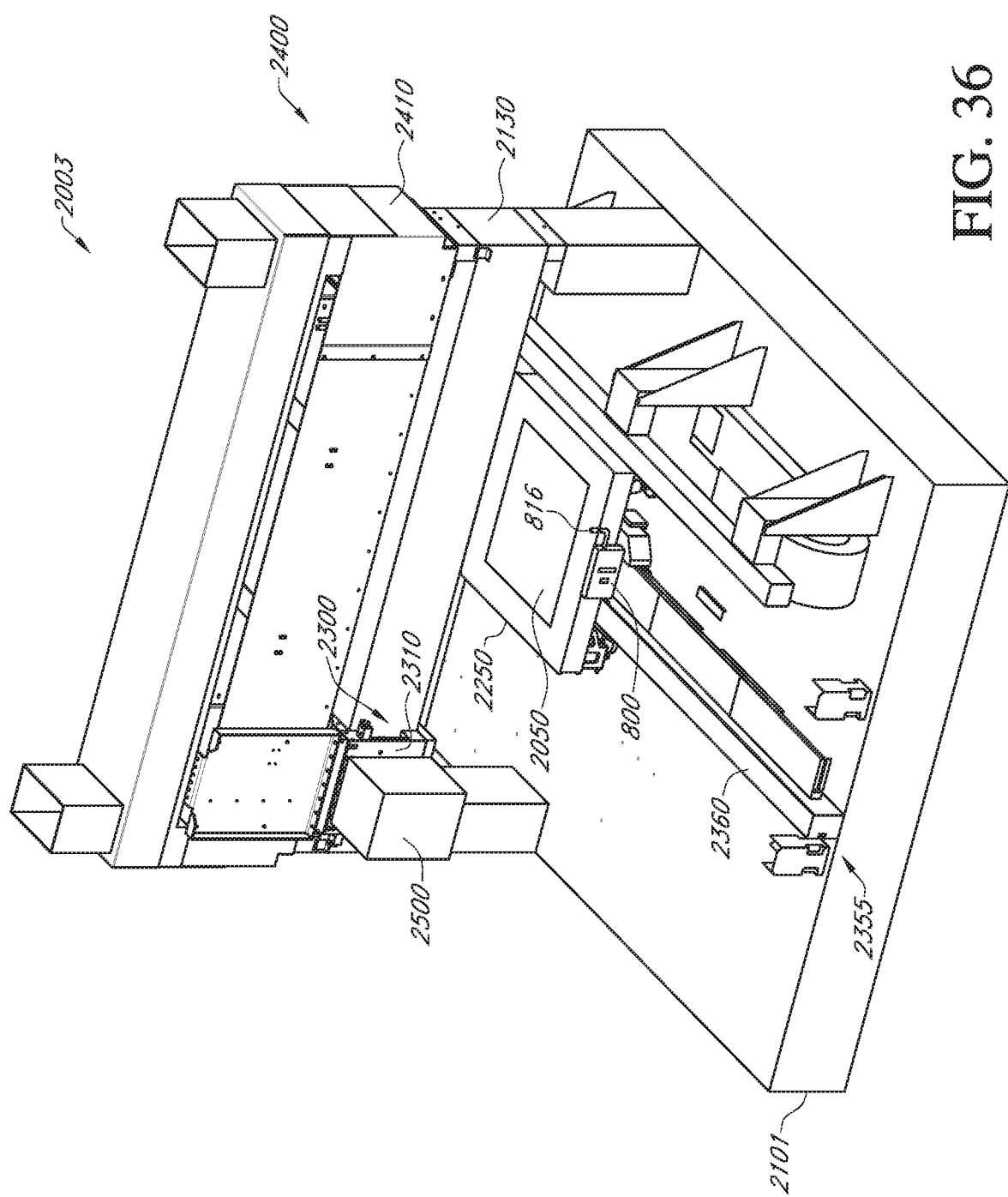
FIG. 36 is an iso perspective view of a portable airborne particle counting device located proximal to a substrate support apparatus in accordance with various embodiments of the present teachings.

For printing system 2003 of FIG. 36, a precision XYZ motion system can have various components for the positioning of a substrate mounted on substrate support apparatus 2250 relative to printhead assembly 2500, which can include Y-axis motion assembly 2355, as well as X-axis carriage assembly 2300. Substrate support apparatus 2250 can be mounted on Y-axis motion assembly 2355 and can be moved on rail system 2360 using, for example, but not limited by, a linear bearing system; either utilizing mechanical bearings or air bearings. For various embodiments of gas enclosure systems, an air bearing motion system helps facilitation frictionless conveyance in the Y-axis direction for a substrate placed on substrate support apparatus 2250. Y-axis motion system 2355 can also optionally use dual rail motion, once again, provided by a linear air bearing motion system or a linear mechanical bearing motion system. According to the present teachings, other precision XYZ motion systems can be used, such as, for example, but not limited by, various embodiments of a 3-axis gantry system. For example, various embodiments of a 3-axis gantry system can have an X,Z carriage assembly mounted on a gantry bridge for precision X,Z axis movement, where the gantry can be moved precisely in the Y-axis direction.

According to various systems and methods of the present teachings, printing system 2003 of FIG. 36 can have a particle counter 800 mounted to a side of substrate support apparatus 2250, so that isokinetic sample probe 816 is at about the same height as substrate 2050. Though FIG. 36 depicts particle counter 800 on a front side of substrate support apparatus, it is possible to mount one or more particle counters at various locations of a substrate support apparatus to effectively monitor airborne particulate matter proximal to a substrate. Additionally, for various embodiments of systems and methods, additional particle counters can be mounted or placed in other locations, as described for FIG. 35.

According to various embodiments of a gas circulation and filtration system contained in various embodiments of a gas enclosure system of the present teachings, continuous measurement of airborne particles can be done in a gas enclosure system. In various embodiments of a gas enclosure system of the present teachings, such measurements can be performed in a fully automated mode and continuously reported to an end user, for example, through a graphical user interface (GUI). In various embodiments of a gas enclosure system of the present teachings, measurement of airborne particulate matter can be done in targeted locations of interest, as depicted in FIG. 35. The output from each of a particle counter located in a gas enclosure can be reported to an end user, for example, through a GUI. For example, a target area of interest can be airborne particulate matter just proximal to a substrate over a substrate support apparatus, such as a chuck or a floatation table, as depicted in FIG. 36.

In that regard, continual monitoring of various embodiments of a gas enclosure system of the present teachings has confirmed that particles of the size of about ≥2 μm can be maintained at less than about 1 particle of that size range over a print cycle. For various embodiments of a gas enclosure system of the present teachings, particles of the size of about ≥2 μm can be maintained at less than about 1 particle of that size range over at least about a 24 hour period. For various embodiments of a gas enclosure system of the present teachings, particles of the size of about ≥0.3 μm can be maintained at less than about 3 particles of that size range over a print cycle. For various embodiments of a gas enclosure system of the present teachings, particles of the size of about ≥0.3 μm can be maintained at less than about 3 particles of that size range over at least about a 24 hour period. According to the present teachings, measurements of particulate matter taken from different locations in various embodiments of a gas enclosure system of the present teachings over a duration of at least about 24 hour period have been reported as an average of 0.001 particles of ≥2 μm and 0.02 particles of ≥0.5 μm.

Figure 37A:
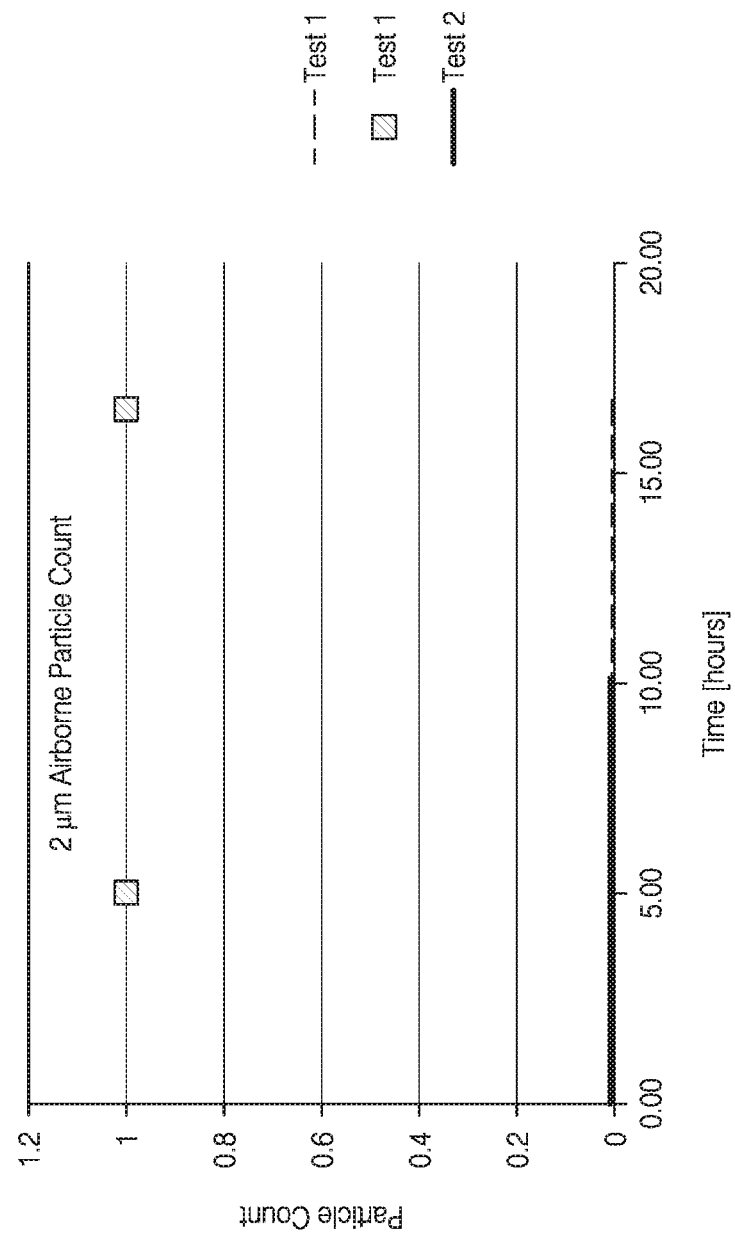
FIG. 37A and FIG. 37B are graphs depicting long-term test results of particle counts in various embodiments of a gas enclosure system of the present teaching.
Figure 37B:
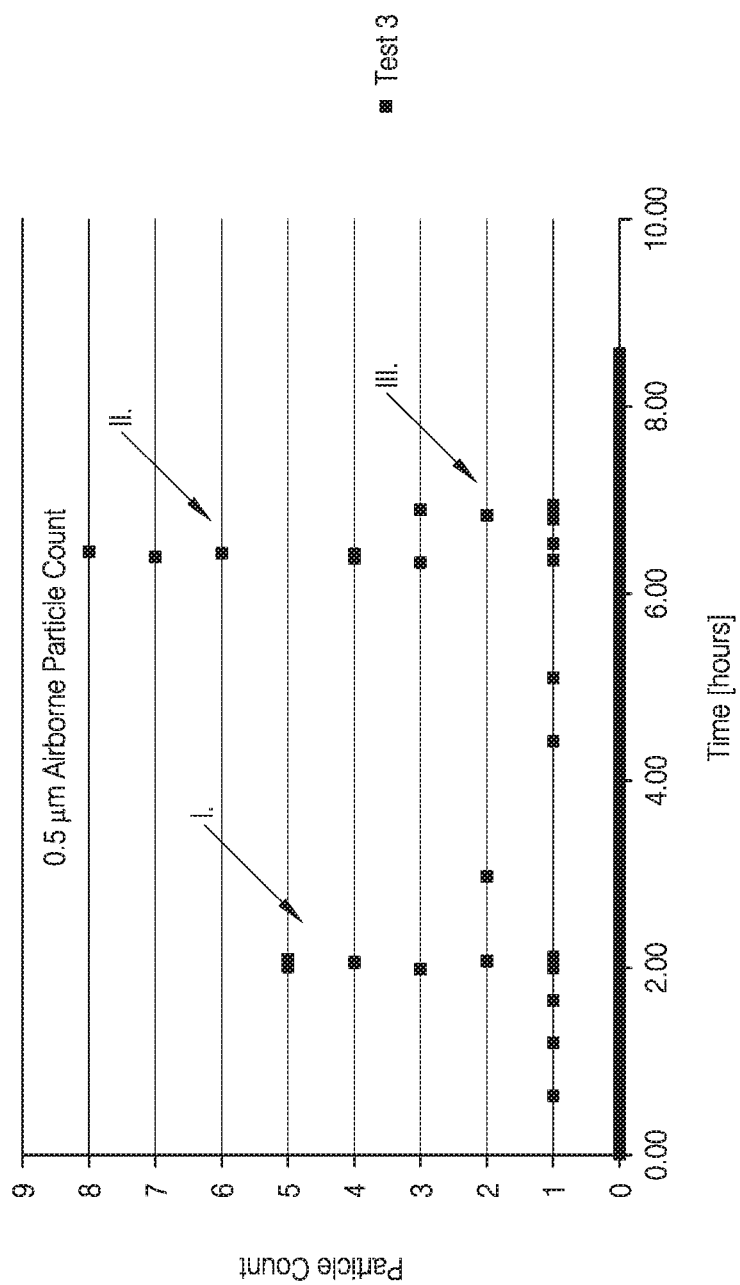

For example, FIG. 37A and FIG. 37B depict the results of long term measurements taken in various embodiments of a gas enclosure system of the present teachings. In FIG. 37A, two tests taken on different days are depicted. Such tests were performed in a gas enclosure system, such as those shown in FIG. 12 and FIG. 13, which was maintained in an inert nitrogen environment. The measurements were performed proximal to a substrate support apparatus, such as a chuck or a floatation table, as depicted in FIG. 36. During the testing period, the gas enclosure system was under continuous use for sequences including printing, maintenance and idle. In Test 1, the duration of real-time measurement was about 16 hours. During that period, a total of 2 particles of the size of about ≥2 μm were measured; 1 at about 5 hours and 1 near the end of the test period. For Test 2, which had a duration of about 10 hours, no particles of this size range were measured. In FIG. 37B, the measurements for Test 3, performed on the system on still another day over more than an 8 hour period, are depicted for particles of the size of about ≥0.5 μm. During this test period, a gas enclosure assembly window, such as window 130 of FIG. 1A, was opened periodically, at about 2 hours (reference number I.), at about 6.5 hours (reference number II.) and at about 7 hours (reference number III.). During these periods of transient gas enclosure system exposure to the ambient environment, the measurement of particulate matter can be observed to spike and then be rapidly re-established to a baseline value of about ≤1 particle in that size range.

For various embodiments of systems and methods of the present teachings, airborne particulate matter measured in a gas enclosure system can be less than about 3 particles/ft$^3$ for particles about 0.3 μm, less than about 1 particle/ft$^3$ for particles about ≥0.5 μm, and less than about 0 particles/ft$^3$ for particles about ≥1.0 μm. In that regard, various embodiments of a gas circulation and filtration system can be designed to provide a low particle inert gas environment for airborne particulates meeting the standards of International Standards Organization Standard (ISO) 14644-1:1999, "Cleanrooms and associated controlled environments—Part 1: Classification of air cleanliness," as specified by Class 1 through Class 5, and may even meet or exceed the standards set by Class 1.

Figure 38:
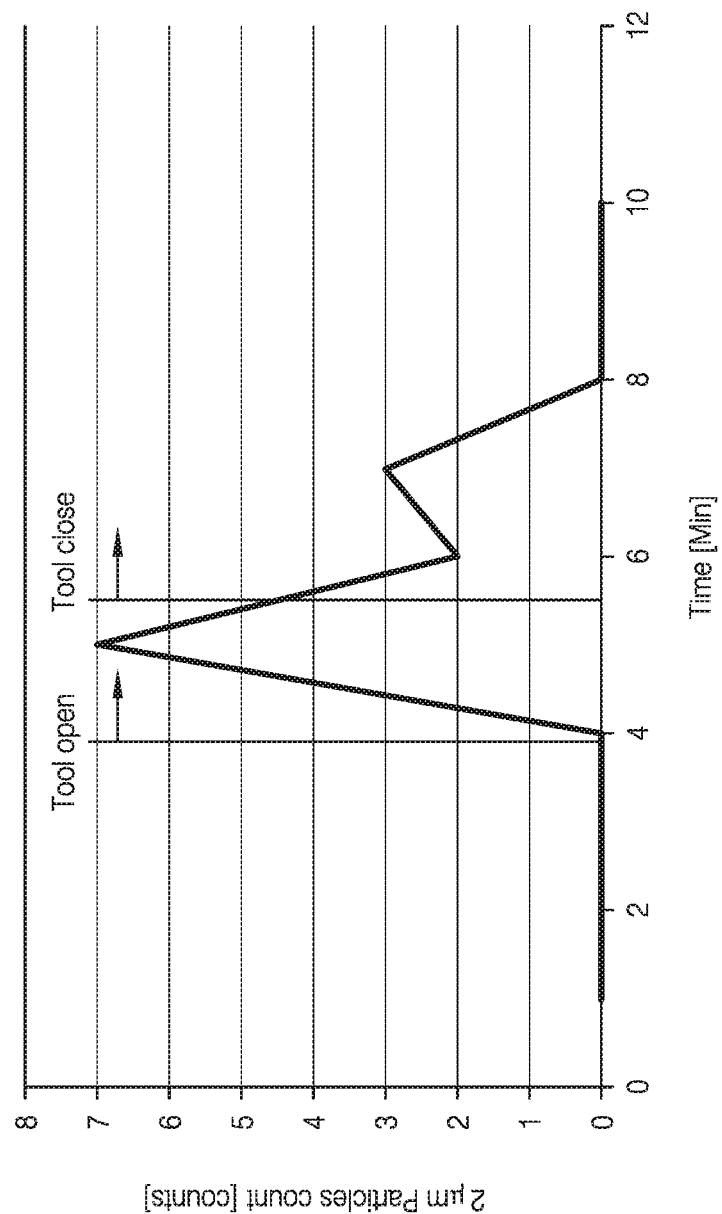
FIG. 38 is a graph depicting recovery test results of particle counts before and after a gas enclosure system window opening.

Such rapid system recovery by various embodiments of a circulation and filtration system of the present teachings as demonstrated in the data presented for FIG. 37B is additionally depicted in the graph of FIG. 38. In FIG. 38, particles of the size of about ≥2 µm were monitored proximal to a substrate support apparatus, such as a chuck or a flotation table. As can be seen the graph of FIG. 38, recover back to a baseline level of about ≤1 particle in that size range occurred in less than 3 minutes.

A determination of an on-substrate distribution of particulate matter on a substrate can be performed for various embodiments of a gas enclosure system before a substrate is printed for system validation, using, for example, a test substrate. In various embodiments of a gas enclosure system, a determination of an on-substrate distribution of particulate matter can be performed as an ongoing quality check in situ while a substrate is printed. For various embodiments of a gas enclosure system, a determination of an on-substrate distribution of particulate matter can be performed for system validation before a substrate is printed and additionally in situ while a substrate is printed.

Figure 39:
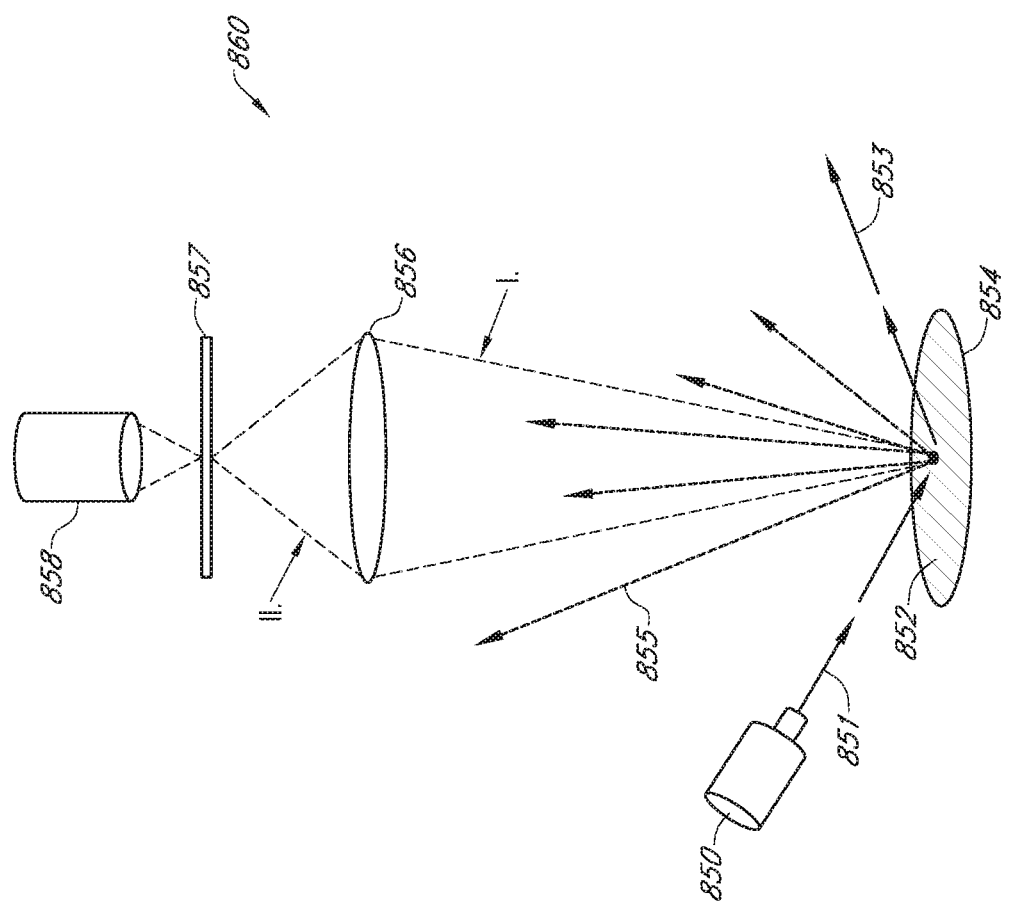
FIG. 39 is a schematic representation of the principle of operation of various particle detection devices for on-substrate particle detection based on scattering of electromagnetic radiation.

FIG. 39 depicts an on-substrate detection scheme based on light scattering, which can have essentially the same components as previously described for particle counter detector 830 of FIG. 34 in regard to detection systems for airborne particulate matter.

In FIG. 39, on-substrate particle counter detection system 860 based on light scattering can have a source of electromagnetic radiation of known wavelength range of known wavelength, such as light source 850. For various embodiments of on-substrate particle counter detection system 860, light source 850 can be a laser source emitting light of a known wavelength between about 600 nm to about 850 nm. Emitted source light 851 is depicted by ray tracing to interact with particle 852 on substrate 854. For various embodiments of systems and methods of the present teachings, a substrate can be a test substrate, such as a silicon wafer. Given the history of on-substrate particle determinations that have evolved from the semiconductor industry, particle determinations on silicon wafers are well-accepted testing methods. Further, a silicon wafer can have attributes such as having a reflective surface, which is preferable for an on-substrate detection system based on light scattering. Additionally, a silicon wafer is a substantially conductive material, so that it can be grounded. Having a substrate surface that is electrical neutral is important for getting unbiased sampling of on-substrate particle deposition. As it is not uncommon for particulate matter to carry a charge, a charged surface could thereby render a false positive or false negative result, depending on whether the interaction between a charged particle and a charged surface is attractive or repulsive.

With respect to a substrate having a reflective surface, such as a silicon wafer test substrate, emitted source light 851 can be reflected, as shown by reflected light rays 853 and it can also interact with particle 852 on substrate surface 854 to produce scattered light, as depicted by scattered light 855. As previously discussed herein for the case of an airborne particle detection based on light scattering, such as particle counter detector 830 of FIG. 34, light can be scattered in a number of angular directions, including orthogonal to the direction of emitted source light 851, as depicted for scattered light 855 falling within light path I. Focusing lens 856 can focus light scattered orthogonal to the direction of emitted source light 851 by particle 852, as depicted by light path II towards at least one optical filter, such as filter 857. Optical filter 857 can be for example, a spatial or an optical bandpass filter, or an additional filter can be added to provide combinations thereof. Finally, light scattered orthogonal to the direction of emitted source light 851 can be detected by detector 858, which can be various types of a photometer detectors, for example, based on photodiode technology. According to various embodiments of systems and methods of the present teachings, using an on-substrate particle counter detection system, such as on-substrate particle counter detection system 860 of FIG. 39, a report including the number of particles of a particle size, as well as a the location of every particle detected on the surface can be provided to an end-user.

With respect to testing protocols for on-substrate particle determination, for example, but not limited by, for system validation, silicon test wafers that have been analyzed and then sealed can be obtained with a report of the size and location of particles determined for each test wafer. Test wafers can be obtained as individually sealed or in cassette. According to various systems and methods of the present teachings, a cassette of witness wafers can be sealed within the cassette housing and then the cassette housing can be sealed with a removable sealing material, such as a sealed polymeric pouch. For various testing protocols for on-substrate particle determination for gas enclosure system validation, a cassette of witness wafers can be placed into a gas enclosure system either by an end-user or robotically. For example, a cassette can be placed in an auxiliary enclosure, as previously described herein, either by an end-user or robotically and the auxiliary enclosure can be placed through a recovery process until the gas environment is brought into specification with respect to reactive gases. The cassette can be transferred into a printing system enclosure, either by an end-user or robotically. Once the sealed cassette is within a gas enclosure system, the cassette of witness wafer can be unsealed and the cassette housing can be opened to readily access a wafer.

Figure 40:
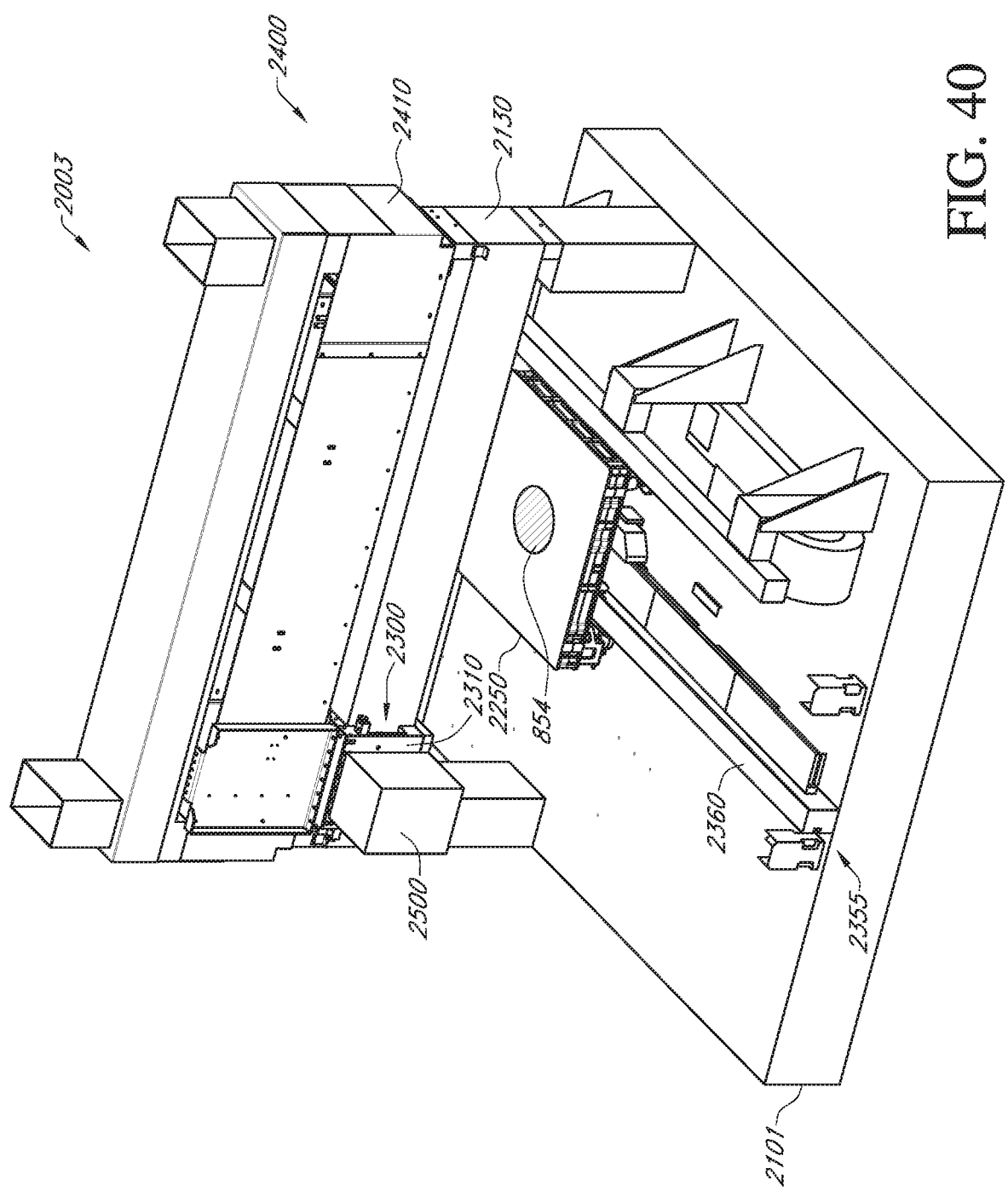
FIG. 40 is an iso perspective view of the placement of test substrate proximal to a printing area in accordance with various embodiments of the present teachings.

In reference to FIG. 40, printing system 2003 depicted having test wafer 854 can have all of the elements previously described for printing system 2002 of FIG. 26, as well as printing system 2003 of FIG. 28A and FIG. 36. For example, but not limited by, in FIG. 40, printing system 2003, as previously described for FIG. 26, FIG. 28A and FIG. 36, can have X-axis carriage assembly 2300 mounted on bridge 2130, which can also include Z-axis moving plate 2310 for the Z-axis positioning of printhead assembly 2500. In that regard, various embodiments of carriage assembly 2300 can provide precision X,Z positioning of printhead assembly 2500 with respect to a substrate positioned on substrate support 2250. For various embodiments of printing system 2003, X-axis carriage assembly 2300 can utilize a linear air bearing motion system, which is intrinsically low-particle generating. Printing system 2003 of FIG. 40 can have can have service bundle housing exhaust system 2400 for containing and exhausting particles generated from service bundles, which can include service bundle housing 2410 for housing a service bundle. Printing system 2003 of FIG. 40 can have substrate support apparatus 2250 for supporting a substrate, which can be positioned with precision in the Y-axis direction using Y-axis positioning system 2355. Both substrate support apparatus 2250 and Y-axis positioning system 2355 are supported by printing system base 2101. Substrate support apparatus 2250 can be mounted on Y-axis motion assembly 2355 and can be moved on rail system 2360 using, for example, but not limited by, a linear bearing system; either utilizing mechanical bearings or air bearings. For various embodiments of gas enclosure systems, an air bearing motion system helps facilitation frictionless conveyance in the Y-axis direction for a substrate placed on substrate support apparatus 2250. Y-axis motion system 2355 can also optionally use dual rail motion, once again, provided by a linear air bearing motion system or a linear mechanical bearing motion system.

Test wafer 854 of FIG. 40 can be placed on substrate support apparatus 2250 of printing system 2003. Substrate support apparatus 2250 can be positioned proximal to bridge 2130, in a variety of positions that can simulate where a substrate can be positioned during a printing process. A test wafer can have an edge exclusion zone, in which particle determination is not performed post testing, as an edge exclusion zone is zone where handling is performed, which can introduce contamination at the wafer edge. According to various testing protocols for on-substrate particle determination for gas enclosure system validation, an edge exclusion zone can be between about 1 cm to about 2 cm in width around the perimeter of a wafer and measured from the wafer edge. For various testing protocols for on-substrate particle determination for gas enclosure system validation, a series of on-substrate particle determination can be made to assess the state of a gas enclosure system housing a printing system. First, a background test can be performed, in which a statistical number of test wafers can be taken out by handling a test substrate just at the edge exclusion zone and placed then placed back into the cassette. In a next static test, a statistical number of test wafers can be taken out by handling a test substrate just at the edge exclusion zone and then exposed to the tool environment for a set duration of time, such as for a duration of a printing process, without any actuation of any apparatus or device within the gas enclosure system. In that regard, test wafers in the static set of test wafers are in a static printing environment. A set of test wafers for a static test, can then be moved back into the cassette housing. In a print test, a statistical number of test wafers can be taken out by handling a test substrate just at the edge exclusion zone and then exposed to the tool environment for the duration a printing process, without any actuation of ink ejection, but with full actuation of apparatus or device within the gas enclosure system. For example, printhead assembly 2500 mounted on carriage assembly 2300 can move relative to test wafer 854 mounted on substrate support apparatus of printing system 2003 depicted in FIG. 40, simulating a true print cycle. In that regard, the test wafers in a print set of test wafers are in a static printing environment. The set of test wafers for a print test can then be moved back into the cassette housing.

Once the testing protocol including background testing, static testing, and print testing, have been completed, the cassette housing can be resealed, and the cassette can be removed from the printing system enclosure for testing. For example, a sealed cassette with the series of test wafers can be placed in an auxiliary enclosure. When the printing system enclosure is sealably isolated from the auxiliary enclosure as previously described herein, the auxiliary enclosure can be opened to the surrounding environment and the sealed cassette with the test wafers can be retrieved and sent for analysis. All process steps for various embodiments an on-substrate particle determination testing protocol of the present teachings can be performed either by an end-user or robotically, or combinations thereof. Finally, the auxiliary enclosure closed and can be placed through a recovery process until the gas environment is brought into specification with respect to reactive gases.

Various imaging systems and methods of the present teachings can be utilized for in situ on-substrate particulate matter determination, as well as for performing system validation procedures. In reference to FIG. 41, printing system 2004 can have all of the elements previously described for printing system 2002 of FIG. 26, as well as printing system 2003 of FIG. 28A, FIG. 36, and FIG. 40. For example, but not limited by, printing system 2004 of FIG. 41 can have service bundle housing exhaust system 2400 for containing and exhausting particles generated from a service bundle. Service bundle housing exhaust system 2400 of printing system 2004 can include service bundle housing 2410, which can house a service bundle. According to the present teachings, a service bundle can be operatively connected to a printing system to provide various optical, electrical, mechanical and fluidic connections required to operate various devices and apparatuses in a gas enclosure system, for example, but not limited by, various devices and apparatuses associated with a printing system. Printing system 2004 of FIG. 41 can have substrate support apparatus 2250 for supporting substrate 2050, which can be positioned with precision in the Y-axis direction using Y-axis positioning system 2355. Both substrate support apparatus 2250 and Y-axis positioning system 2355 are supported by printing system base 2101. Substrate support apparatus 2250 can be mounted on Y-axis motion assembly 2355 and can be moved on rail system 2360 using, for example, but not limited by, a linear bearing system; either utilizing mechanical bearings or air bearings. For various embodiments of gas enclosure systems, an air bearing motion system helps facilitation frictionless conveyance in the Y-axis direction for a substrate placed on substrate support apparatus 2250. Y-axis motion system 2355 can also optionally use dual rail motion, once again, provided by a linear air bearing motion system or a linear mechanical bearing motion system.

Figure 41:
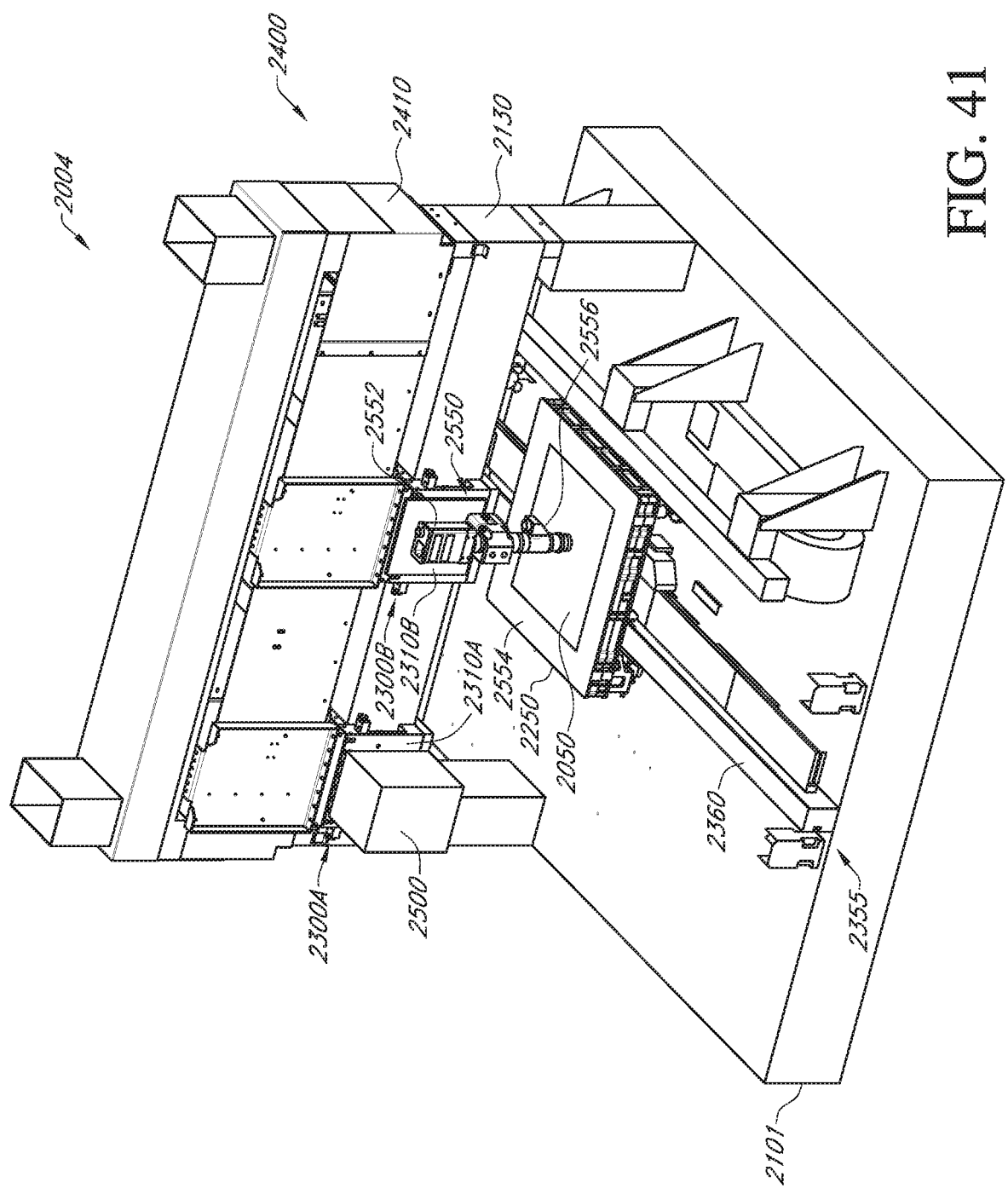
FIG. 41 is an iso perspective view of the placement of substrate proximal to a printing area in a printing system equipped with a camera in accordance with various embodiments of the present teachings.

Regarding motion systems supporting various carriage assemblies, printing system 2004 of FIG. 41 can have first X-axis carriage assembly 2300A that is depicted having printhead assembly 2500 mounted thereupon and second X-axis carriage assembly 2300B that is depicted having camera assembly 2550 mounted thereupon. Substrate 2050, which is on substrate support apparatus 2250, can be located in various positions proximal to bridge 2130, for example, during a printing process. Substrate support apparatus 2250 can be mounted on printing system base 2101. In FIG. 41, printing system 2004 can have first X-axis carriage assembly 2300A and second X-axis carriage assembly 2300B mounted on bridge 2130. First X-axis carriage assembly 2300A can also include first Z-axis moving plate 2310A for the Z-axis positioning of printhead assembly 2500, while second X-axis carriage assembly 2300B can have second Z-axis moving plate 2310B for the Z-axis positioning of camera assembly 2550. In that regard, various embodiments of carriage assemblies 2300A and 2300B can provide precision X,Z positioning with respect to a substrate positioned on substrate support 2250 for printhead assembly 2500 and camera assembly 2550, respectively. For various embodiments of printing system 2004, first X-axis carriage assembly 2300A and second X-axis carriage assembly 2300B can utilize a linear air bearing motion system, which is intrinsically low-particle generating.

Camera assembly 2550 of FIG. 41 can be a high-speed, high-resolution camera. A camera assembly 2550 can include camera 2552, camera mount assembly 2554 and lens assembly 2556. Camera assembly 2550 can be mounted to motion system 2300B on Z-axis moving plate 2310B, via camera mount assembly 2556. Camera 2552 can be any image sensor device that converts an optical image into an electronic signal, such as by way of non-limiting example, a charge-coupled device (CCD), a complementary metal-oxide-semiconductor (CMOS) device or N-type metal-oxide-semiconductor (NMOS) device. Various image sensor devices can be configured as an array of sensors for an area scan camera, or a single row of sensors, for a line scan camera. Camera assembly 2550 can be connected to image processing system that can include, for example, a computer for storing, processing, and providing results. As previously discussed herein for printing system 2004 of FIG. 41, Z-axis moving plate 2310B can controllably adjust the Z-axis position of camera assembly 2550 relative to substrate 2050. During various processes, such as for example, printing and data collection, substrate 2050 can be controllably positioned relative to the camera assembly 2550 using the X-axis motion system 2300B and Y-axis motion system 2355.

Accordingly, the split axis motion system of FIG. 41 can provide precise positioning of the camera assembly 2550 and substrate 2050 relative to one another in three dimensions in order to capture image data on any part of the substrate 2050 at any desired focus and/or height. Moreover, precision XYZ motion of a camera relative to a substrate can be done for either area scanning or line scanning processes. As previously discussed herein, other motion systems, such as a gantry motion system, can also be used to provide precision movement in three dimensions between, for example, a printhead assembly and/or a camera assembly, relative to a substrate. Additionally, lighting can be mounted in various positions; either on an X-axis motion system or on a substrate support apparatus proximal to a substrate, and combinations thereof. In that regard, lighting can be positioned according to performing various lightfield and darkfield analyses, and combinations thereof. Various embodiments of a motion system can position camera assembly 2550 relative to substrate 2050 using a continuous or a stepped motion or a combination thereof to capture a series of one or more images of the surface of substrate 2050. Each image can encompass an area associated with one or more pixel wells, associated electronic circuitry components, pathways and connectors of an OLED substrate. By using image processing, images of particles can be obtained, and size and number of particles of a specific size determined. In various embodiments of systems and methods of the present teachings, a line scan camera having about 8192 pixels, with a working height of about 190 mm, and capable of scanning at about 34 kHz can be used. Additionally, more than one camera can be mounted on an X-axis carriage assembly for various embodiments of a printing system substrate camera assembly, where each camera can have different specifications regarding field of view and resolution. For example, one camera can be a line scan camera for in situ particle inspection, while a second camera can be for regular navigation of a substrate in a gas enclosure system. Such a camera useful for regular navigation can be an area scan camera having a field of view in the range of about 5.4 mm×4 mm with a magnification of about 0.9× to about 10.6 mm×8 mm with a magnification of about 0.45×. In still other embodiments, one camera can be a line scan camera for in situ particle inspection, while a second camera can be for precise navigation of a substrate in a gas enclosure system, for example, for substrate alignment. Such a camera useful for precise navigation can be an area scan camera having a field of view of about 0.7 mm×0.5 mm with a magnification of about 7.2×.

With respect to in situ inspection of an OLED substrate, various embodiments of a printing system substrate camera assembly, such as camera assembly 2550 of printing system 2004 depicted in FIG. 41, can be used to inspect a panel without significant impact to total average cycle time (TACT). For example, a Gen 8.5 substrate can be scanned for on-substrate particulate matter in less than 70 seconds. In addition to in situ inspection of OLED substrate, a printing system substrate camera assembly can be used for a system validation study by using a test substrate to determine whether or not a sufficiently low particle environment for a gas enclosure system can be verified prior to using the gas enclosure system for a printing process.

With respect to airborne particulate matter and particle deposition within a system, a substantial number of variables can impact developing a general model that may adequately compute, for example, an approximation of a value for particle fallout rate on a surface, such as a substrate, for any particular manufacturing system. Variables such as the size of particles, the distribution of particles of particular size; surface area of a substrate and the time of exposure of a substrate within a system can vary depending on various manufacturing systems. For example, the size of particles and the distribution of particles of particular size can be substantially impacted by the source and location of particle-generating components in various manufacturing systems. Calculations based on various embodiments of gas enclosure systems of the present teachings suggest that without various particle control systems of the present teachings, on-substrate deposition per print cycle per square meter of substrate can be between more than about 1 million to more than about 10 million particles for particles in a size range of 0.1 μm and greater. Such calculations suggest that without various particle control systems of the present teachings, on-substrate deposition per print cycle per square meter of substrate can be between more than about 1000 to about more than about 10,000 particles for particles in a size range of about 2 μm and greater.

Using testing protocols as described for various embodiments an on-substrate particle determination testing protocol of the present teachings, various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 10 μm in size. Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 5 μm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 2 μm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 1 μm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.5 µm in size. For various embodiments of a gas enclosure system of the present teachings, a low-particle environment can be maintained providing for an average on-substrate particle distribution that meets an on-substrate deposition rate specification of less than or equal to about 1000 particles per square meter of substrate per minute for particles greater than or equal to 0.3 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.1 µm in size.

All publications, patents, and patent applications mentioned in this specification are herein incorporated by reference to the same extent as if each individual publication, patent, or patent application was specifically and individually indicated to be incorporated by reference.

While embodiments of the present disclosure have been shown and described herein, it will be obvious to those skilled in the art that such embodiments are provided by way of example only. Numerous variations, changes, and substitutions will now occur to those skilled in the art without departing from the disclosure.

It should be understood that various alternatives to the embodiments of the disclosure described herein may be employed in practicing the disclosure. For example, while vastly different arts such as chemistry, biotechnology, high technology and pharmaceutical arts may benefit from the present teachings. OLED printing is used to exemplify the utility of various embodiments of a gas enclosure system according to the present teachings. Various embodiments of a gas enclosure system that may house an OLED printing system can provide features such as, but not limited by, sealing providing an hermetic-sealed enclosure through cycles of construction and deconstruction, minimization of enclosure volume, and ready access from the exterior to the interior during processing, as well as during maintenance. Such features of various embodiments of a gas enclosure system may have an impact on functionality, such as, but not limited by, structural integrity providing ease of maintaining low levels of reactive species during processing, as well as rapid enclosure-volume turnover minimizing downtime during maintenance cycles. As such, various features and specifications providing utility for OLED panel printing may also provide benefit to a variety of technology areas. It is intended that the following claims define the scope of the disclosure and that methods and structures within the scope of these claims and their equivalents be covered thereby.

What is claimed is:

1. A system comprising:
    a gas enclosure assembly to contain a gas;
    a printing system disposed within the gas enclosure assembly, the printing system comprising:
        a printhead assembly comprising at least one printhead;
        a substrate support apparatus;
        a housing defining an interior; and
        a service bundle comprising a plurality of lines held together in a bundle and routed through the interior of the housing, the plurality of lines being operatively connected to the printing system and configured to provide at least one of optical, electrical, mechanical, and fluidic function to the printing system; and
    an exhaust system fluidically coupled with the housing, the exhaust system comprising an inlet and an outlet to exhaust gas from the housing and away from the substrate support apparatus;
    wherein the printhead assembly is moveably mounted to move across the substrate support apparatus, and the service bundle is movable in response to motion of the printhead assembly across the substrate support apparatus.

2. The system of claim 1, further comprising a gas circulation and filtration system fluidically coupled with the exhaust system.

3. The system of claim 1, wherein the exhaust system is a first exhaust system, and the system further comprises a second exhaust system to exhaust gas proximal the printhead assembly away from the substrate support apparatus.

4. The gas enclosure system of claim 3, further comprising a gas circulation and filtration system fluidically coupled with the second exhaust system.

5. The system of claim 1, further comprising a motion system to position the printhead assembly and the substrate relative to one another.

6. The system of claim 5, wherein the motion system is a split-axis motion system.

7. The system of claim 1, wherein the gas enclosure assembly further comprises:
    a printing system enclosure housing the printing system; and
    an auxiliary enclosure, wherein the auxiliary enclosure is configured to be sealably isolated from the printing system.

8. The system of claim 1, wherein the substrate support apparatus comprises a floatation table.

9. The system of claim 5, wherein the motion system comprises an air bearing motion system.

10. The system of claim 1, wherein the gas enclosure assembly contains the gas and the gas is an inert gas.

11. The system of claim 10, wherein the inert gas is selected from nitrogen, any of the noble gases and combinations thereof.

12. The system of claim 1, wherein the gas enclosure assembly contains the gas and the gas is clean dry air (CDA).

13. The system of claim 1, further comprising a gas purification system.

14. The system of claim 13, wherein the gas purification system is configured to maintain the gas at less than 100 ppm of a reactive specie.

15. The system of claim 14, wherein the reactive specie is selected from water vapor and oxygen and combinations thereof.

16. The system of claim 1, wherein the substrate support apparatus is configured to support a substrate of a size ranging from about generation 3.5 to about generation 10.

* * * * *